(12) United States Patent
Kubota et al.

(10) Patent No.: US 7,190,338 B2
(45) Date of Patent: Mar. 13, 2007

(54) DATA SIGNAL LINE DRIVE CIRCUIT, DRIVE CIRCUIT, IMAGE DISPLAY DEVICE INCORPORATING THE SAME, AND ELECTRONIC APPARATUS USING THE SAME

(75) Inventors: Yasushi Kubota, Nara (JP); Hajime Washio, Nara (JP); Michael James Brownlow, Oxford (GB); Graham Andrew Cairns, Oxford (GB); Yasuyoshi Kaise, Nara (JP); Kazuhiro Maeda, Nara (JP)

(73) Assignee: Sharp Kabushiki Kaisha (JP)

( * ) Notice: Subject to any disclaimer, the term of this patent is extended or adjusted under 35 U.S.C. 154(b) by 13 days.

(21) Appl. No.: 11/091,012

(22) Filed: Mar. 25, 2005

(65) Prior Publication Data

US 2005/0243588 A1   Nov. 3, 2005

Related U.S. Application Data

(62) Division of application No. 09/851,885, filed on May 9, 2001.

(30) Foreign Application Priority Data

| May 9, 2000 | (JP) | ............................. 2000-135844 |
| Oct. 13, 2000 | (JP) | ............................. 2000-314332 |
| Dec. 27, 2000 | (JP) | ............................. 2000-399579 |

(51) Int. Cl.
*G09G 5/00* (2006.01)

(52) U.S. Cl. ............................. 345/89; 345/90; 345/95; 345/204; 349/33; 349/34

(58) Field of Classification Search .................. 345/89, 345/90, 95, 98, 100, 204, 205; 349/33, 34
See application file for complete search history.

(56) References Cited

U.S. PATENT DOCUMENTS 5,600,344 A    2/1997   Sono et al.
5,638,501 A *  6/1997   Gough et al. ............... 345/639

(Continued)

FOREIGN PATENT DOCUMENTS

EP           0 558 056 A1     9/1993

(Continued)

*Primary Examiner*—Bipin Shalwala
*Assistant Examiner*—Vincent E. Kovalick
(74) *Attorney, Agent, or Firm*—David G. Conlin; William J. Daley, Jr.; Edwards Angell Palmer & Dodge LLP

(57) ABSTRACT

An image display device includes two data signal line drive circuits and two scan signal line drive circuits configured differently from each other. Different data signal line drive circuits and scan signal line drive circuit are compatible with different display formats. A display can be produced in the most suitable display format, and power consumption also can be reduced, by switch operating drive circuits according to the kind of input video and environmental conditions. Further, an image can be written over another image by writing video signals to signal lines with a time lag using a plurality of drive circuits; therefore, a superimposed display can be produced without externally processing the video signals. Thus, both a satisfactory image display and low power consumption can be achieved in an image display device.

31 Claims, 141 Drawing Sheets

U.S. PATENT DOCUMENTS

| | | |
|---|---|---|
| 5,898,417 A | 4/1999 | Kanno et al. |
| 5,973,661 A * | 10/1999 | Kobayashi et al. ......... 345/100 |
| 6,181,317 B1 * | 1/2001 | Taguchi et al. ............. 345/698 |
| 6,232,938 B1 | 5/2001 | Tsuchida et al. |
| 6,232,949 B1 * | 5/2001 | Imamura .................... 345/100 |
| 6,335,778 B1 | 1/2002 | Kubota et al. |
| 6,340,959 B1 | 1/2002 | Inamori |
| 6,353,460 B1 | 3/2002 | Sokawa et al. |

FOREIGN PATENT DOCUMENTS

| | | |
|---|---|---|
| JP | 61-128292 | 6/1986 |
| JP | 01-119191 | 5/1989 |
| JP | 02-210985 | 8/1990 |
| JP | 02-244880 | 9/1990 |
| JP | 03-051887 | 3/1991 |
| JP | 04-204628 | 7/1992 |
| JP | 04-294324 | 10/1992 |
| JP | 04-309995 | 11/1992 |
| JP | 06-250602 | 9/1994 |
| JP | 07-253566 | 10/1995 |
| JP | 07-294873 | 11/1995 |
| JP | 07-295520 | 11/1995 |
| JP | 08-137443 | 5/1996 |
| JP | 09-244852 | 9/1997 |
| JP | 09-329807 | 12/1997 |
| JP | 2000-187470 | 7/2000 |
| JP | 2000-339984 | 12/2000 |
| JP | 3056631 | 4/2001 |
| JP | 2002-175045 | 6/2002 |
| KR | 1997-22933 | 5/1997 |
| KR | 1997-50043 | 7/1997 |
| TW | 303448 | 4/1997 |

* cited by examiner

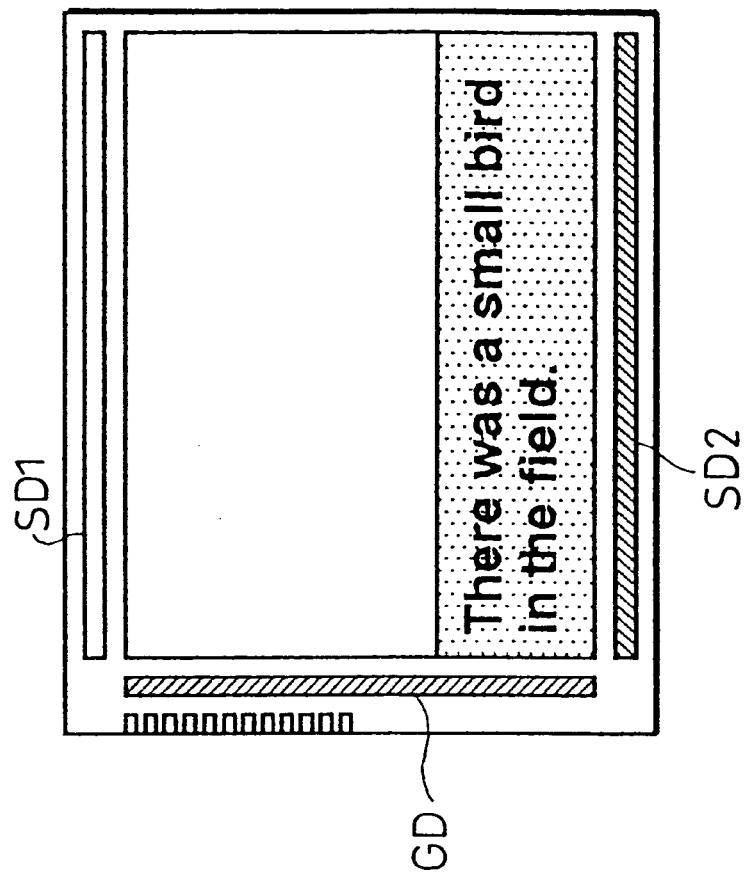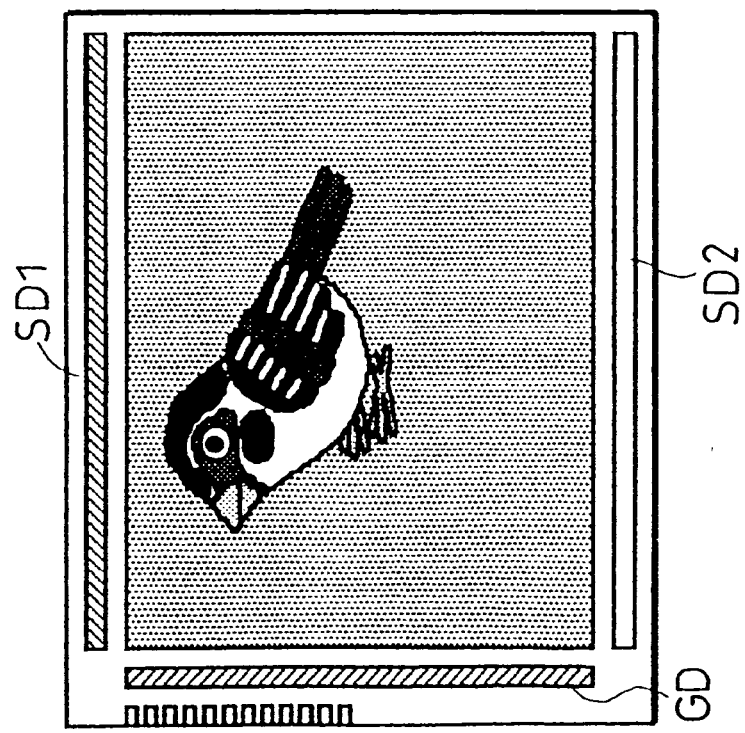

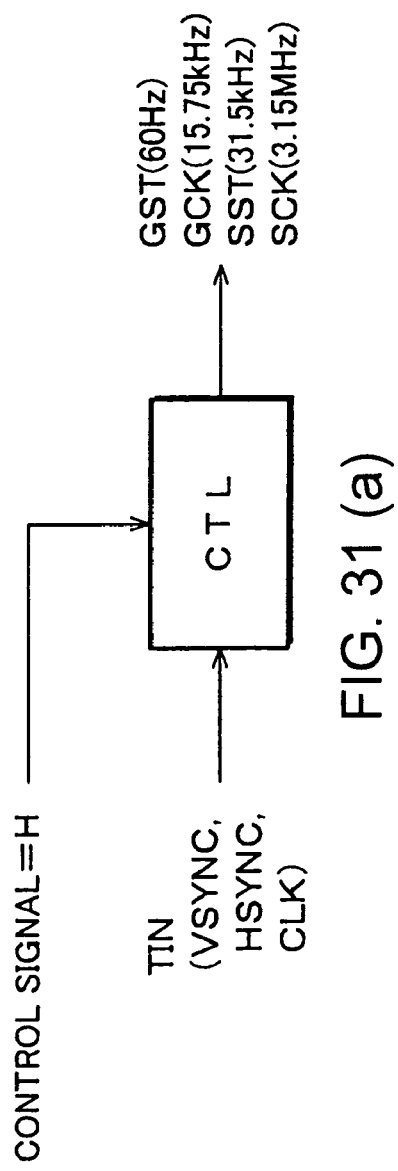
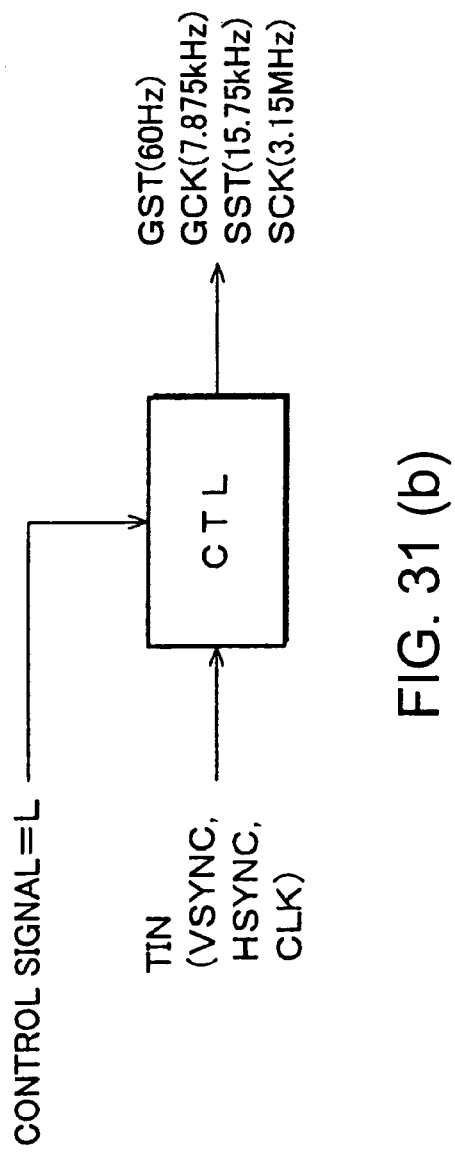

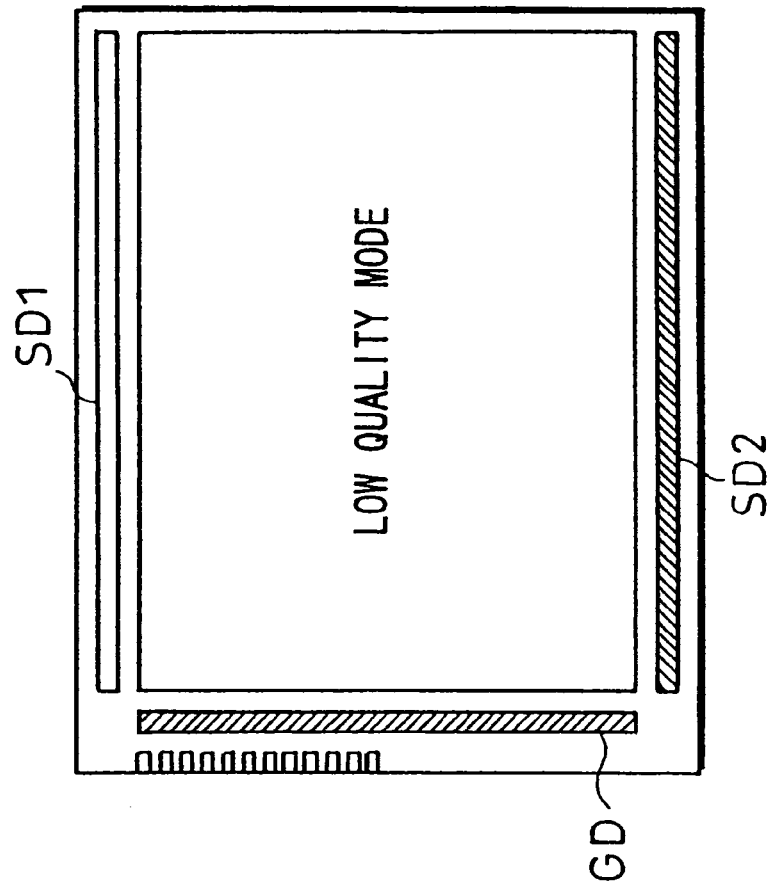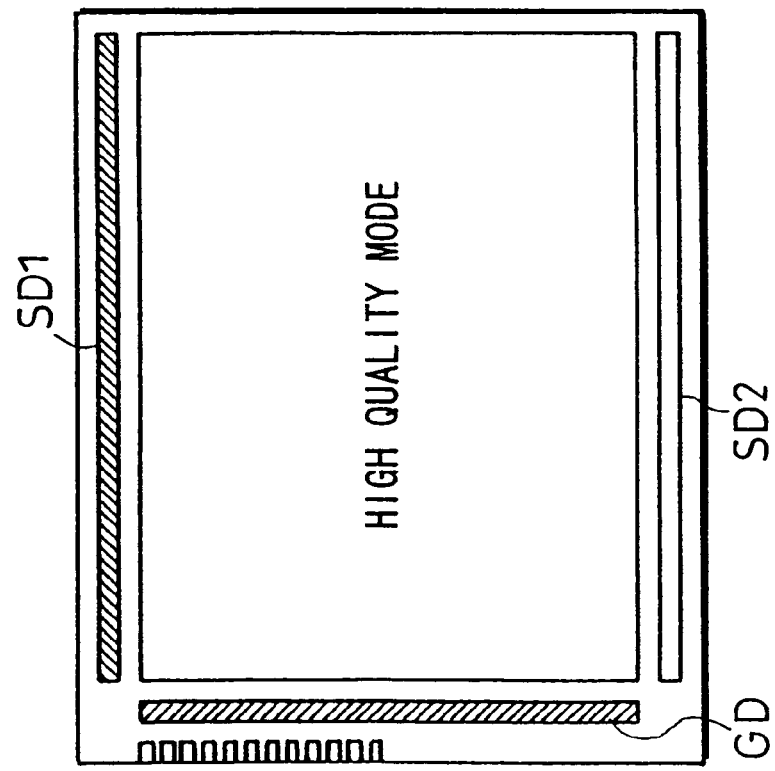

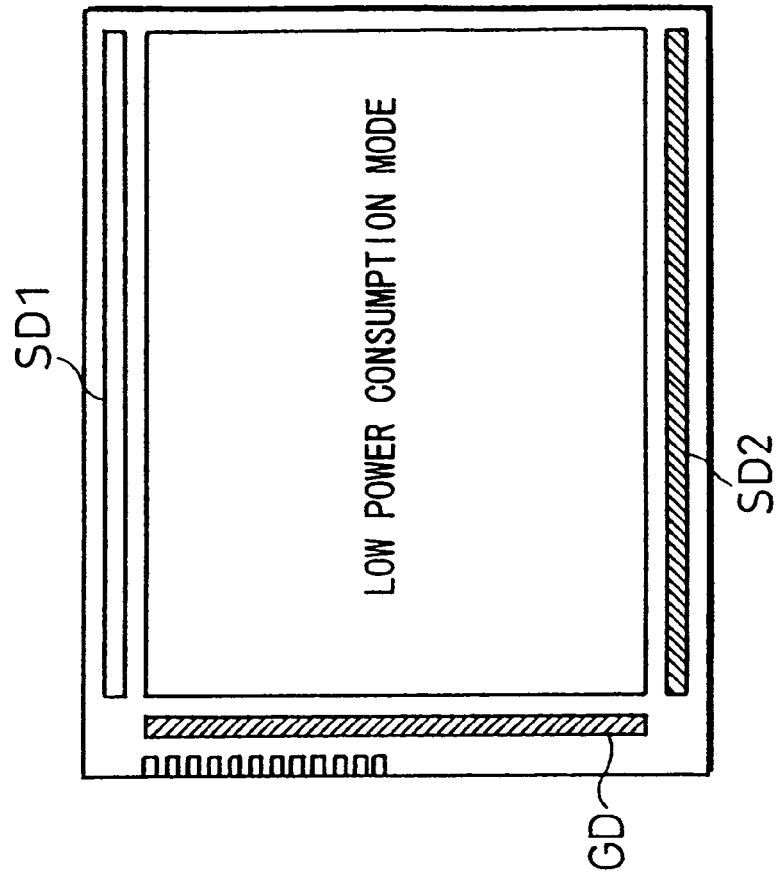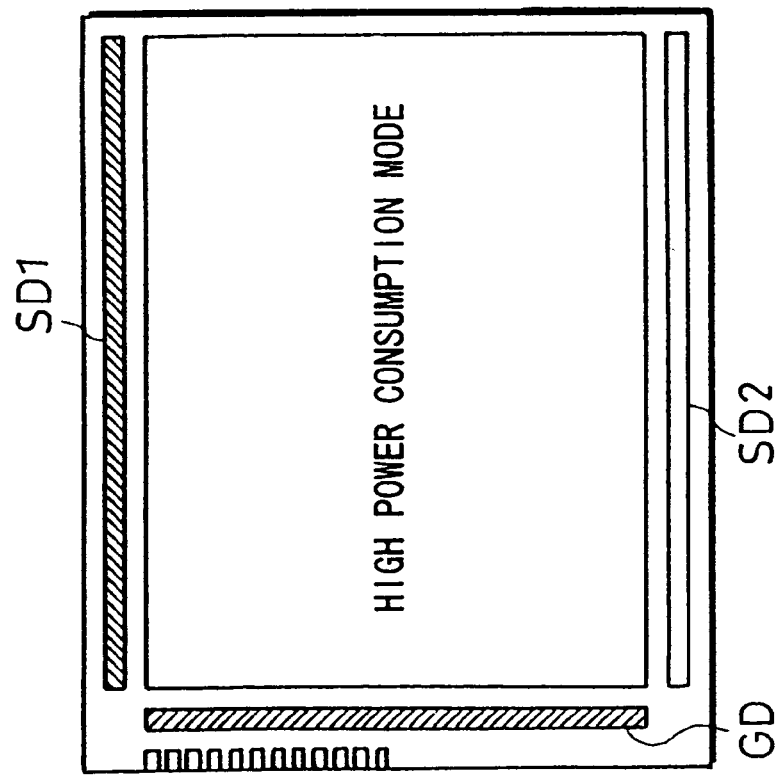

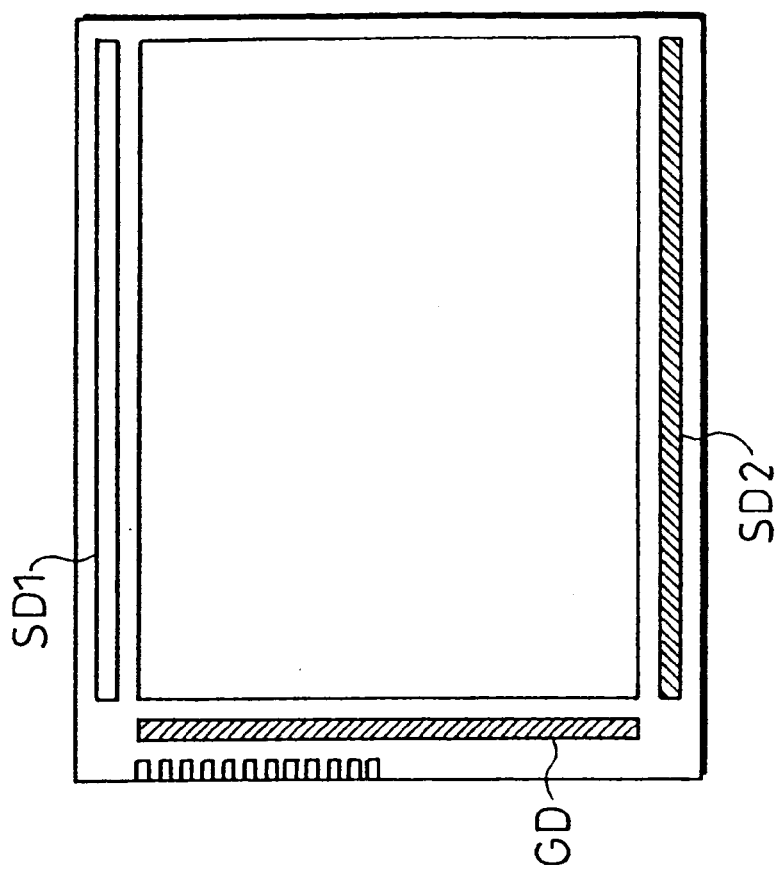
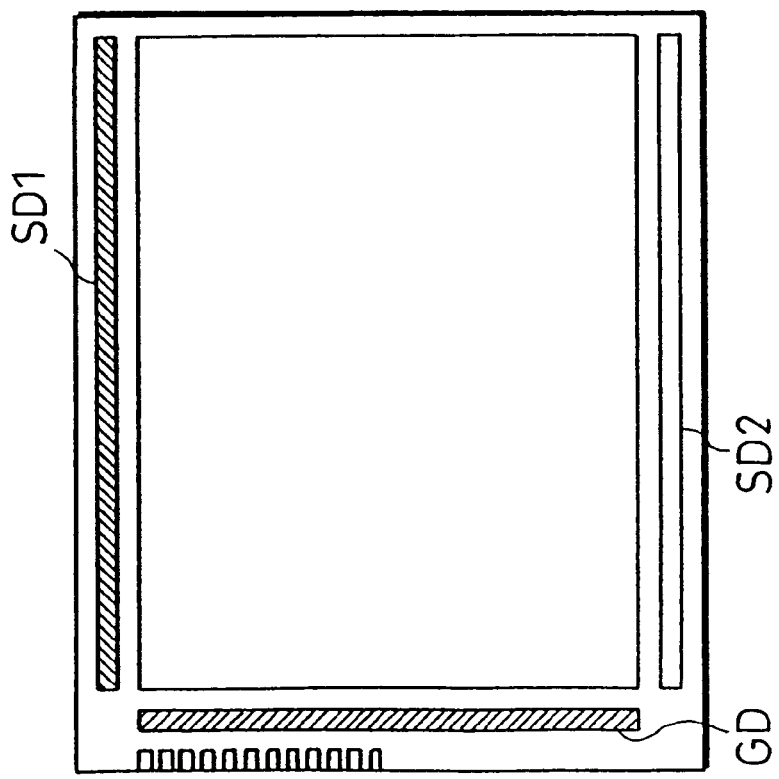

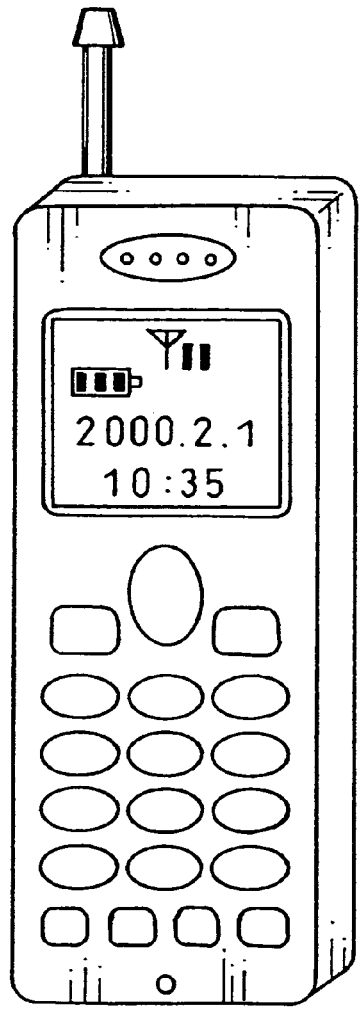 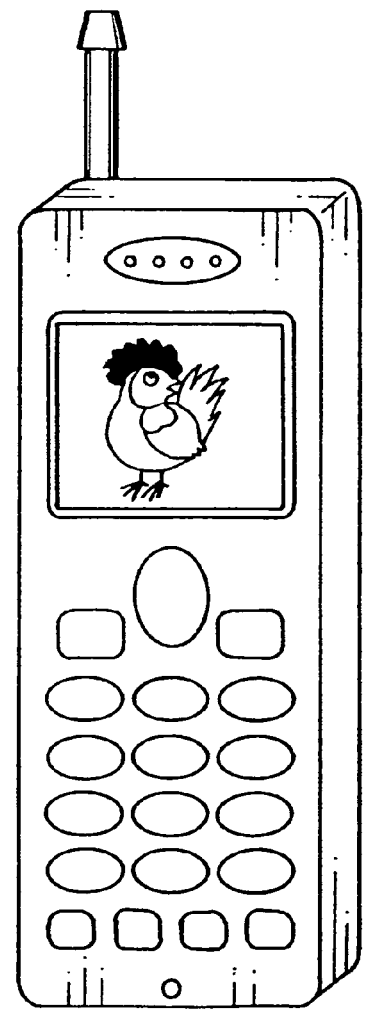
FIG. 81 (a)　　　　　　FIG. 81 (b)

DATA SIGNAL LINE DRIVE CIRCUIT, DRIVE CIRCUIT, IMAGE DISPLAY DEVICE INCORPORATING THE SAME, AND ELECTRONIC APPARATUS USING THE SAME

This application is a divisional of U.S. application Ser. No. 09/851,885, filed May 9, 2001, now allowed, the teachings of which are incorporated herein by reference in their entirety.

FIELD OF THE INVENTION

The present invention relates to a data signal line drive circuit, drive circuits, such as a data signal line drive circuit and a scan signal line drive circuit, an image display device incorporating the same, and an electronic apparatus using the same.

BACKGROUND OF THE INVENTION

The following will describe an active matrix liquid crystal display device as an example of image display devices related to the technologies of interest in the present invention. However, the present invention is not limited to the example and is equally applicable to image display devices of other types.

One of known, conventional image display devices is a liquid crystal display device of an active matrix drive type. The liquid crystal display device as shown in FIG. 132, is composed of a pixel array ARY, a scan signal line drive circuit GD, and a data signal line drive circuit SD. The pixel array ARY includes large numbers of scan signal lines GL and data signal lines SL crossing each other. A pixel PIX is provided in each segment that is surrounded by two adjacent scan signal lines GL and two adjacent data signal lines SL, forming a matrix of pixels as a whole. The data signal line drive circuit SD samples an input video signal DAT according to a timing signal, such as a clock signal SCK, amplifies the sampled data as required, and writes the data to associated data signal lines SL. The scan signal line drive circuit GD selects the scan signal lines GL sequentially according to a timing signal, such as a clock signal GCK, and controls opening/closure of those switching elements in the pixels PIX, to write to the pixels PIX the video signal (data) written to the data signal lines SL and also to cause the data written in the pixels PIN to be held.

Each pixel PIX in FIG. 132 is composed of a field effect transistor SW which is a switching element and a pixel capacitance (composed of a liquid crystal capacitance CL and an added-as-required supplemental capacitance CS) as shown in FIG. 133. Further referring to FIG. 133, the data signal line SL is connected to one of two electrodes of the pixel capacitance through the drain and source of the transistor SW acting as a switching element; the gate of the transistor SW is connected to the scan signal line GL; and the other electrodes of the pixel capacitance is connected to a common electrode line which is shared by all the pixels. The voltage applied across the liquid crystal capacitance CL changes the transmittance or reflectance of the liquid crystal, producing a display.

Now, schemes of writing video data to data signal lines will be described. A data signal line can be driven either of two schemes: analog scheme or digital scheme. The analog scheme can be classified further into point sequential drive scheme and line sequential drive scheme. The digital scheme can be classified further depending on whether or not there is provided an amplifier.

FIG. 134 shows an example of a data signal line drive circuit employing a point sequential scheme. According to a point sequential drive scheme, as shown in FIG. 134, the input video signal DAT to the video signal lines is written to the data signal lines SL by opening/closing the analog switches AS as a sampling circuit in synchronism with output pulses N (i.e., N1, N2, . . . ) from the associated stages of the shift register composed of a plurality of latch circuits FF. According to the configuration of FIG. 134, sampling-signals S, /S are produced based on a stack pulse of output signals N from two adjacent latch circuits FF, and as a result, video signals DAT at falling (trailing edge) timings of a sampling signal are written to data signal lines SL FIG. 135 shows another example of a data signal line drive circuit employing a point sequential scheme. In FIG. 135, the data signal line drive circuit is adapted to a color display whereby three video signals corresponding to the three primary colors (R, G, B) for display are inputted to the drive circuit and outputted to individual data signal lines SL1$r$, SL1$g$, SL1$b$, by identical pulse signals S1, /S1, . . . .

FIG. 136 shows an example of a data signal line drive circuit employing a line sequential scheme. According to line sequential drive scheme, as shown in FIG. 136, after the video signal DAT inputted to the video signal line is picked up by means of the opening/closing of the sampling circuits AS in synchronism with output pulses N from the associated stages of the shift register composed of a plurality of latch circuits FF, those signals for a single horizontal period are transferred simultaneously to next stages and written to the data signal lines SL via an amplifier AM.

FIG. 137 shows an example of a data signal line drive circuit employing a digital scheme with no amplifier. According to the scheme, after the digital video signal DIG inputted to the video signal line is picked up by a latch circuit LT in synchronism with output pulses N from the associated stages of the shift register composed of a plurality of latch circuits FF, those signals for a single horizontal period are transferred simultaneously to next stages, converted into analog signals by a digital-analog converter circuit DA, and written to the data signal lines SL.

FIG. 138 shows an example of a data signal line drive circuit employing a digital scheme with an amplifier. According to the scheme, after the digital video signal DIG inputted to the video signal line is picked up by a latch circuit LT in synchronism with output pulses N from the associated stages of the shift register composed of a plurality of latch circuits FF, those signals for a single horizontal period are transferred simultaneously to next stages, converted into analog signals by a digital-analog converter circuit DA, amplified by an amplifier AP, and written to the data signal lines SL.

FIG. 139 shows an example of a scan signal line drive circuit. As shown in FIG. 139, the scan signal line drive circuit outputs to the scan signal line GL as scan signals, the product (AND) signals of pulse signals sequentially transferred in synchronism with the clock signal GCK and a signal GEN specifying a pulse width. As described earlier, the scan signal is used to control the writing and holding of the video signal in the pixel.

FIG. 140 is a timing chart corresponding to the configuration in FIG. 132.

If binary displayed images such as text and graphics are to be synthesized with a multitone image before producing a display, there are needed a multitone data storage section in which multitone data is recorded, a binary data storage section in which binary image data is stored, and a synthesized data storage section in which the synthesized image data is stored, and the data synthesized by means of these sections is inputted to the data signal line drive circuit SD as image data.

Incidentally, in recent years, technologies to integrate the pixel array and drive circuit for controlling the display on a single substrate have been a focus of attention for the purposes of manufacturing smaller liquid crystal display devices with improved resolution at lower mounting costs, which is illustrated in FIG. 141. Note that in the figure, SUB represents substrate, and COM represents a common terminal. In this kind of liquid crystal display device with an integrated drive circuit, since the substrate needs to be transparent (in a case where the substrate will be a part of a currently popular liquid crystal display device of a transmission type), polycrystalline silicon thin film transistors which can be provided on a quartz or glass substrate are often used as active elements.

Incidentally, a conventional image display device includes only a single pair of a data signal line drive circuit and a scan signal line drive circuit as shown in FIG. 132.

Therefore, its video display capability is limited only to a single format. Although there are some image display devices with display capabilities in more than one format, they simply convert signals (control and video signals) inputted to the display device using an external circuit; they do not differ much in structure. In other words, whichever format is used for the video display, the same circuits (the data signal line drive circuit and the scan signal line drive circuit) operate, and their power consumption hardly varies.

Incidentally, in recent years, demand is growing for display devices with reduced power consumption in response to the demand for portable apparatuses with longer battery life. The portable apparatus is not always operating; in contrary, most of the time it is standing by. Moreover, the video to be displayed and format differ during use and during standby: for example, when it is standing by, it only needs to display a menu screen and time and often does not require a fine display or a great number of display colors. Rather, reduced power consumption and resultant longer battery life are important. By contrast, when the portable apparatus is being used, it often needs to display large amounts of text and images, such as graphics and photographs, in high quality. Under these circumstances, the display module consumes relatively little power, because power consumption increases in the other parts of the portable apparatus (for example, the communications module, the input interface section, and the processing section) Demand for lower power consumption during use is therefore not so strong as during standby.

Further, in a conventional configuration where there are provided only a pair of drive circuits, such as the data signal line drive circuit and the scan signal line drive circuit, corresponding only to a single display video format, if the image display device is to display a superimposed image from a plurality of sets of image data, the data for the superimposed image needs to be synthesized prior to the input to the image display device. The synthesis process requires an external image processing circuit to be provided to synthesize a plurality of images.

SUMMARY OF THE INVENTION

The present invention has an objective to offer an image display device, data signal line drive circuit, drive circuit, and electronic apparatus using the same, which have individual, suitable driving capabilities for standby and use. It is another objective of the present invention to offer an image display device, data signal line drive circuit, drive circuit, and electronic apparatus using the same, which can display a superimposed image from a plurality of sets of image data without preliminary synthesis.

To accomplish the objectives, an image display device in accordance with the present invention is characterized in that it includes:

a pixel array constituted by a plurality of pixels for displaying an image;

a data signal line drive circuit for supplying a video signal to the pixel array;

a scan signal line drive circuit for controlling writing of the video signal to the plurality of pixels;

a timing circuit for supplying a timing signal to the data signal line drive circuit and the scan signal line drive circuit; and a video signal processing circuit for supplying the video signal to the data signal line drive circuit, wherein:

a part or entirety of either or both of the data signal line drive circuit and the scan signal line drive circuit is provided in plurality so as to realize mutually different display configurations.

The provision of the parts or entireties of the data signal line drive circuit which are capable of realizing mutually different configurations enables video displays in different formats. In other words, the parts or entireties of the data signal line drive circuit are provided in accordance with a plurality of display formats and selectively operated depending on the need of the user, kind of input signal, and environmental conditions, enabling a video display in a format that is most suited to a purpose.

Further, data signal line drive circuits are provided so that each data signal line drive circuit can individually write image data to pixel arrays, enabling a superimposed display of a plurality of images to be produced.

The provision of the parts or entireties of the scan signal line drive circuit which are capable of realizing mutually different configurations enables video displays in different formats. In other words, the parts or entireties of the scan signal line drive circuit are provided in accordance with a plurality of display formats and selectively operated depending on the need of the user, kind of input signal, and environmental conditions, enabling a video display in a format that is most suited to a purpose.

To accomplish the objectives, another image display device in accordance with the present invention is characterized in that it includes:

a plurality of pixels arranged in a matrix form;

a plurality of data signal lines arranged to match with columns of the plurality of pixels and a plurality of scan signal lines arranged to match with rows of the plurality of pixels;

a display section in which the plurality of pixels are fed with data for an image display from the plurality of data signal lines in synchronism with a scan signal supplied from the plurality of scan signal lines;

a plurality of data signal line drive circuits, connected to the same data signal lines, for outputting a video signal to the plurality of data signal lines in synchronism with a predetermined timing signal; and a scan signal line drive circuit for outputting the scan signal to the plurality of scan signal lines in synchronism with a predetermined timing signal, wherein:

at least one of the plurality of data signal line drive circuits is a binary data signal line drive circuit including:

a shift register section operating at a predetermined timing;

a data holding section for sampling and holding a separately inputted binary data signal according to an output of the shift register section;

a data switching section for switching binary data potentials, i.e., a for-turn-on potential and a for-non-turn-on potential, according to the binary data signal being held; and an output control section, provided between an output of the data switching section and the plurality of data signal lines, for controlling an output of the data switching section based on an externally inputted transfer instruction signal.

In this configuration, at least one of the plurality of data signal line drive circuits includes a binary data signal line drive circuit that determines the externally supplied binary data potential (a for-turn-on potential or a for-non-turn-on potential) according to a binary data signal and supplies the binary data potential to the plurality of data signal lines within a predetermined period according to an external timing signal.

In the configuration, the output control section controls whether or not at least one of the plurality of data signal line drive circuits as a binary data signal line drive circuit (BINSD) supplies the binary data potential to the plurality of data signal lines: for example, the output control section may be configured to supply either a for-turn-on potential or a for-non-turn-on potential to the plurality of data signal lines when the data holding section holds and outputs a binary data signal that is meaningful. At least one other of the plurality of data signal line drive circuits (e.g., analog data signal line drive circuit (SD)) performs data supply and a display regardless of this. Therefore, when only binary text data needs to be displayed, for example in a mobile telephone in a standby mode, if only the binary data signal line drive circuit BINSD is driven, power consumption is reduced by the amount that would be otherwise consumed by the other data signal line drive circuit (e.g., analog data signal line drive circuit SD). The image display device is driven suitably to individual needs in both actual use and standby, thereby achieving low power consumption.

In other words, such driving that is suitable to individual needs in both actual use and standby becomes possible by allowing only the binary data signal line drive circuit BINSD to drive the plurality of data signal lines and suspending the supply of the start signal SP, the clock signal CK, and the video signal DAT to the other data signal line drive circuit (e.g., analog data signal line drive circuit-SD).

Further, the other data signal line drive circuit (e.g., analog data signal line drive circuit SD) can produce a display based on multitone image data, and the binary data signal line drive circuit BINSD can supply binary image data thereto to display an image overlapping part of the foregoing display. Thereby, a display of superimposed images can be produced based on a plurality of sets of image data without preliminary synthesis.

To accomplish the objectives, a data signal line drive circuit in accordance with the present invention is characterized in that it includes:

a reference voltage selection circuit; and an intermediate potential generation circuit, wherein:

when relatively a few halftones are displayed, the reference voltage selection circuit operates, but the intermediate potential generation circuit does not operate; and when relatively many halftones are displayed, both the reference voltage selection circuit and the intermediate potential generation circuit operate.

To accomplish the objectives, another image display device in accordance with the present invention is characterized in that it includes the foregoing data signal line drive circuit.

To accomplish the objectives, a drive circuit in accordance with the present invention incorporates a scan circuit including n stages, where n is an integral greater than 1, and is characterized in that it includes:

a first control switching means for controlling an input of a start signal to a first stage of the scan circuit;

a second control switching means provided between mth and (m+1)th stages of the scan circuit, where m is a positive integral not exceeding n; and a third control switching means for controlling an input of a start signal to the (m+1)th stage.

wherein:

the first control signal controls the first control switching means and the second control switching means; and the second control signal controls the third control switching means.

To accomplish the objectives, another image display device in accordance with the present invention is characterized in that it includes the foregoing drive circuit.

To accomplish the objectives, an electronic apparatus in accordance with the present invention incorporates an image display device as output device, and is characterized in that the image display device is any one of the aforementioned image display devices.

The image display device switchable between display modes and display formats as described earlier, when provided in the electronic apparatus, enables both the display quality of an output device to be improved and the total power consumption of the electronic apparatus to be reduced appropriately depending on operating and environmental conditions of the electronic apparatus.

For a fuller understanding of the nature and advantages of the invention, reference should be made to the ensuing detailed description taken in conjunction with the accompanying-drawings.

BRIEF DESCRIPTION OF THE DRAWINGS

FIG. 17(a) and FIG. 17(b) are explanatory drawings showing, as an example, another display by an image display device in accordance with the present invention.

FIG. 31(a) and FIG. 31(b) are explanatory drawings showing, as an example, operation of a timing circuit which is a part of an image display device in accordance with the present invention.

FIG. 43(a) and FIG. 43(b) are explanatory drawings showing, as an example, an image display device in accordance with the present invention.

FIG. 44(a) and FIG. 44(b) are explanatory drawings showing, as an example, another image display device in accordance with the present invention.

FIG. 61(a) and FIG. 61(b) are is an explanatory drawings showing, as an example, another configuration of an image display device in accordance with the present invention.

FIG. 81(a) and FIG. 81(b) are explanatory drawings showing, as an example, another configuration of an electronic apparatus in accordance with the present invention.

FIG. 120 is a block diagram showing, as an example, a configuration of a binary data signal line drive circuit BINSD.

FIG. 121 is a block diagram showing, as an example, a configuration of a shift register section.

FIG. 122 is a block diagram showing, as an example, a configuration of an SOR section.

FIG. 123 is a block diagram showing, as an example, a configuration of an SEL-LOG section.

FIG. 124 is a timing chart showing a waveform of input and output signals of an SEL-LOG section.

FIG. 125 is a block diagram showing, as an example, a configuration of a selector section.

FIG. 126 is a block diagram showing, as an example, a configuration of a selector section in detail.

FIG. 127 is a block diagram showing, as an example, a configuration of a internal selector.

FIG. 128 is a timing chart showing a precharge operation when the binary data signal is meaningless.

FIG. 129 is a timing chart showing a precharge operation when the binary data signal is meaningful.

FIG. 130 is a block diagram when a precharge potential is provided separately from a liquid crystal drive white potential.

FIG. 131 is a block diagram showing, as an example, a configuration of the internal selector shown, as an example, in FIG. 130.

Figure 132:
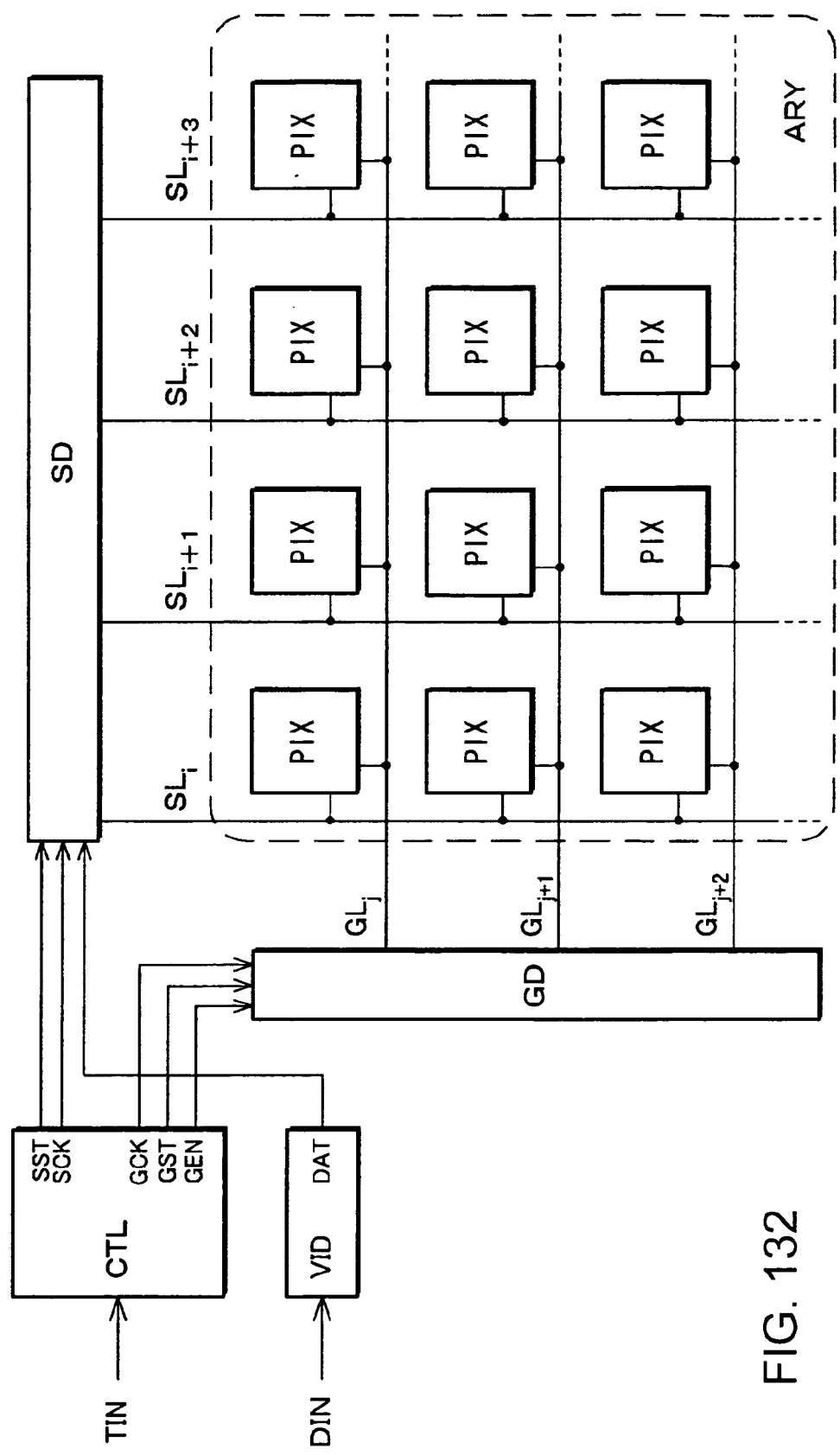

FIG. 132 is a block diagram showing, as an example, a configuration of a conventional image display device.

Figure 133:
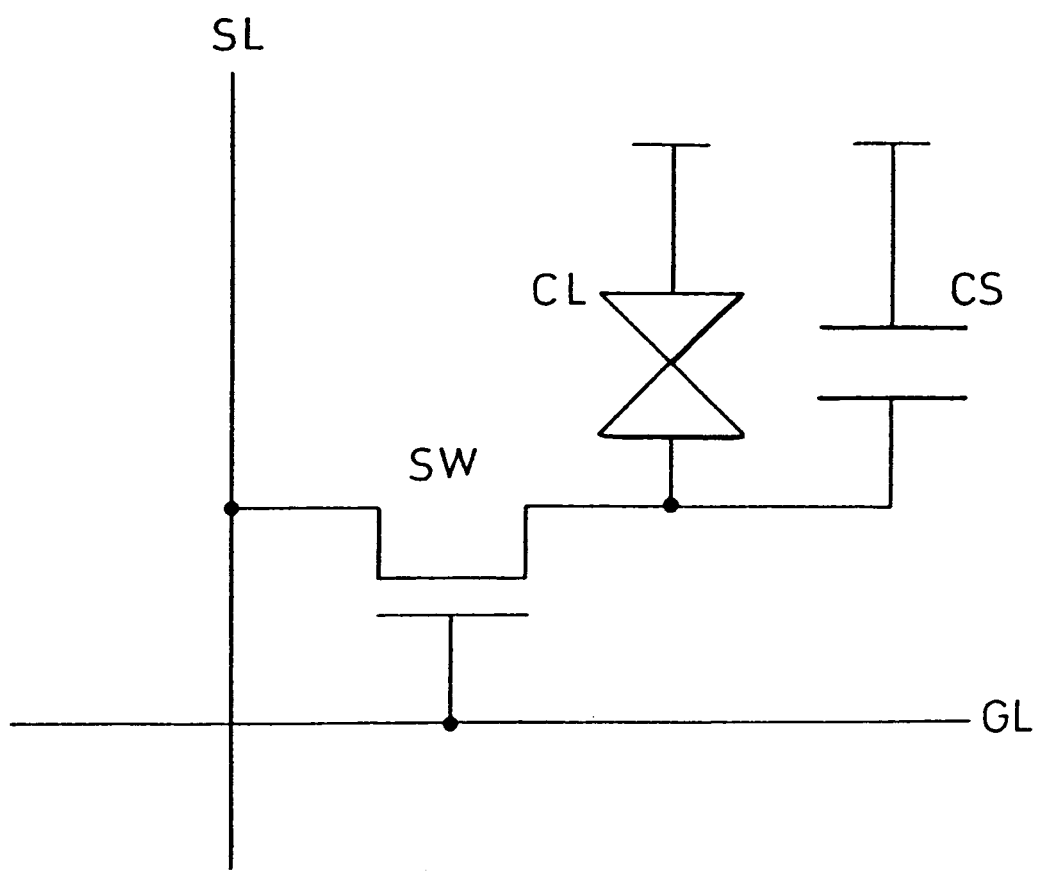

FIG. 133 is an explanatory drawing showing, as an example, an internal structure of a pixel in an image display device of FIG. 132.

Figure 134:
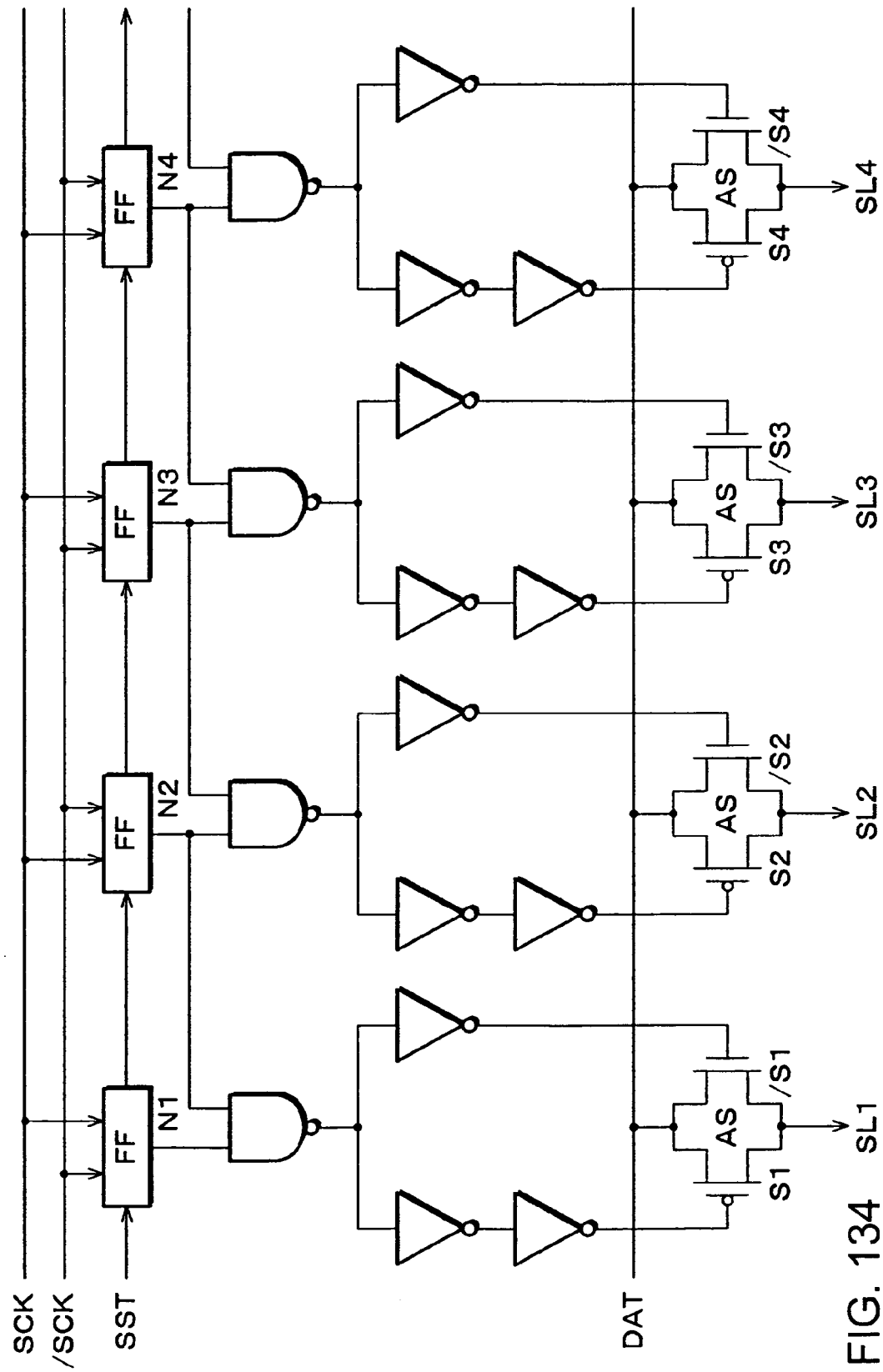

FIG. 134 is a circuit diagram showing, as an example, a data signal line drive circuit constituting a conventional image display device.

Figure 135:
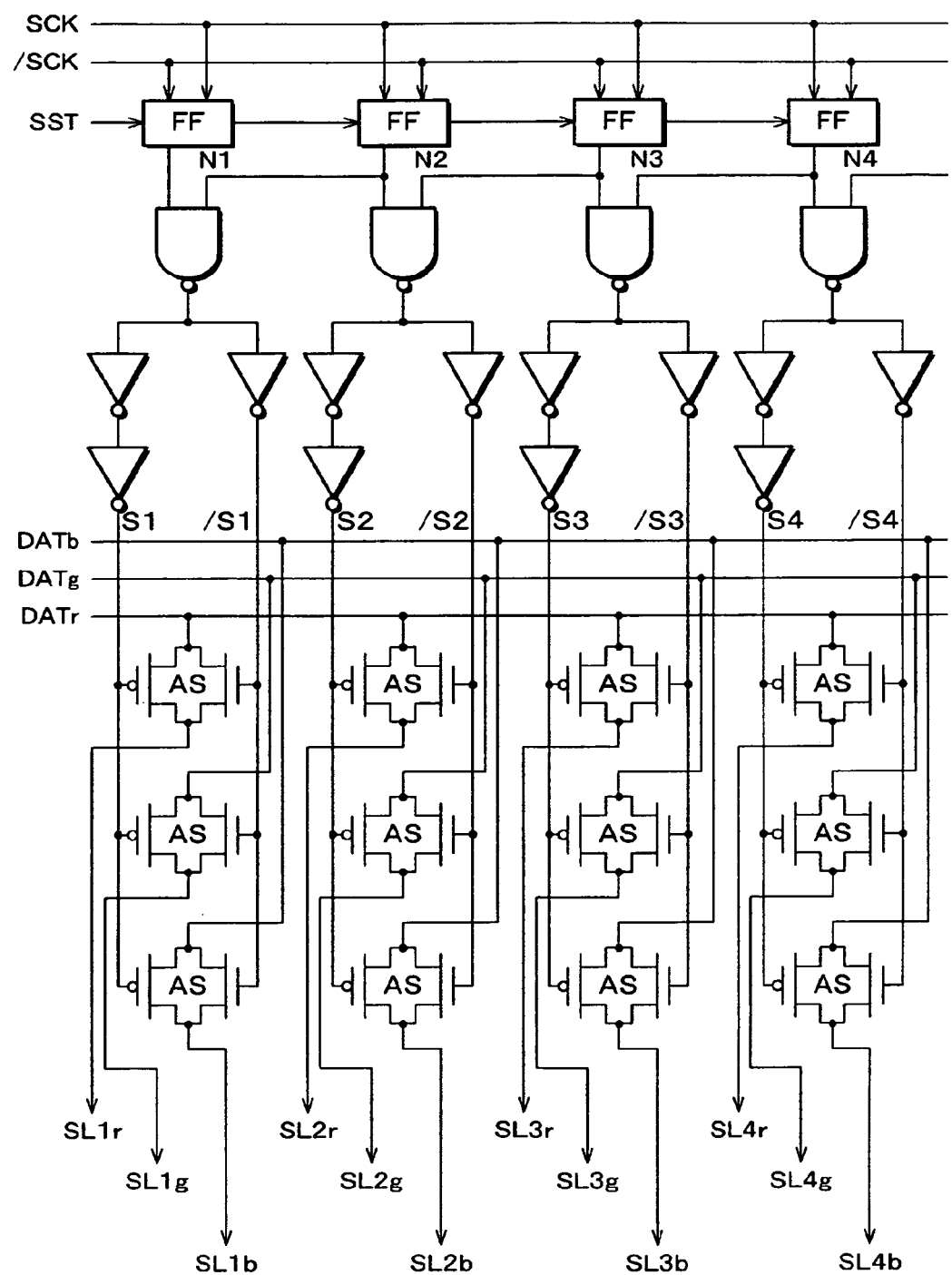

FIG. 135 is an explanatory drawing showing, as an example, another configuration of a data signal line drive circuit constituting a conventional image display device.

Figure 136:
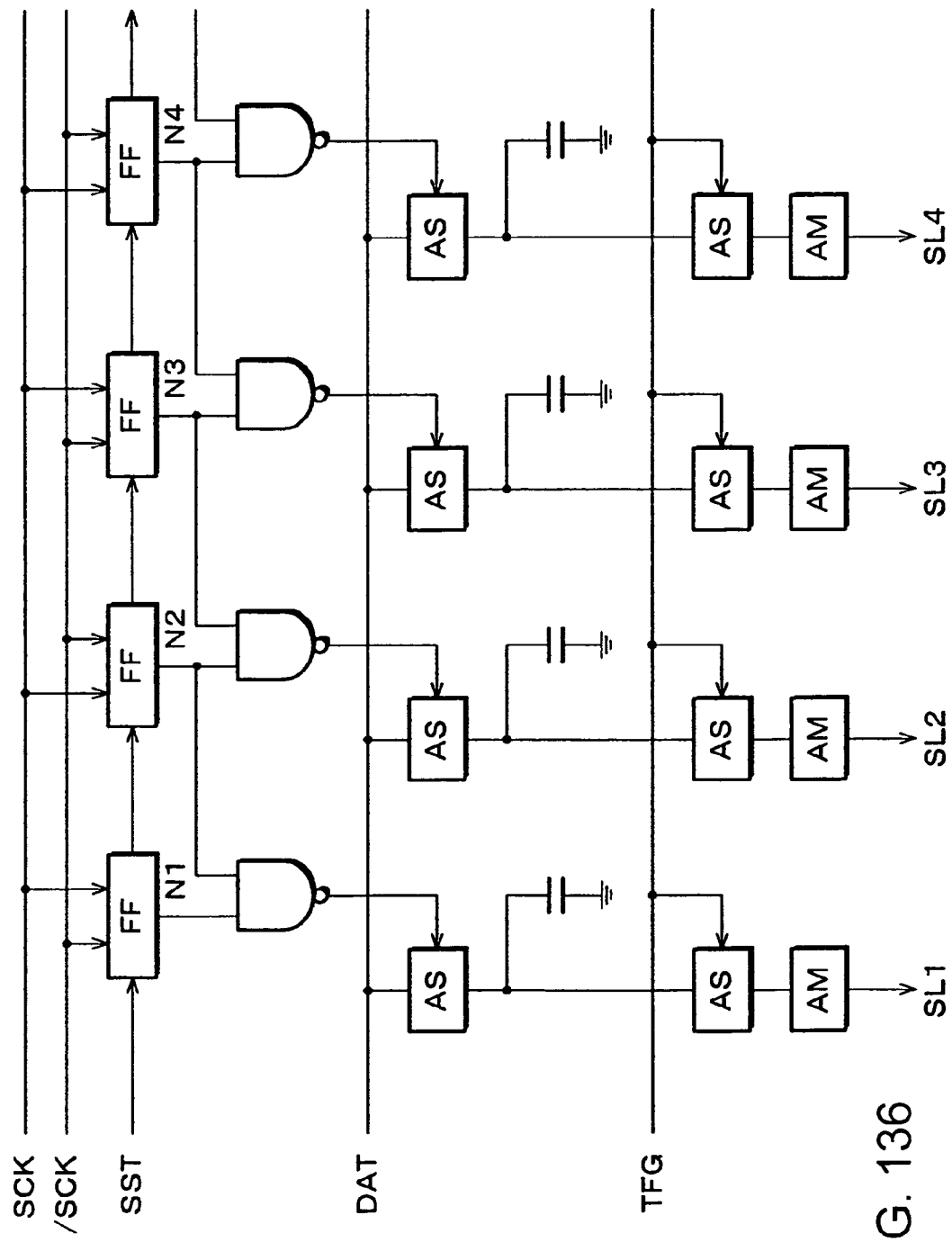

FIG. 136 is an explanatory drawing showing, as an example, a configuration of a data signal line drive circuit constituting an image display device.

Figure 137:
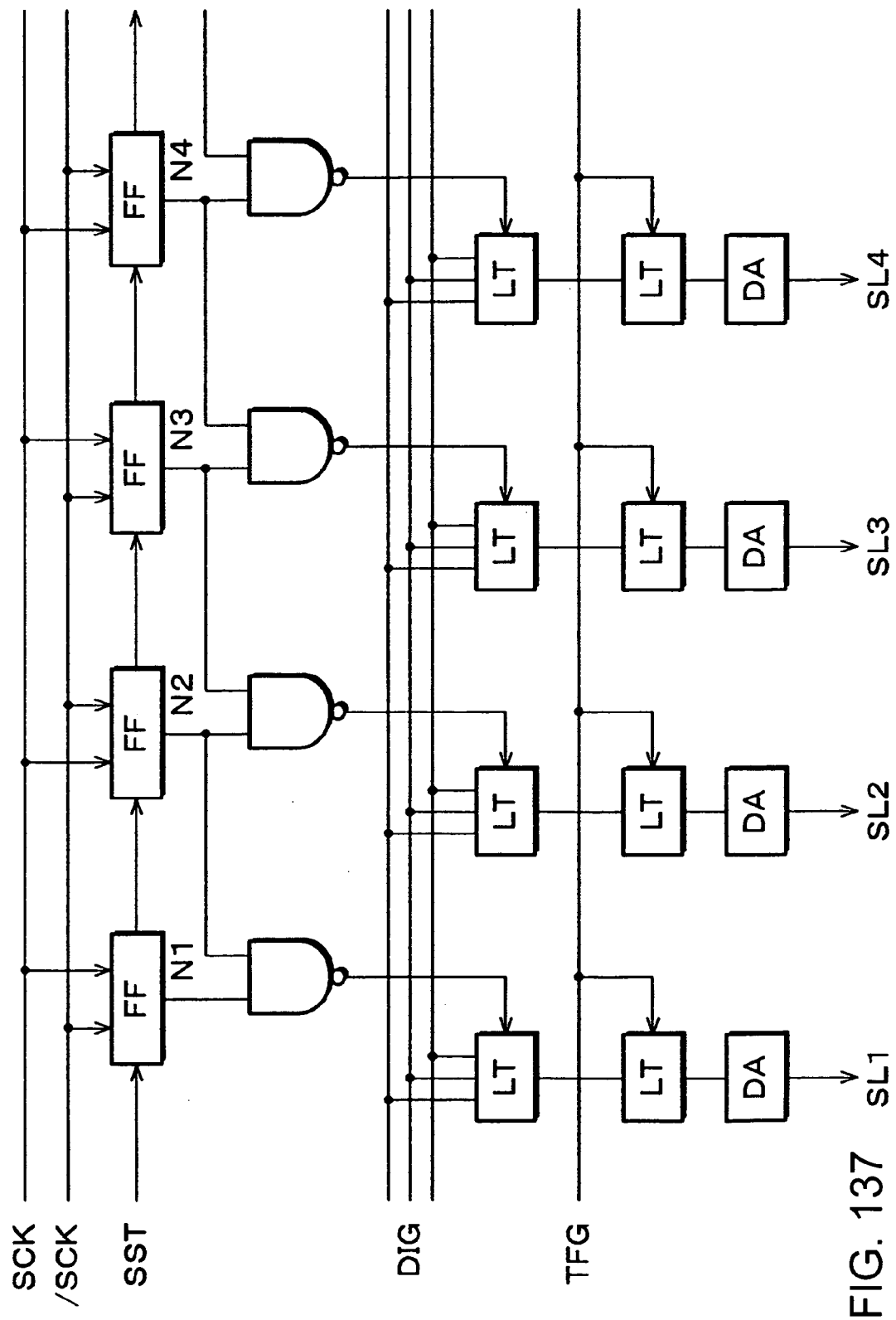

FIG. 137 is an explanatory drawing showing, as an example, a configuration of a data signal line drive circuit constituting an image display device.

Figure 138:
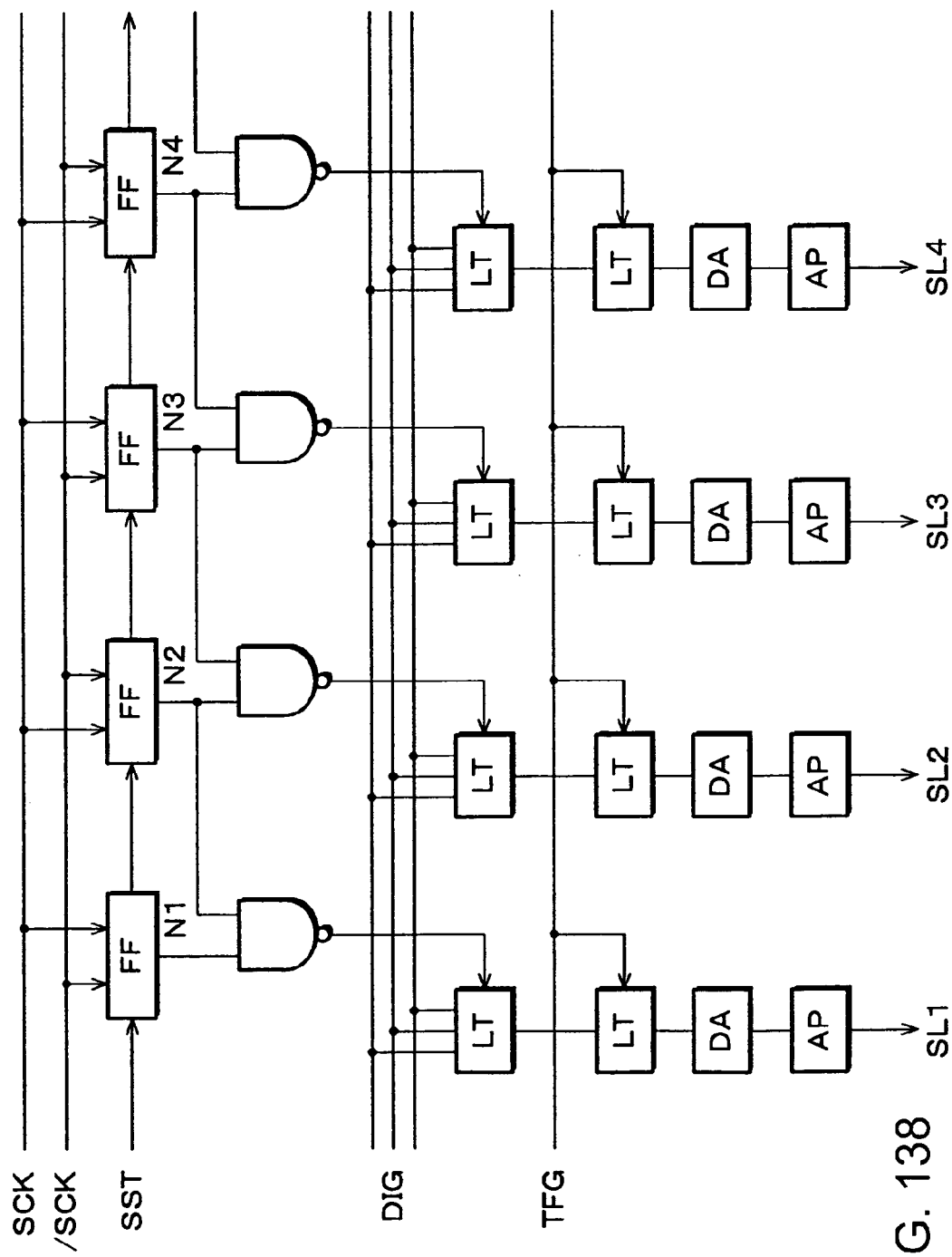

FIG. 138 is an explanatory drawing showing, as an example, a configuration of a data signal line drive circuit constituting an image display device.

Figure 139:
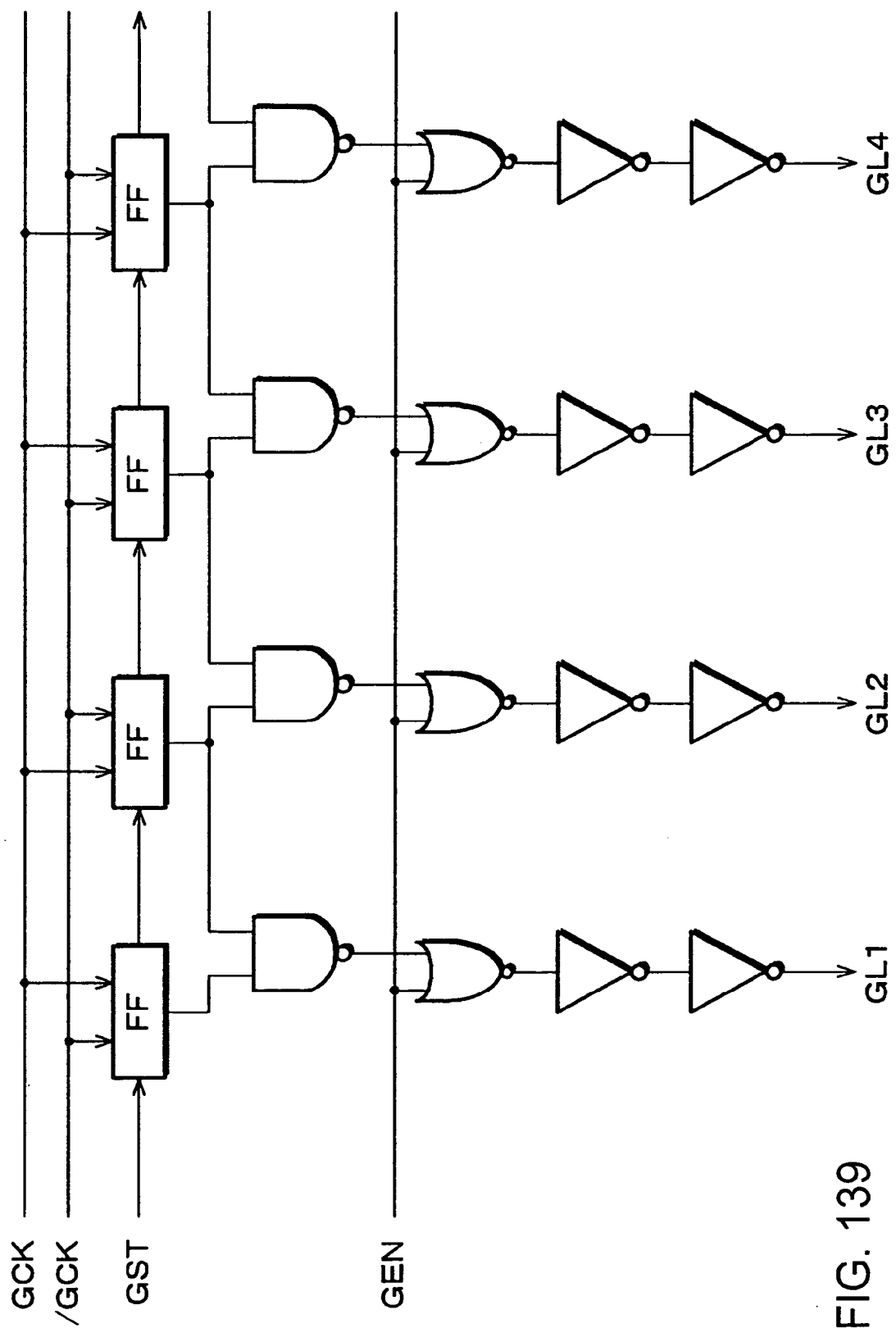

FIG. 139 is a circuit diagram showing, as an example, a scan signal line drive circuit constituting a conventional image display device.

Figure 140:
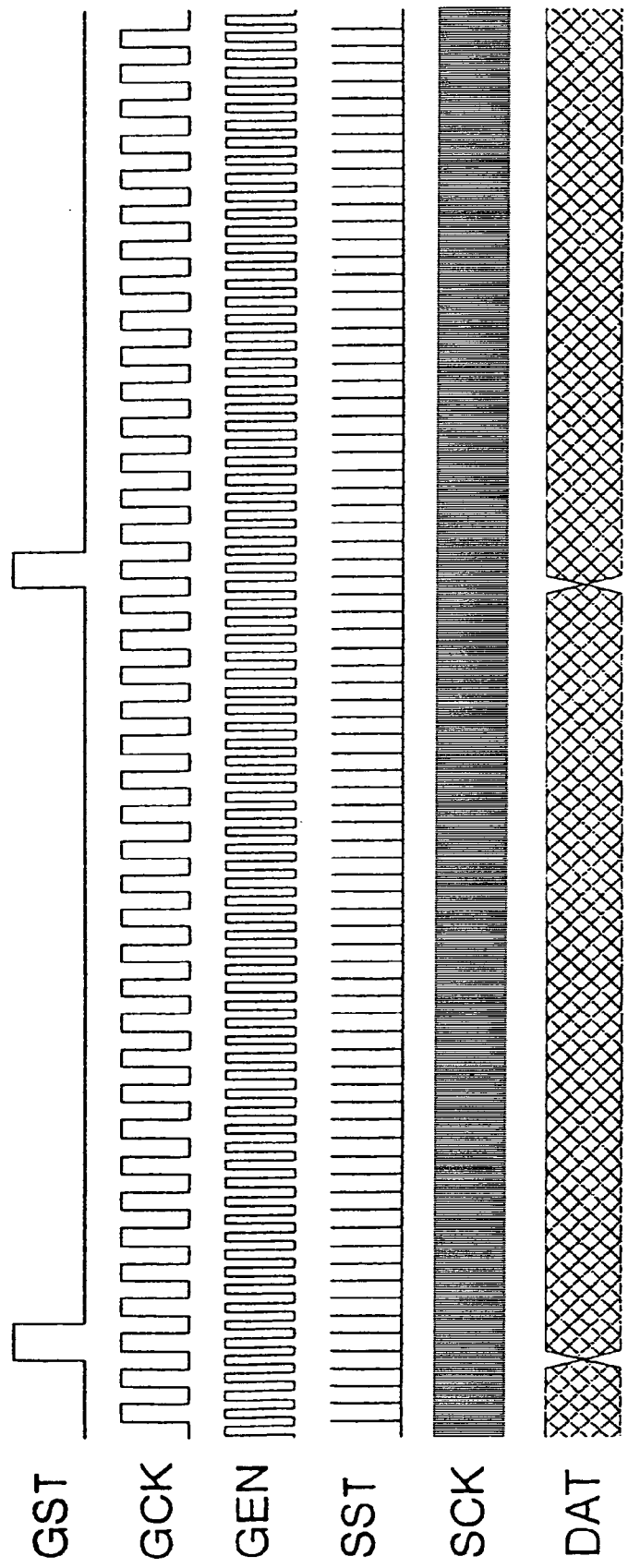

FIG. 140 is an explanatory drawing showing, as an example, a timing chart of a conventional image display device.

Figure 141:
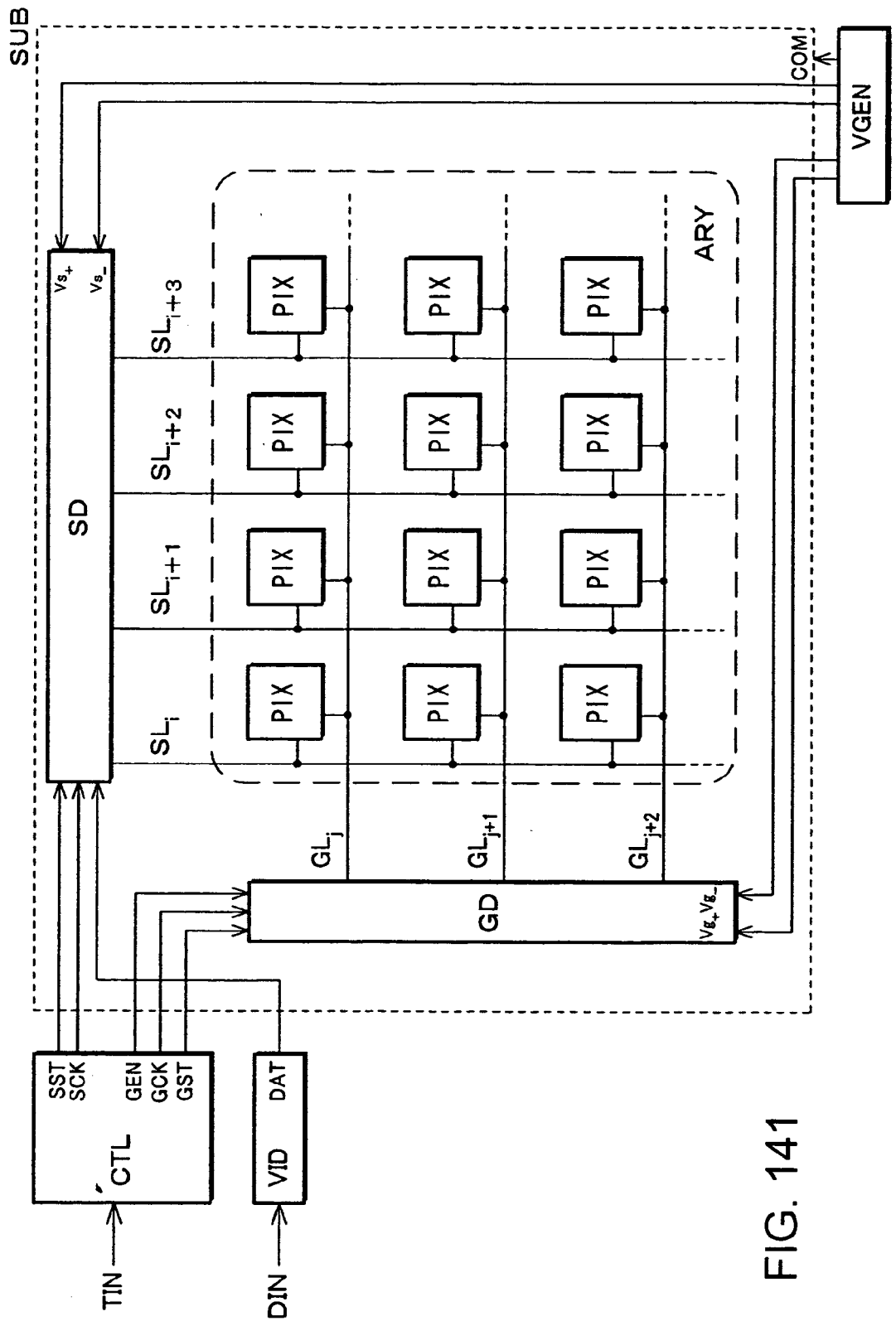

FIG. 141 is a block diagram showing, as an example, another configuration of a conventional image display device.

DETAILED DESCRIPTION OF THE PREFERRED EMBODIMENTS

Embodiment 1

Figure 1:
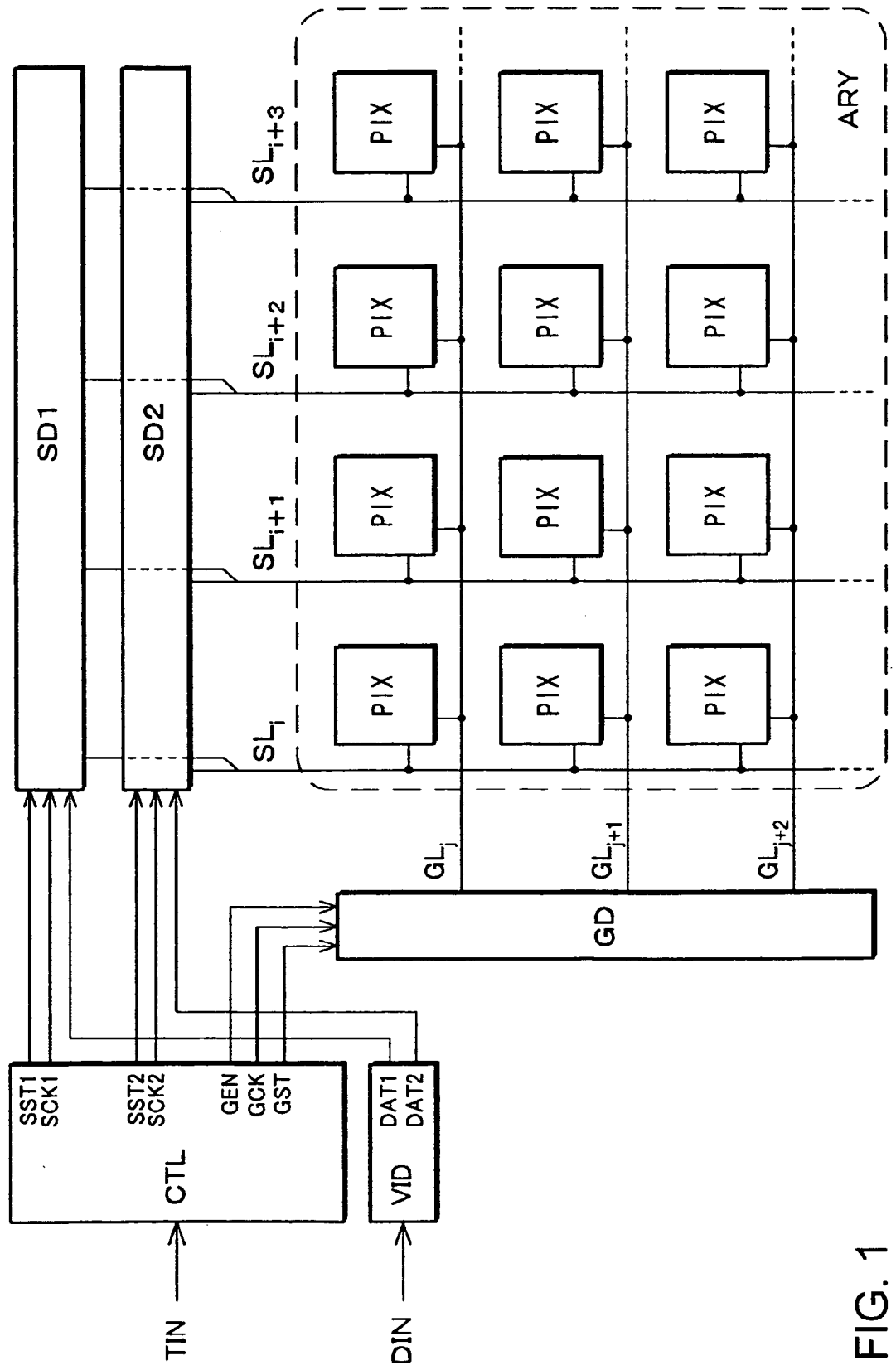
FIG. 1 is a block diagram showing, as an example, a configuration of an image display device in accordance with the present invention.
Figure 92:
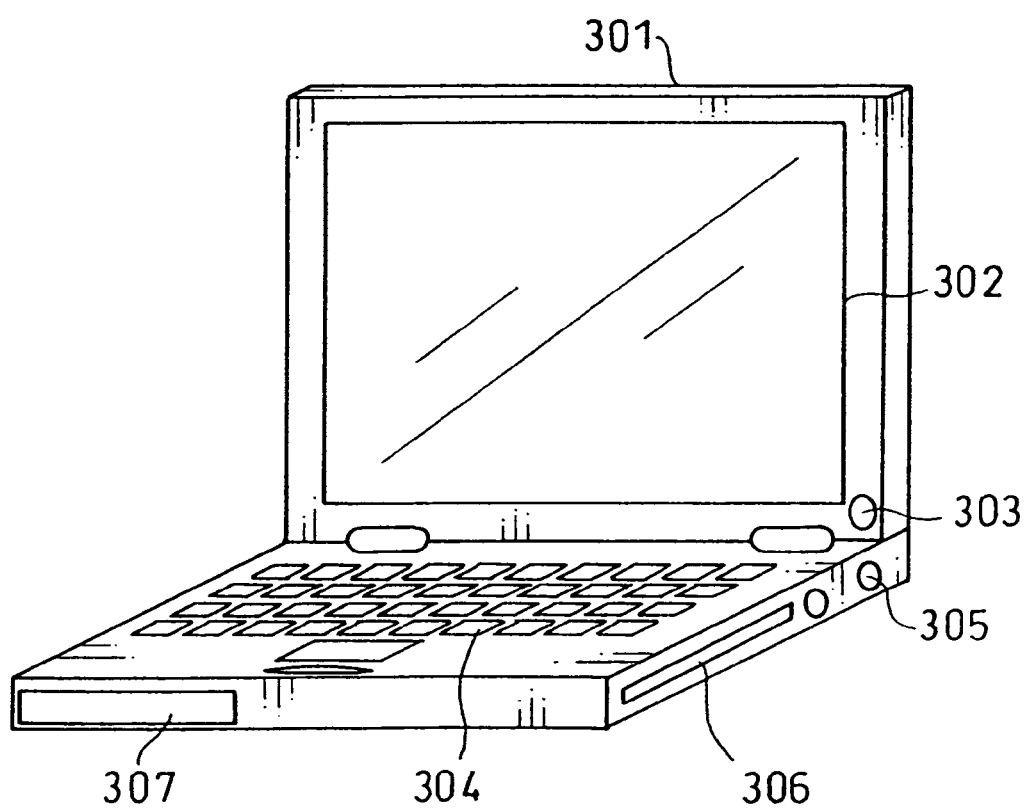
FIG. 92 is an explanatory drawing showing, as an example, another configuration of an electronic apparatus in accordance with the present invention.

Referring to FIG. 1 to FIG. 92, the following will describe an embodiment in accordance with the present invention.

An image display device of the present embodiment includes a plurality of drive circuits which is switchable to the most suitable display mode and format depending on the kind of video data and environmental conditions to achieve both high display quality and low power consumption and which operate simultaneously to produce a superimposed display of a plurality of sets of image data.

In the present embodiment, an active matrix liquid crystal display device will be described as an example of image display devices related to the technologies of interest in the present invention. However, the present invention is not limited to the example and is equally applicable to image display devices of other types.

FIG. 1 to FIG. 7 are block diagrams showing, as an example, a configuration of an image display device in accordance with the present invention.

In FIG. 1, the image display device is composed of a pixel array ARY, a data signal line drive circuits (source drivers) SD1 and SD2 for driving data signal lines, a scan signal line drive circuit (gate driver) GD for driving scan signal lines, a timing circuit CTL for supplying a timing signal, and a video signal processing circuit VID for supplying a video signal. The data signal line drive circuits SD1 and SD2 are positioned on the same side of the pixel array ARY. Throughout the description below, the data signal lines will be collectively designated SL, whereas individual ones will be designated SL1, SL2, . . . . Similarly, the scan signal lines will be collectively designated GL, whereas individual ones will be designated GL1, GL2, . . . SCK1, SCK2, and GCK represent clock signals; SST1, SST2, and GST represent start signals; GEN represents an enable signal; and DAT1 and DAT2 represent video signals.

Figure 2:
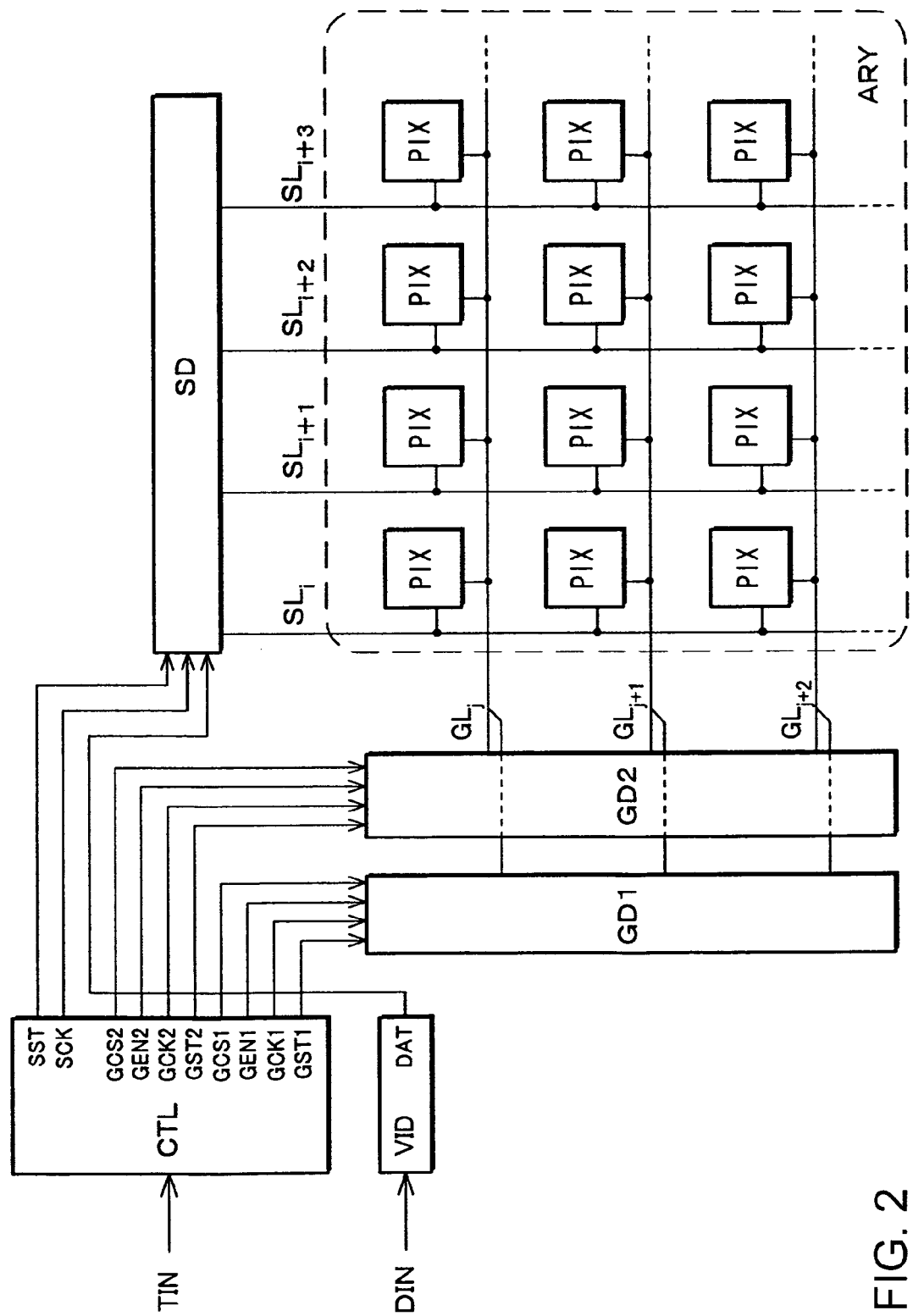
FIG. 2 is a block diagram showing, as an example, another configuration of an image display device in accordance with the present invention.

In FIG. 2, the image display device is composed of a pixel array ARY, a data signal line drive circuit SD, scan signal line drive circuits GD1 and GD2, a timing circuit CTL for supplying a timing signal, and a video signal processing circuit VID for supplying a video signal. The scan signal line drive circuits GD1 and GD2 are positioned on the same side of the pixel array ARY. SCK, GCK1, and GCK2 represent clock signals; SST, GST1, and GST2 represent start signals; GEN1 and GEN2 represent enable signals; DAT represents a video signal; GCS1 and GCS2 are selection signals (signals to control which scan signal line drive circuit(s) is (are) to operate).

Figure 3:
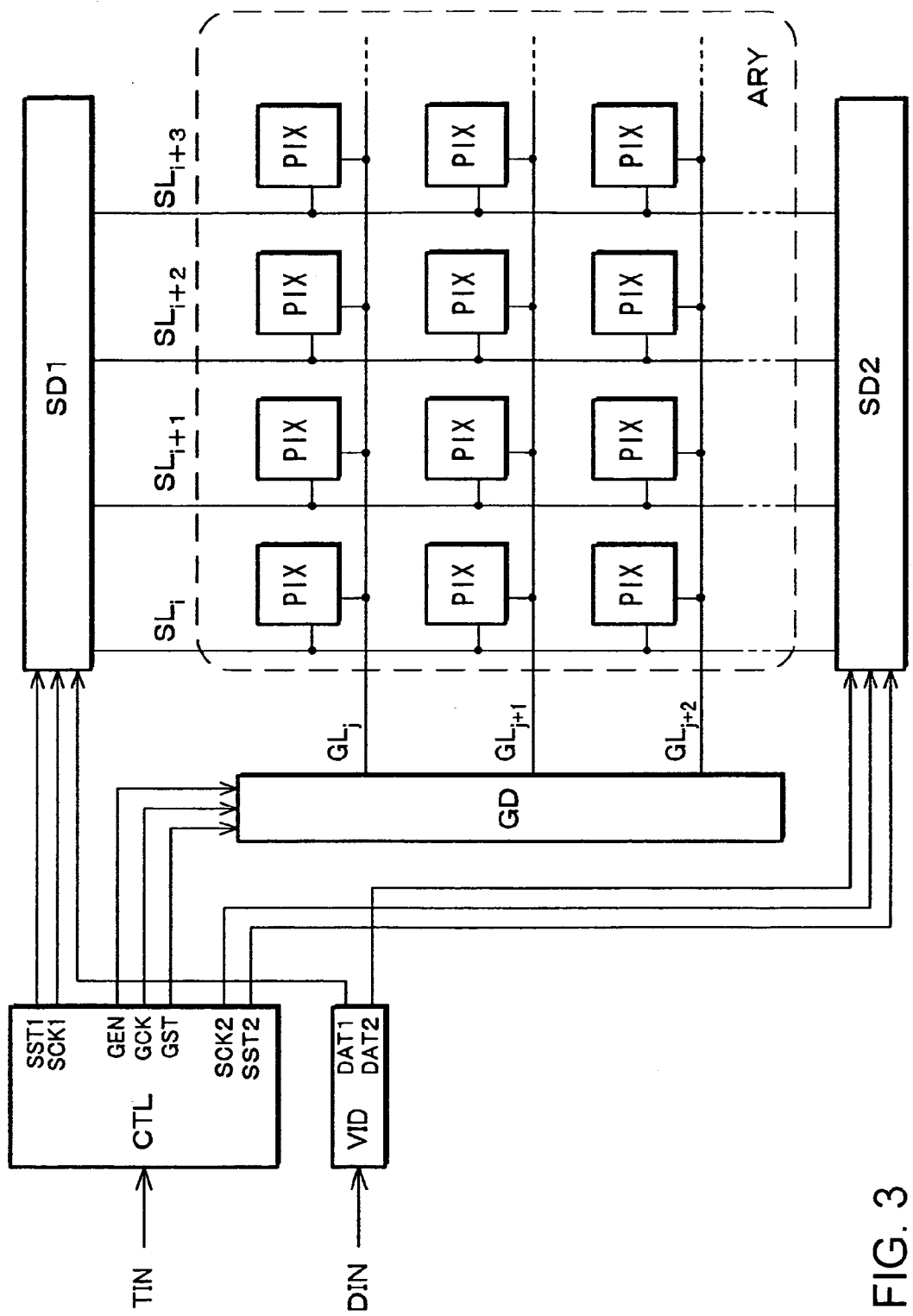
FIG. 3 is a block diagram showing, as an example, another configuration of an image display device in accordance with the present invention.

In FIG. 3, the image display device is composed of a pixel array ARY, data signal line drive circuits SD1 and SD2, a scan signal line drive circuit GD, a timing circuit CTL for supplying a timing signal, and a video signal processing circuit VID for supplying a video signal. The data signal line drive circuits SD1 and SD2 are positioned on the opposite sides of the pixel array ARY.

Figure 4:
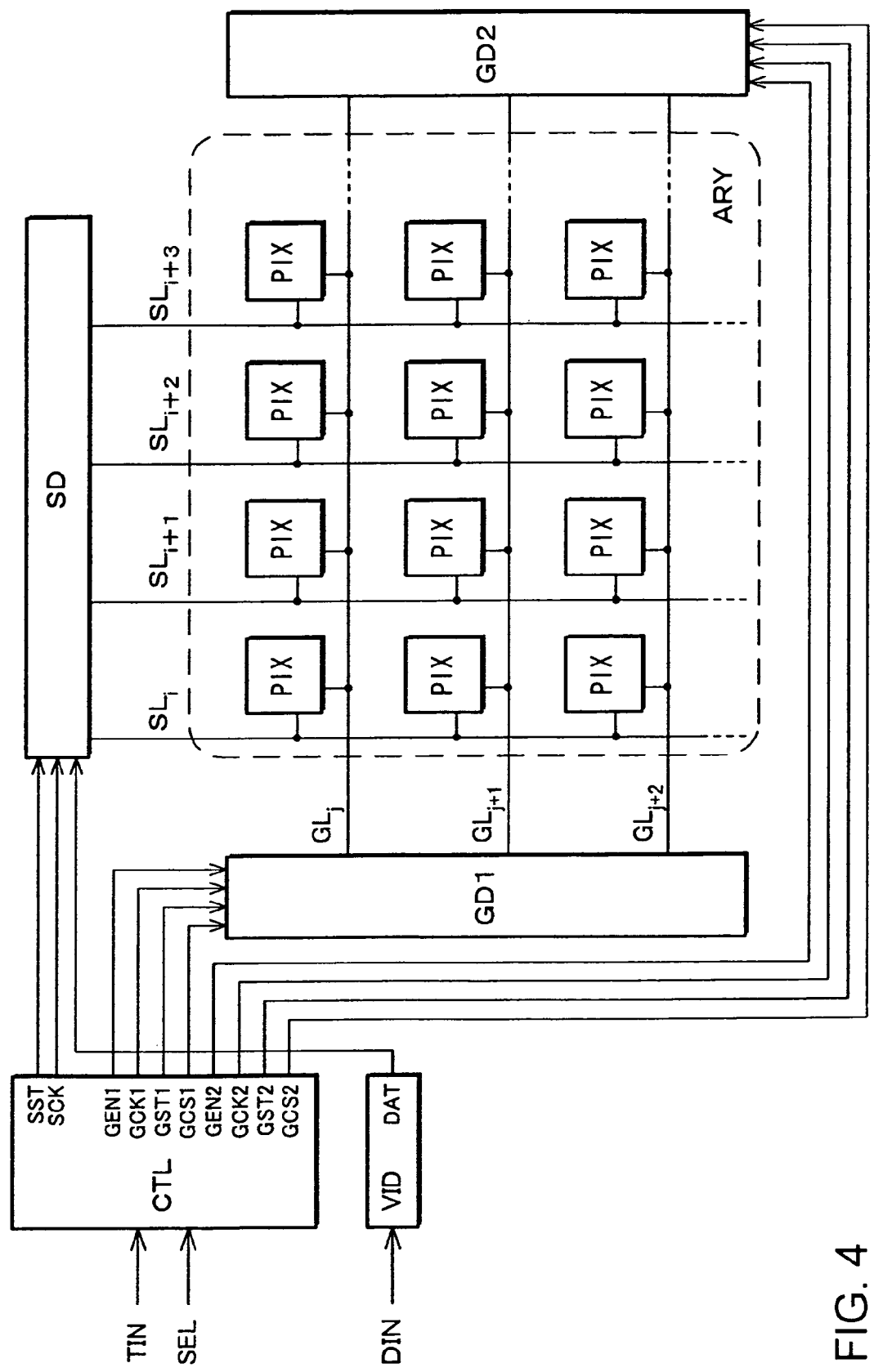
FIG. 4 is a block diagram showing, as an example, another configuration of an image display device in accordance with the present invention.

In FIG. 4, the image display device is composed of a pixel array ARY, a data signal line drive circuit SD, scan signal line drive circuits GD1 and GD2, a timing circuit CTL for supplying a timing signal, and a video signal processing circuit VID for supplying a video signal. The scan signal line drive circuits GD1 and GD2 are positioned on the opposite sides of the pixel array ARY.

Figure 5:
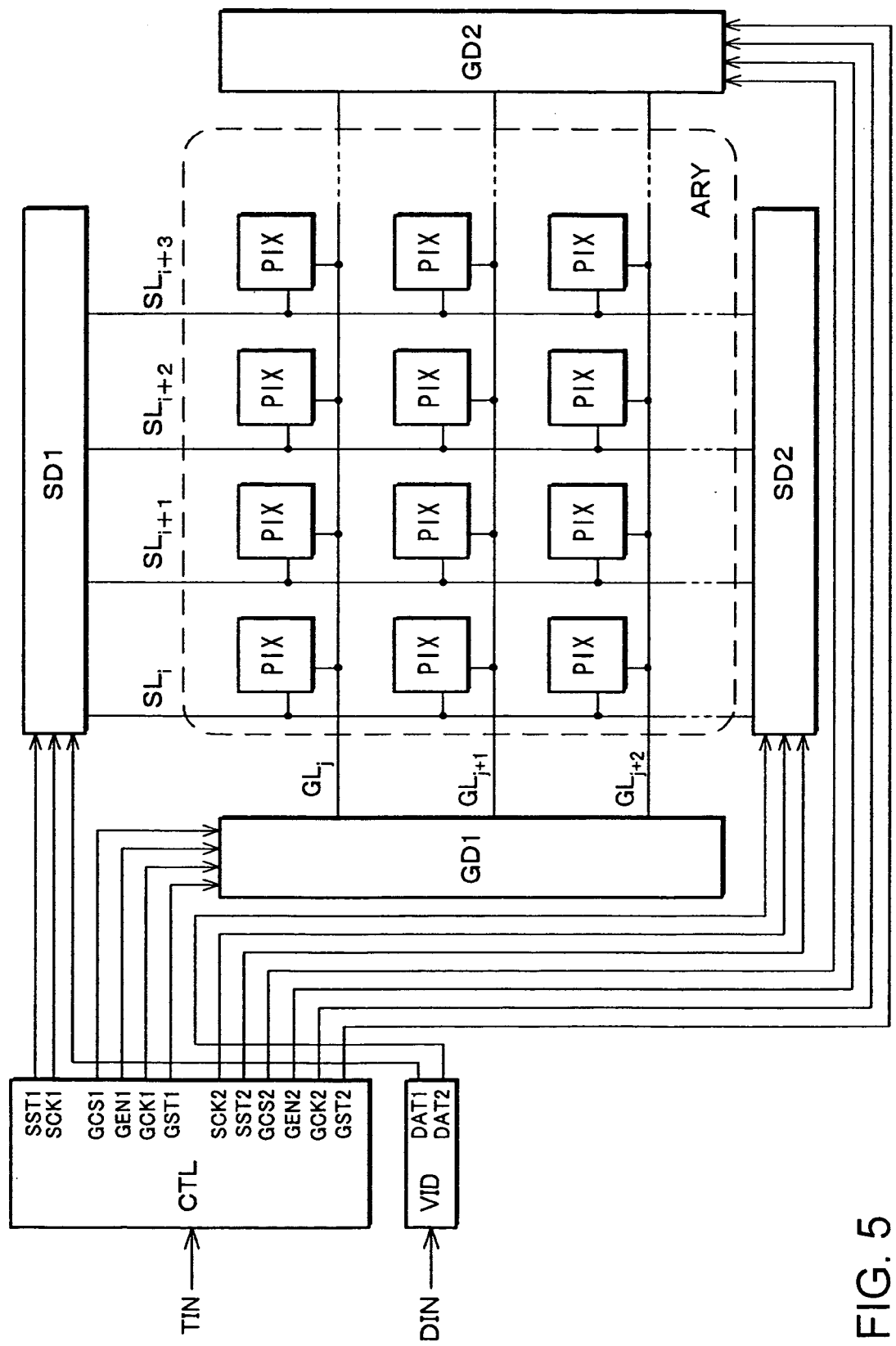
FIG. 5 is a block diagram showing, as an example, another configuration of an image display device in accordance with the present invention.

In FIG. 5, the image display device is composed of a pixel array ARY, data signal line drive circuits SD1 and SD2, scan signal line drive circuits GD1 and GD2, a timing circuit CTL for supplying a timing signal, and a video signal processing circuit VID for supplying a video signal. The data signal line drive circuits SD1 and SD2, as well as the scan signal line drive circuits GD1 and GD2, are positioned on the opposite sides of the pixel array ARY.

Figure 6:
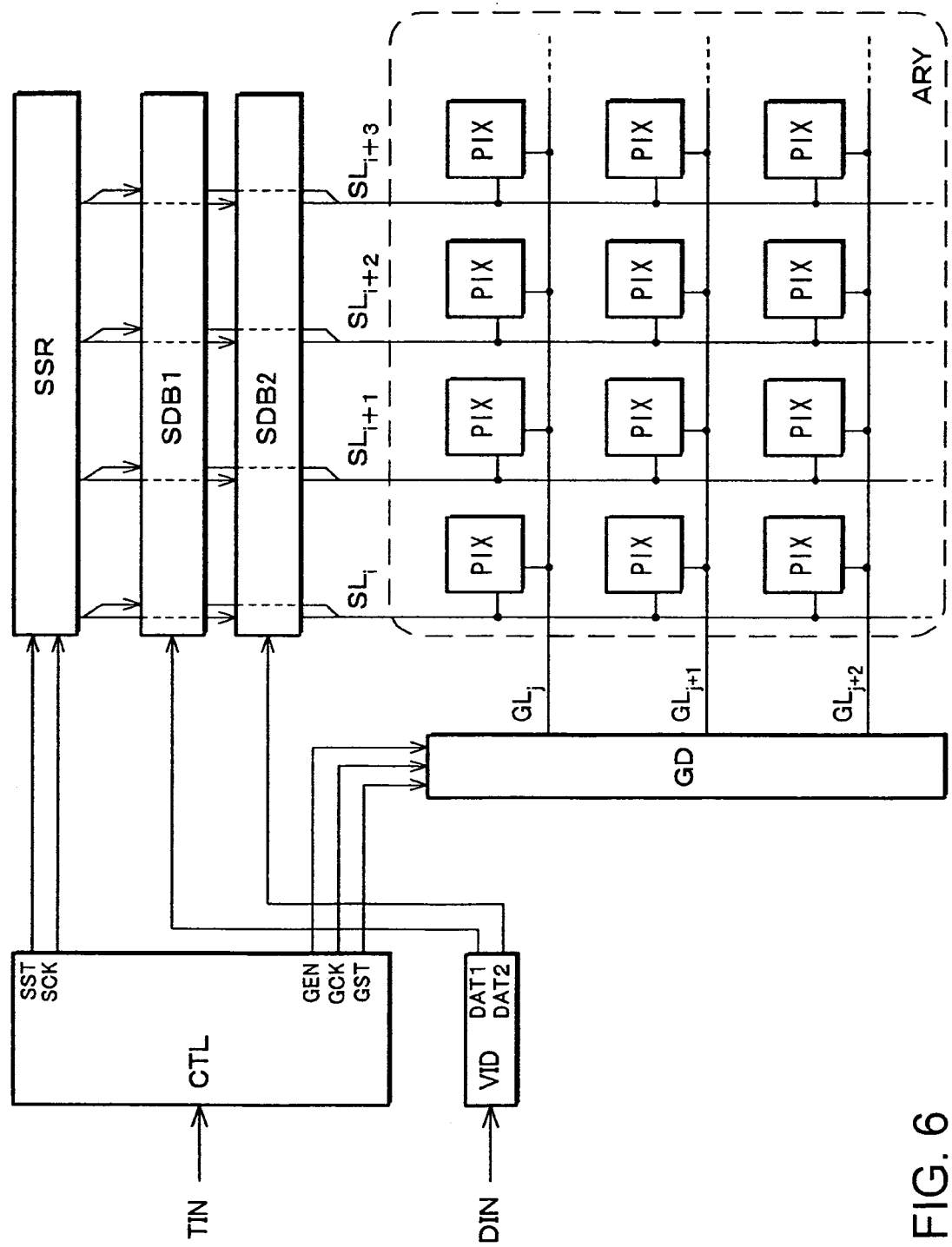
FIG. 6 is a block diagram showing, as an example, another configuration of an image display device in accordance with the present invention.

In FIG. 6, the image display device is composed of a pixel array ARY, a data signal line drive circuit, a scan signal line drive circuit GD, a timing circuit CTL for supplying a timing signal, and a video signal processing circuit VID for supplying a video signal. The data signal line drive circuit is made up of two circuit parts: a common shift register circuit part SSR and mutually independent circuit parts SDB1 and SDB2. SSR and SDB1 together act as a data signal line drive circuit, whereas SSR and SDB2 together act as another data signal line drive circuit.

Figure 7:
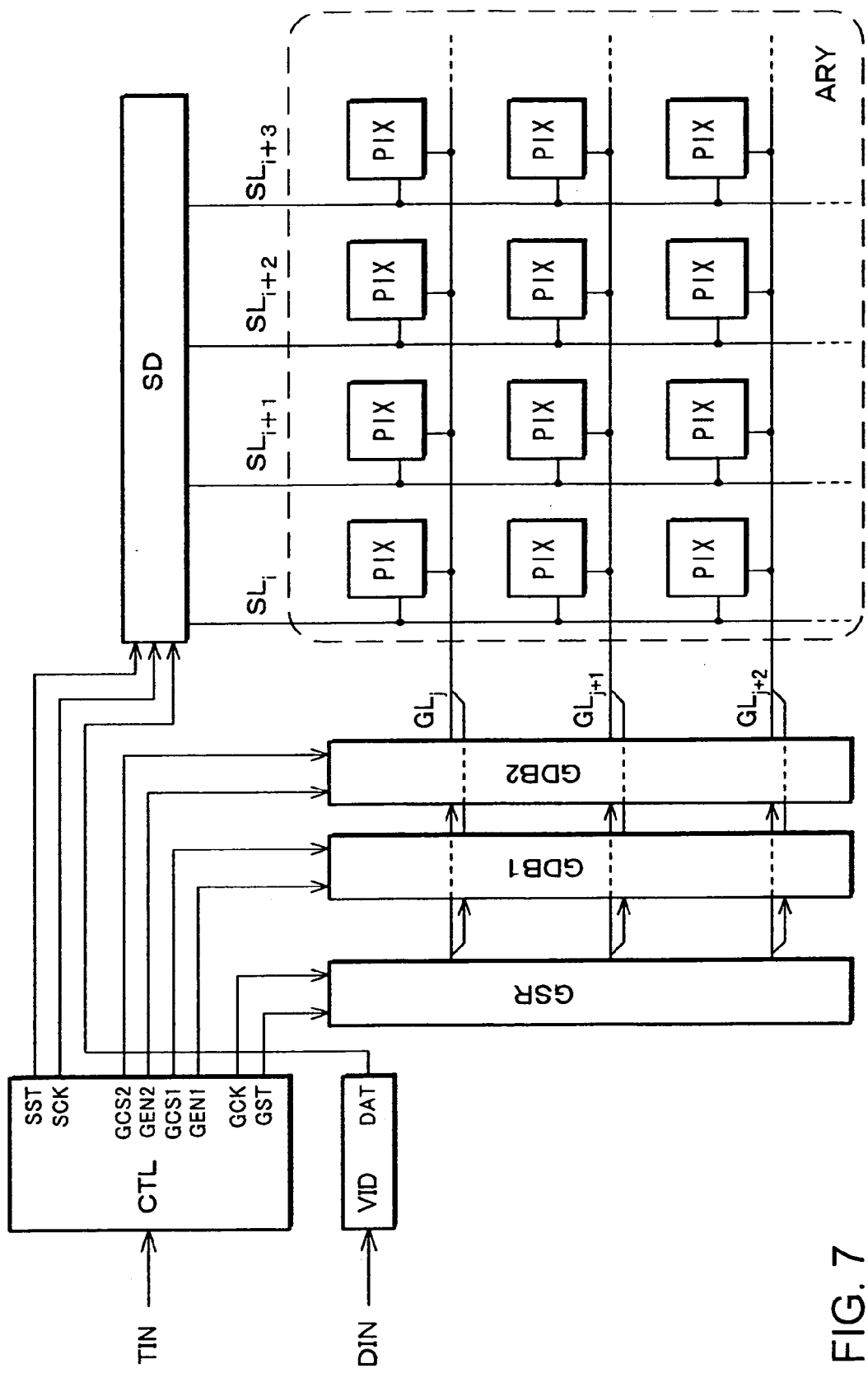
FIG. 7 is a block diagram showing, as an example, another configuration of an image display device in accordance with the present invention.

In FIG. 7, the image display device is composed of a pixel array ARY, a data signal line drive circuit SD, a scan signal line drive circuit, a timing circuit CTL for supplying a timing signal, and a video signal processing circuit VID for supplying a video signal. The scan signal line drive circuit is made up of two circuit parts: a common shift register circuit part GSR and mutually independent circuit parts GDB1 and GDB2. GSR and GDB1 together act as a scan signal line drive circuit, whereas GSR and GDB2 together act as another scan signal line drive circuit.

In the above configuration examples, the data signal line drive circuits SD1 and SD2 or the scan signal line drive circuits GD1 and GD2 are specified to drive the same pixel array, but differ in circuit structure, to produce a video display in more than one format with different resolutions and halftones (number of display colors).

Under these circumstances, those drive circuits that are not involved in producing the display are preferably operating in view of reduction in power consumption and prevention of erroneous operation due to noise.

Figure 8:
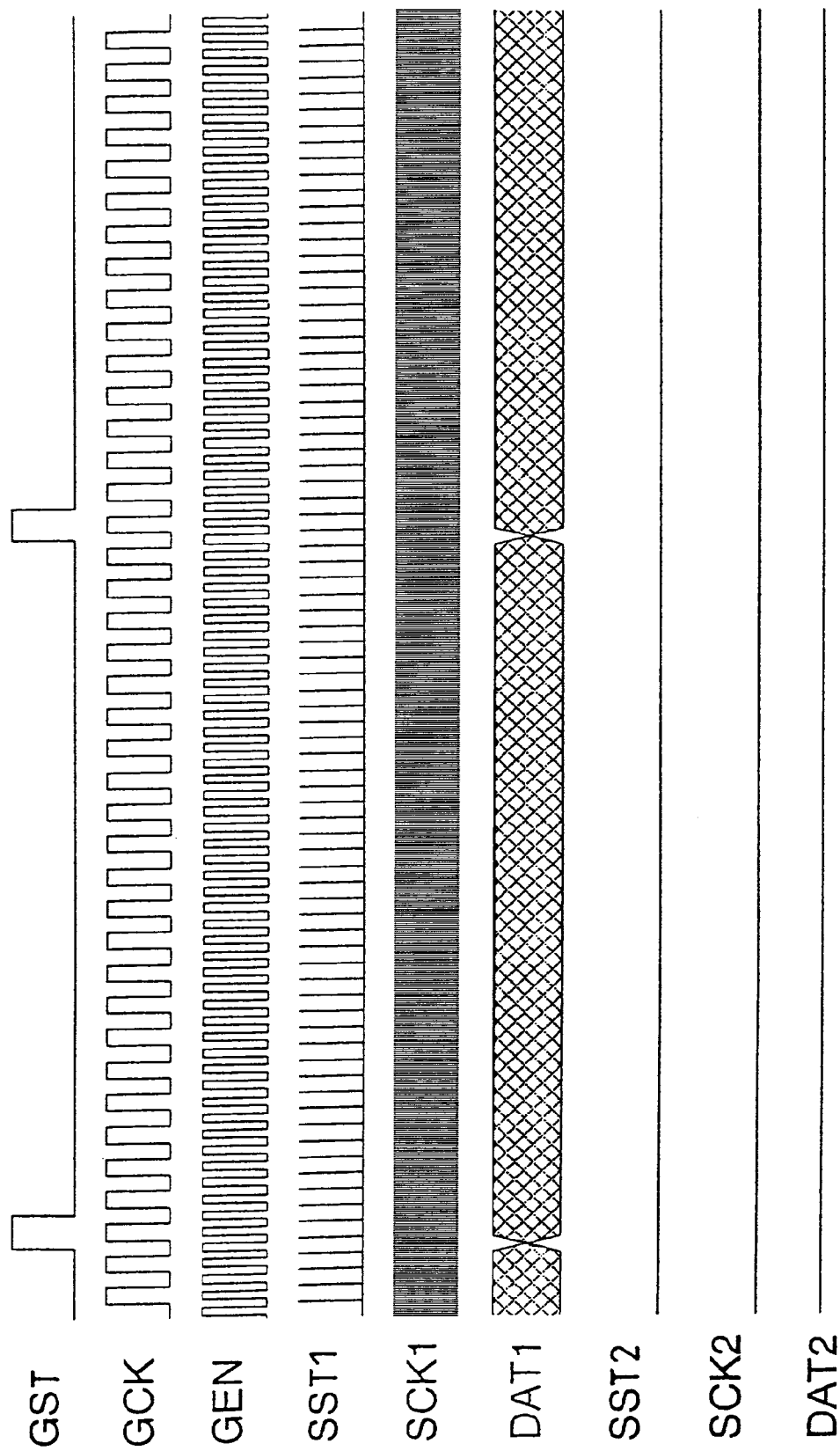
FIG. 8 is an explanatory drawing showing, as an example, a timing chart of an image display device in accordance with the present invention.
Figure 9:
FIG. 9 is an explanatory drawing showing, as an example, another timing chart of an image display device in accordance with the present invention.

FIG. 8 and FIG. 9 show timing charts, as examples, of various signals in such a case.

FIG. 8 is a timing chart corresponding to the configuration of FIG. 1 and shows that only one of the two data signal line drive circuits is operating and is receiving inputs of a control signal and a video signal, whereas the other is not operating.

FIG. 9 is a timing chart corresponding to the configuration of FIG. 2 and shows that only one of the two scan signal line drive circuits is operating and is receiving inputs of an active selection signal GCS1 and control signals (GCK1, GST1, GEN1), whereas the other is not operating.

Figure 10:
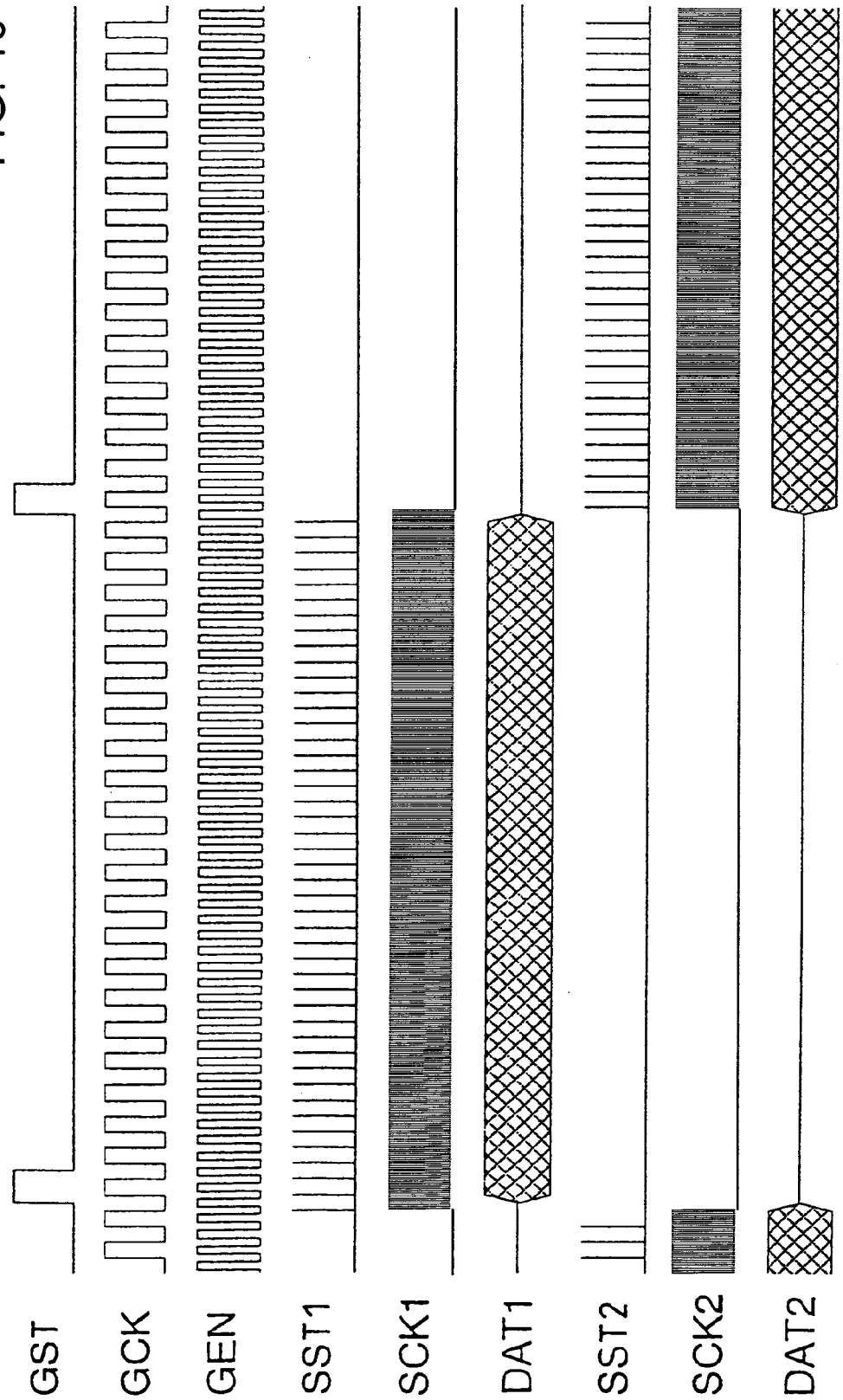
FIG. 10 is an explanatory drawing showing, as an example, another timing chart of an image display device in accordance with the present invention.
Figure 11:
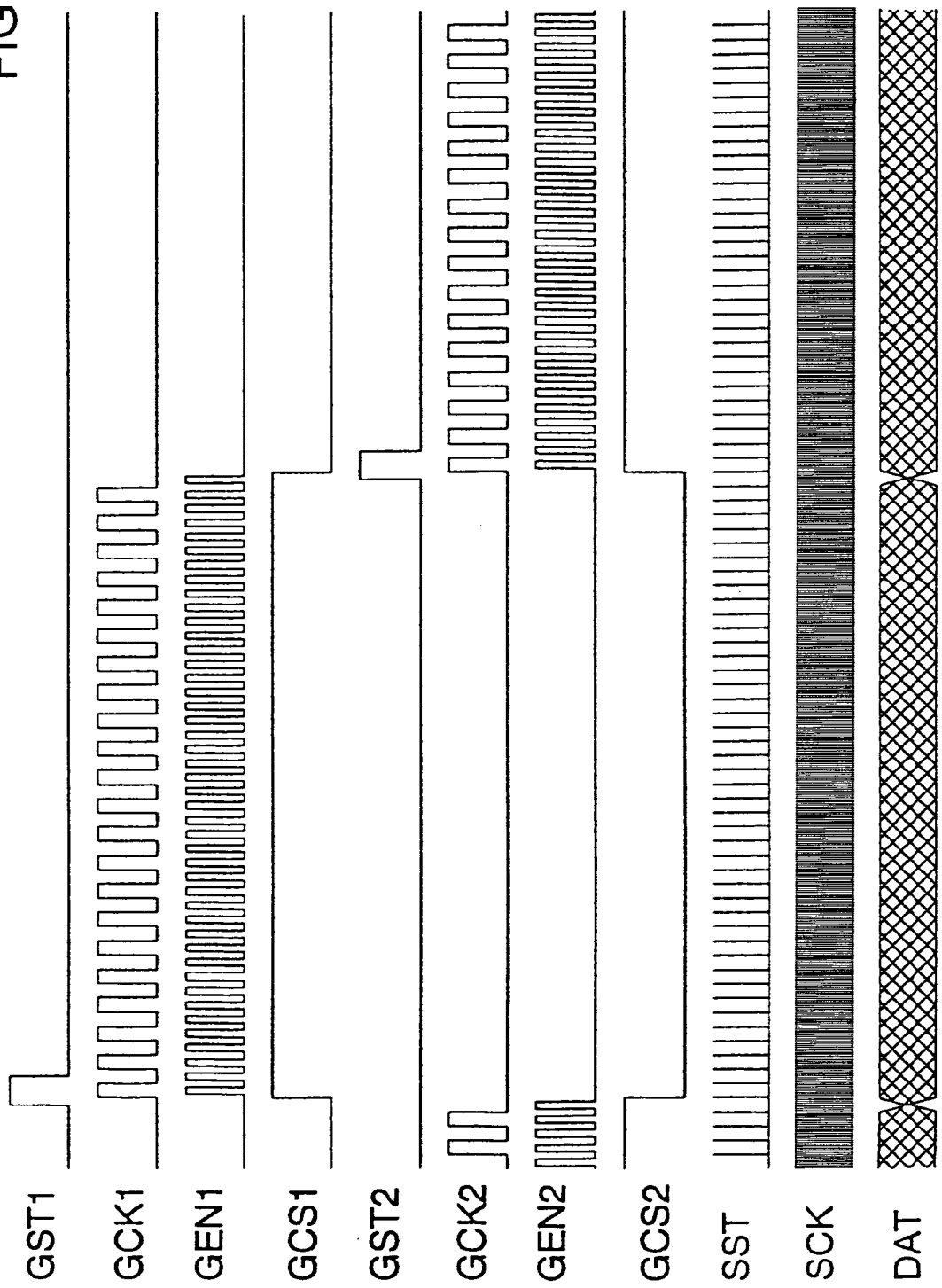
FIG. 11 is an explanatory drawing showing, as an example, another timing chart of an image display device in accordance with the present invention.

FIG. 10 and FIG. 11 show timing charts, as examples, when an operating data signal line drive circuit and scan signal line drive circuit are switched for each frame so that the most suitable display is selectable according to the format of each screen (frame) of the displayed image.

Figure 12:
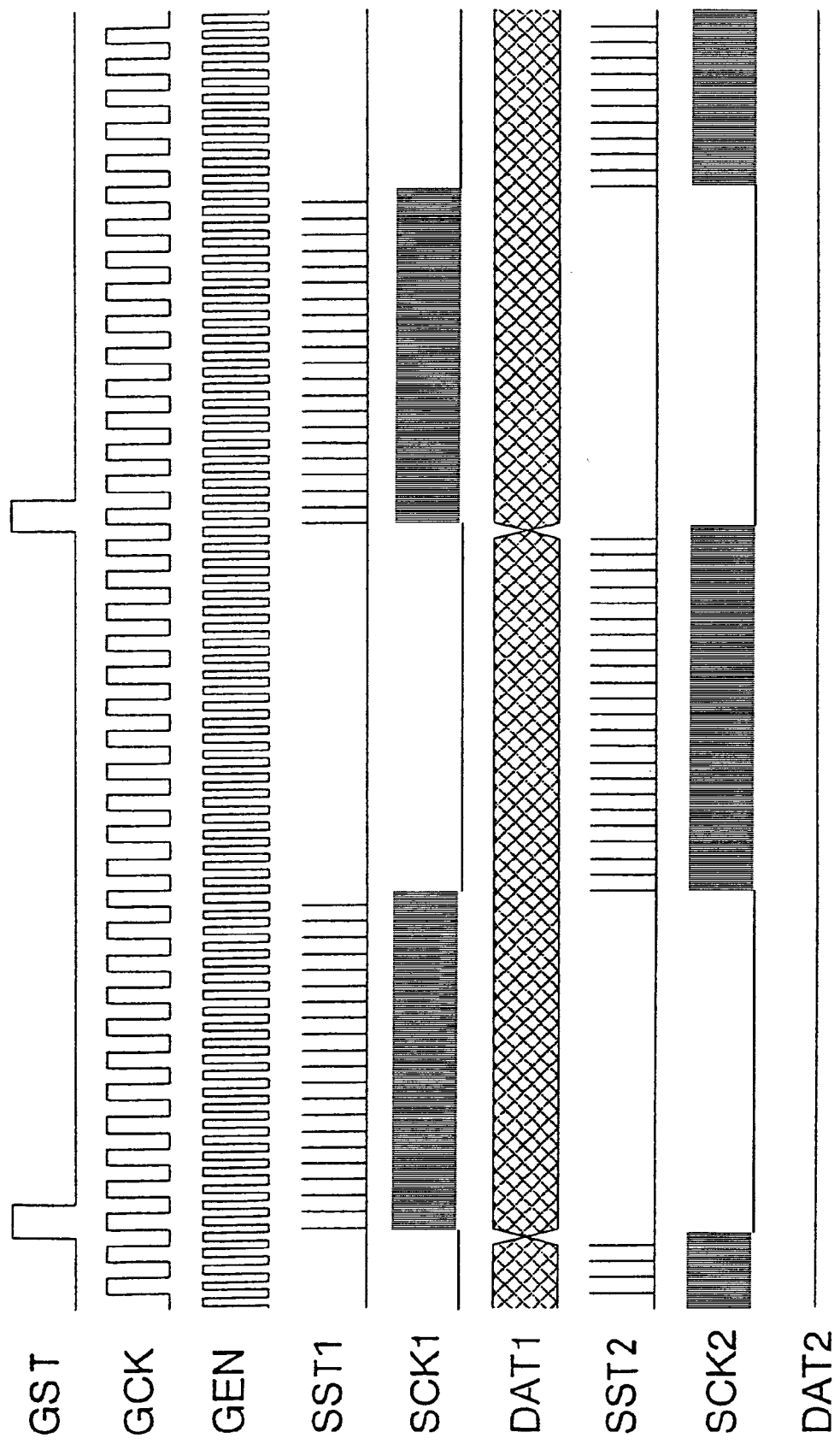
FIG. 12 is an explanatory drawing showing, as an example, another timing chart of an image display device in accordance with the present invention.
Figure 13:
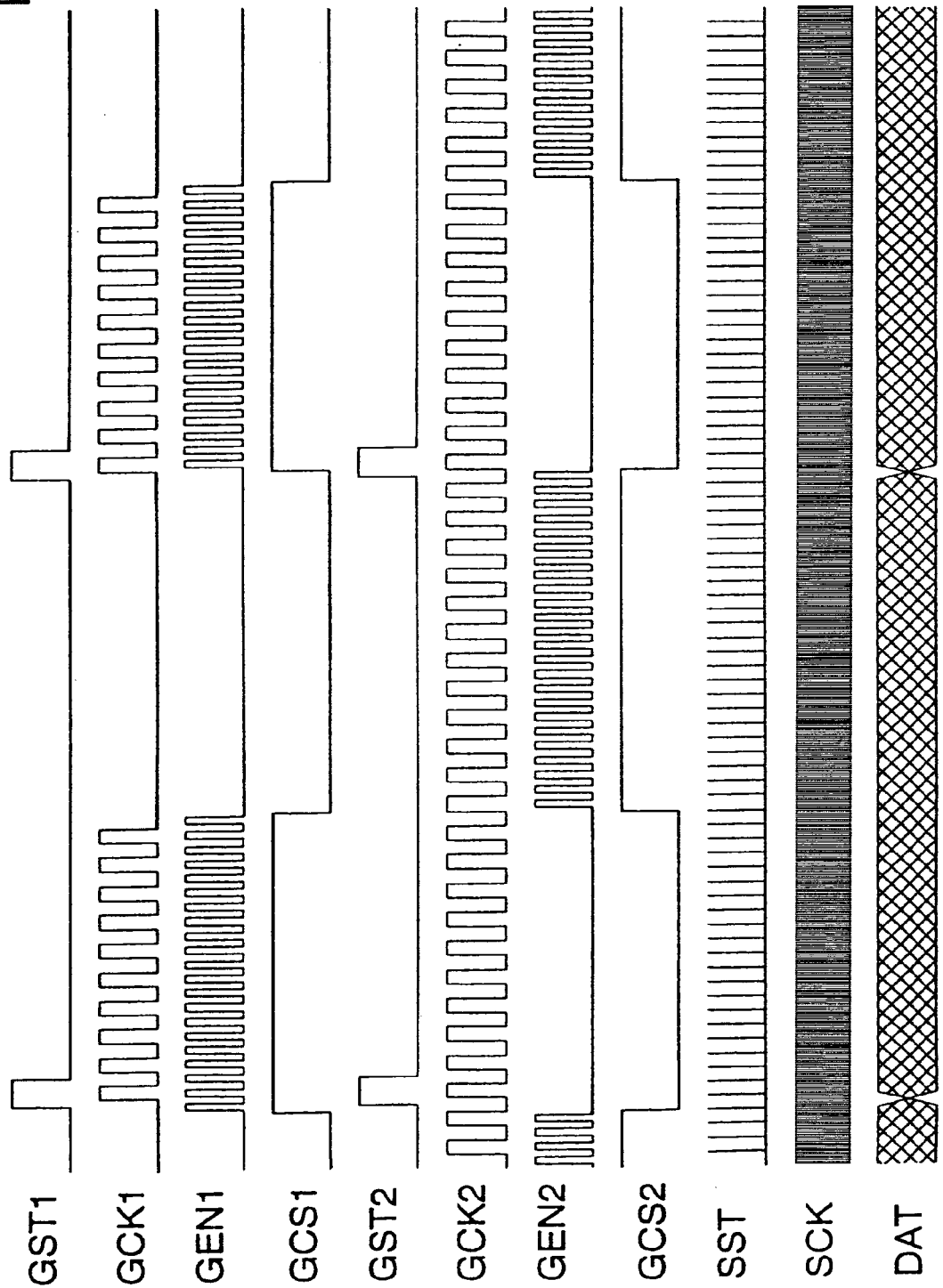
FIG. 13 is an explanatory drawing showing, as an example, another timing chart of an image display device in accordance with the present invention.

FIG. 12 and FIG. 13 show timing charts, as examples, when an operating data signal line drive circuit and scan signal line drive circuit are switched during the course of each frame so that a plurality of kinds of images, such as photographs and text, included in each screen can be displayed in separate areas of the screen by switching the format for each area of the screen.

Figure 14:
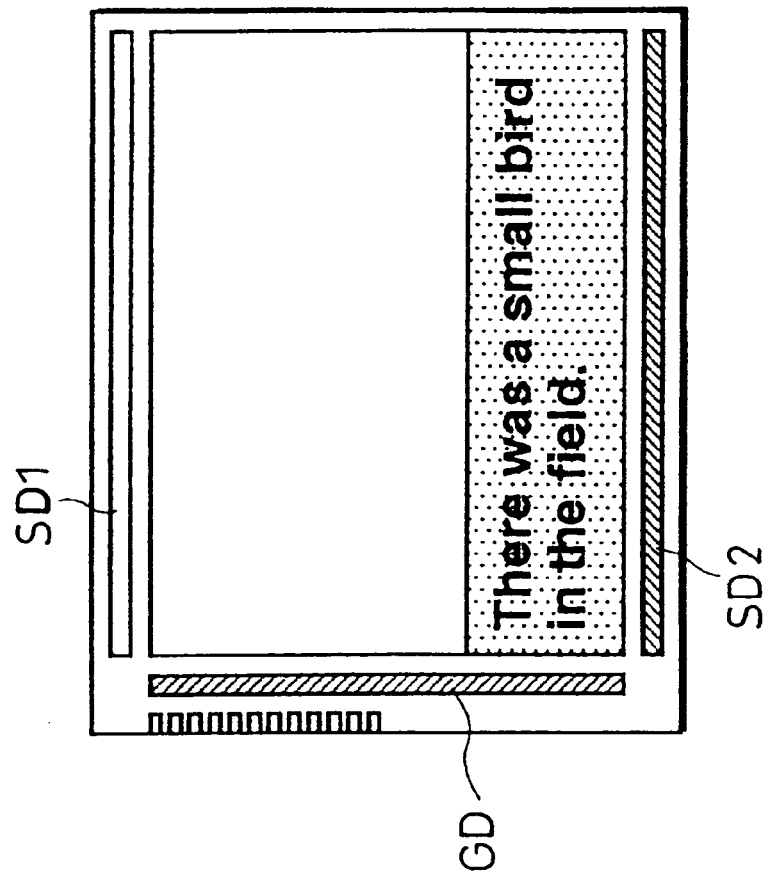
FIG. 14(a) and FIG. 14(b) are explanatory drawings showing, as an example, a display by an image display device in accordance with the present invention.
Figure 14:
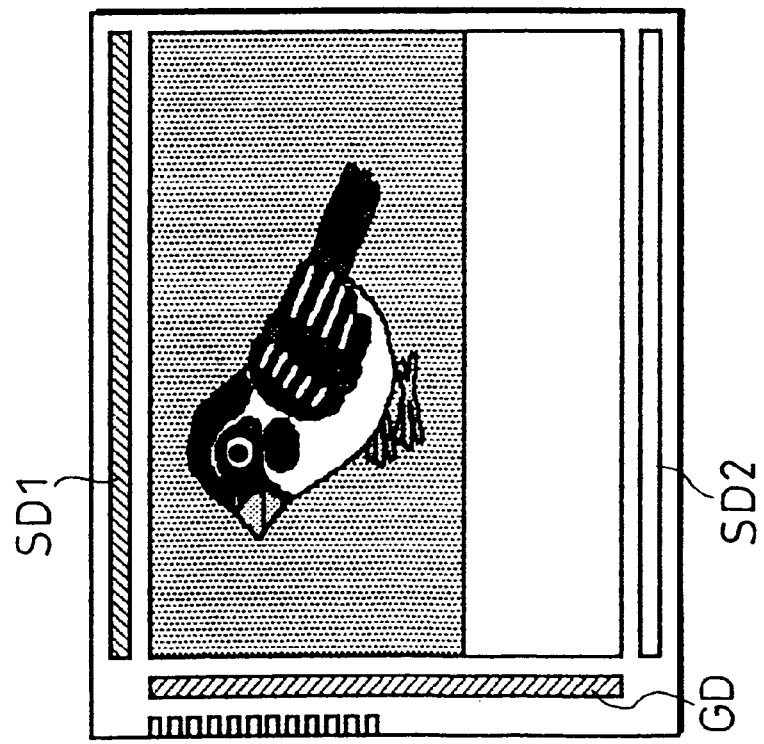
Figure 15:
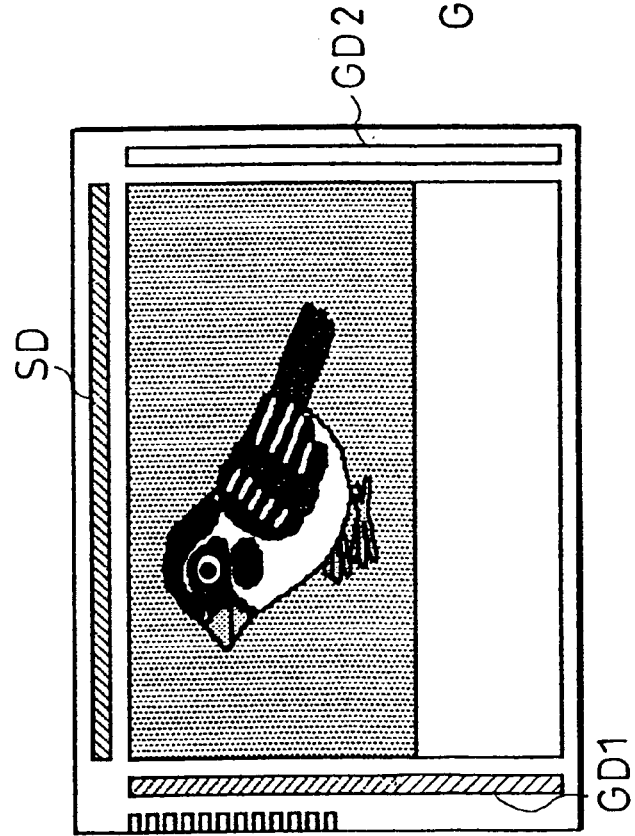
FIG. 15(a) and FIG. 15(b) are explanatory drawings showing, as an example, another display by an image display device in accordance with the present invention.
Figure 15:
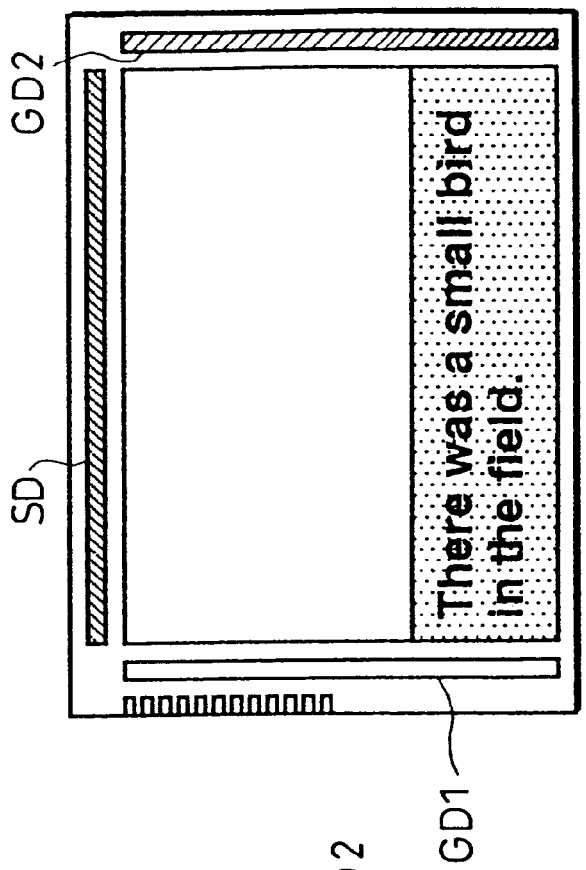

FIGS. 14(*a*), 14(*b*), 15(*a*), and 15(*b*) show the data signal line drive circuit and the scan signal line drive circuit in operation, together with images displayed by the drive circuits, under these circumstances. In the figures, hatches indicate that the drive circuits are operating.

Figure 16:
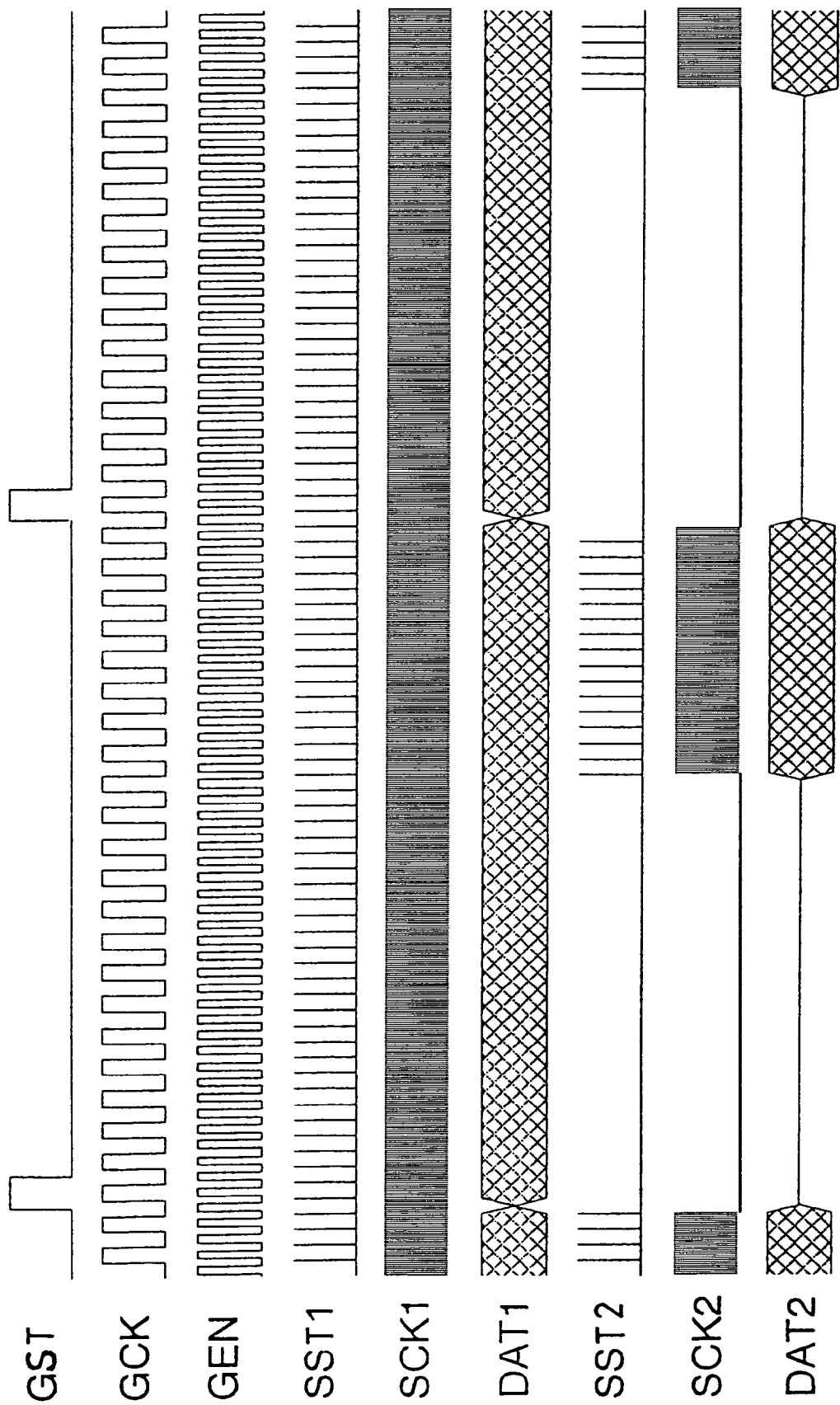
FIG. 16 is an explanatory drawing showing, as an example, another timing chart of an image display device in accordance with the present invention.

FIG. 16 is, as an example, a timing chart showing a plurality of data signal line drive circuits are simultaneously operating at least for some period to write image data. The data signal line drive circuits, each writing a different set of image data, enables a plurality of images to be readily combined and displayed.

FIG. 17(a) and FIG. 17(b) show the data signal line drive circuits in operation, together with an image displayed by the drive circuits, under these circumstances: FIG. 17(a) shows an image displayed when the data signal line drive circuit SD1 and the scan signal line drive circuit GD are in drive operation, and FIG. 17(b) shows an image displayed when the data signal line drive circuit SD2 and the scan signal line drive circuit GD are in drive operation. However, the actual image is a synthesized one of the images shown in FIG. 17(a) and FIG. 17(b). In the figure, hatches indicate that the drive circuits are operating.

Figure 18:
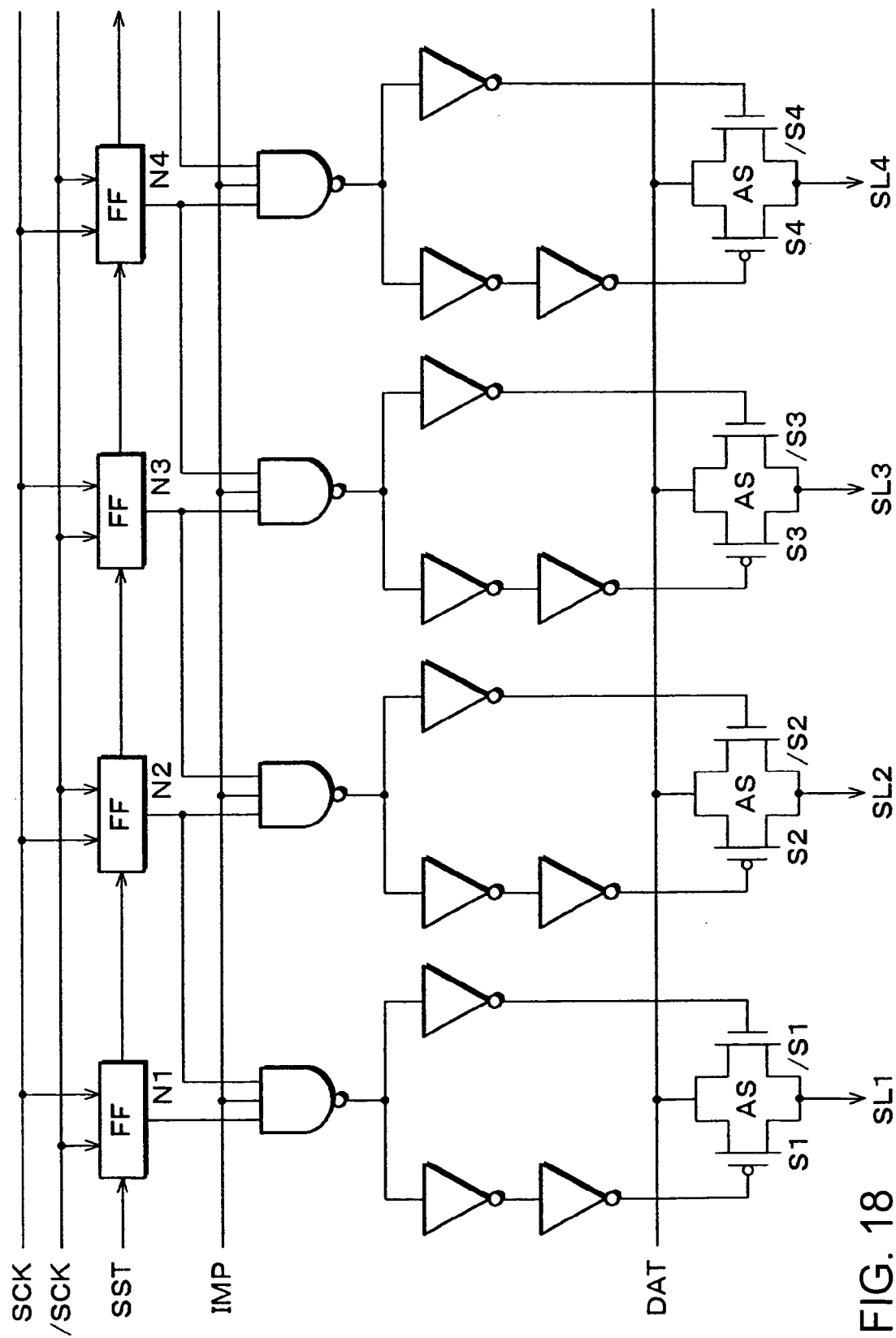
FIG. 18 is an explanatory drawing showing, as an example, a configuration of a data signal line drive circuit constituting an image display device in accordance with the present invention.
Figure 19:
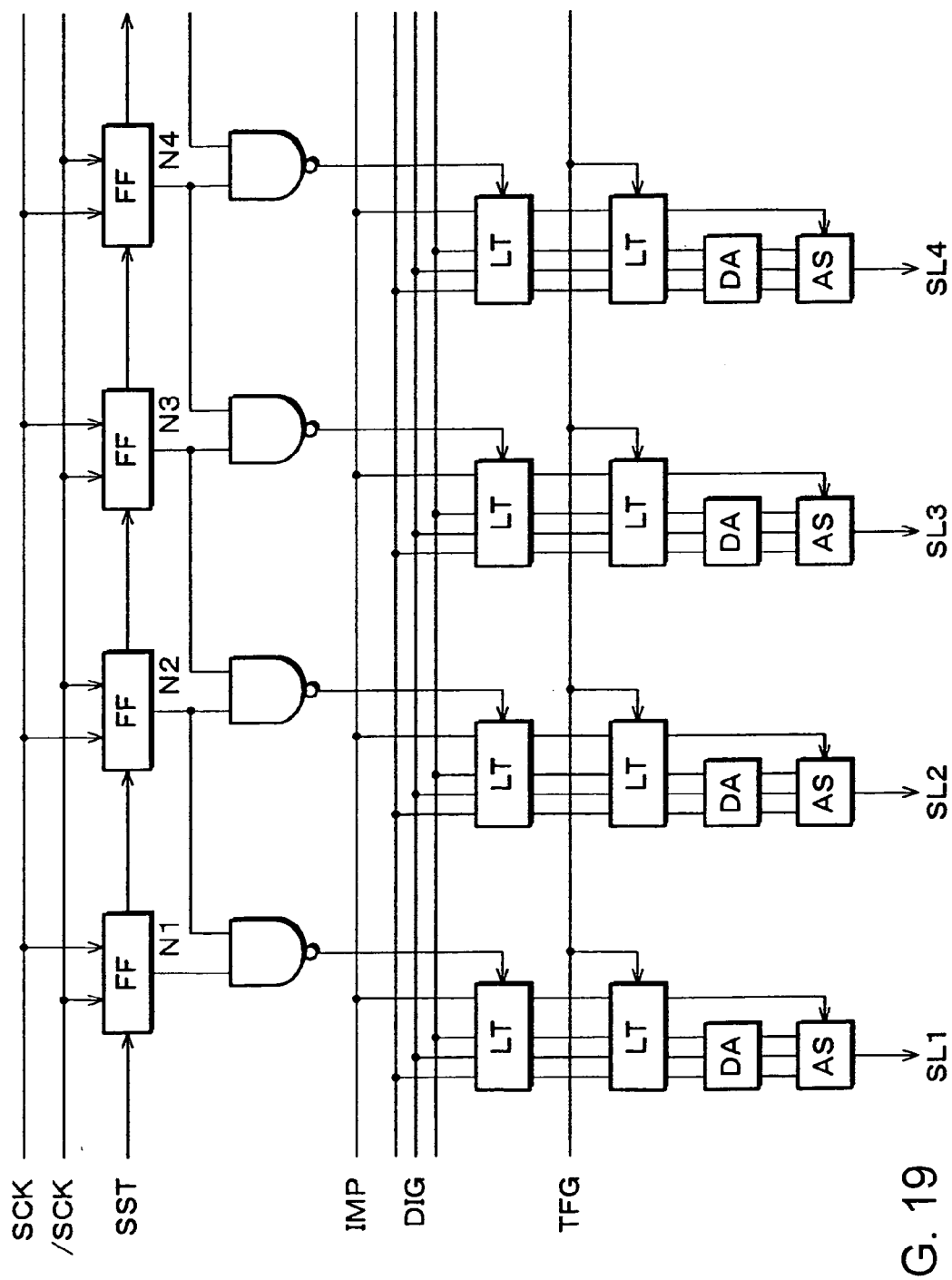
FIG. 19 is an explanatory drawing showing, as an example, another configuration of a data signal line drive circuit constituting an image display device in accordance with the present invention.

FIG. 18 and FIG. 19 is a configuration, as an example, of a data signal line drive circuit for overwriting (superimposing) an image. In the figures, SCK (and /SCK) represents a clock signal; SST represents a start signal; FF represents a flip-flop; N1, N2, . . . represent output pulses; IMP represents a superimposition control signal; DAT represents a video signal; AS represents an analog switch; and S1, /S1, . . . represent input signals to the analog switch AS. Further, DIG represents a digital video signal; TFG represents a transfer gate; LT represents a latch circuit; and DA represents a digital-analog converter circuit. FIG. 18 shows an example of a data signal line drive circuit employing an analog scheme. FIG. 19 shows an example of a data signal line drive circuit employing an digital scheme. Both of the circuits, combined with another data signal line drive circuit, can overwrite an image, since the analog video signal DAT or the digital video signal DIG is written to the data signal line only when the superimposition control signal IMP as an overwrite control signal is active.

In other words, the superimposition control signal IMP is a signal to control a superimpose function and causes a video signal (the potential level of DAT or potential level corresponding to DIG) to be written to a data signal line only when it is active.

Signals, including the superimposition control signal IMP and the transfer gate TFG, are produced in the timing circuit CTL in the same manner as other control signals (SCK, SST, etc.) and inputted to the data signal line drive circuit. Signals, such as IMP, TFG, etc., can be specified using a control signal SEL (described later) so that they are outputted only when the data signal line drive circuit is selected (driven). As a result of the specification, no unnecessary signals are transmitted, thereby saving power consumption.

The transfer gate TFG becomes active during a horizontal blanking period, i.e., during a period starting with the termination of the input of a binary or superimposed video signal for one horizontal line and ending with the start of the input of a video signal for another horizontal line. This enables all the video signals for one horizontal scan period to be simultaneously written to a data signal line SL.

Here, the overwriting of the image can be carried out either for an entire horizontal scan period or only during a fraction of a horizontal scan period. The two modes are selectable according to whether the superimposition control signal IMP is active throughout the horizontal scan period or is active only when video data to be overwritten is being inputted.

Figure 20:
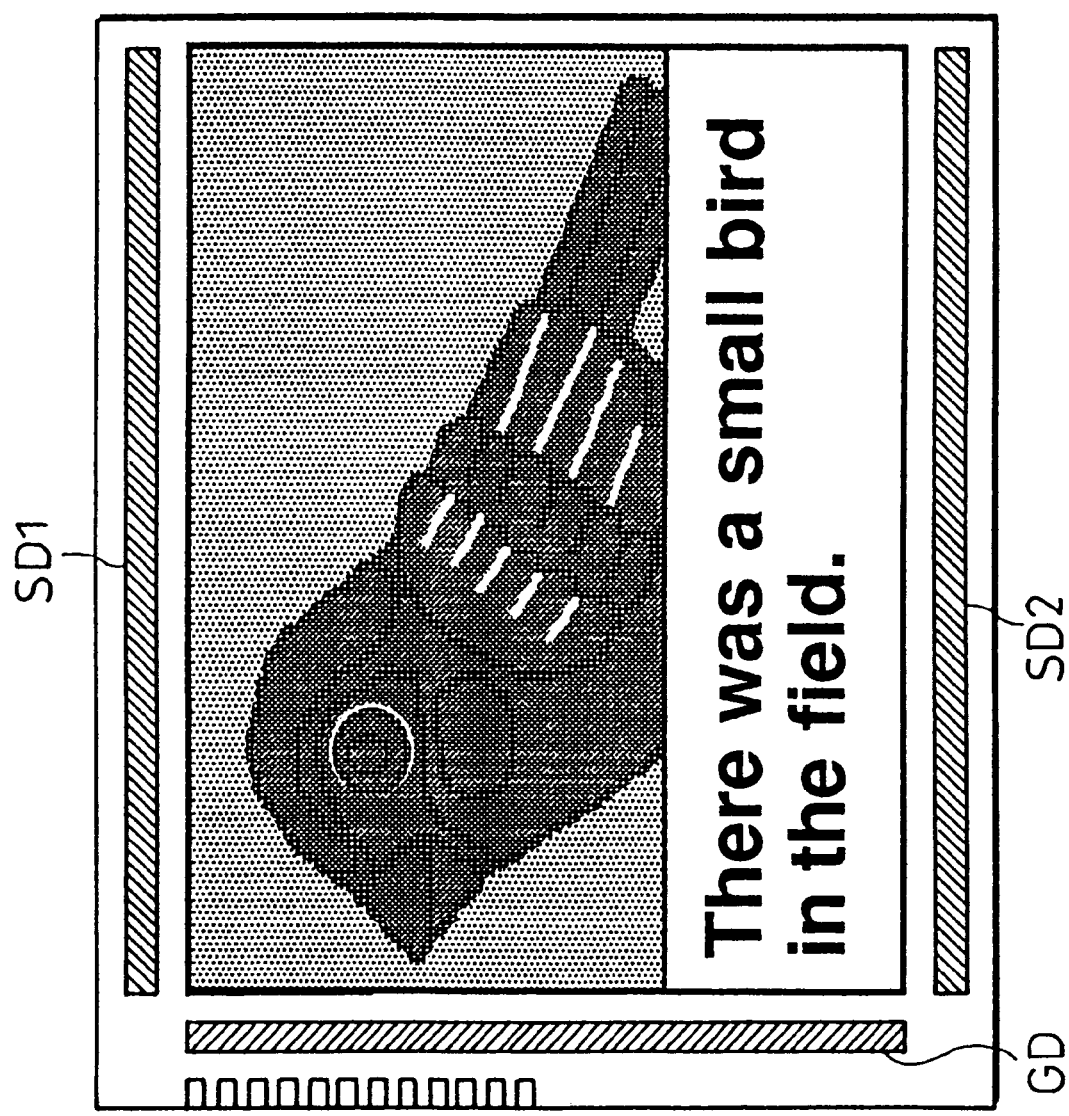
FIG. 20 is an explanatory drawing showing, as an example, another display by an image display device in accordance with the present invention.
Figure 21:
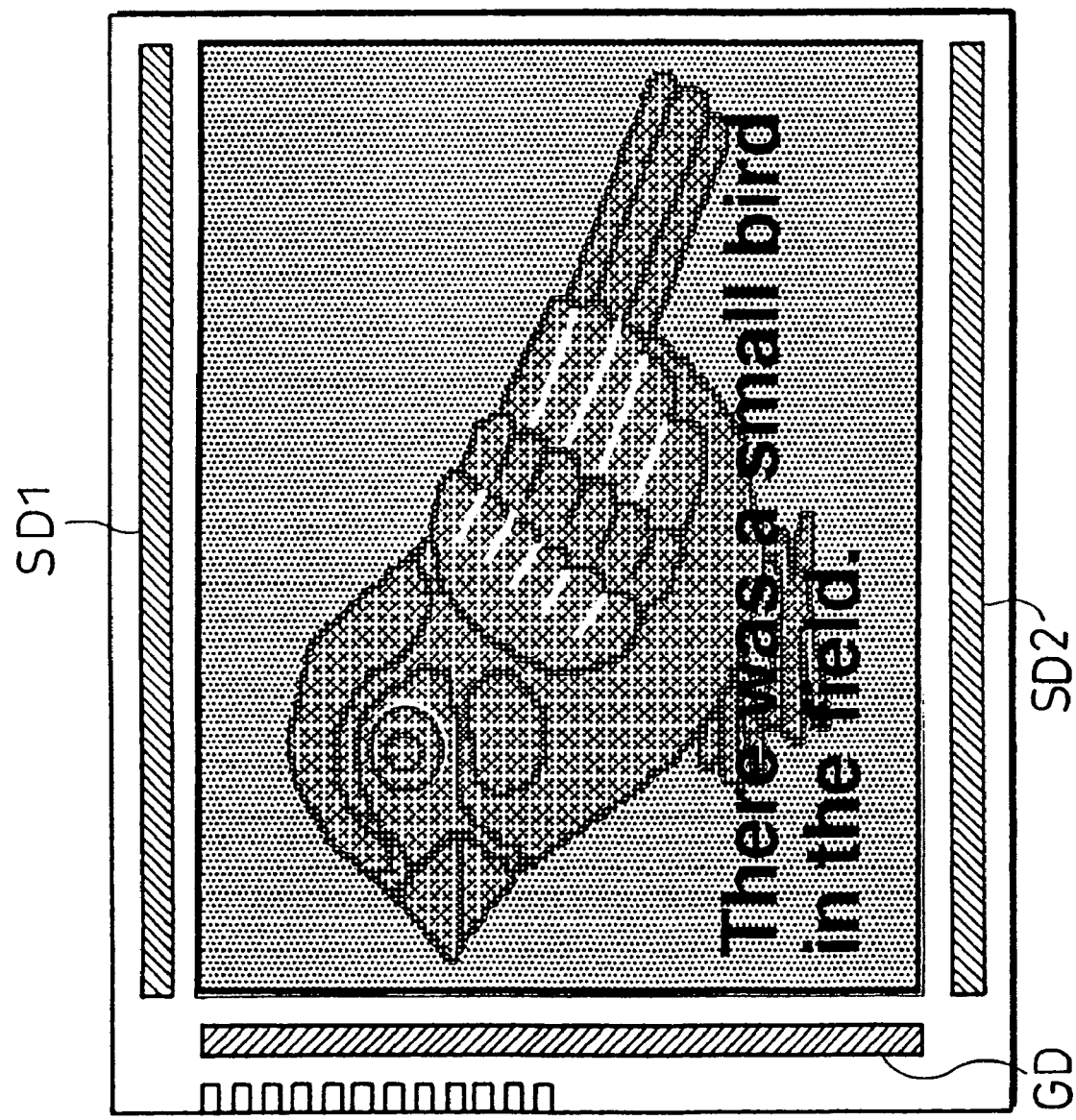
FIG. 21 is an explanatory drawing showing, as an example, another display by an image display device in accordance with the present invention.

FIG. 20 and FIG. 21 show displayed images as results of the above driving. FIG. 20 is an example when the image is overwritten for each horizontal scan period, showing text data overwritten on a white background occupying about ⅓ of the screen on the bottom. FIG. 21 is an example when the image is overwritten only during a fraction of a horizontal scan period, showing text overwritten on the original image which is left unchanged and visible through the text.

To produce image overwriting in these manners, the original video data needs to be written to the data signal line before the video data to be overwritten is written to the data signal line. This is actually carried out by overwriting the video data during the blanking period in a horizontal scan period or by writing the video data to be overwritten with a predetermined delay from the writing of the original video data.

Figure 22:
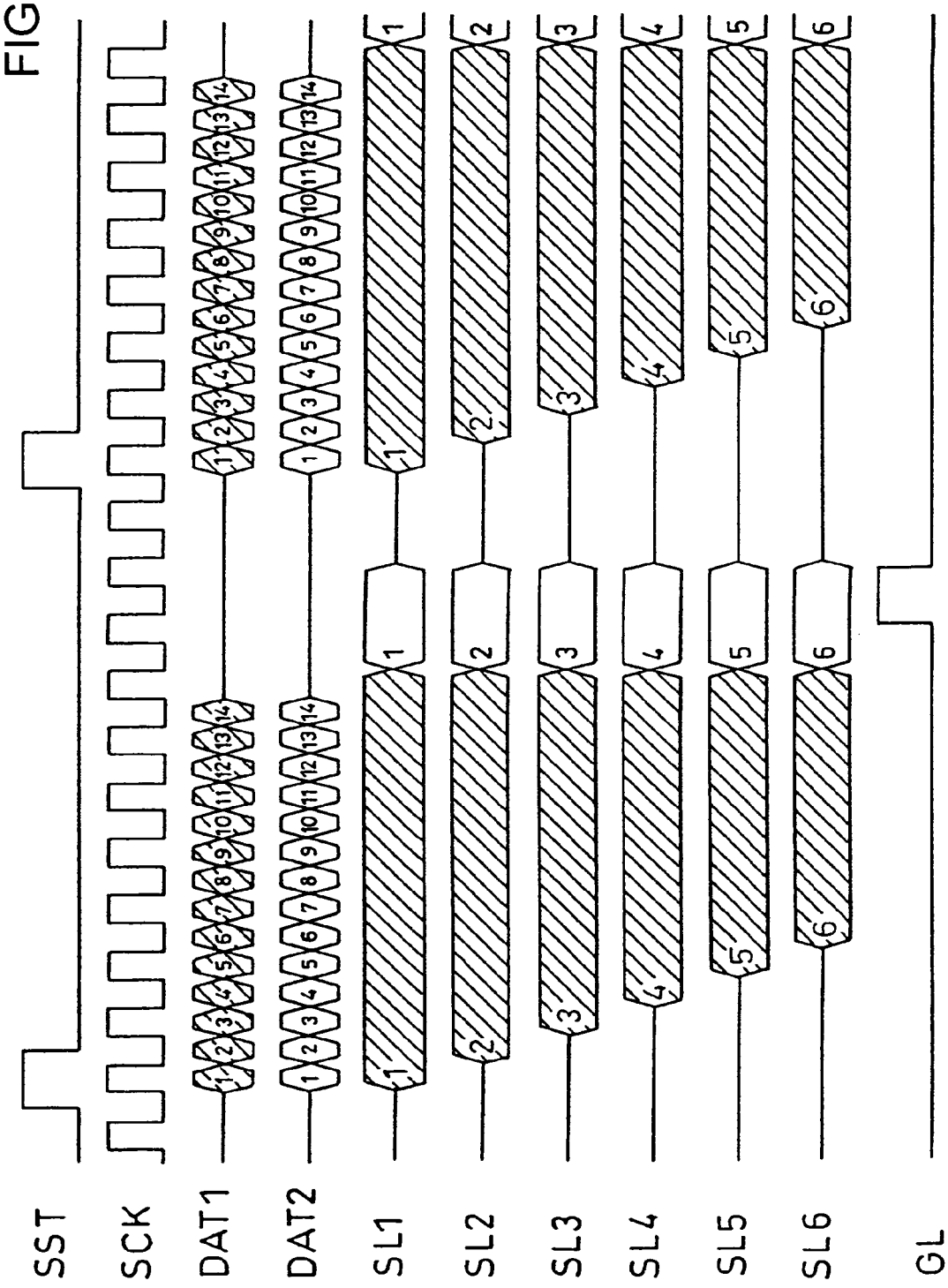
FIG. 22 is an explanatory drawing showing, as an example, another timing chart of an image display device in accordance with the present invention.
Figure 23:
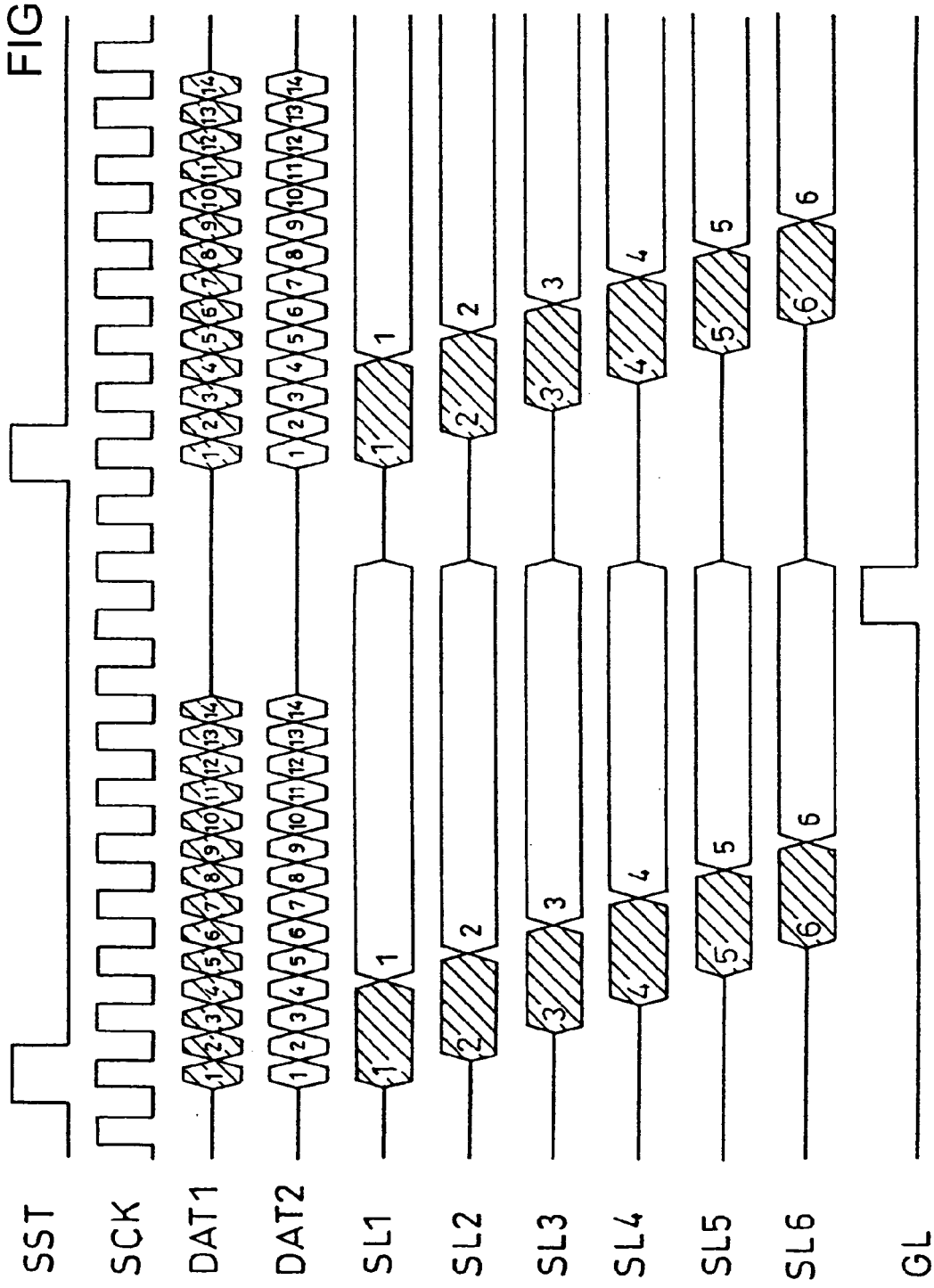
FIG. 23 is an explanatory drawing showing, as an example, another timing chart of an image display device in accordance with the present invention.

FIG. 22 is, as an example, a timing chart in a case where the video data is overwritten during the blanking period in a horizontal scan period. FIG. 23 is, as an example, a timing chart in a case where the video data to be overwritten is written with a predetermined delay from the writing of the original video data.

Figure 24:
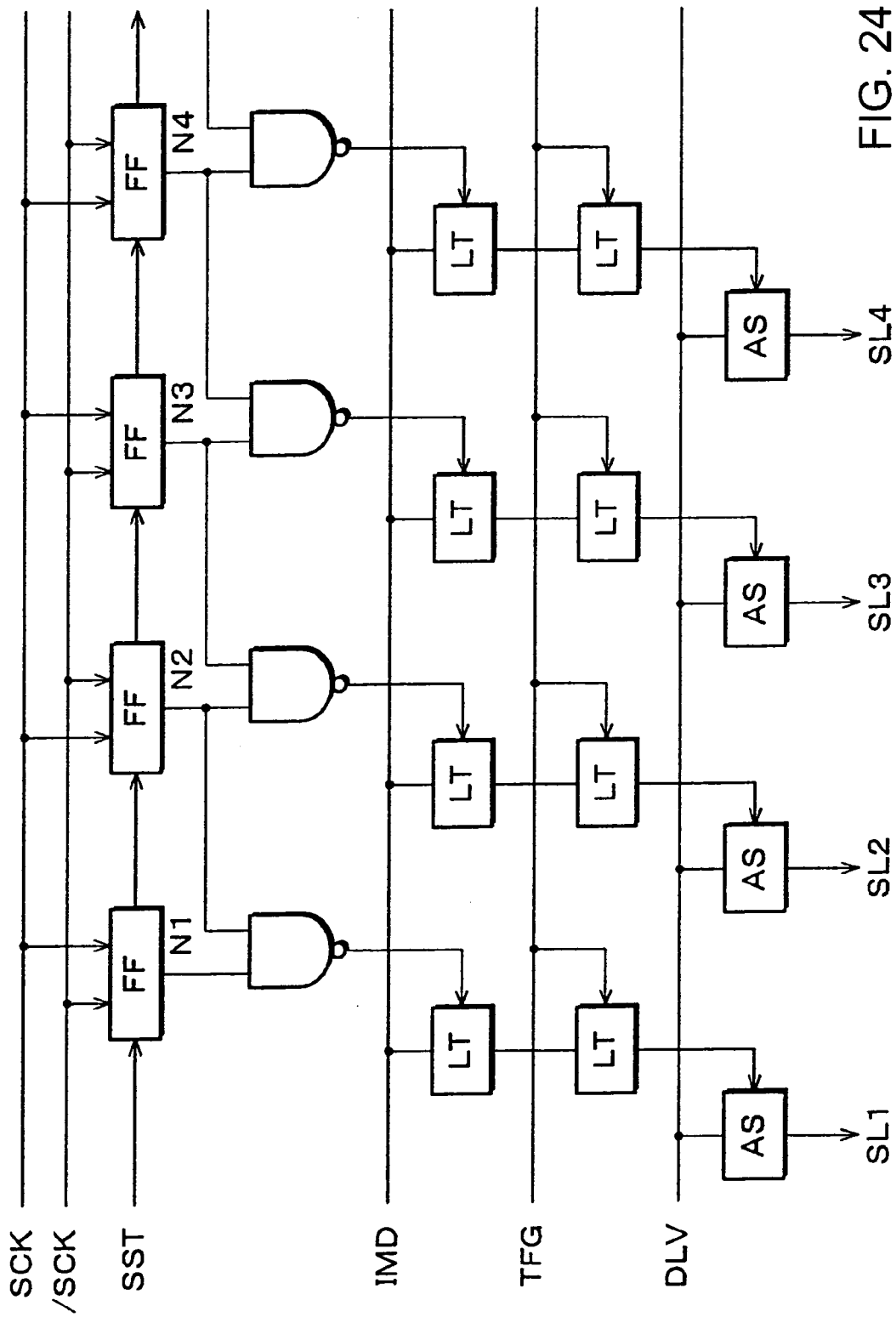
FIG. 24 is an explanatory drawing showing, as an example, another configuration of a data signal line drive circuit constituting an image display device in accordance with the present invention.

FIG. 24 shows, as an example, a configuration of a data signal line drive circuit effecting an overwrite function specified only to text overwriting. In FIG. 24, a binary superimposed video signal IMD which is a video signal to be overwritten is picked up in synchronism with an output of the shift register circuit, and data (black or white) is written to the data signal line only when the superimposed video signal IMD is active. Therefore, by inputting superimposed video signals IMD corresponding to black portions in the text, no signals are written for the non-black portions in the text; this leaves the original video unchanged and effects a readily switchable function like a display of subtitles of a movie.

Figure 25:
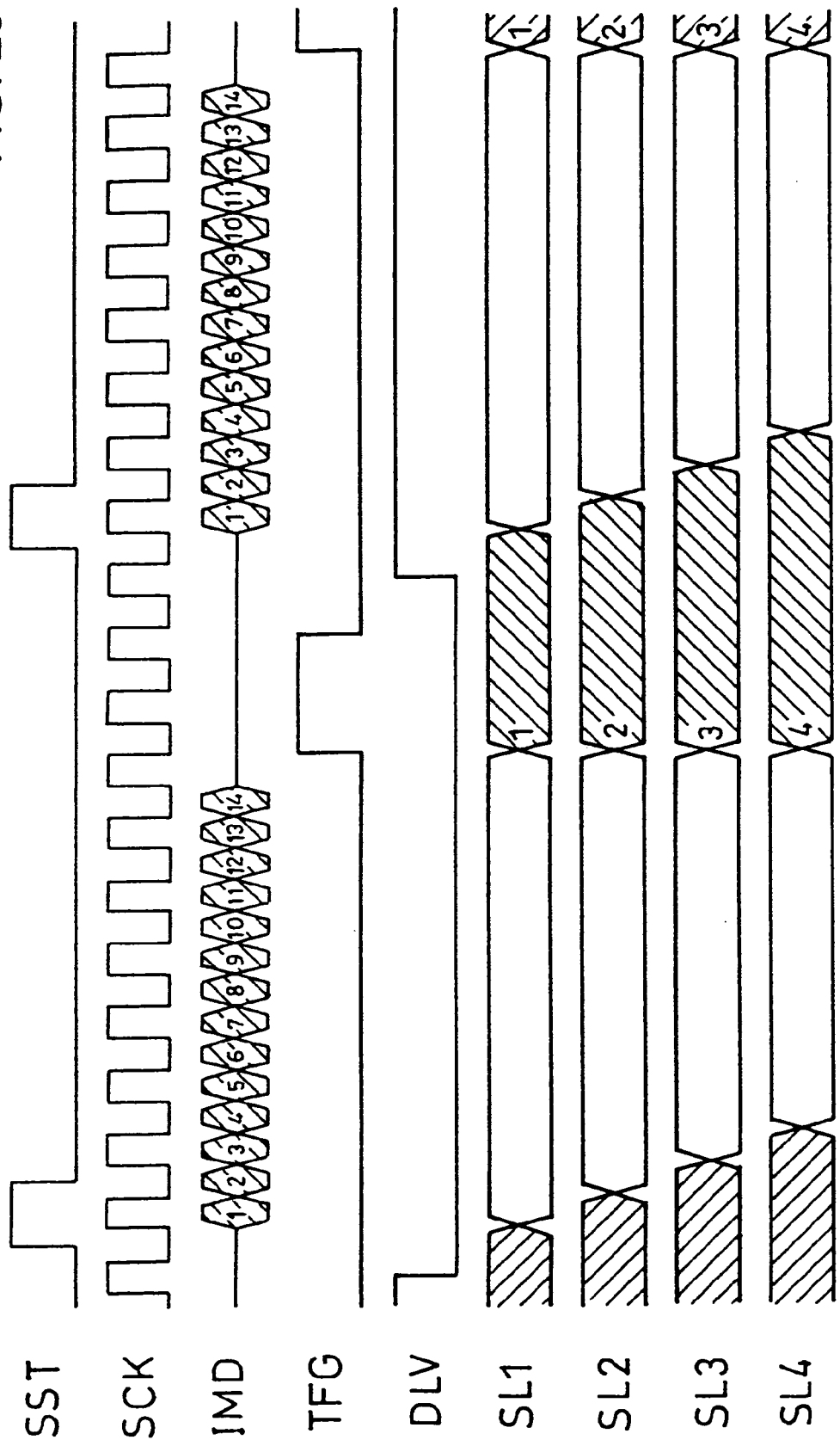
FIG. 25 is an explanatory drawing showing, as an example, another timing chart of an image display device in accordance with the present invention.

FIG. 25 is, as an example, a timing chart under these circumstances. That is, the superimposed video signal IMD is a binary superimposed video signal as a overwritten video signal. The video level DLV is a signal representative of the potential level corresponding to the level of the written video signal to produce a superimpose display and reverses its polarity for every horizontal period as shown in FIG. 25 to carry out line reverse drive. By inputting the transfer gate TFG after the binary superimposed video signal IMD for one horizontal line is picked up by a first latch circuit (LT), all the binary superimposed video signals for one horizontal line are simultaneously transferred to the analog switch AS as a selection switch, and the signal representative of the writing level to produce a superimpose display is written to the data signal line.

Figure 26:
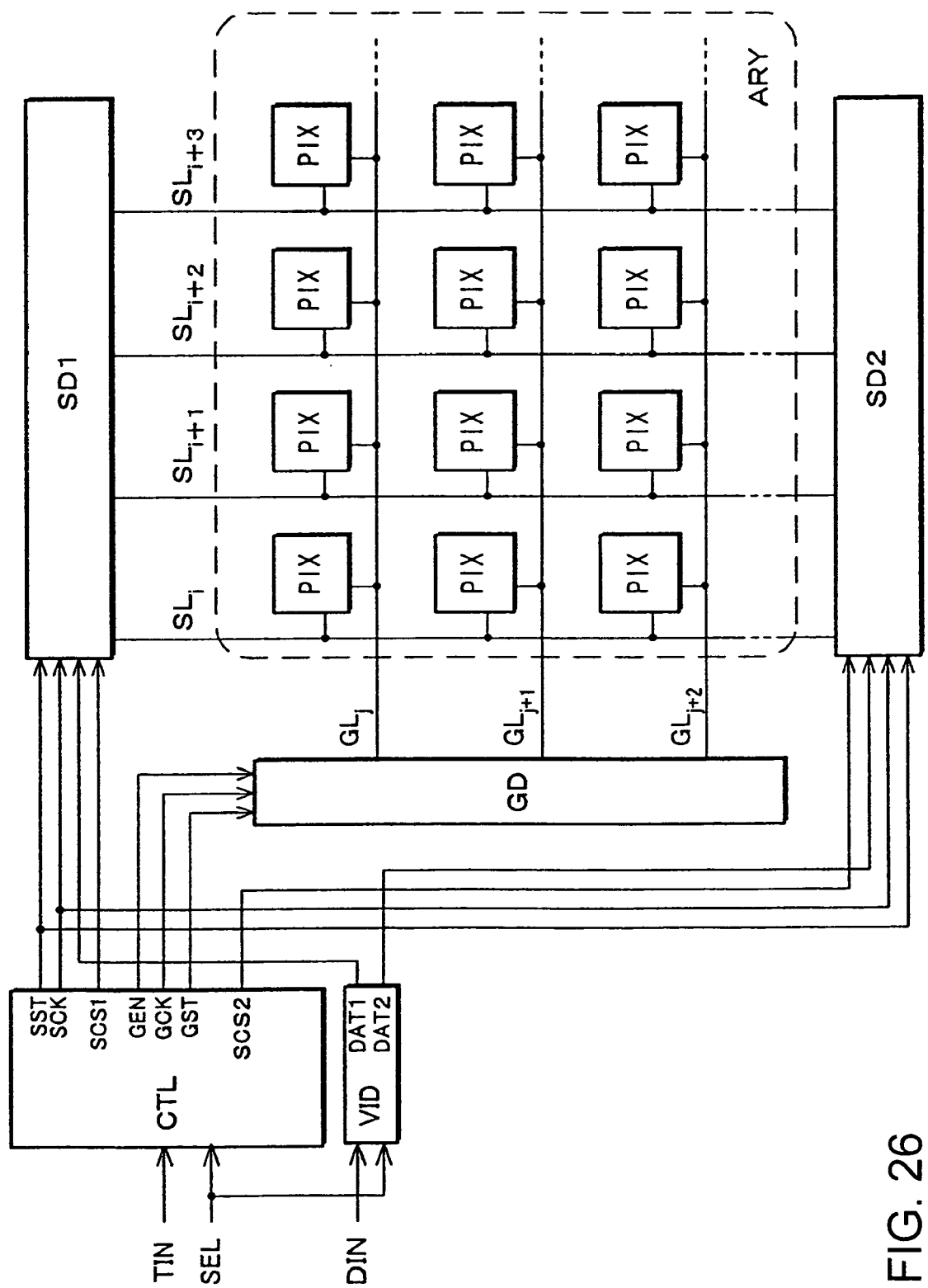
FIG. 26 is a block diagram showing, as an example, another configuration of an image display device in accordance with the present invention.

FIG. 26 to FIG. 29 are diagrams showing, as an example, another configuration in accordance with the present invention. In FIG. 26, the image display device is composed of a pixel array ARY, data signal line drive circuits SD1 and SD2, a scan signal line drive circuit GD, a timing circuit CTL for supplying a timing signal, and a video signal processing circuit VID for supplying a video signal. To the data signal line drive circuits SD1 and SD2 are externally inputted the selection signals SCS1 and SCS2 as operation control signals to control which of the data signal line drive circuits is to be driven.

Figure 27:
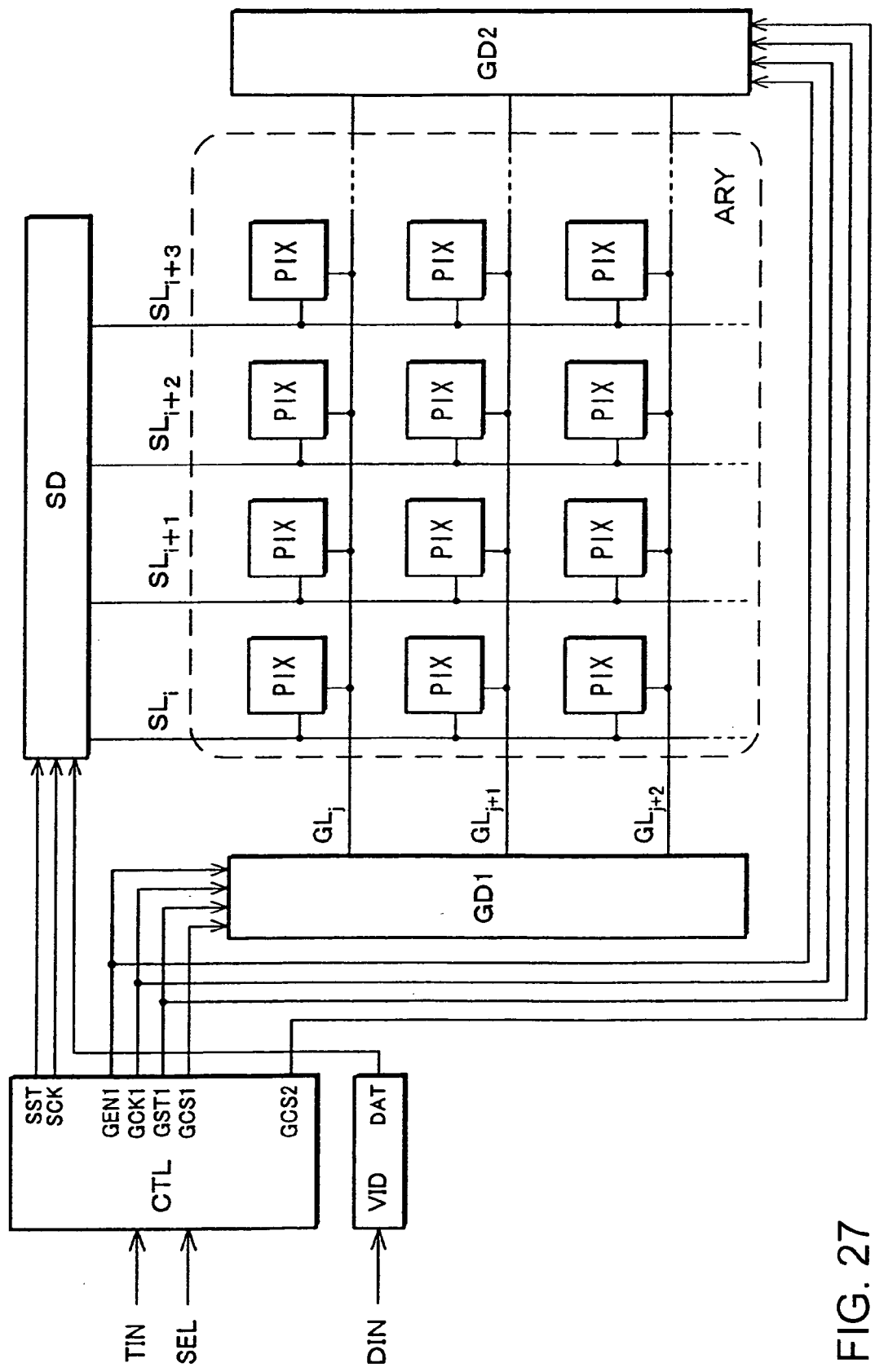
FIG. 27 is a block diagram showing, as an example, another configuration of an image display device in accordance with the present invention.
Figure 28:
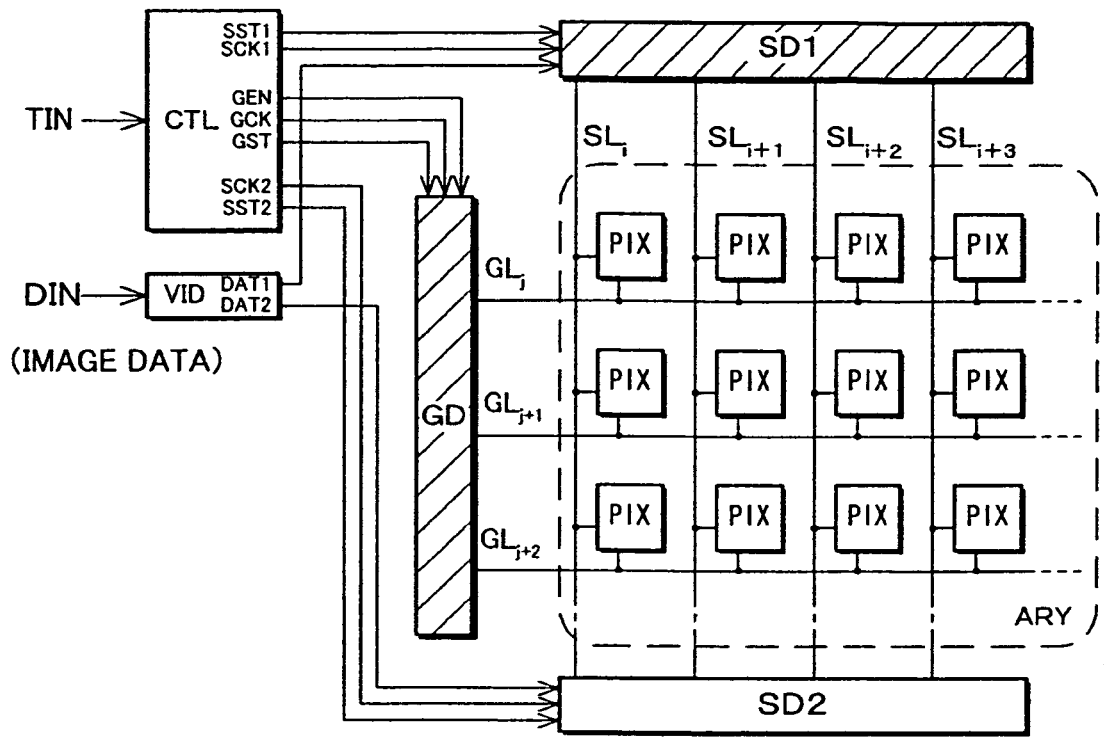
FIG. 28(a) and FIG. 28(b) are block diagrams showing, as an example, another configuration of an image display device in accordance with the present invention.
Figure 28:
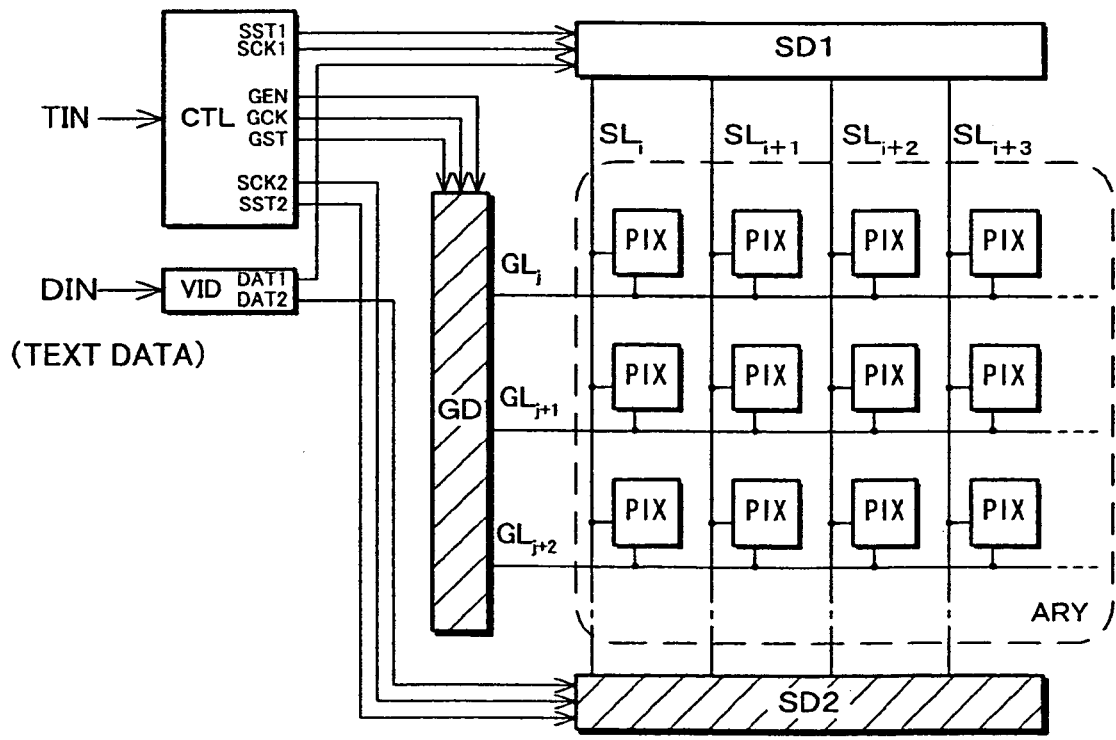
Figure 29:
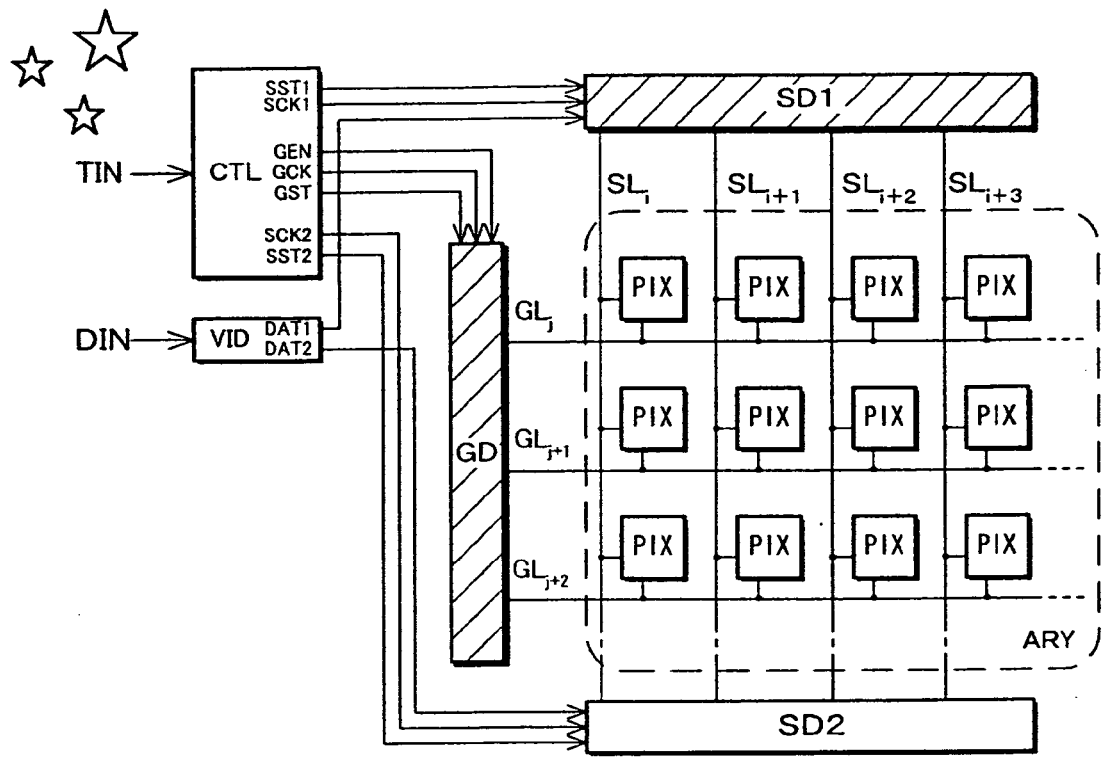
FIG. 29(a) and FIG. 29(b) are block diagrams showing, as an example, another configuration of an image display device in accordance with the present invention.
Figure 29:
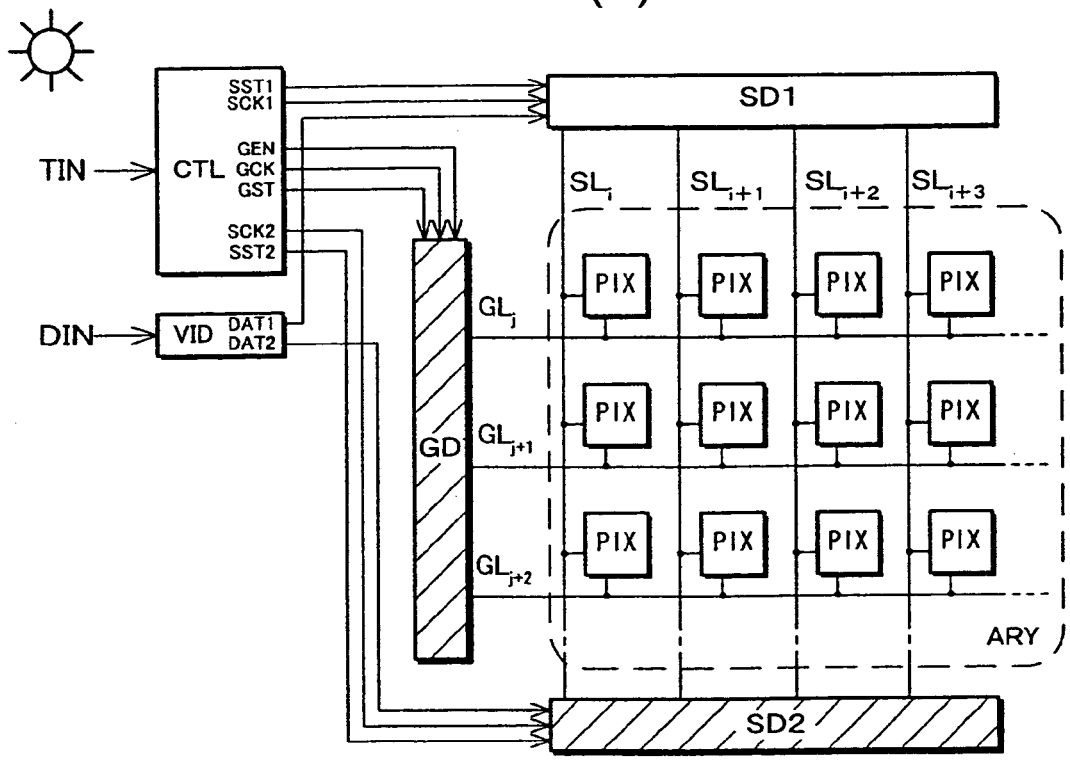

In FIG. 27, the image display device is composed of a pixel array ARY, a data signal line drive circuit SD, scan signal line drive circuits GD1 and GD2, a timing circuit CTL for supplying a timing signal, and a video signal processing circuit VID for supplying a video signal. To the scan signal line drive circuits GD1 and GD2 are externally inputted the selection signals GCS1 and GCS2 to control which of the scan signal line drive circuits is to be driven.

In FIG. 26 and FIG. 27, the common input signals (e.g., SCK and SST; GCK, GST, and GEN; etc.) are inputted to both of the drive circuits. These selection signals SCS1 and SCS2 or GCS1 and GCS2 are controlled through the externally inputted control signal SEL.

FIG. 28(a) and FIG. 28(b) are diagrams showing, as an example, another configuration in accordance with the present invention. In FIG. 28(a) and FIG. 28(b), the image display device is composed of a pixel array ARY, data signal line drive circuits SD1 and SD2, a scan signal line drive circuit GD, a timing circuit CTL for supplying a timing signal, and a video signal processing circuit VID for supplying a video signal. The data signal line drive circuit SD1 is capable of producing a multitone display, whereas the data signal line drive circuit SD2 is only capable of producing a binary display.

Under these circumstances, the data signal line drive circuit SD1 is specified to operate as shown in FIG. 28(a) when the externally inputted video is image data, whereas the data signal line drive circuit SD2 is specified to operate as shown in FIG. 28(b) when the externally inputted video is text data. Thereby, the data signal line drive circuit is switchable so that an image is displayed in the most suitable format according to the kind of the input video data.

FIG. 29(a) and FIG. 29(b) are diagrams showing, as an example, another configuration in accordance with the present invention. In FIG. 29(a) and FIG. 29(b), the image display device is composed of a pixel array ARY, data signal line drive circuits SD1 and SD2, a scan signal line drive circuit GD, a timing circuit CTL for supplying a timing signal, and a video signal processing circuit VID for supplying a video signal. The data signal line drive circuit SD1 is capable of producing a multitone display, whereas the data signal line drive circuit SD2 is only capable of producing a binary display.

Further, as shown in FIG. 29(a), when the data signal line drive circuit SD1 operates, the image display device is in transmission display mode with the backlight turned on. By contrast, as shown in FIG. 29(b), when the data signal line drive circuit SD2 operates, the image display device is in reflection display mode with the backlight turned off. The image display device can operate in both transmission display mode and reflection display mode by providing an area transparent to light and an area where light reflects in each pixel PIX.

Under these circumstances, by causing the data signal line drive circuit SD1 to operate in a relatively dark environment, such as at night and indoors, and causing the data signal line drive circuit SD2 to operate when there exists strong external light, such as under daylight and outdoors, the image display device can produce a display in the most suitable display mode and display format depending on environmental conditions.

Figure 30:
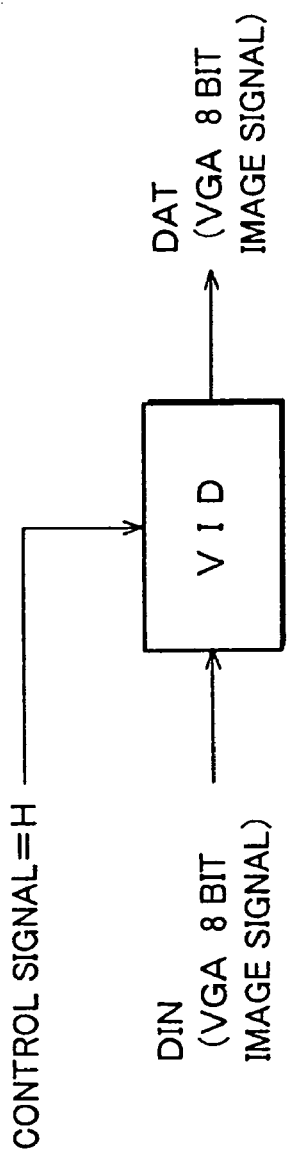
FIG. 30(a) and FIG. 30(b) are explanatory drawings showing, as an example, operation of a video signal processing circuit which is a part of an image display device in accordance with the present invention.
Figure 30:
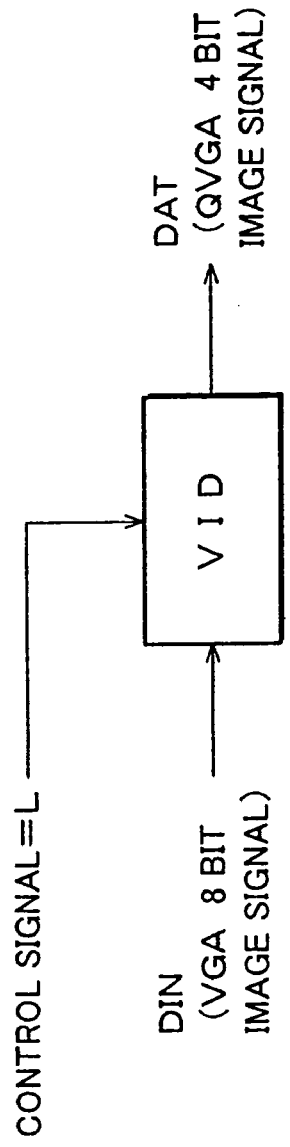

FIG. 30(a) and FIG. 30(b) are diagrams showing, as an example, another configuration in accordance with the present invention. FIG. 30(a) and FIG. 30(b) show examples of format conversion of a video signal in the video signal processing circuit VID. The input video signal DIN inputted as an original video signal is converted to one of convertible formats by means of an external control signal. For example, if the original video signal is an 8-bit VGA (640×480 pixel) signal, the original is convertible to a signal with an equal (FIG. 30(a)) or smaller (FIG. 30(b)) number of bits in view of resolution and halftones. In FIG. 30(b), an 8-bit VGA signal is converted to a 4-bit QVGA (320×240 pixel) signal.

With the provision of a circuit having such a format conversion function, an image display device can be offered which can produce a display in a plurality of formats.

FIG. 31(a) and FIG. 31(b) are diagrams showing, as an example, another configuration in accordance with the present invention. FIG. 31(a) and FIG. 31(b) show examples of timing signal conversion in the timing circuit CTL. One of producible timings is produced from the input timing signal TIN inputted as an original timing signal according to an external control signal. For example, if the original video signal is a clock signal CLK which is an original clock corresponding to a VGA (640×480 pixel) display or a synchronous signal VSYNC or HSYNC, a clock signal GCK, SCK, a start signal GST, and SST corresponding to the display format are produced from these signals according to an external control signal and inputted to the drive circuits. As shown in FIG. 31(a) and FIG. 31(b), the clock signal GCK, SCK, start signal GST, and SST are produced with a relevant frequency depending on whether the control signal is high or low.

With the provision of a circuit having such a plurality of timing signal production functions, an image display device can be offered which can produce a display in a plurality of formats.

Figure 32:
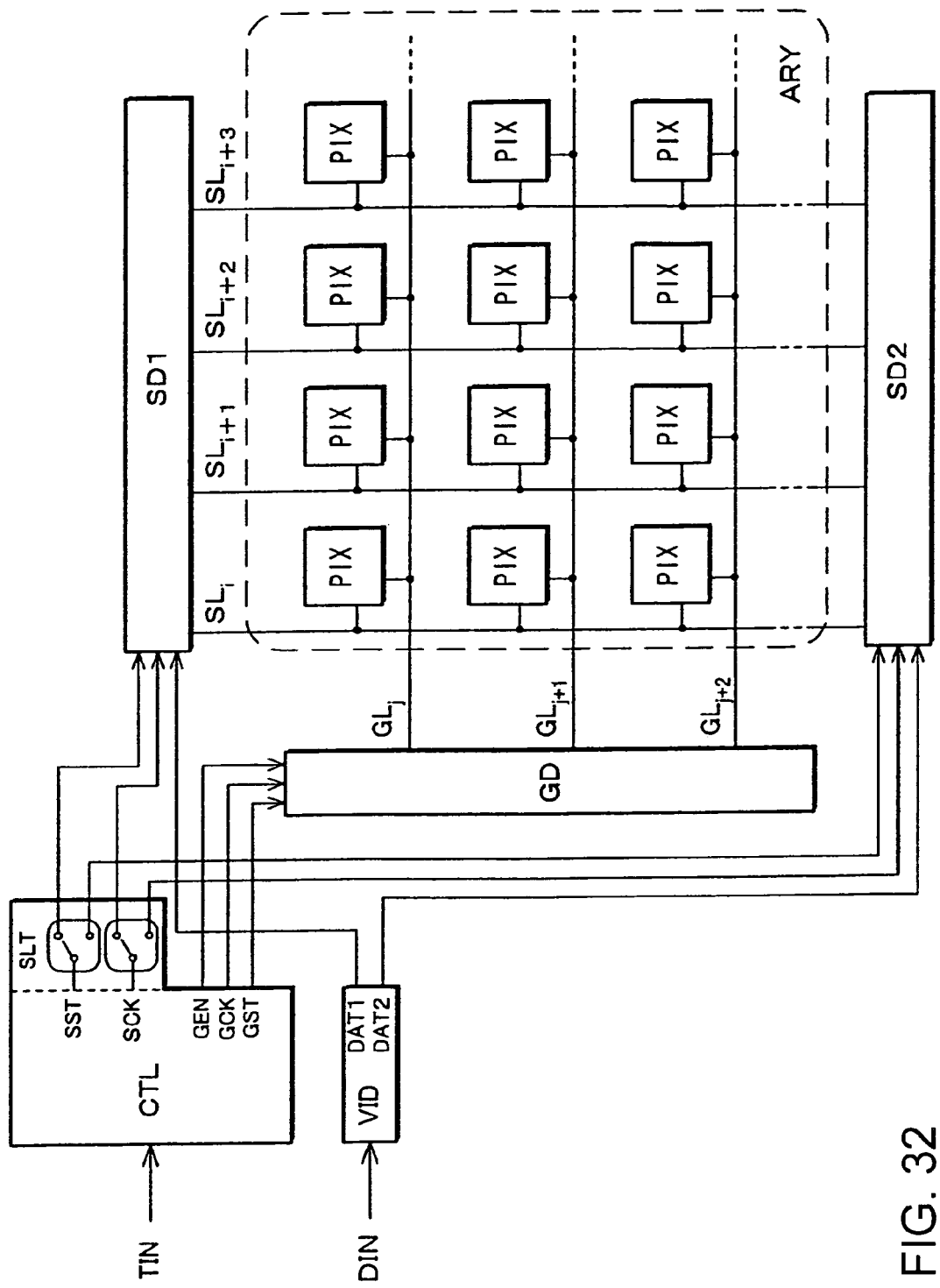
FIG. 32 is a block diagram showing, as an example, another configuration of an image display device in accordance with the present invention.
Figure 33:
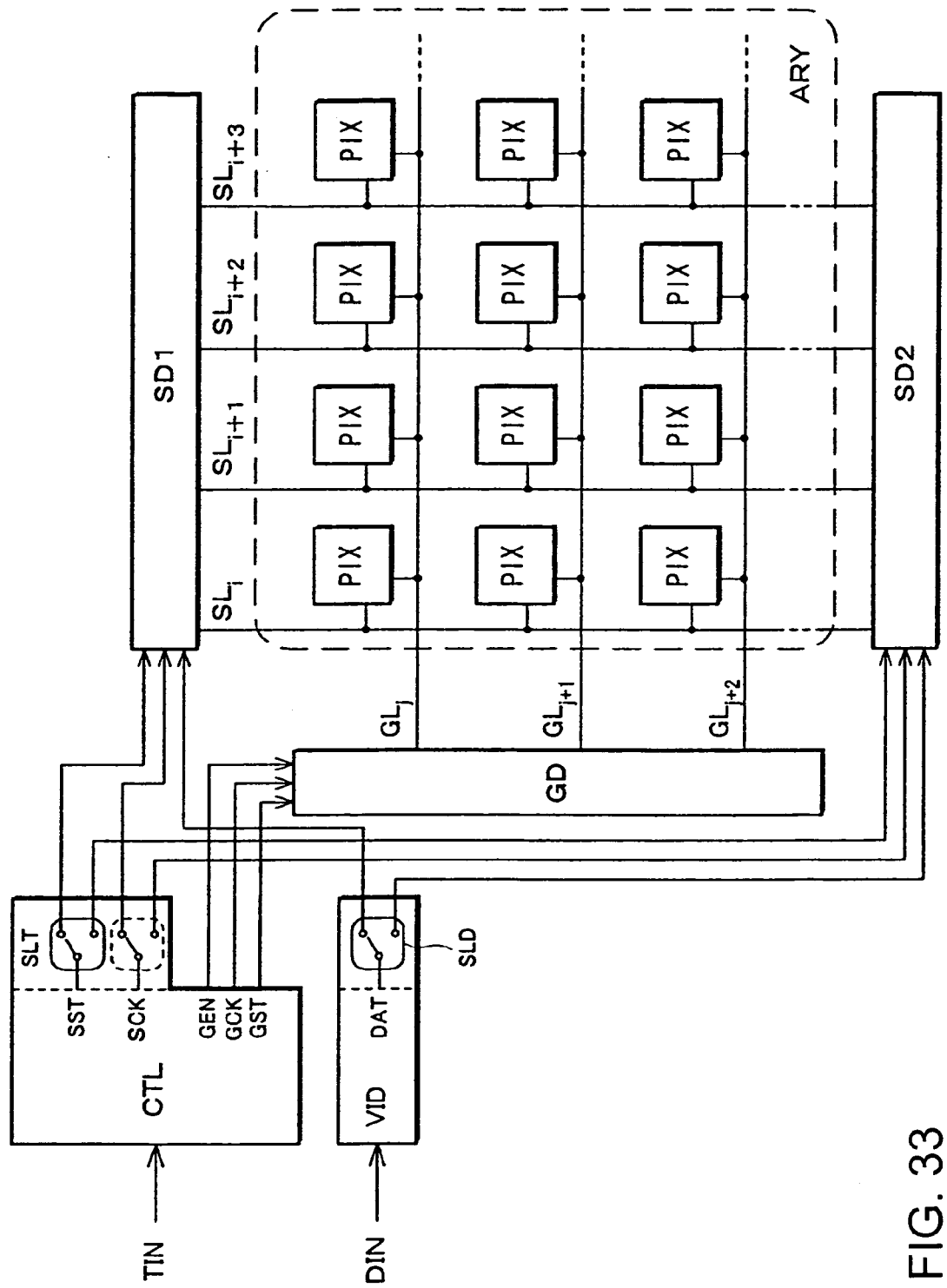
FIG. 33 is a block diagram showing, as an example, another configuration of an image display device in accordance with the present invention.

FIG. 32 and FIG. 33 are diagrams showing, as an example, another configuration in accordance with the present invention. In FIG. 32, the image display device is composed of a pixel array ARY, data signal line drive circuits SD1 and SD2, a scan signal line drive circuit GD, a timing circuit CTL for supplying a timing signal, a video signal processing circuit VID for supplying a video signal. The start signal SST and clock signal SCK is inputted to either the data signal line drive circuit SD1 or SD2 by means of a switch SLT (timing signal supply destination switching means) immediately after being outputted from the timing circuit CTL.

In FIG. 33, the image display device is composed of a pixel array ARY, a data signal line drive circuits SD1 and SD2, a scan signal line drive circuit GD, a timing circuit CTL for supplying a timing signal, a video signal processing circuit VID for supplying a video signal. The start signal SST and clock signal SCK is inputted to either the data signal line drive circuit SD1 or SD2 by means of the switch SLT immediately after being outputted from the timing circuit CTL. The video signal DAT is inputted to either the data signal line drive circuit SD1 or SD2 by means of a switch SLD (video signal supply destination switching means) immediately after being outputted from the video signal processing circuit VID.

Hence, the switch enables the timing signal and the video signal to be supplied only to one of the two drive circuits, prohibiting the other, unnecessary signal from being supplied. The configuration prevents the power consumption from increasing. The switch SLT and the switch SLD are controllable by, for example, a detection circuit SEN (see FIG. 34; will be described later in detail) and an identification circuit JDG (see FIG. 35; again will be described later in detail).

Figure 34:
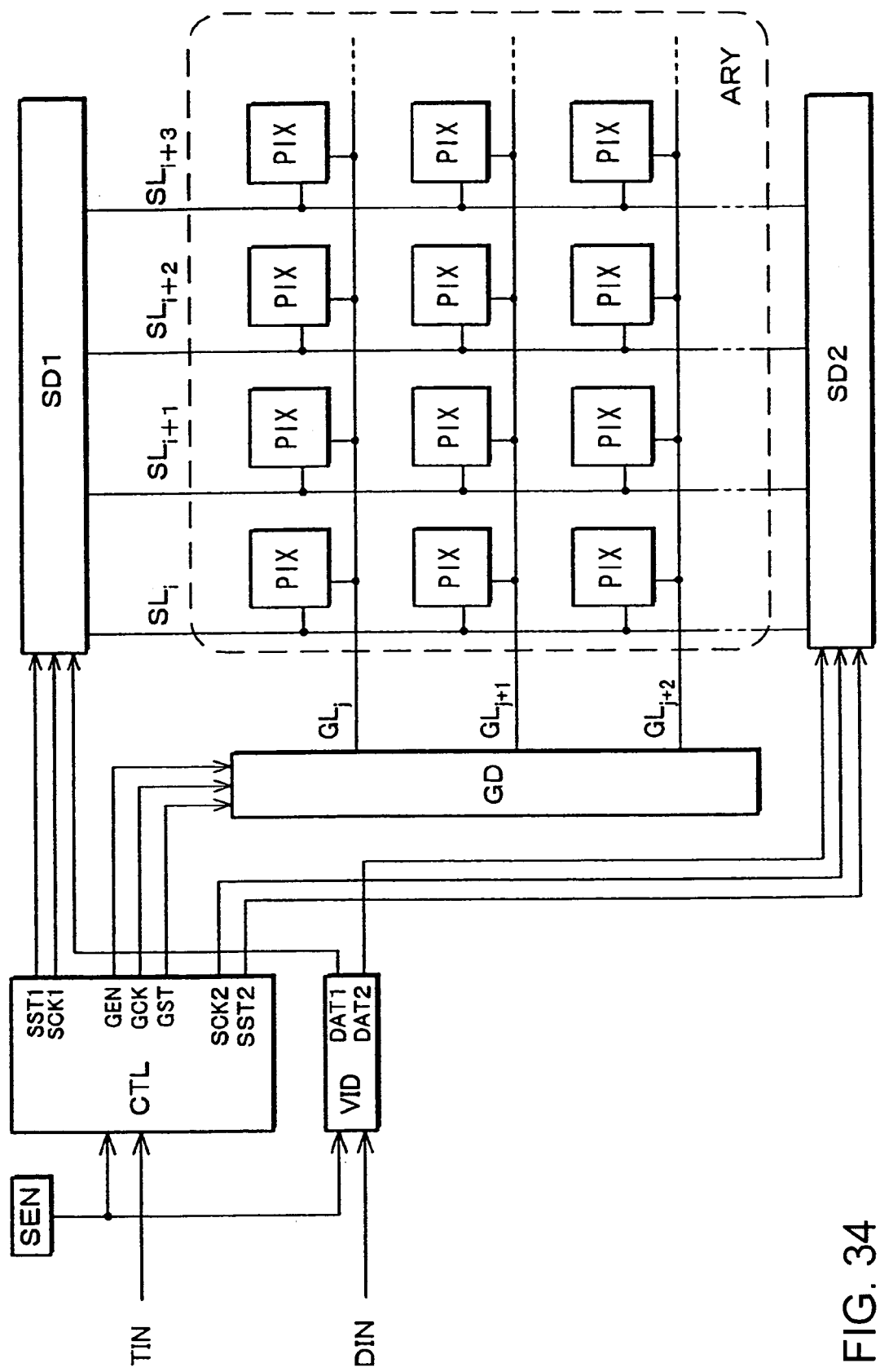
FIG. 34 is a block diagram showing, as an example, another configuration of an image display device in accordance with the present invention.
Figure 35:
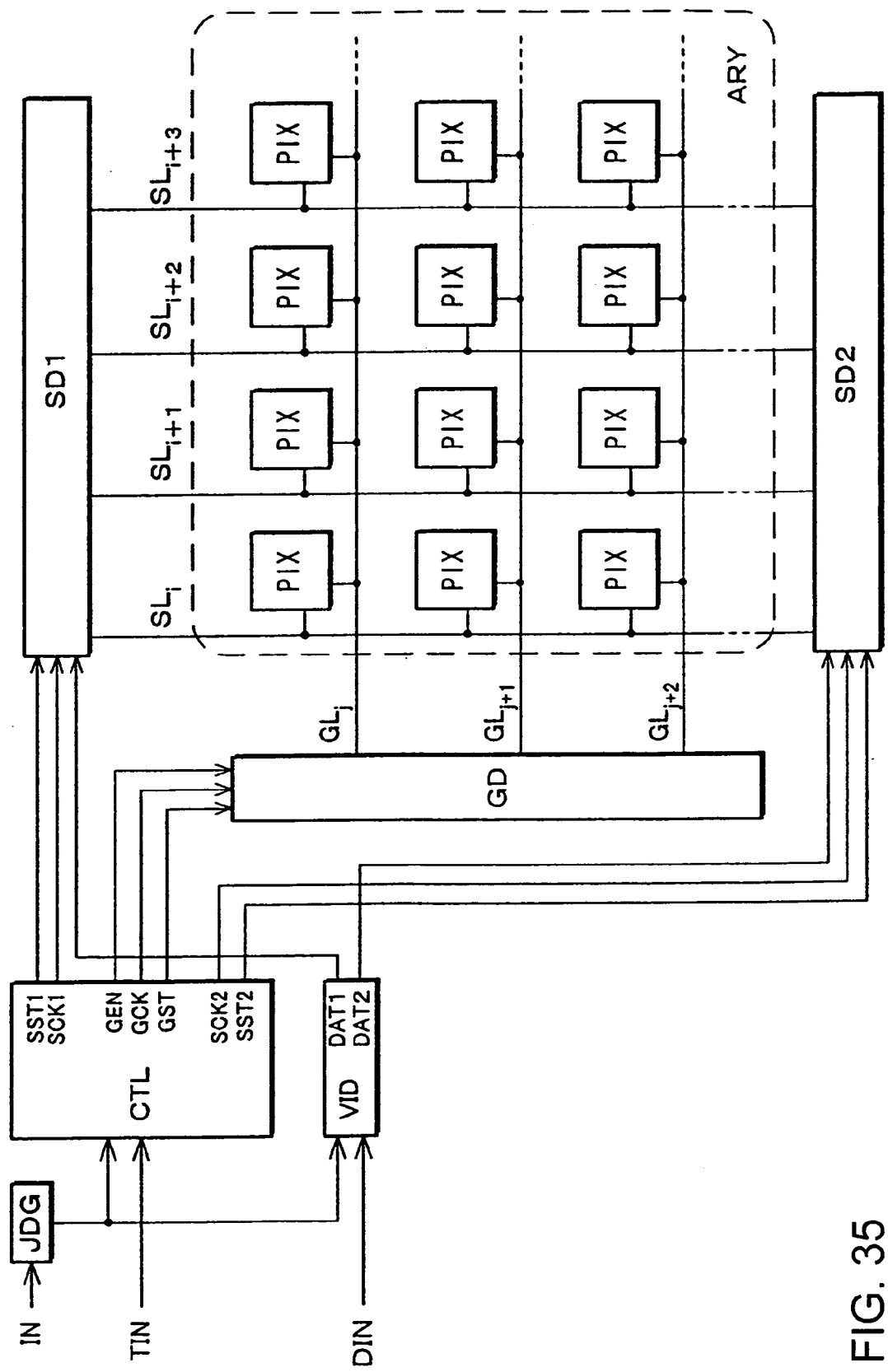
FIG. 35 is a block diagram showing, as an example, another configuration of an image display device in accordance with the present invention.

FIG. 34 and FIG. 35 are diagrams showing, as an example, another configuration in accordance with the present invention. In FIG. 34, the image display device is composed of a pixel array ARY, data signal line drive circuits SD1 and SD2, a scan signal line drive circuit GD, a timing circuit CTL for supplying a timing signal, a video signal processing circuit VID for supplying a video signal, and a detection circuit (detection means) SEN as a sensor for detecting an environmental condition.

Under these circumstances, the detection circuit SEN detects an environmental condition (brightness, for instance), and the result is inputted to the timing circuit CTL and the video signal processing circuit VID as display configuration switching means; thereby, the most suitable format of the timing signal and video signal is selected to produce a display that best matches with the environmental condition.

In FIG. 35, the image display device is composed of a pixel array ARY, data signal line drive circuits SD1 and SD2, a scan signal line drive circuit GD, a timing circuit CTL for supplying a timing signal, a video signal processing circuit VID for supplying a video signal, and an identification circuit (video kind identification means) JDG for identifying different kinds of video.

Under these circumstances, the identification circuit JDG determines the kind of video according to the input data IN (if the data head includes a tag indicative of that kind, for example, the identification circuit JDG can determine it by reading the tag). The result is inputted to the timing circuit CTL and the video signal processing circuit VID as display configuration switching means; thereby the most suitable format of the timing signal and video signal is selected to produce a display that best matches with the kind of video.

Figure 36:
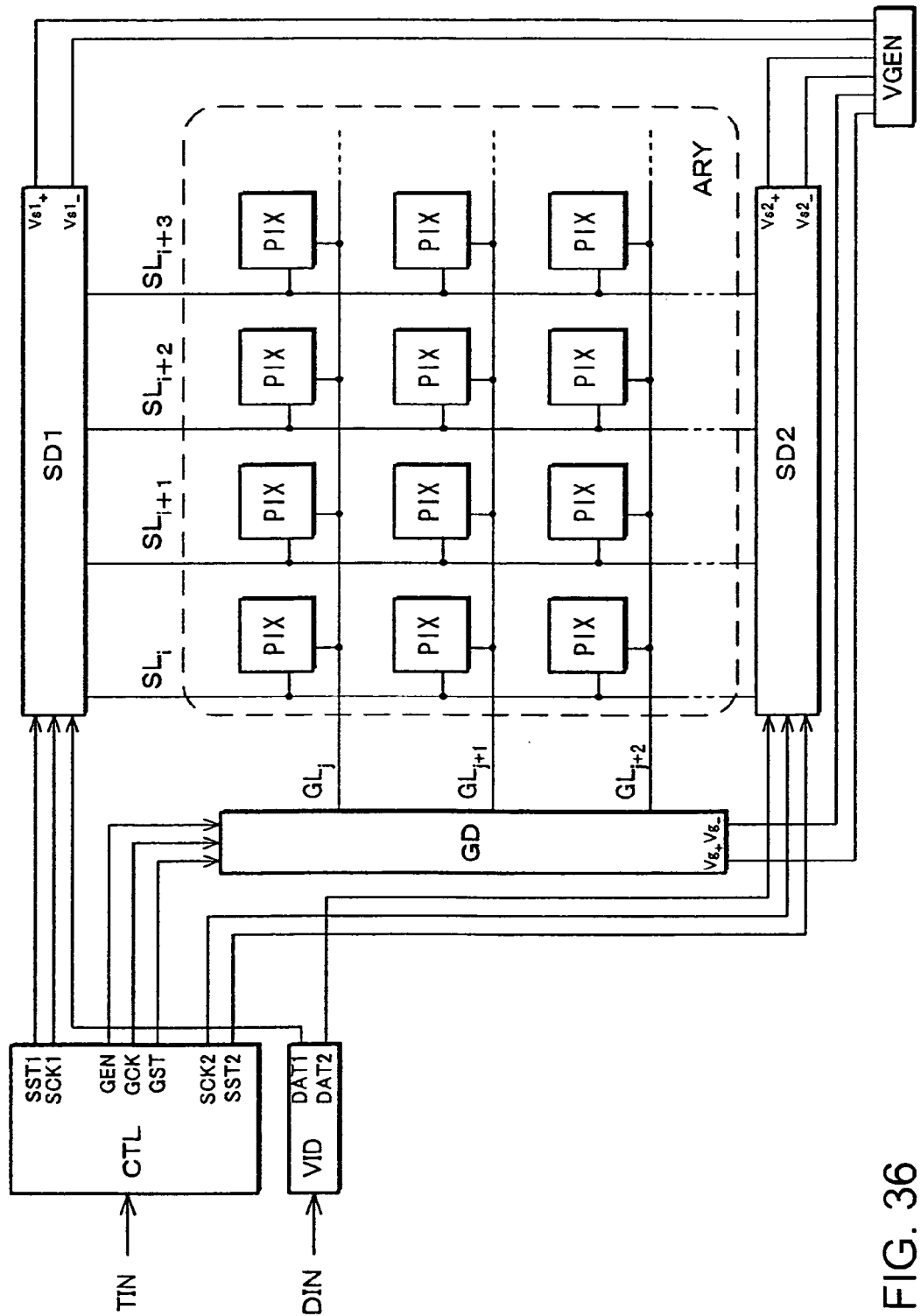
FIG. 36 is a block diagram showing, as an example, another configuration of an image display device in accordance with the present invention.
Figure 37:
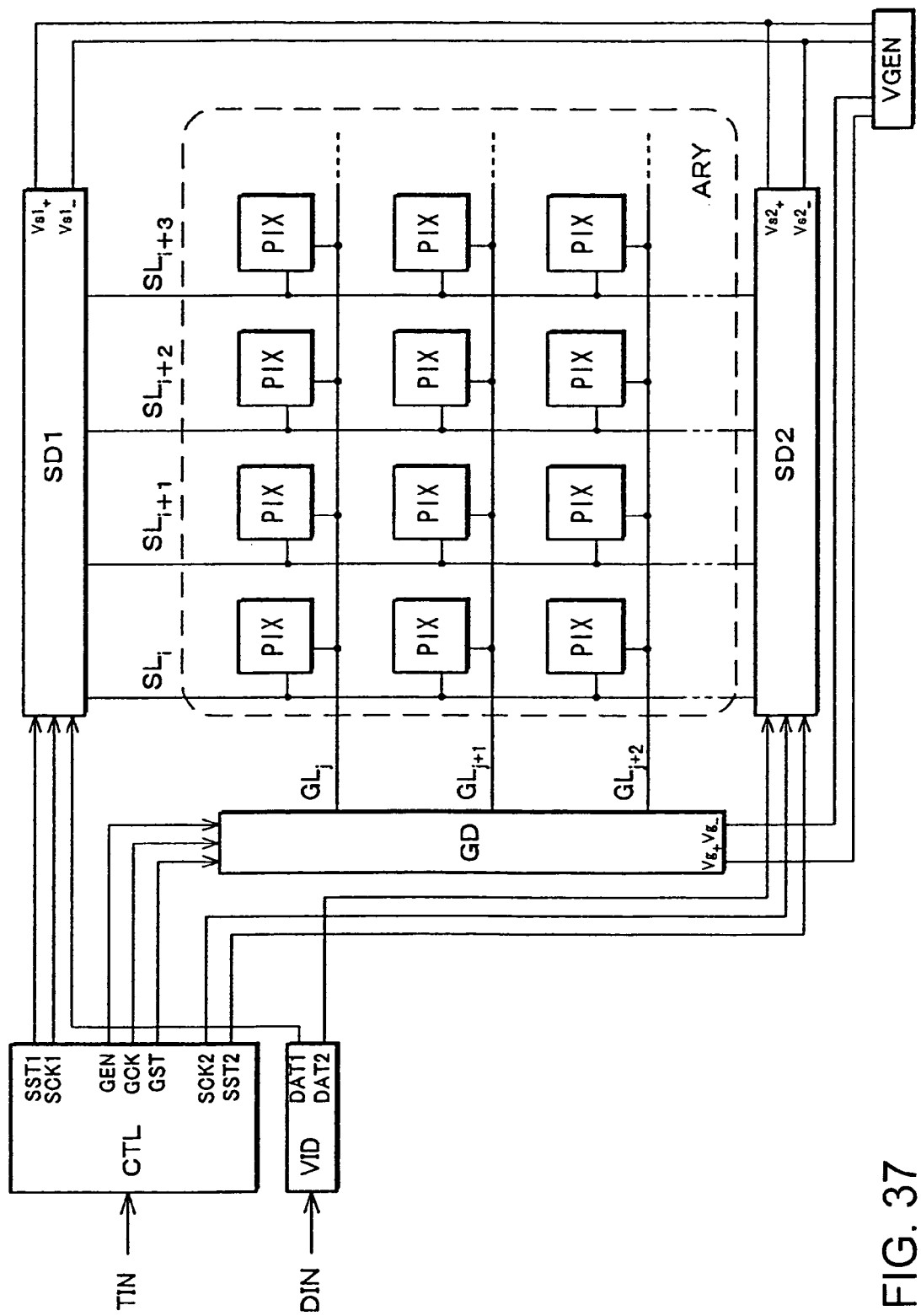
FIG. 37 is a block diagram showing, as an example, another configuration of an image display device in accordance with the present invention.
Figure 38:
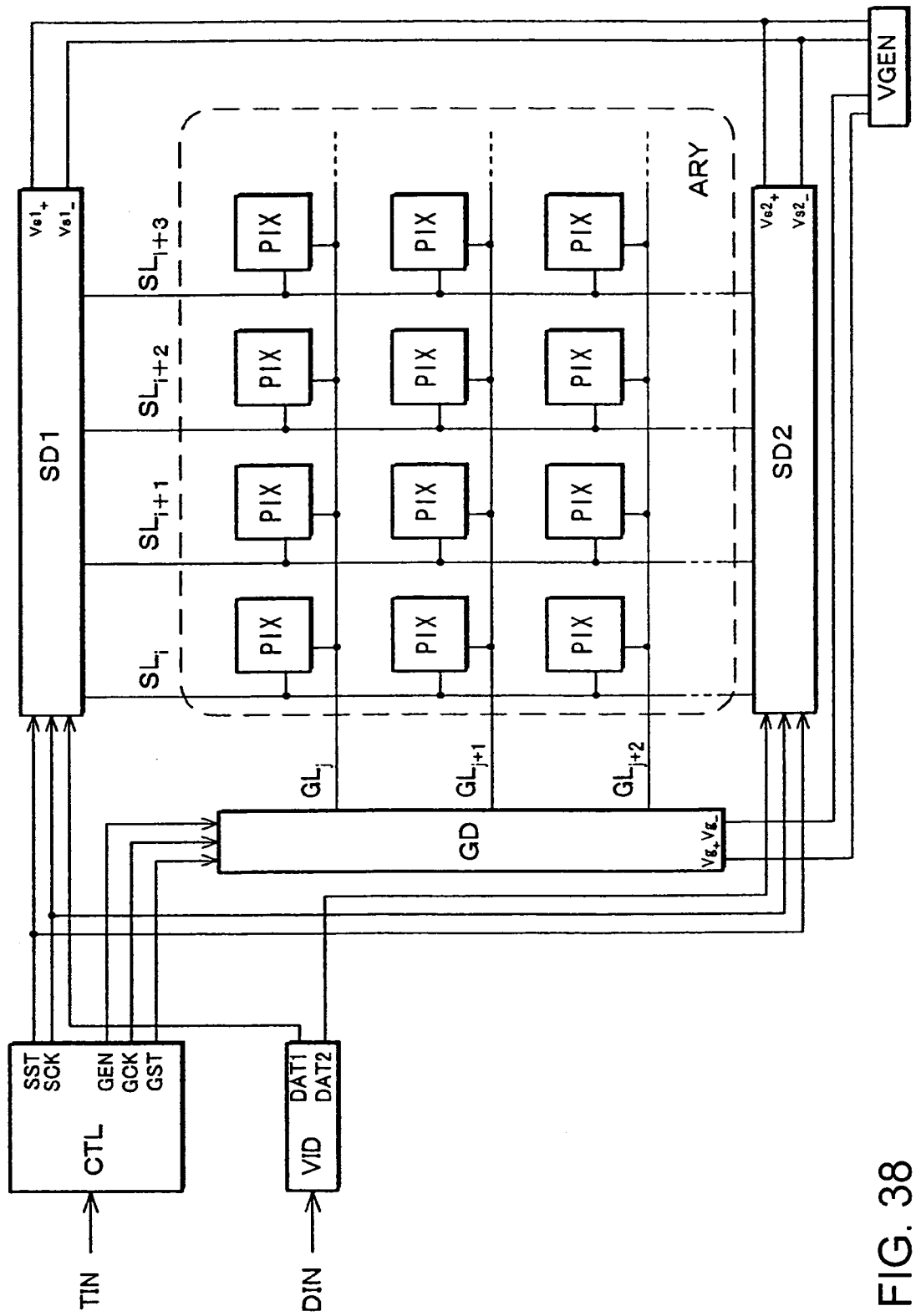
FIG. 38 is a block diagram showing, as an example, another configuration of an image display device in accordance with the present invention.

FIG. 36 to FIG. 38 are diagrams showing, as an example, another configuration in accordance with the present invention. In FIG. 36 to FIG. 38, the image display devices are each composed of a pixel array ARY, data signal line drive circuit SD1 and SD2, a scan signal line drive circuit GD, a timing circuit. CTL for supplying a timing signal, a video signal processing circuit VID for supplying a video signal, and a power source circuit VGEN. In the figure, Vs1+, Vs1−, Vs2+, and Vs2− represent terminals for the data signal line drive circuit at which voltage is inputted from the power source circuit VGEN. Vg+ and Vg− are terminals for the scan signal line drive circuit at which voltage is inputted from the power source circuit VGEN.

Under these circumstances, in the configuration of FIG. 36, the two data signal line drive circuits SD1 and SD2 are connected to different signal terminals of the timing circuit CTL and power source terminals for the power source circuit VGEN. In contrast, in the configuration of FIG. 37, the two data signal line drive circuits SD1 and SD2 are connected to different signal terminals of the timing circuit CTL, but share common power source terminals of the power source circuit VGEN. In the configuration of FIG. 38, the two data signal line drive circuits SD1 and SD2 share common signal terminals of the timing circuit CTL and power source terminals of the power source circuit VGEN.

The two data signal line drive circuits SD1 and SD2 share some common input signals and source voltages. When this is the case, if they share common terminals, the number of terminals can be reduced; however, there is an undesirable possibility of more complex signal line wiring and noise. A choice should be made from these options in view of the overall specifications and configuration of the image display device.

Figure 39:
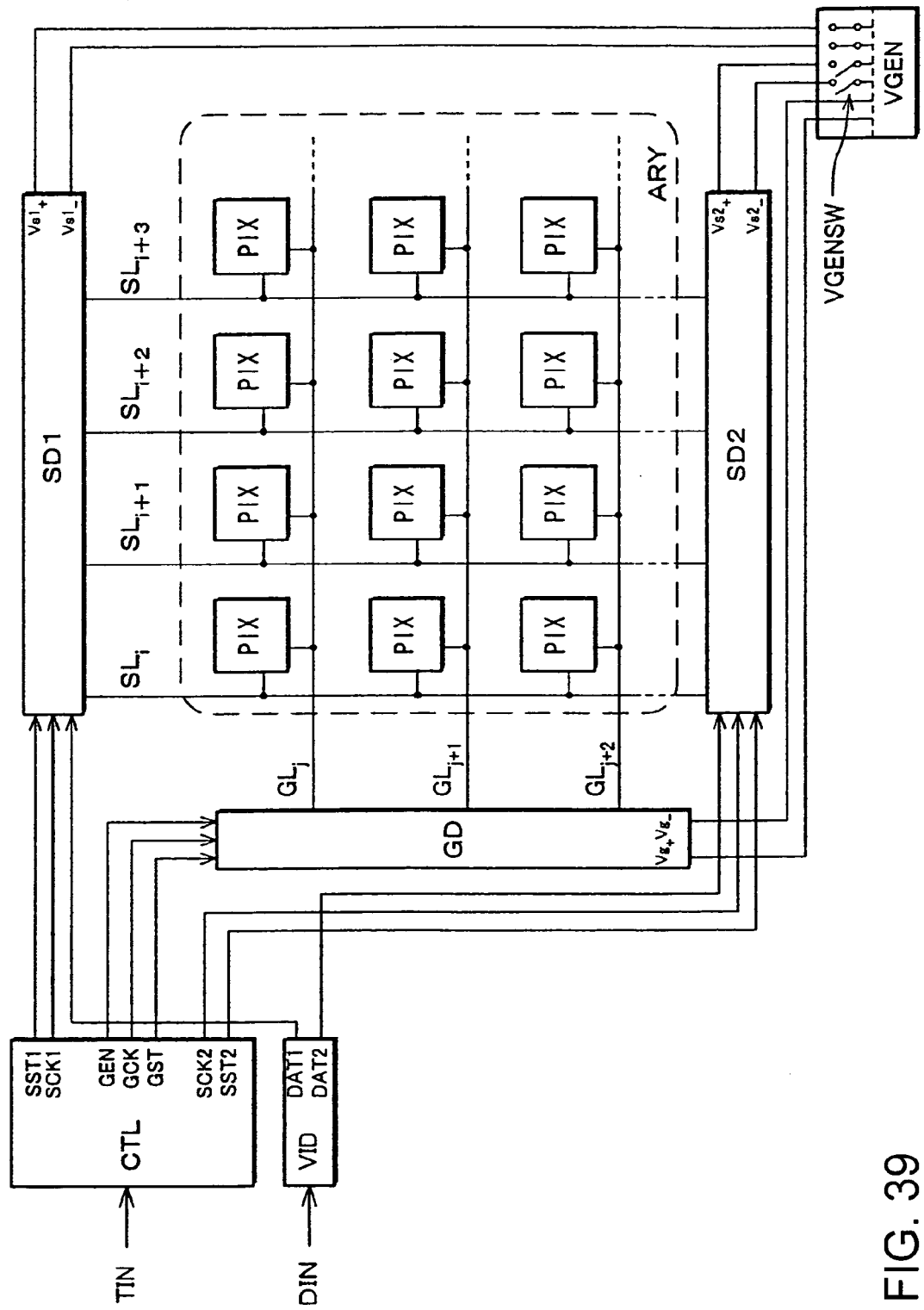
FIG. 39 is a block diagram showing, as an example, another configuration of an image display device in accordance with the present invention.

FIG. 39 is a diagram showing, as an example, another configuration in accordance with the present invention. In FIG. 39, the image display device is composed of a pixel array ARY, data signal line drive circuits SD1 and SD2, a scan signal line drive circuit GD, a timing circuit CTL for supplying a timing signal, a video signal processing circuit VID for supplying a video signal, and a power source circuit VGEN. Under these circumstances, there is provided a switch VGENSW for controlling a power supply from the power source circuit VGEN so that the non-operating data signal line drive circuit is not fed with a power supply. The non-operating data signal line drive circuit thereby consumes no power at all, effectively reducing the total power consumption. The switch VGENSW is controllable through, for example, the detection circuit SEN (see FIG. 34) and the identification circuit JDG (see FIG. 35).

Figure 40:
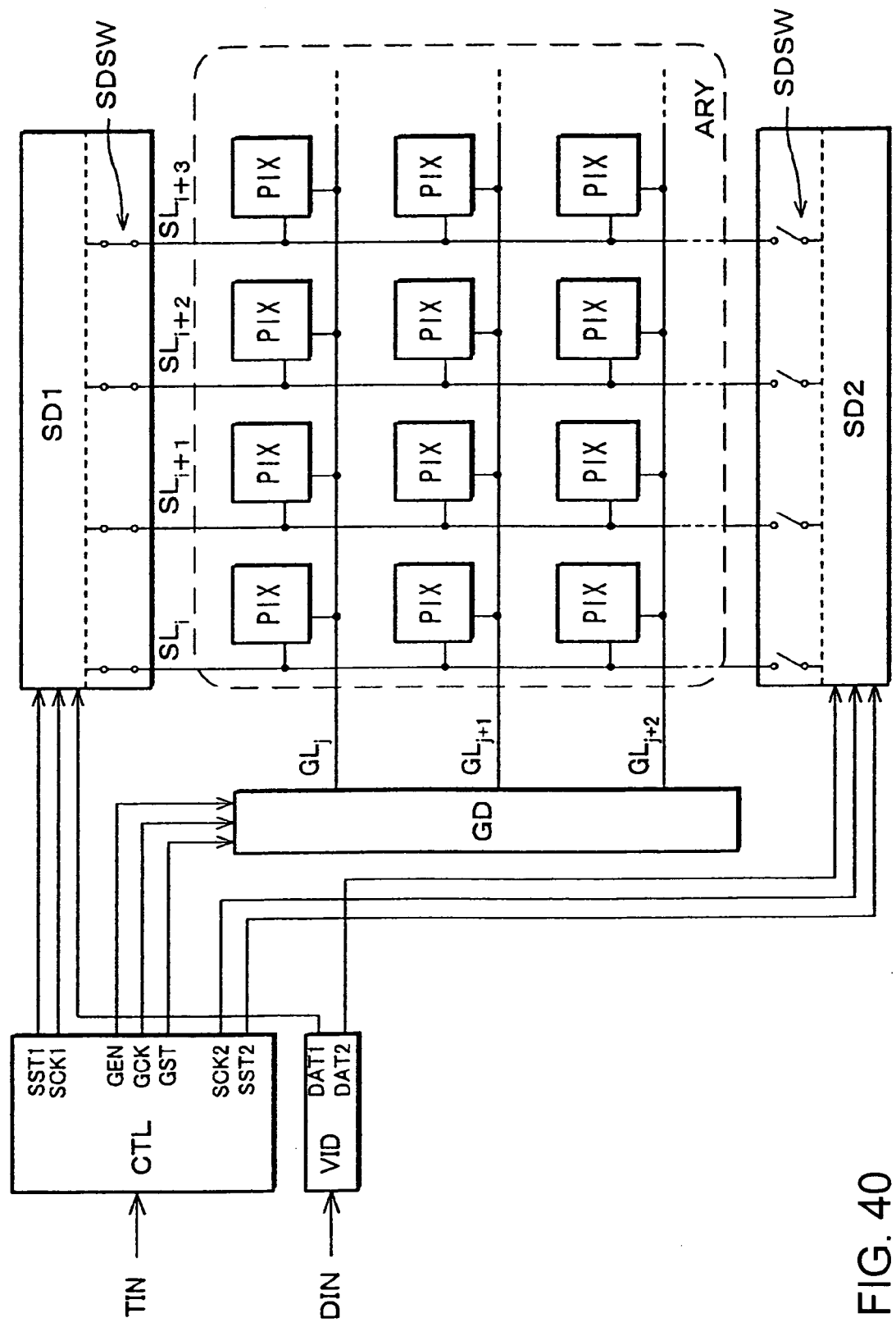
FIG. 40 is a block diagram showing, as an example, another configuration of an image display device in accordance with the present invention.

FIG. 40 is a diagram showing, as an example, another configuration in accordance with the present invention. In FIG. 40, the image display device is composed of a pixel array ARY, data signal line drive circuits SD1 and SD2, a scan signal line drive circuit GD, a timing circuit CTL for supplying a timing signal, and a video signal processing circuit VID for supplying a video signal.

Under these circumstances, switches (drive circuit isolating means) SDSW are interposed between the two data signal line drive circuits SD1 and SD2 and the data signal line SL. The data signal line SL is electrically connected only to one of the two data signal line drive circuits. The switches SDSW are controllable by means of, for example, the selection signals SCS1 and SCS2 (see FIG. 26).

Figure 41:
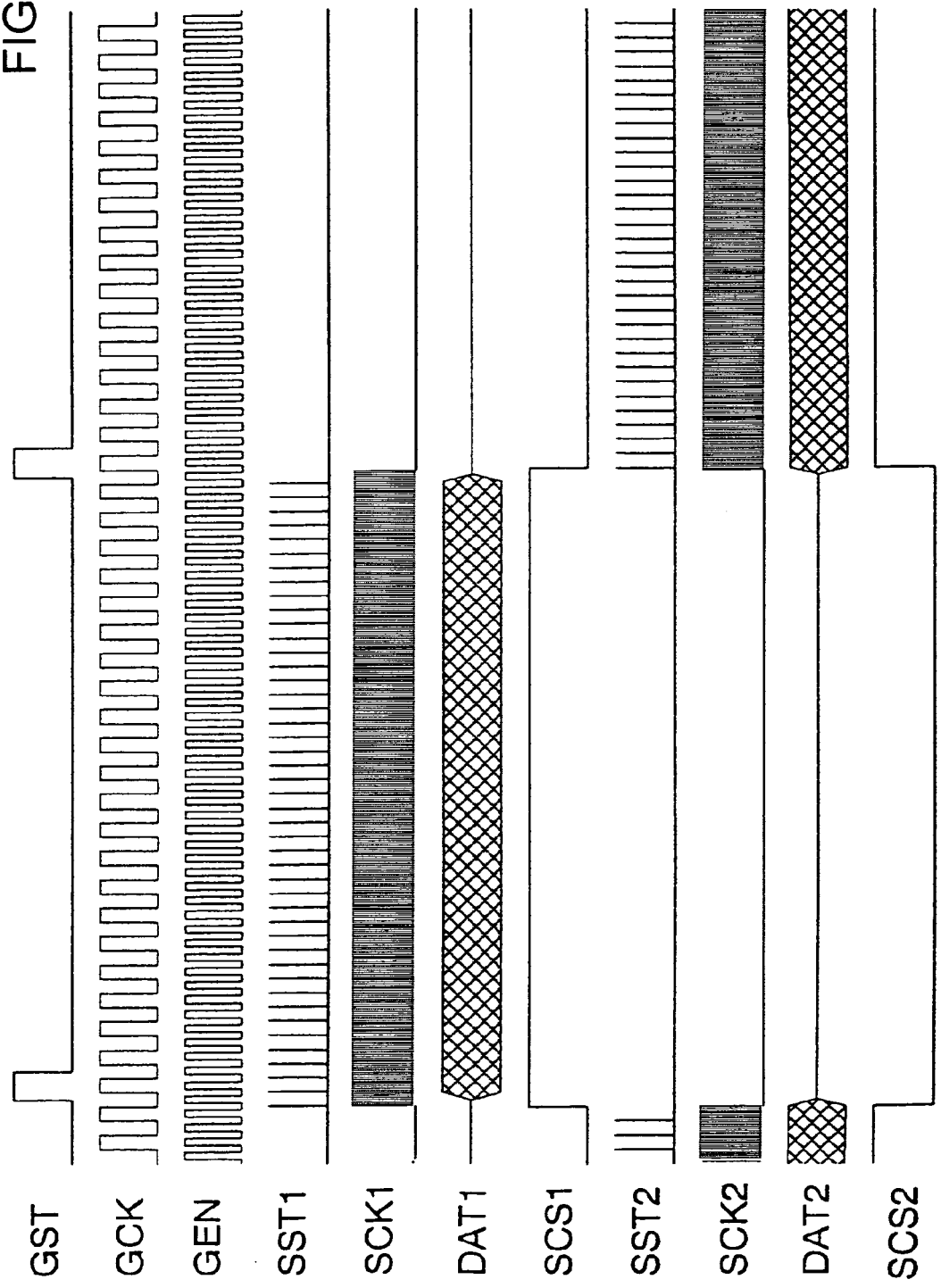
FIG. 41 is an explanatory drawing showing, as an example, another timing chart of an image display device in accordance with the present invention.

The data signal line drive circuit, depending on its configuration, may output a constant voltage signal while it is not operating. When this is the case, the output signals from the two data signal line drive circuits may interfere with each other, failing to provide a desired signal. Such an inconvenience is avoidable by electrically isolating one of the two data signal line drive circuits as in the present configuration example. FIG. 41 shows a timing chart under these circumstances.

Figure 42:
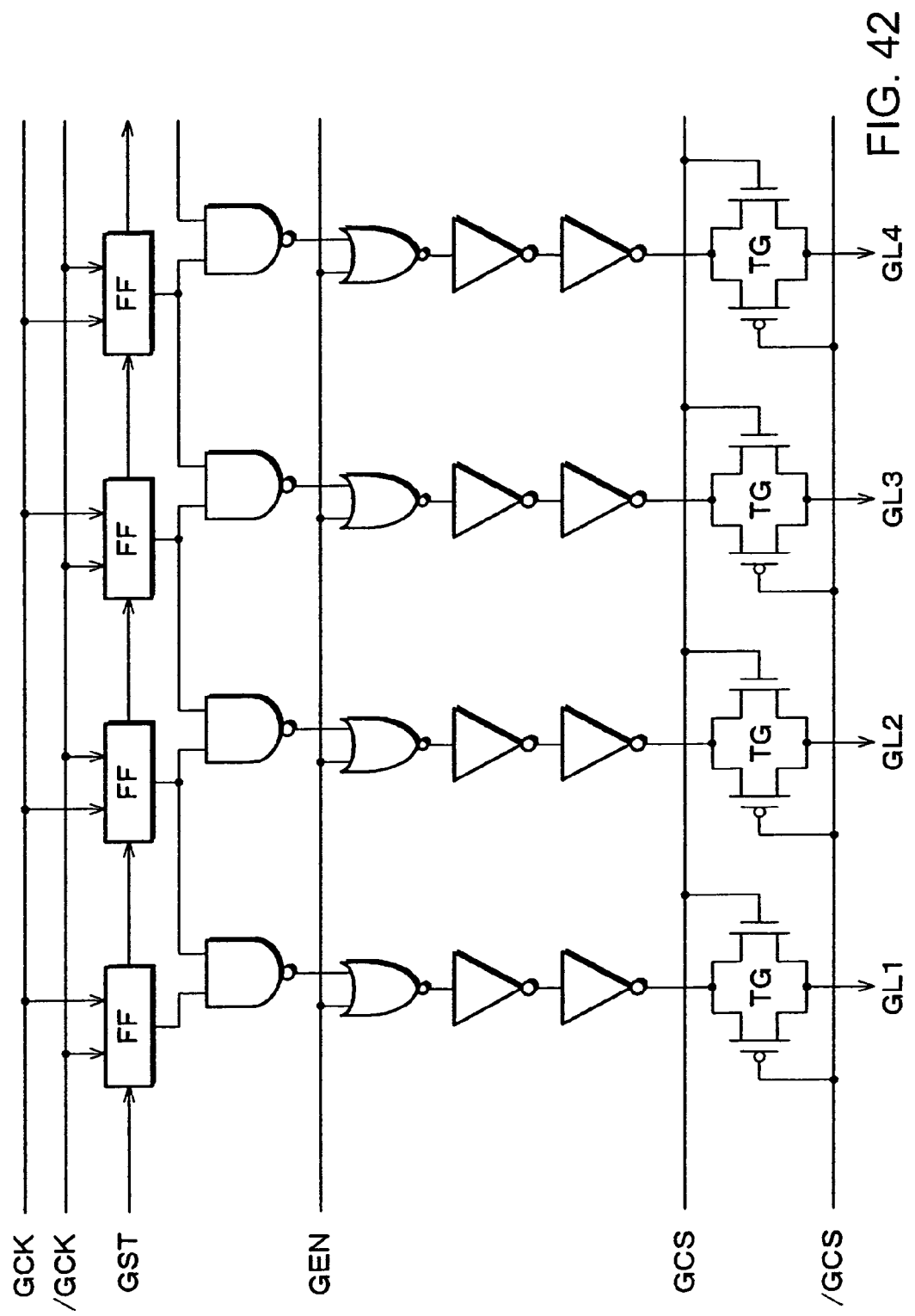
FIG. 42 is an explanatory drawing showing, as an example, another configuration of a scan signal line drive circuit constituting an image display device in accordance with the present invention.

Similarly, to avoid output signals from the two scan signal line drive circuits from interfering with each other and failing to provide desired signals, the configuration of the scan signal line drive circuit includes, as shown in FIG. 42, a control switch TG after the buffer (inverter circuit in the figure) in the final stage.

FIGS. 43(*a*), 43(*b*), 44(*a*), and 44(*b*) are diagrams showing, as an example, another configuration in accordance with the present invention. In FIG. 43(*a*) and FIG. 43(*b*), the display modes and display formats are switched by selecting the drive circuit which will operate, so as to choose between high display quality (see FIG. 43(*a*)) and low display quality (see FIG. 43(*b*)). The display quality here refers to resolution, display halftones, and the number of display colors, including display types: namely, a transmissive display or a reflective display.

In FIG. 44(*a*) and FIG. 44(*b*), the display modes and the display format are similarly switched by selecting the drive circuit which will operate, so as to choose between high power consumption (see FIG. 44(*a*)) and low power consumption (see FIG. 44(*b*)). The power consumption here includes that by the backlight depending whether the transmissive display or reflective display is selected.

Figure 45:
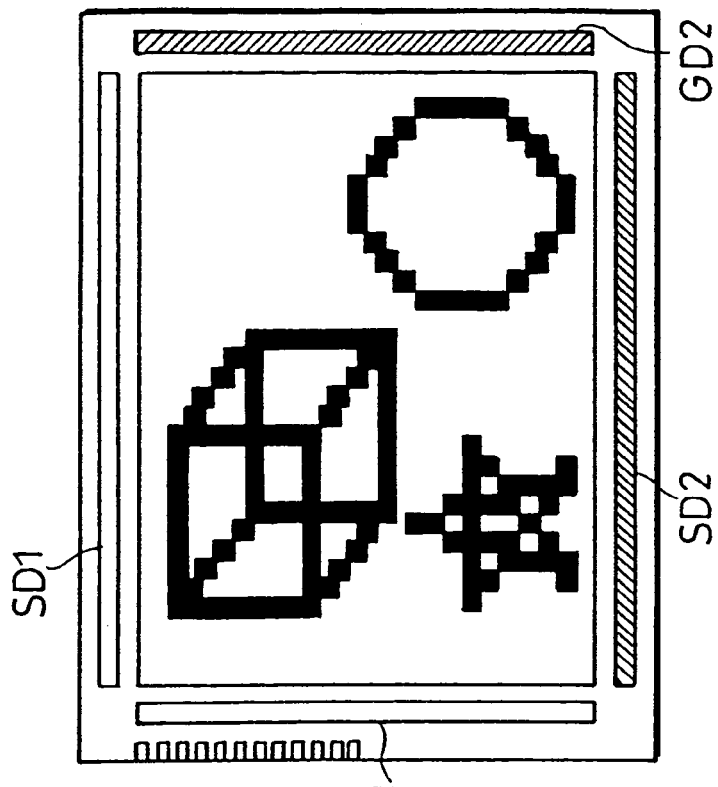
FIG. 45(a) and FIG. 45(b) are explanatory drawings showing, as an example, another by an image display device in accordance with the present invention.
Figure 45:
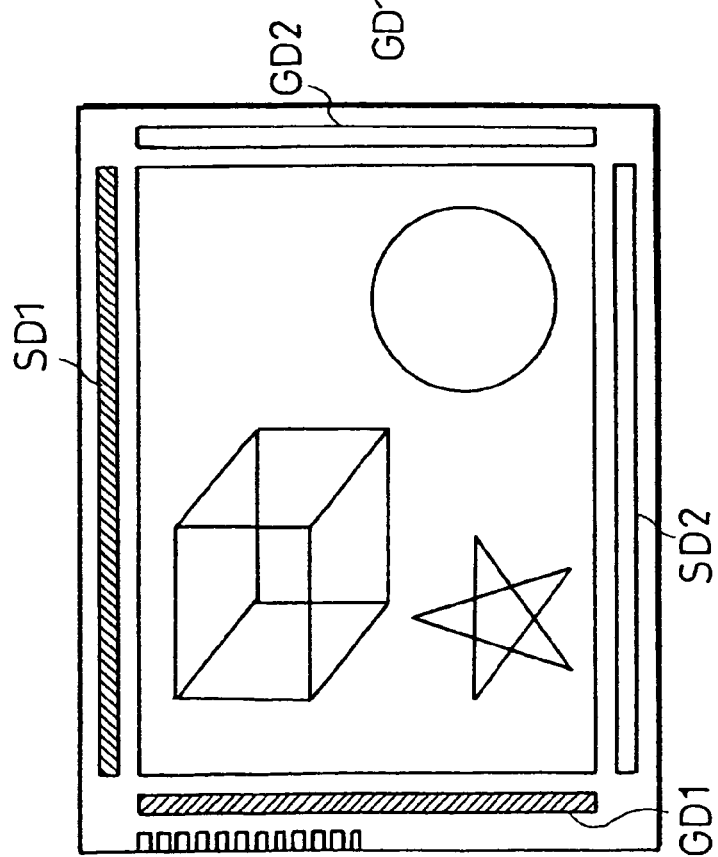

FIG. 45(*a*) and FIG. 45(*b*) are diagrams showing, as an example, another configuration in accordance with the present invention. FIG. 45(*a*) and FIG. 45(*b*) show low and high resolution display respectively. The low resolution display is produced by writing the same signal to a plurality of data signal lines and scan signal lines. The number of signal lines to the drive circuits and the number of the units in the drive circuits are therefore reduced, which results in creating a merit of smaller power consumption.

Figure 46:
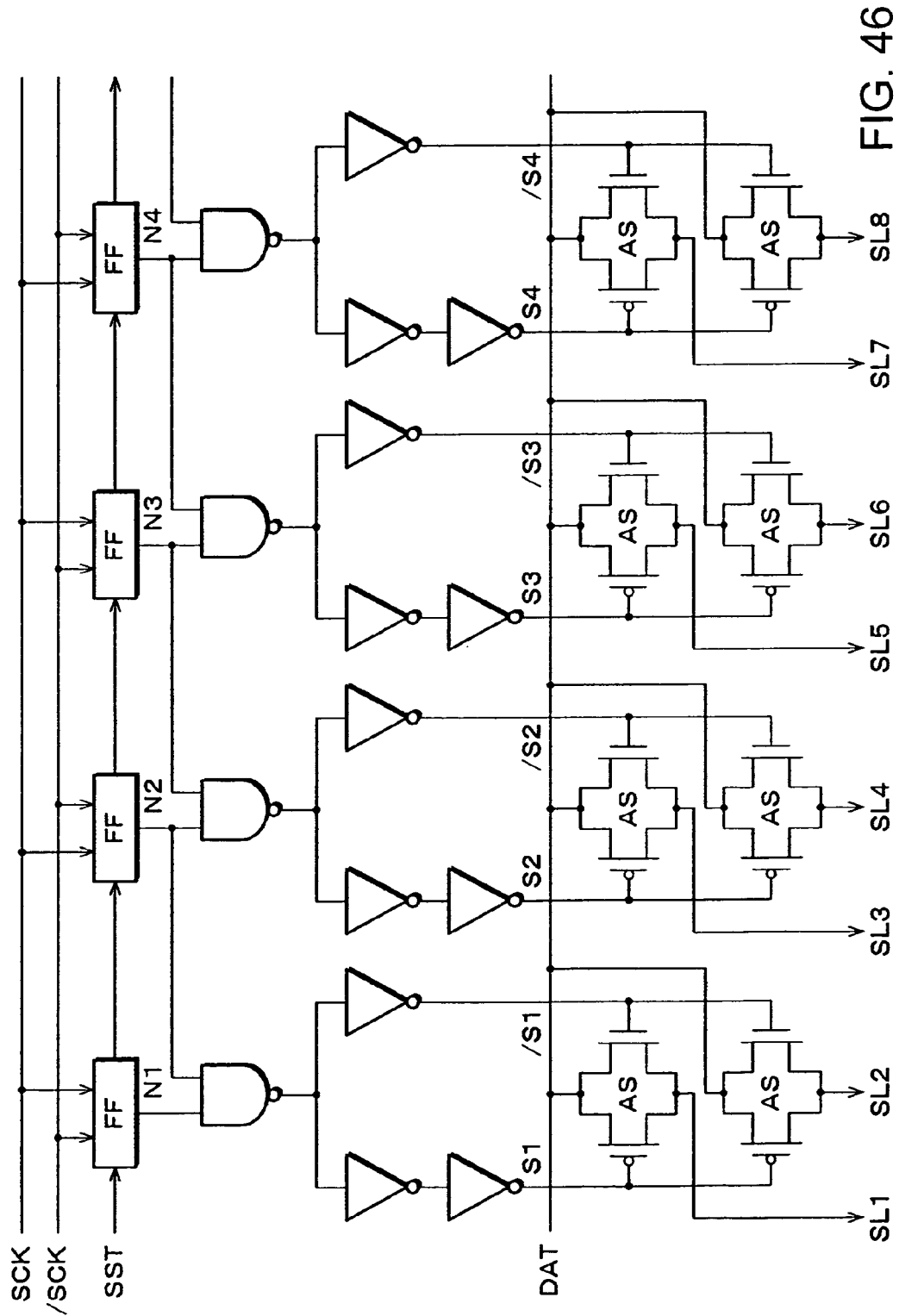
FIG. 46 is an explanatory drawing showing, as an example, another configuration of a data signal line drive circuit constituting an image display device in accordance with the present invention.
Figure 47:
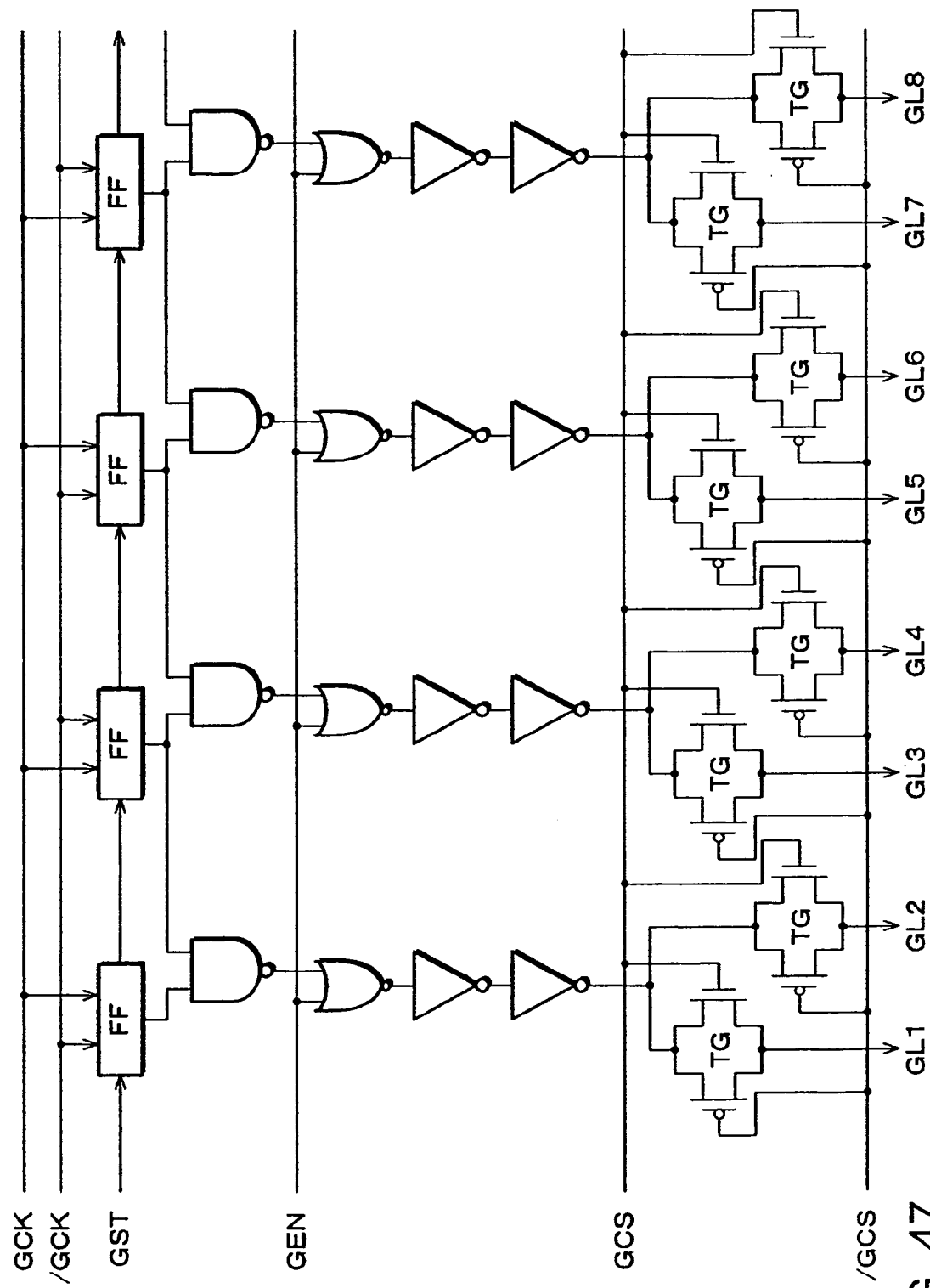
FIG. 47 is an explanatory drawing showing, as an example, a configuration of a scan signal line drive circuit constituting an image display device in accordance with the present invention.

Under these circumstances, to change the display resolution, the data signal line drive circuit and the scan signal line drive circuit are configured either as in FIG. 46 or FIG. 47. In the configurations of FIG. 46 and FIG. 47, the outputs of the drive circuits are coupled to a plurality of signal lines (two signal lines in FIG. 46 and FIG. 47: the data signal line and the scan signal line); therefore, the same signal is written to the plurality of signal lines.

Figure 48:
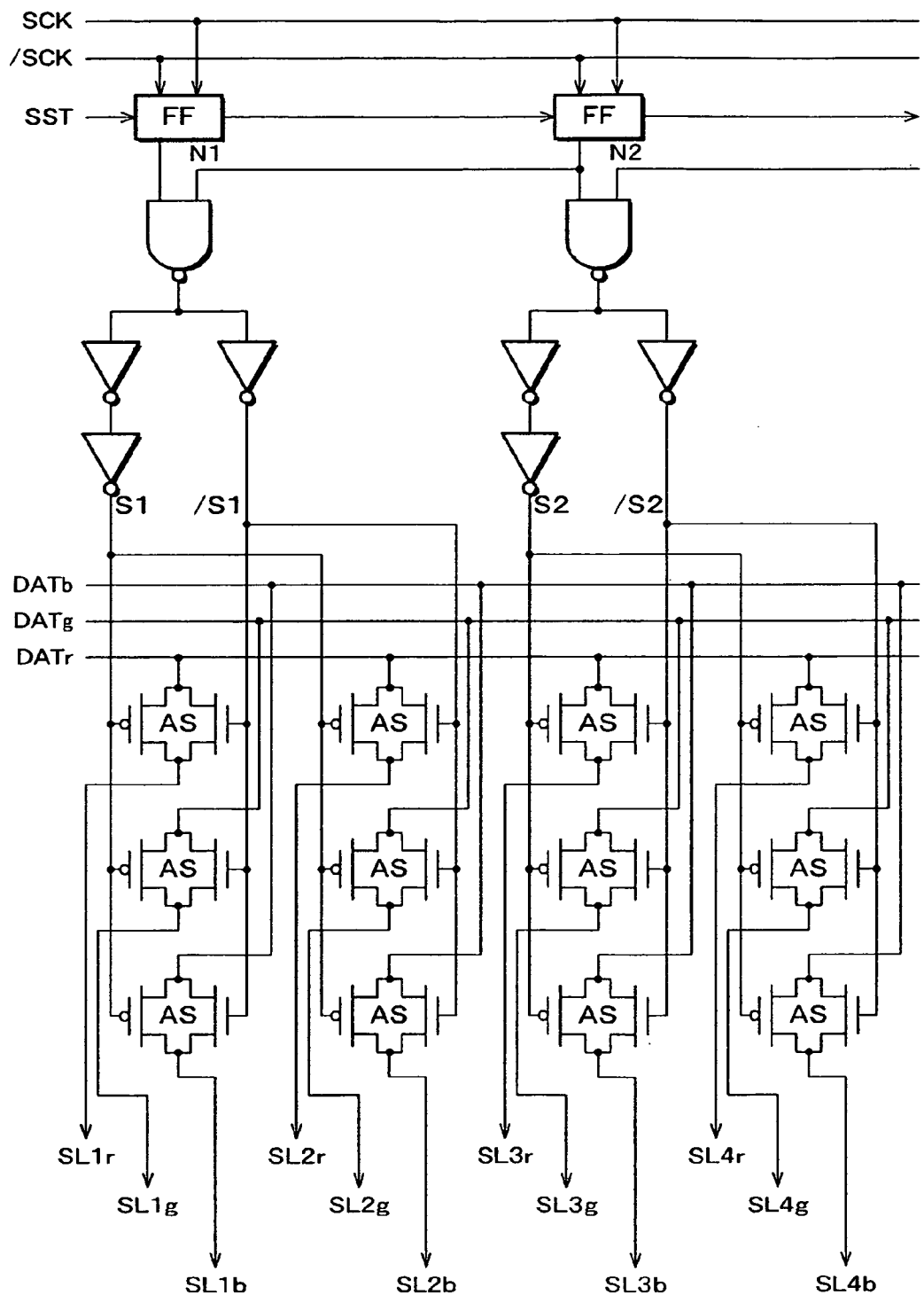
FIG. 48 is an explanatory drawing showing, as an example, another configuration of a data signal line drive circuit constituting an image display device in accordance with the present invention.

Under these circumstances, in a color display, to change display resolution, the same video signal is written not only to adjacent data signal lines, but also to closely located data signal lines for the same color. FIG. 48 shows a configuration example of the data signal line drive circuit under these circumstances.

Figure 49:
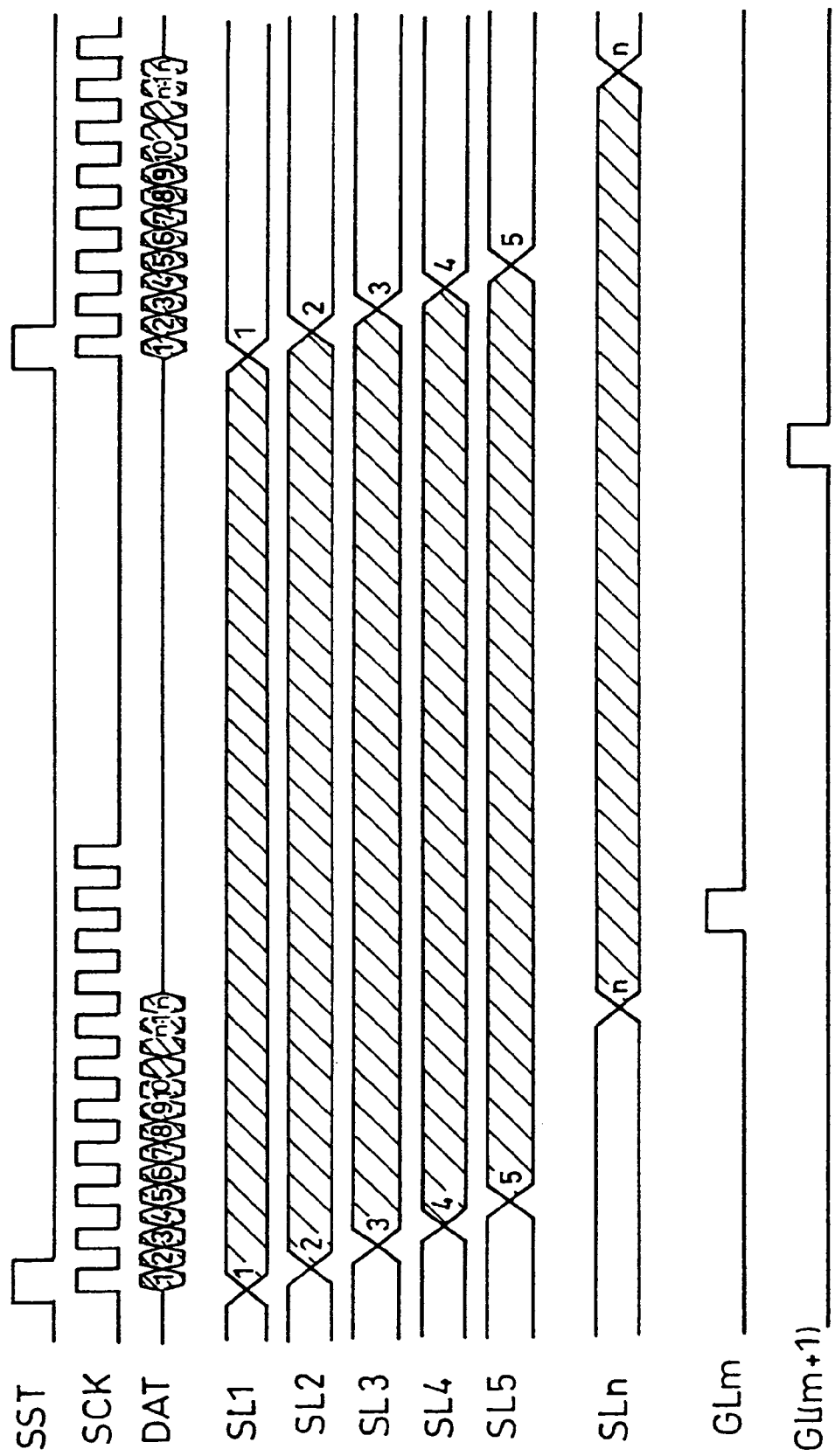
FIG. 49 is an explanatory drawing showing, as an example, another timing chart of an image display device in accordance with the present invention.

FIG. 49 shows, an example, a timing chart when the resolution is reduced for the scan signal lines. To reduce the resolution, the same video signal is written to pixels of a plurality of lines. Under these circumstances, as in FIG. 49, by holding the video signal written to the data signal line by the data signal line drive circuit for a plurality of horizontal scan periods, the operation of the data signal line drive circuit is temporarily suspended, reducing the total power consumption by the data signal line drive circuit. In other words, After applying a data signal (potential) to data signal lines during a horizontal scan period (referred to as "A"), no new data signals are applied to the data signal lines by the data signal line drive circuit during the immediately succeeding horizontal scan period and, optionally, one or more following horizontal scan periods. This causes the data signal lines to sustain its potential at that of the data signal applied during the horizontal scan period A during successive horizontal scan periods including the horizontal scan period A.

Figure 50:
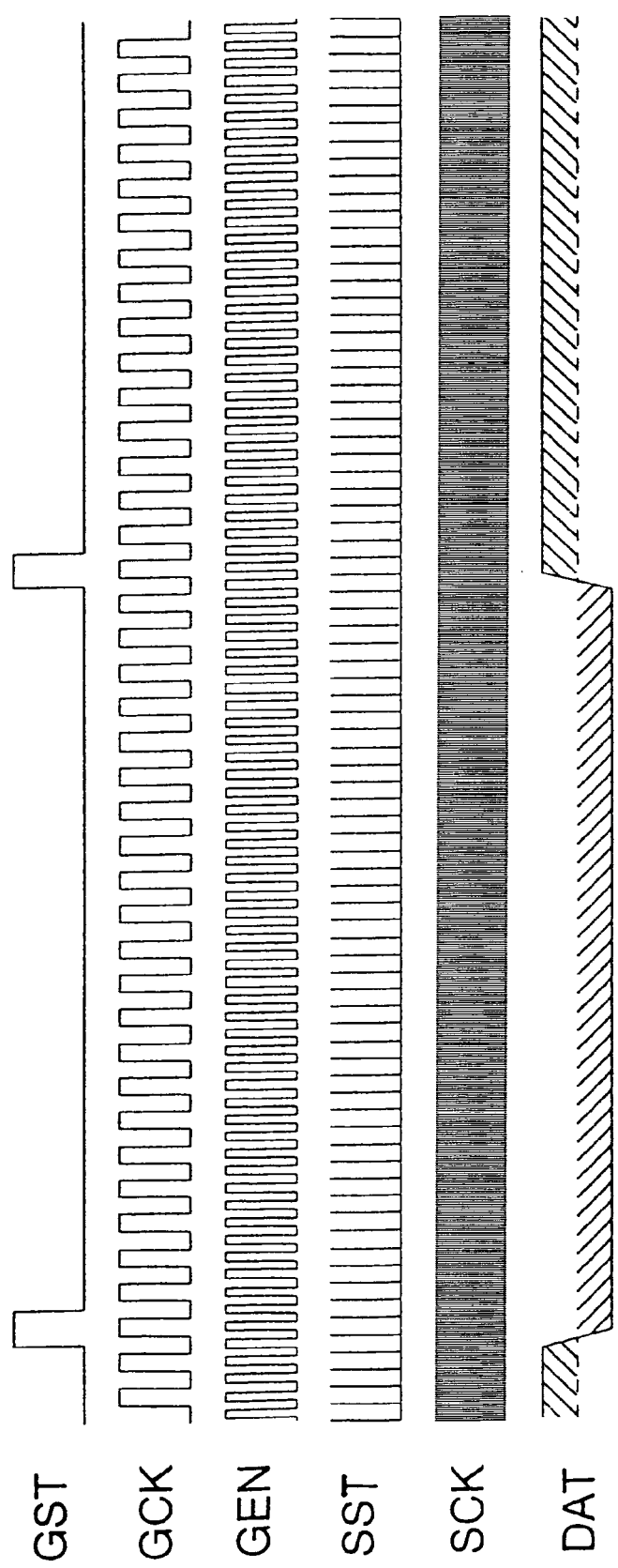
FIG. 50 is an explanatory drawing showing, as an example, another timing chart of an image display device in accordance with the present invention.

Under these circumstances, to restrict the difference in variations of the pixel potential caused by the parasitic capacitance between vertically adjacent pixels, the polarity of the video signal in the data signal lines preferably remains unchanged throughout one screen (one frame) period. FIG. 50 shows a timing chart under these circumstances.

Figure 51:
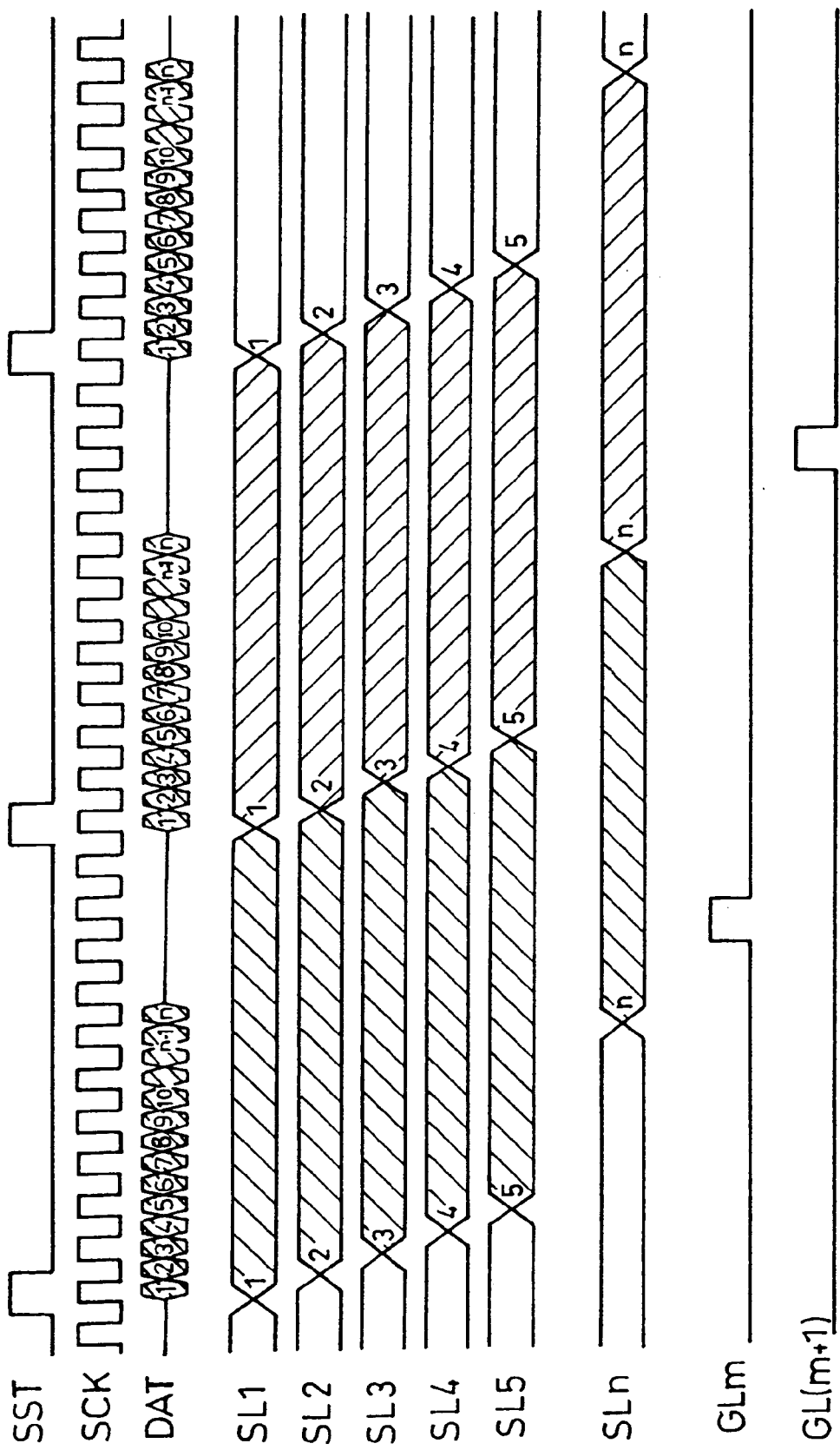
FIG. 51 is an explanatory drawing showing, as an example, another timing chart of an image display device in accordance with the present invention.
Figure 52:
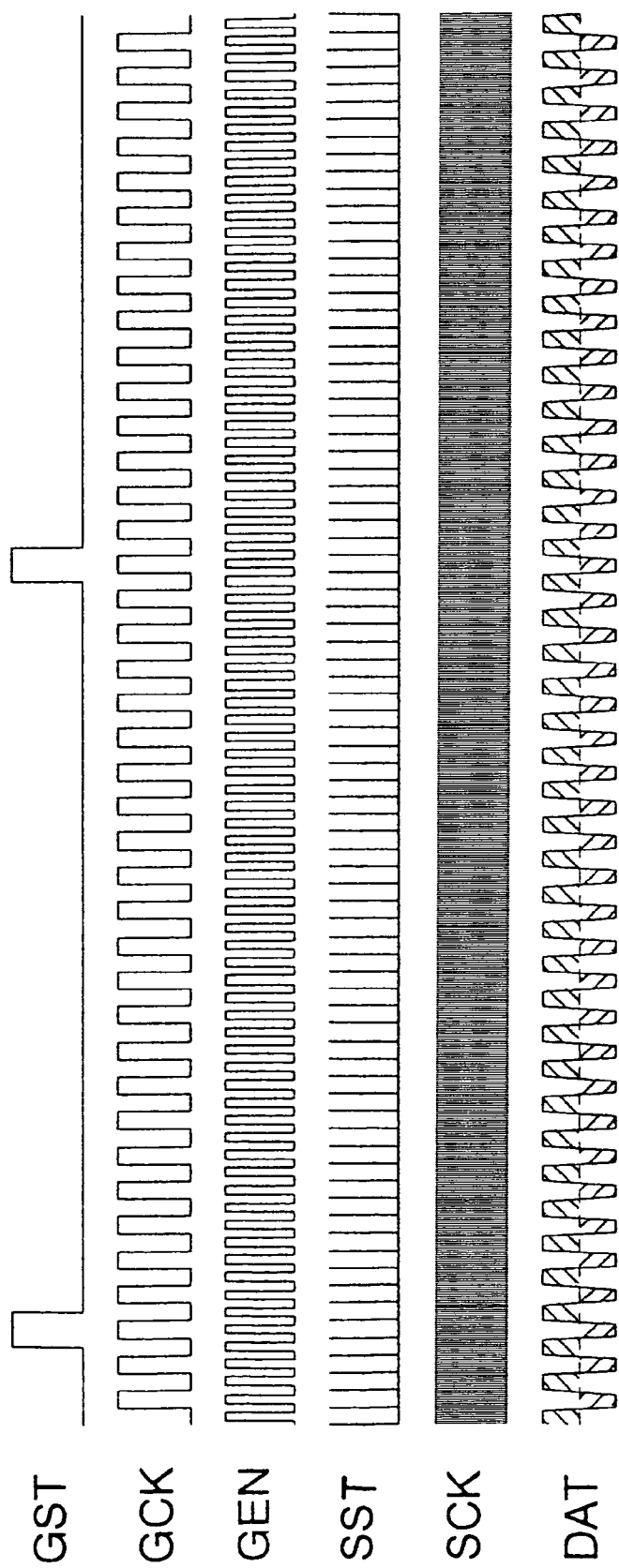
FIG. 52 is an explanatory drawing showing, as an example, another timing chart of an image display device in accordance with the present invention.
Figure 53:
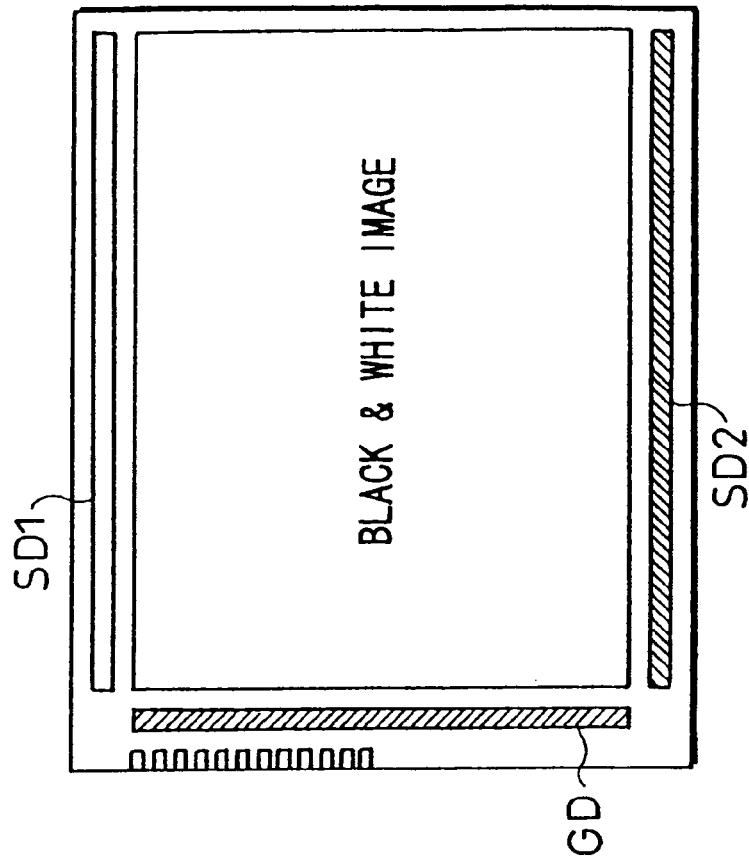
FIG. 53(a) and FIG. 53(b) are explanatory drawings showing, as an example, another display by an image display device in accordance with the present invention.
Figure 53:
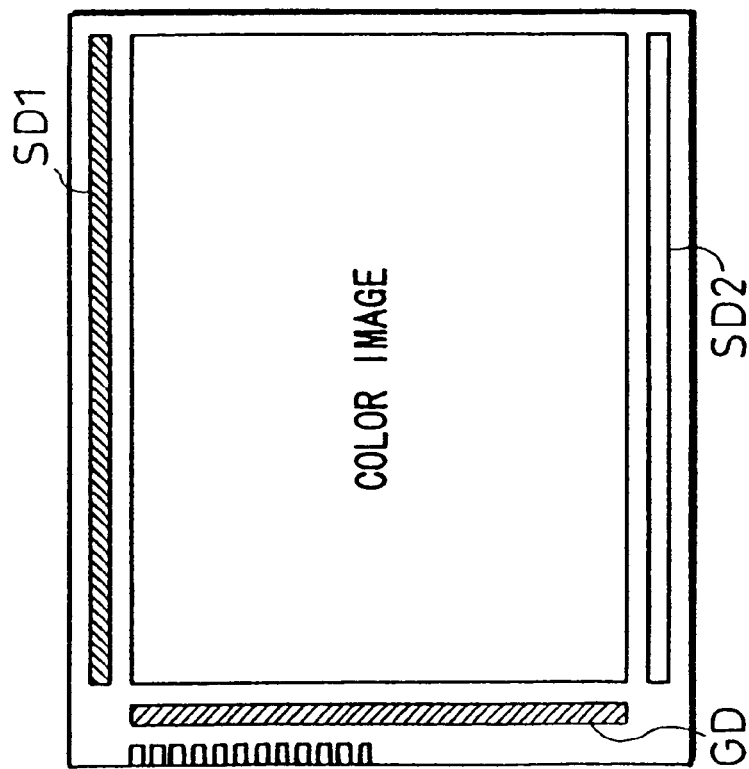

FIG. 51 and FIG. 52 show, further examples, timing charts when the resolution is reduced for the scan signal lines. In FIG. 51 and FIG. 52, a video signal is written to the pixel with its absolute value remaining unchanged, but polarity being altered, during each horizontal scan period. This configuration eliminates the difference in variations of the pixel potential and thereby achieves high display quality.

FIG. 53(a) to FIG. 56(b) are diagrams showing, as examples, another configuration in accordance with the present invention. FIG. 53(a) to FIG. 56(b) also show examples of quality of a video display being switchable by selecting the drive circuit which will operate.

In FIG. 53(a) and FIG. 53(b), one of the two switchable options (FIG. 53(a)) is a color display, and the other option (FIG. 53(b)) is a black & white display. A black & white display is produced by writing the same signal to a plurality of data signal lines corresponding to the R (red), G (green), and B (blue) color display. The number of signal lines to the drive circuits and the number of the units in the drive circuits are therefore reduced, which results in creating a merit of smaller power consumption.

Figure 54:
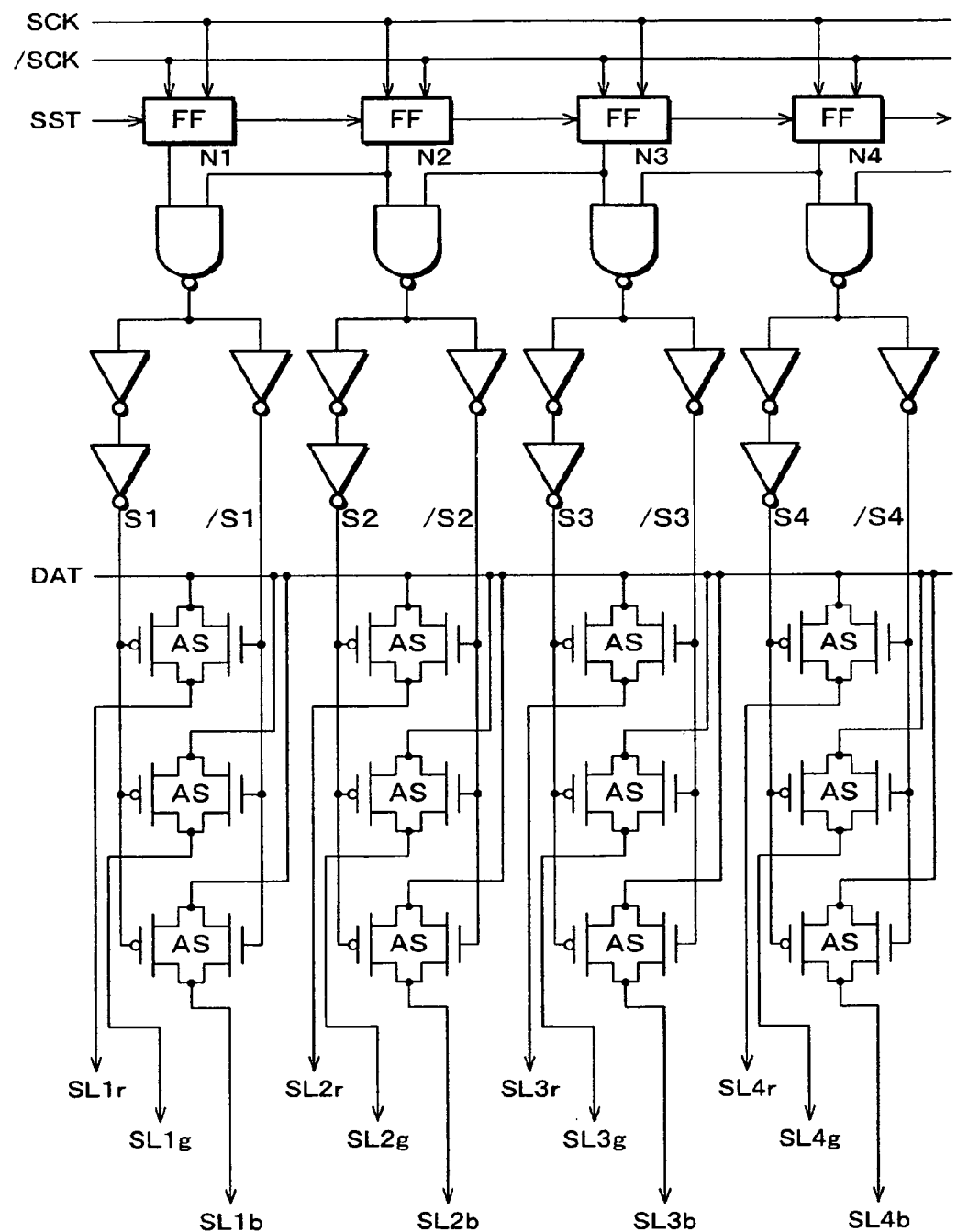
FIG. 54 is an explanatory drawing showing, as an example, another configuration of a data signal line drive circuit constituting an image display device in accordance with the present invention.
Figure 55:
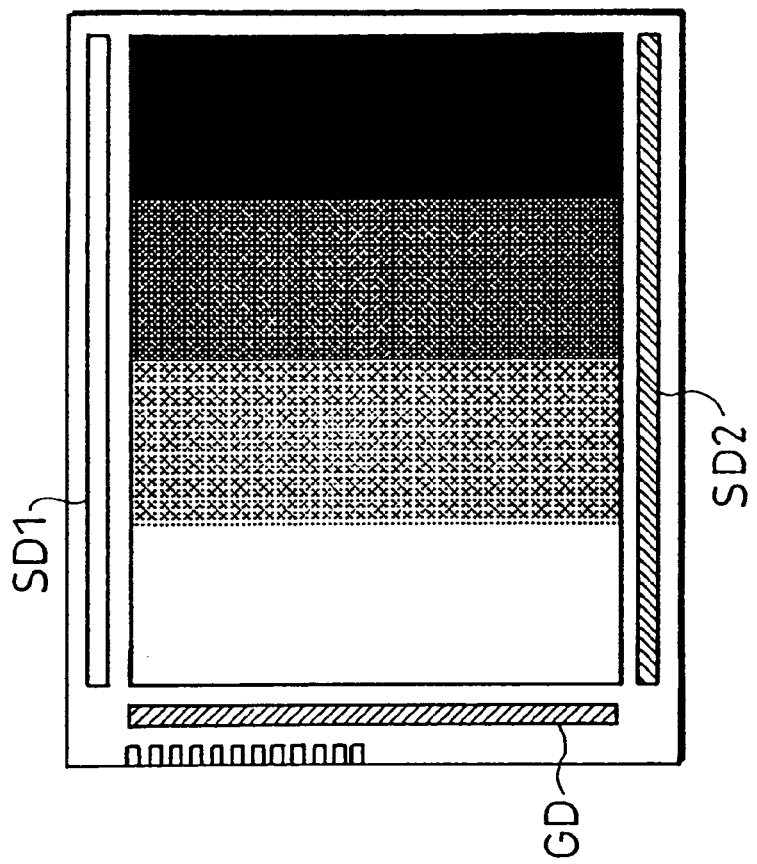
FIG. 55(a) and FIG. 55(b) are explanatory drawings showing, as an example, another display by an image display device in accordance with the present invention.
Figure 55:
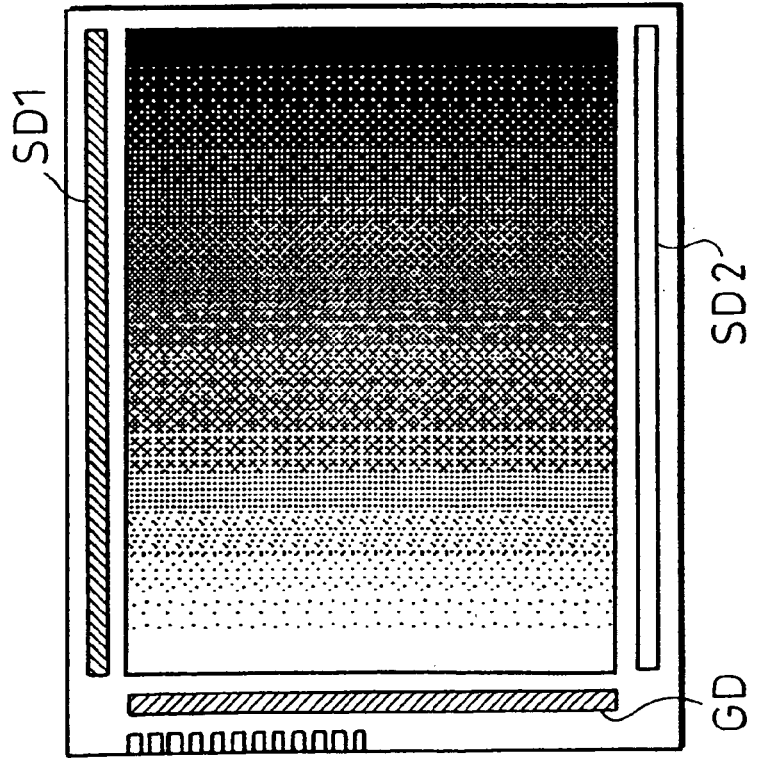
Figure 56:
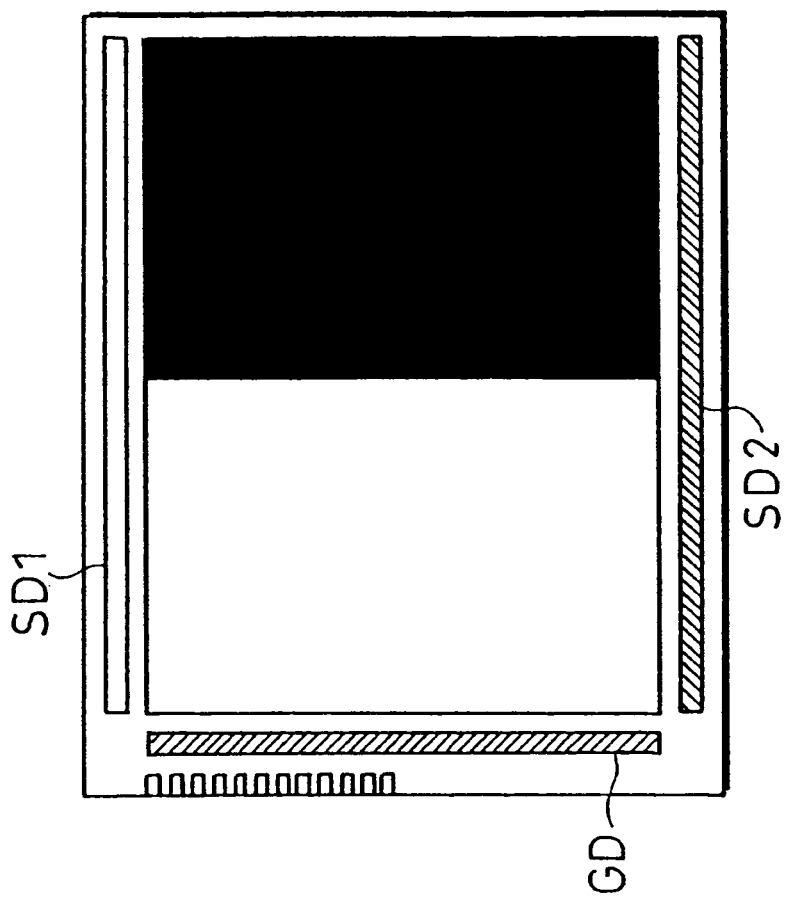
FIG. 56(a) and FIG. 56(b) are explanatory drawings showing, as an example, another display by an image display device in accordance with the present invention.
Figure 56:
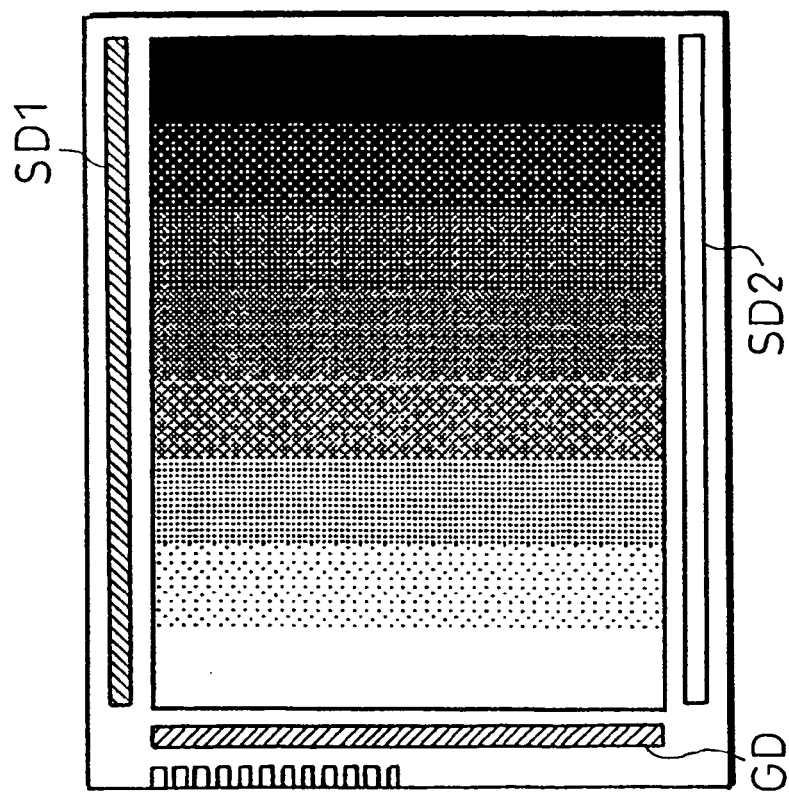

FIG. 54 shows a configuration example of the data signal line drive circuit under these circumstances, whereby the video signal from the same video signal line DAT is written to three data signal lines SL1r, SL1g, and SL1b corresponding to R, G, and B respectively. The configuration enables a black & white display (including intermediate tones, such as gray of various shades).

Alternatively, the configuration of FIG. 48 and the configuration of FIG. 54 may be combined. Specifically, in the combined configuration, the video signal from the same video signal line DAT is written to a plurality of sets of data signal lines SL1r, SL1g, SL1b, SL2r, SL2g, and SL2b corresponding to R, G, and B respectively. The configuration a data signal line drive circuit to be realized with low resolution and a black & white display. Here, the data signal line drive circuit can be further reduced in size, which further cuts down on power consumption.

In FIG. 55(a) and FIG. 55(b), one of the two switchable options (FIG. 55(a)) displays multitones (16 halftones), and the other option (FIG. 55(b)) displays less halftones (4 halftones). In FIG. 56(a) and FIG. 56(b), one of the two switchable options (FIG. 56(a)) displays multitones (8 halftones), and other option (FIG. 56(b)) displays black & white (2 halftones). A digital drive circuit, when used to produce a display of a smaller number of halftones, requires less externally inputted video signals and a less complex circuit configuration, resulting in reduced power consumption. In some configurations, only a reference voltage selection circuit needs to be provided, with no digital-analog converter circuit or amplifier circuit, resulting in further reduced power consumption.

Figure 57:
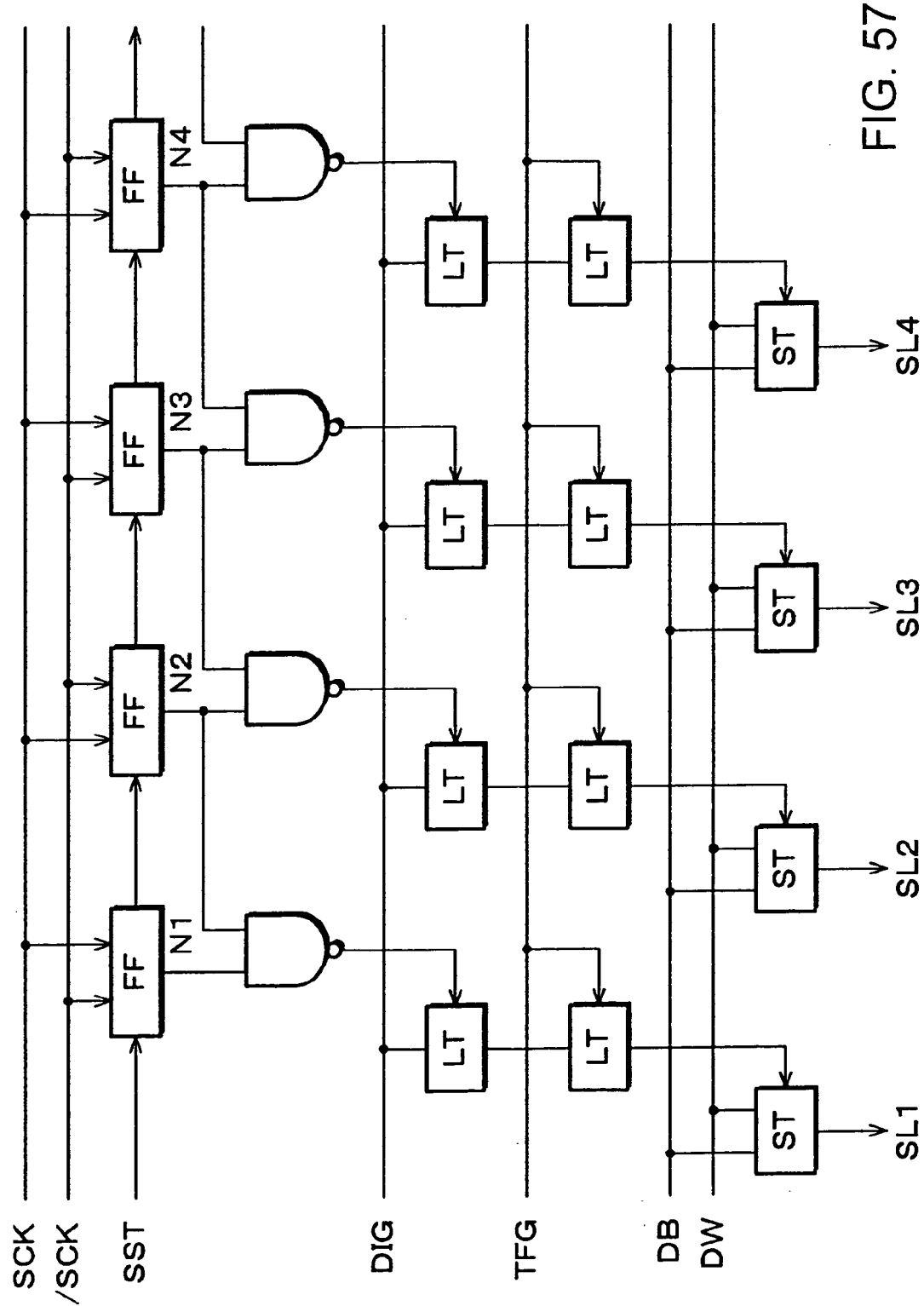
FIG. 57 is an explanatory drawing showing, as an example, another configuration of a data signal line drive circuit constituting an image display device in accordance with the present invention.

FIG. 57 shows a configuration example of a binary output drive circuit producing a two-halftone display. Either a for-white-display reference signal DW and a for-black-display reference signal DB is selected according to the inputted digital video signal DIG for an output to the data signal line SL.

The binary output drive circuit only includes digital circuits and has a very simple configuration, thereby resulting in reduced power consumption while the circuit is operating. In other words, power consumption is reduced in binary display by writing a video signal using a drive circuit specifically configured for binary outputs.

Figure 58:
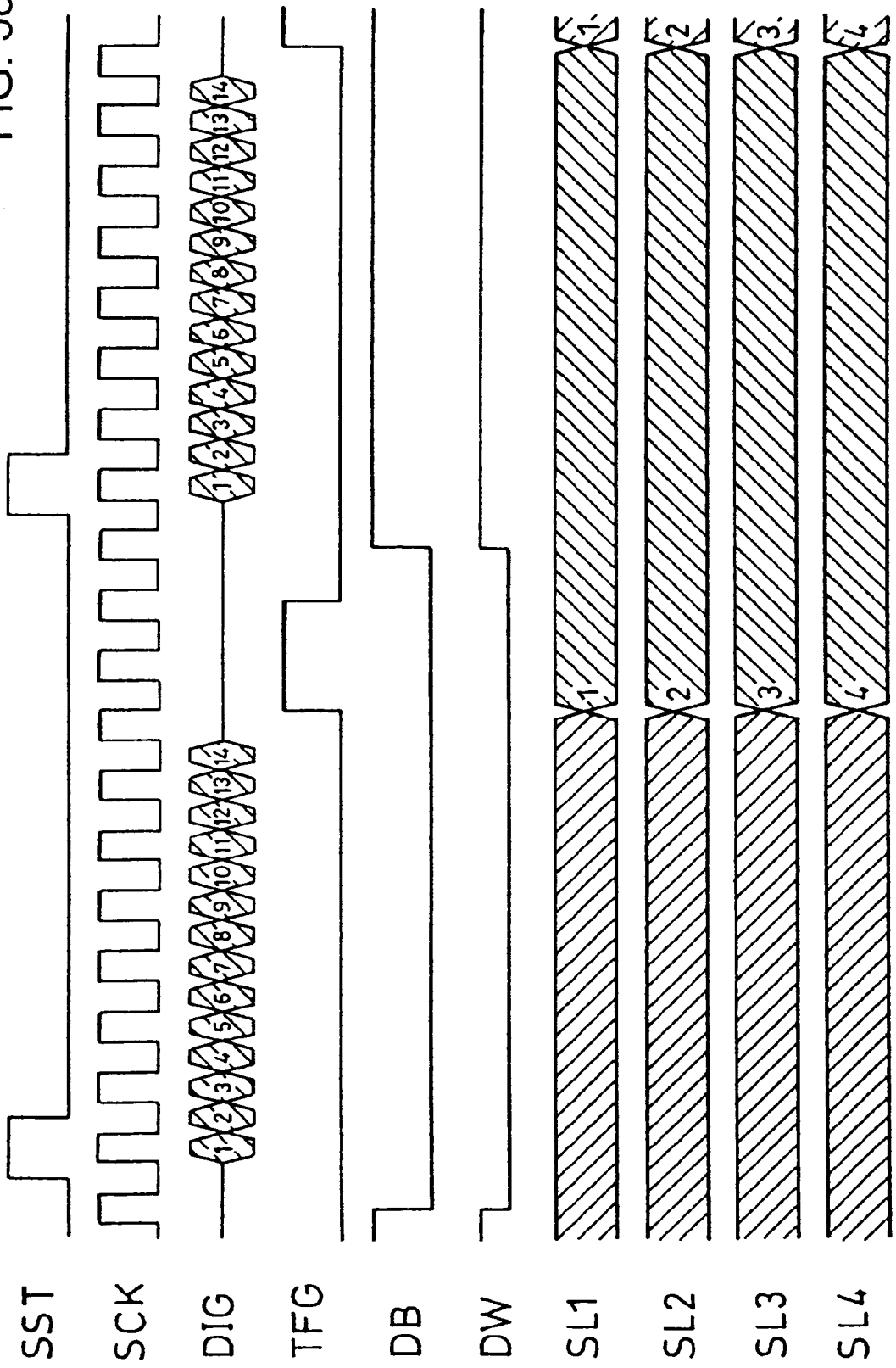
FIG. 58 is an explanatory drawing showing, as an example, another timing chart of an image display device in accordance with the present invention.

FIG. 58 shows a timing chart example under these circumstances. In other words, DIG is a binary digital video signal. Reference signals DB and DW are, as described earlier, are signals having potential levels corresponding respectively to a black display and a white display. In the case of line reverse drive, polarity is reversed for every horizontal period as shown in the figure. By inputting the TFG which is a transfer signal after the first latch circuit (LT) picks up a binary digital video signal DIG for one horizontal line, binary video signals for one horizontal line are all simultaneously transferred to the selection circuit ST as a selection switch, and a black level (DB) or a white level (DW) potential is written to the data signal line.

Figure 59:
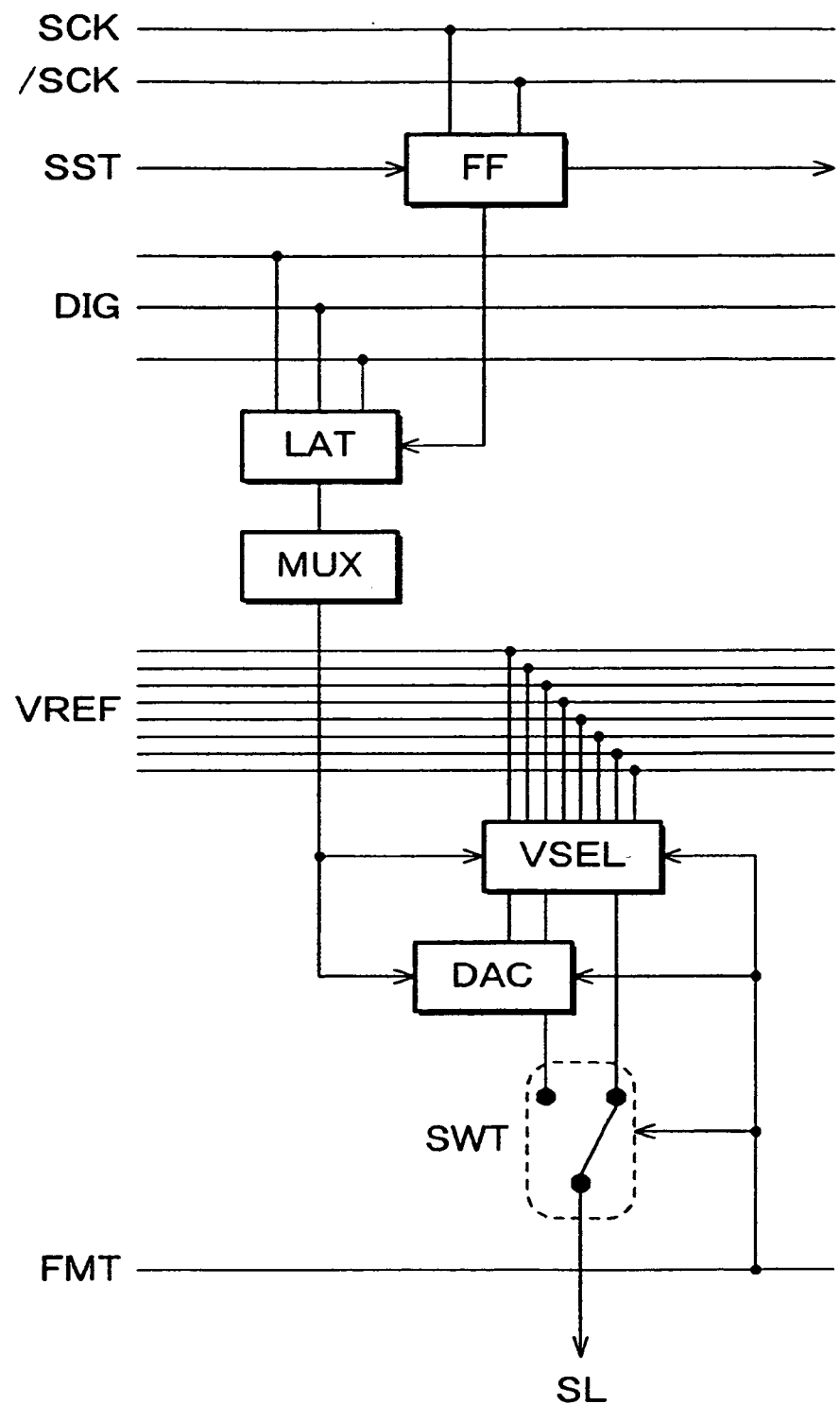
FIG. 59 is an explanatory drawing showing, as an example, another configuration of a data signal line drive circuit constituting an image display device in accordance with the present invention.

In FIG. 59, first, the digital video signal DIG is latched by the latch circuit LAT and then decoded by a multiplexer MuX. As this happens, a corresponding reference signal is selected from-for-video-signal reference potentials VREF by the reference voltage selection circuit VSEL. Here, if there are relatively many display halftones, the selection switch SWT is switched to intermediate potential generation circuit DAC by the display format control signal FMT, two reference signals are selected according to higher order bits as an input to the intermediate potential generation circuit DAC and an intermediate potential is produced according to lower order bits. Conversely, if there are relatively a-few display halftones, the intermediate potential generation circuit DAC is isolated from the rest, and only one reference signal is selected from for-video-signal reference potentials VREF according to the reference voltage selection circuit VSEL as a direct output to the data signal line SL.

In FIG. 59, first, the digital video signal DIG is latched by the latch circuit LAT and then decoded by a multiplexer MUX. As this happens, a corresponding reference signal is selected from-for-video-signal reference potentials VREF by the reference voltage selection circuit VSEL. Here, if there are relatively many display halftones, the selection switch SWT is switched to intermediate potential generation circuit DAC by the display format control signal FMT, two reference signals are selected according to higher order bits as an input to the intermediate potential generation circuit DAC and an intermediate potential is produced according to lower order bits. Conversely, if there are relatively a few display halftones, the intermediate potential generation circuit DAC is isolated from the rest, and only one reference signal is selected from for-video-signal reference potentials VREF according to the reference voltage selection circuit VSEL as a direct output to the data signal line SL.

Under these circumstances, to display an image with relatively a few halftones, a configuration such as to skirt the intermediate potential generation circuit DAC enables many circuits to be shared, resulting in a reduced size of the circuit.

Figure 60:
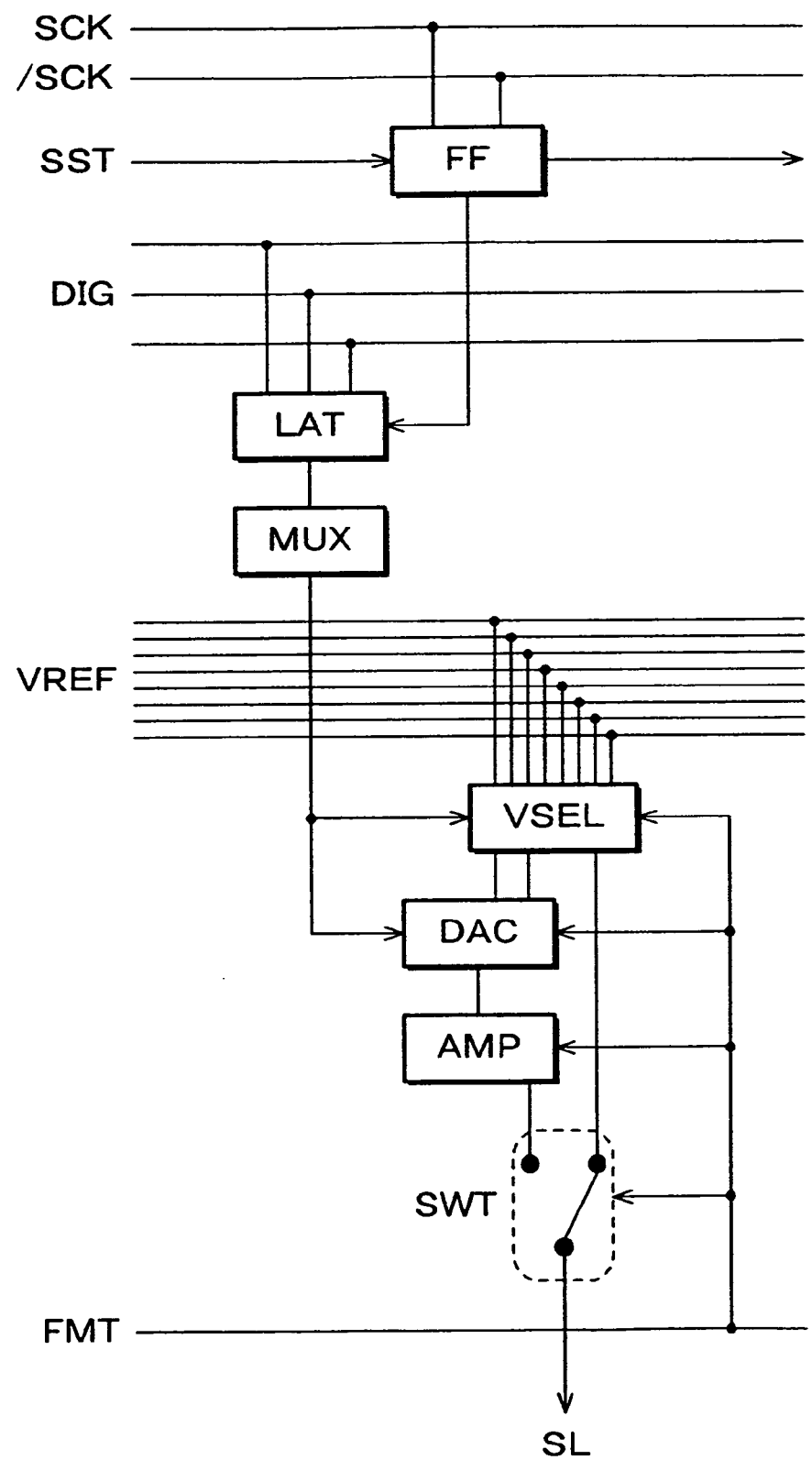
FIG. 60 is an explanatory drawing showing, as an example, another configuration of a data signal line drive circuit constituting an image display device in accordance with the present invention.

In contrast, in FIG. 60, in addition to the configuration in FIG. 59, there is an analog amplifier (amplifier circuit) AMP provided in the succeeding stage of a digital-analog converter circuit composed of the reference voltage selection circuit VSEL and the intermediate potential generation circuit DAC. This enables, when the load produced by the data signal line SL is too large for the intermediate potential generation circuit DAC alone to drive sufficiently, the analog amplifier AMP having a larger current driving force to charge the data signal line.

Similarly to FIG. 59, to display an image with relatively a few halftones, a configuration such as to skirt the intermediate potential generation circuit DAC and the analog amplifier AMP enables many circuits to be shared, resulting in a reduced size of the circuit.

FIG. 61(a) and FIG. 61(b) are diagrams showing, as an example, another configuration in accordance with the present invention. In FIG. 61(a) and FIG. 61(b), one of the two data signal line drive circuits is an analog drive circuit, and the other is a digital drive circuit. In other words, in FIG. 61(a), the data signal line drive circuit SD1 is activated which is an analog drive circuit, and in FIG. 61(b), the data signal line drive circuit SD2 is activated which is a digital drive circuit. The analog drive circuit can display an infinite number of halftones and consumes almost equal amounts of electric power, in whichever format a video signal is inputted. In contrast, the digital drive circuit can display a number of halftones that can be varied depending on the circuit configuration, and the resultant power consumption also varies. Therefore, the analog drive circuit and the digital drive circuit provide the most suitable combination of display quality and power consumption.

A configuration example has been already described of the analog drive circuit and the digital drive circuit under these circumstances. In other words, the data signal line drive circuit of an analog scheme can be classified into those of a point sequential drive (with no amplifier) as shown in FIG. 134 and those of a line sequential drive (with an amplifier) as shown in FIG. 136. The data signal line drive circuit of a digital scheme can be classified into those shown in FIG. 137 (with no amplifier) and those shown in FIG. 138 (with an amplifier). The data signal line drive circuit of a digital scheme is driven by a line sequential scheme.

Figure 62:
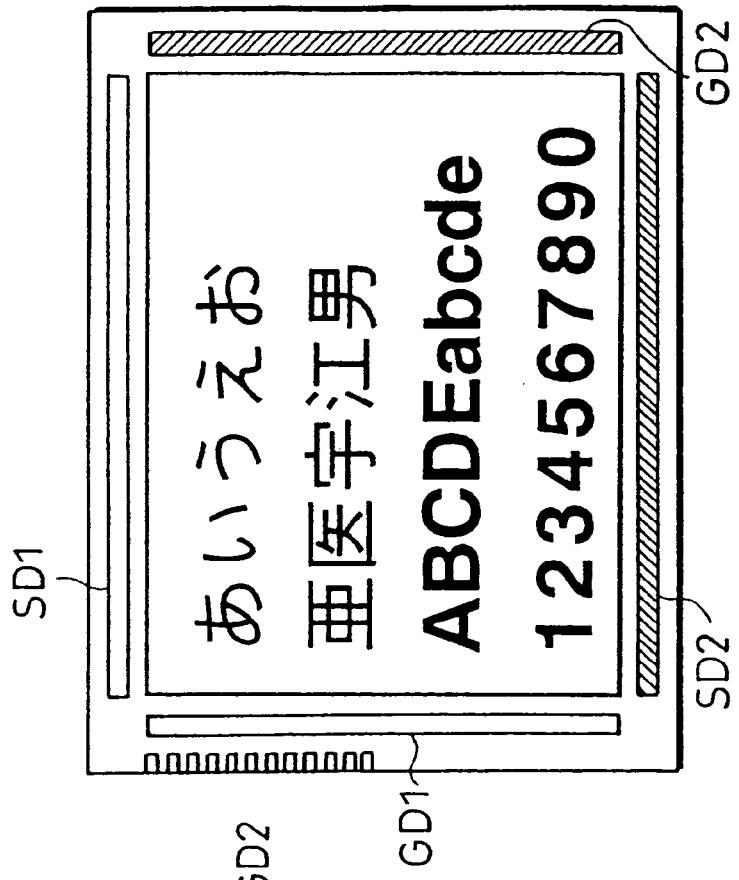
FIG. 62(a) and FIG. 62(b) are explanatory drawings showing, as an example, another display by an image display device in accordance with the present invention.
Figure 62:
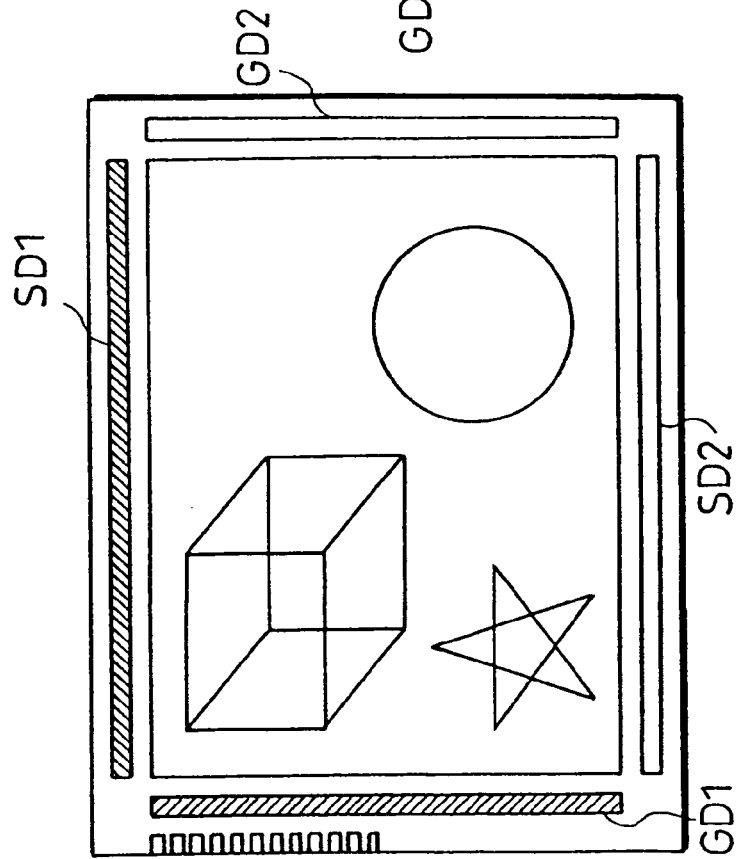

FIG. 62(a), 62(b) 63(a), and 63(b) are diagrams showing, as an example, another configuration in accordance with the present invention. FIG. 62(a) shows a display when graphics data is inputted. FIG. 62(b) shows a display when text data is inputted. The graphics are preferably displayed in color or halftones, whereas the text in some cases is sufficiently displayed in white and black, that is, binary. Accordingly, power consumption can be effectively reduced by switching display formats.

Figure 63:
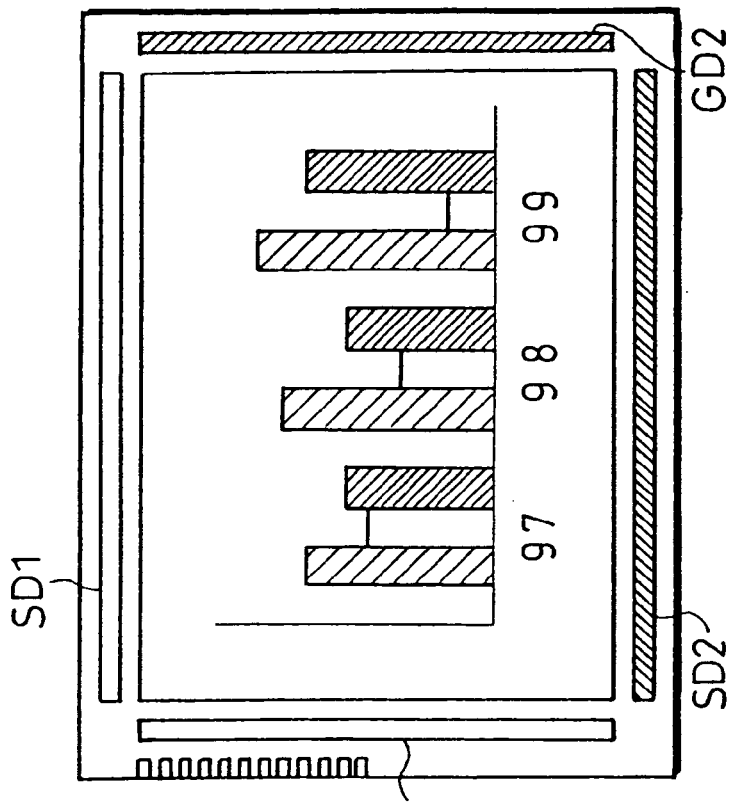
FIG. 63(a) and FIG. 63(b) are explanatory drawing showing, as an example, another display by an image display device in accordance with the present invention.
Figure 63:
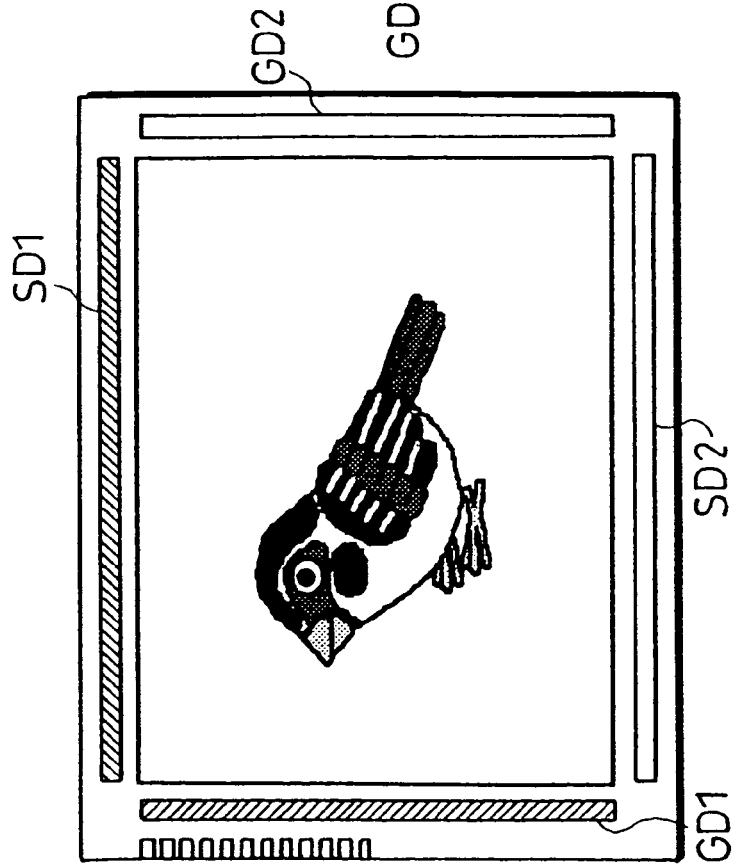

FIG. 63(a) shows a display when a natural image data is inputted. FIG. 63(b) shows a display when) a chart data is inputted. The natural image is preferably displayed in color display and multitone (64 or more halftones), whereas the graphics and charts in some cases are sufficiently displayed in color, but using only a few of halftones. Accordingly, power consumption can be effectively reduced by switching display formats.

Figure 64:
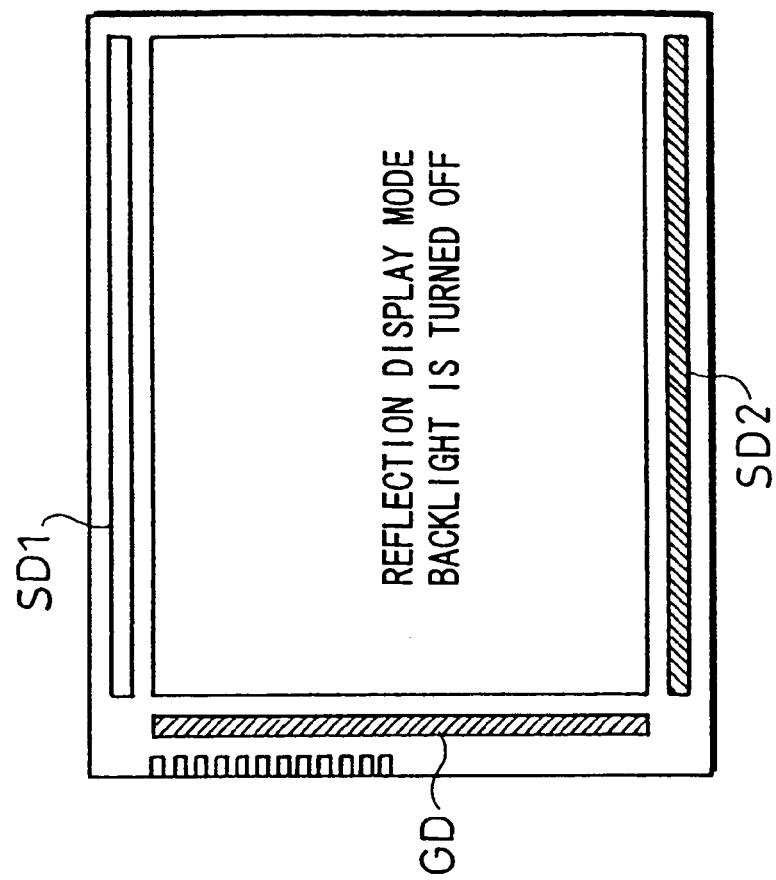
FIG. 64(a) and FIG. 64(b) are explanatory drawings showing, as an example, another image display device in accordance with the present invention.
Figure 64:
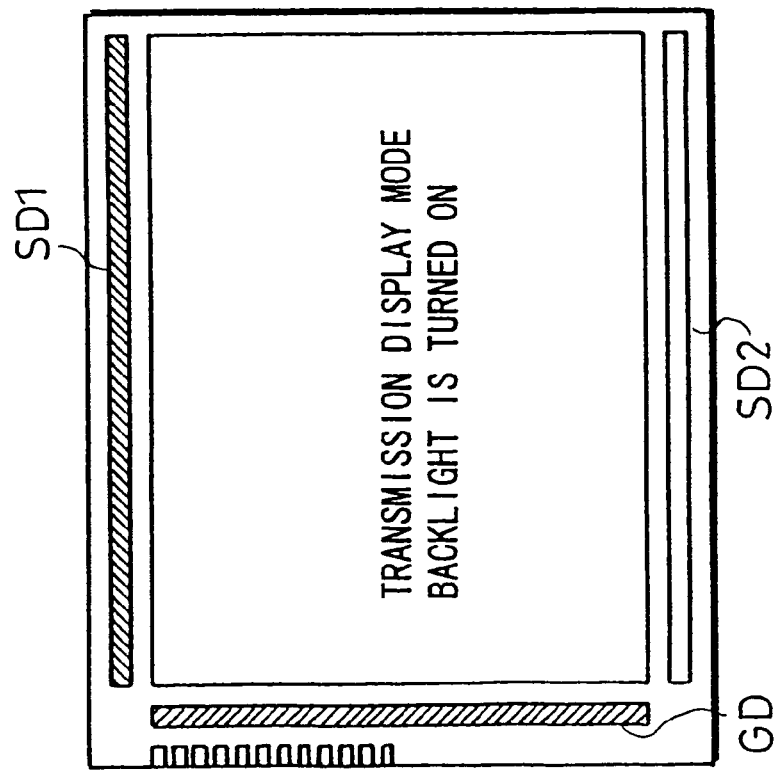

FIG. 64(a) and FIG. 64(b) are diagrams showing, as an example, another configuration in accordance with the present invention. FIG. 64(a) shows a transmission display mode. FIG. 64(b)) shows a reflection display mode. Under these circumstances, by providing an area transparent to light and an area where light reflects in each pixel, in transmission display mode when the backlight is turned on and in reflection display mode when the backlight is turned off.

The present invention may be slightly varied to produce an image on a part of the screen, for example. FIGS. 65, 66, 69, 72, and FIG. 74 show timing chart examples to realize the variation.

Figure 65:
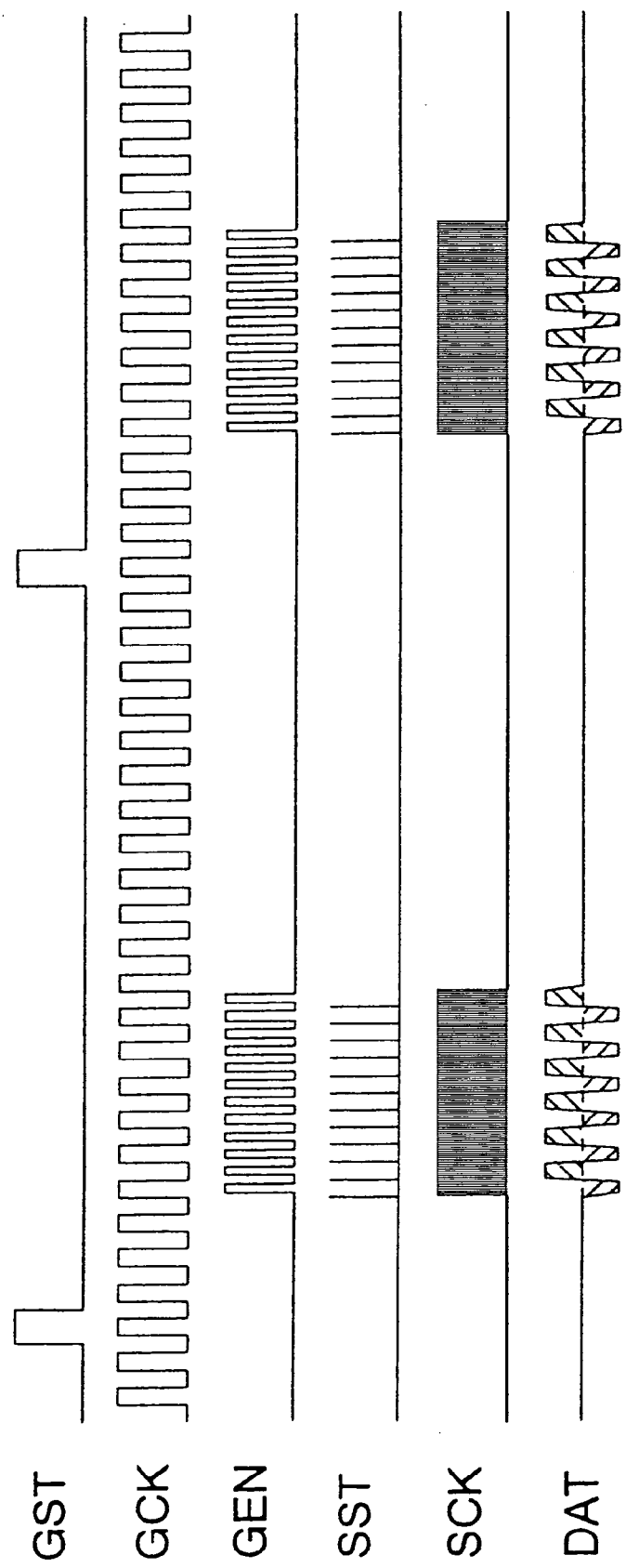
FIG. 65 is an explanatory drawing showing, as an example, another timing chart of an image display device in accordance with the present invention.

In FIG. 65, the supply of the enable signal (GEN) to the scan signal line drive circuit is suspended temporarily, which causes the scan signal line drive circuit to operate temporarily and thus produces an image display temporarily in the vertical direction of the screen. The operation of, and signal inputs (SCK, SST, DAT) to, the data signal line drive circuit are preferably suspended also during the periods when the operation of the scan signal line drive circuit is suspended, since no display is produced during the period.

Figure 66:
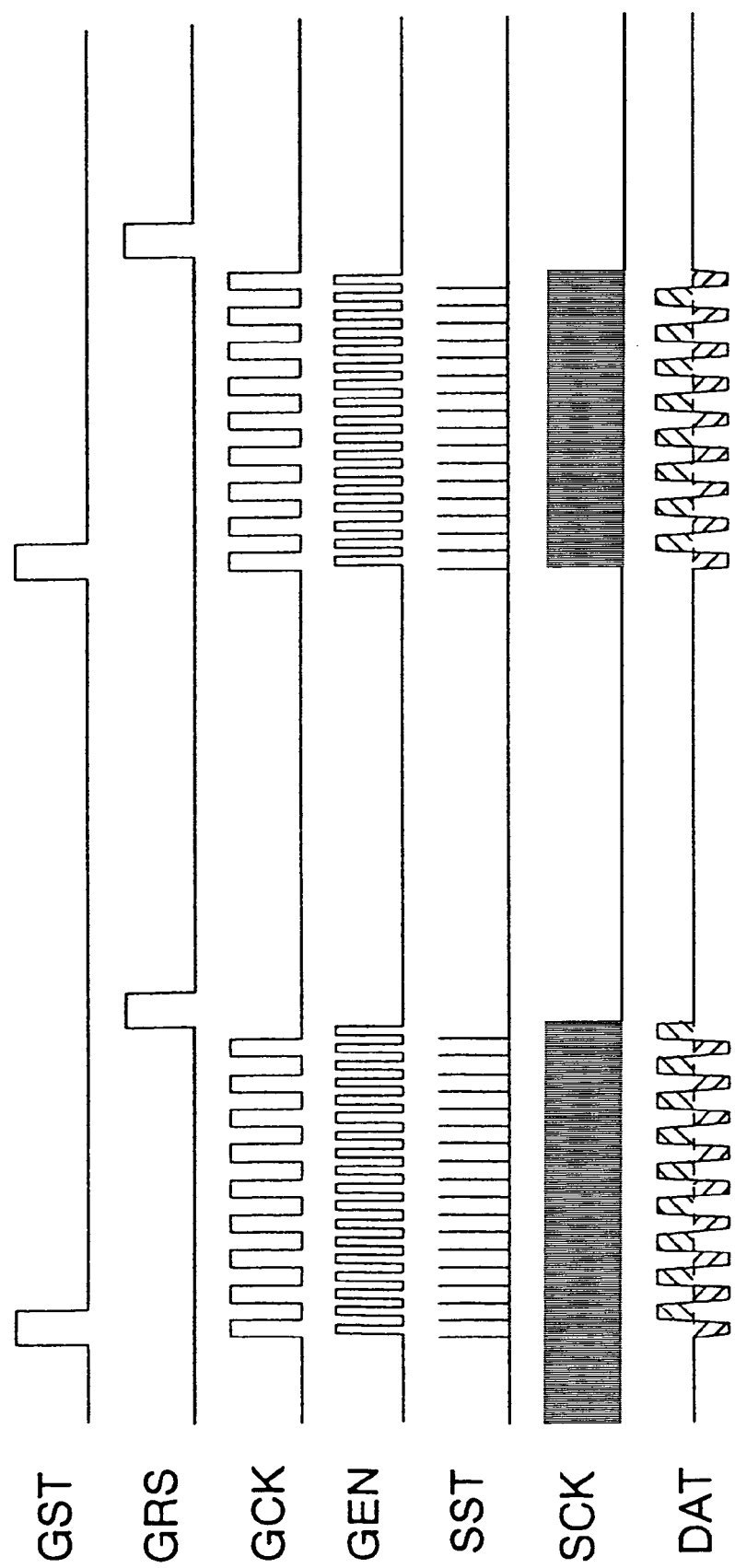
FIG. 66 is an explanatory drawing showing, as an example, another timing chart of an image display device in accordance with the present invention.

In FIG. 66, the reset signal (GRS) is inputted to the scan signal line drive circuit, which causes the scan signal line drive circuit to terminate its scan operation before completion and thus produces an image display temporarily in the vertical direction of the screen. The operation of, and signal inputs (SCK, SST, DAT) to, the scan and data signal line drive circuits are preferably suspended again during the periods when the operation of the scan signal line drive circuit is suspended, since no display is produced during the periods.

Figure 67:
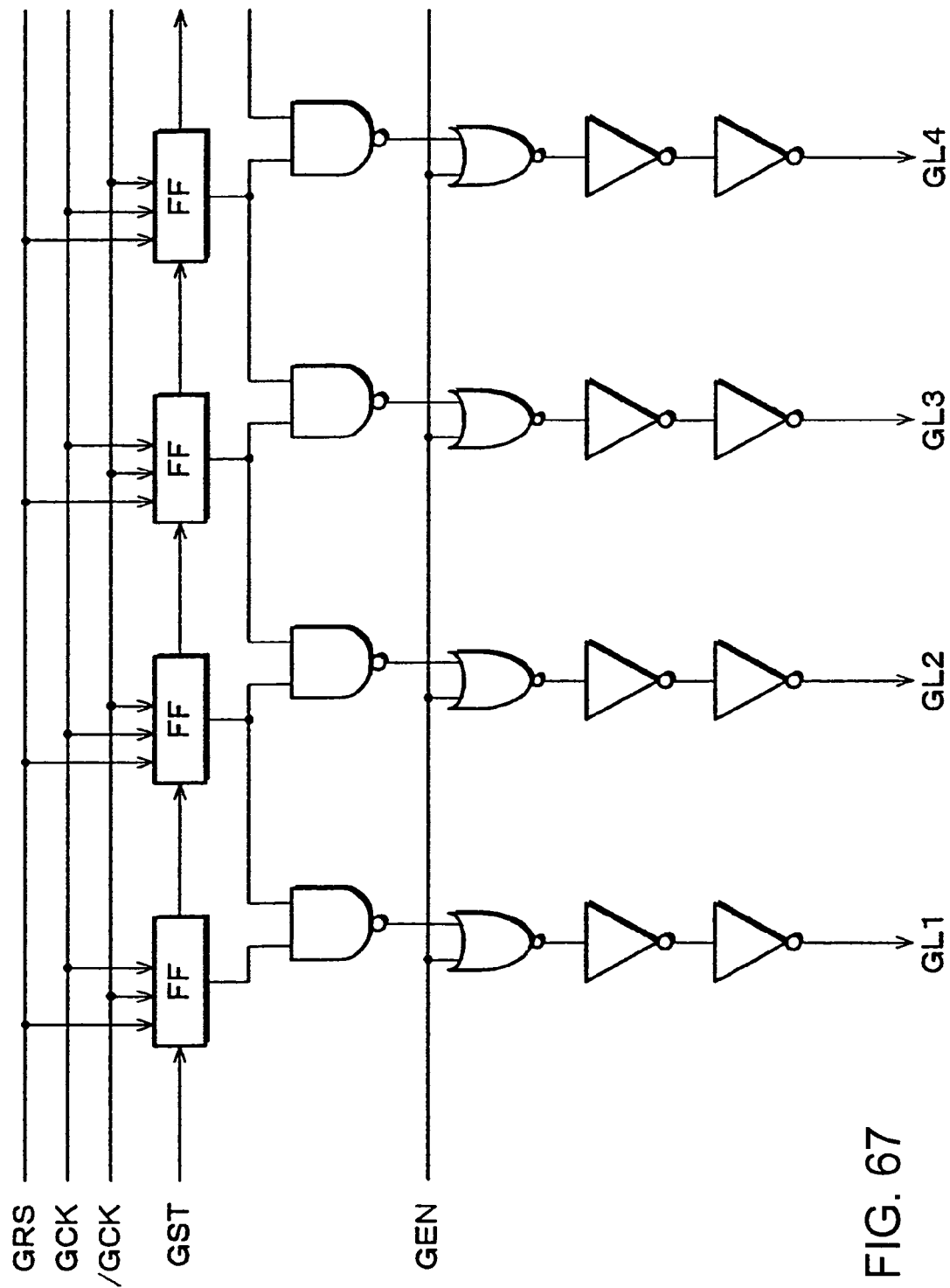
FIG. 67 is an explanatory drawing showing, as an example, another configuration of a scan signal line drive circuit constituting an image display device in accordance with the present invention.

FIG. 67 shows such a configuration to cause the scan signal line drive circuit to terminate its scan operation before completion, where the reset signal GRS is inputted to each flip-flop FF constituting a scan section in the scan signal line drive circuit.

Figure 68:
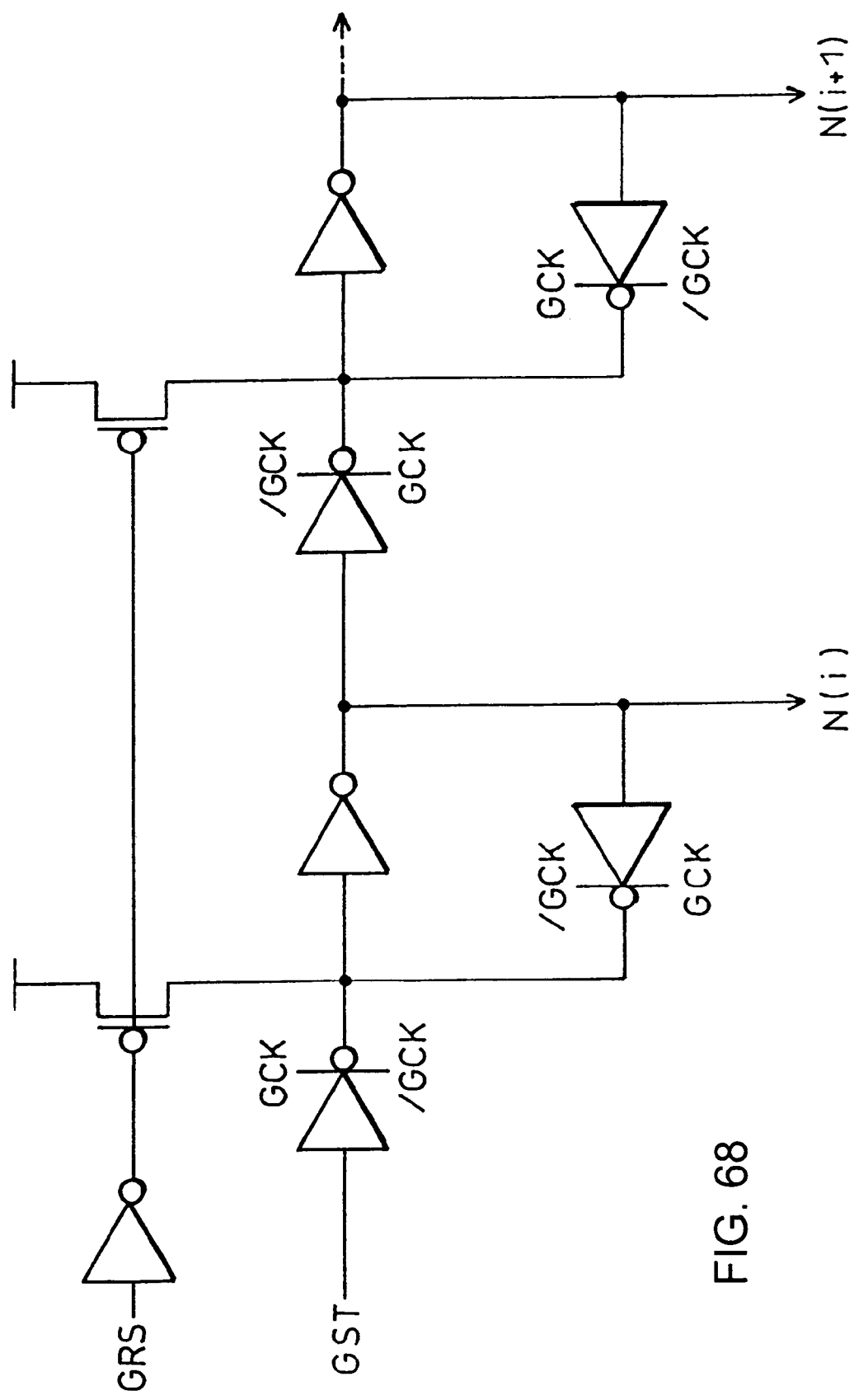
FIG. 68 is an explanatory drawing showing, as an example, a configuration of a scan circuit constituting the scan signal line drive circuit of FIG. 67.

FIG. 68 shows a configuration of a flip-flop part of the circuit. The input of the reset signal GRS forcibly causes the internal node to have a high potential.

Figure 69:
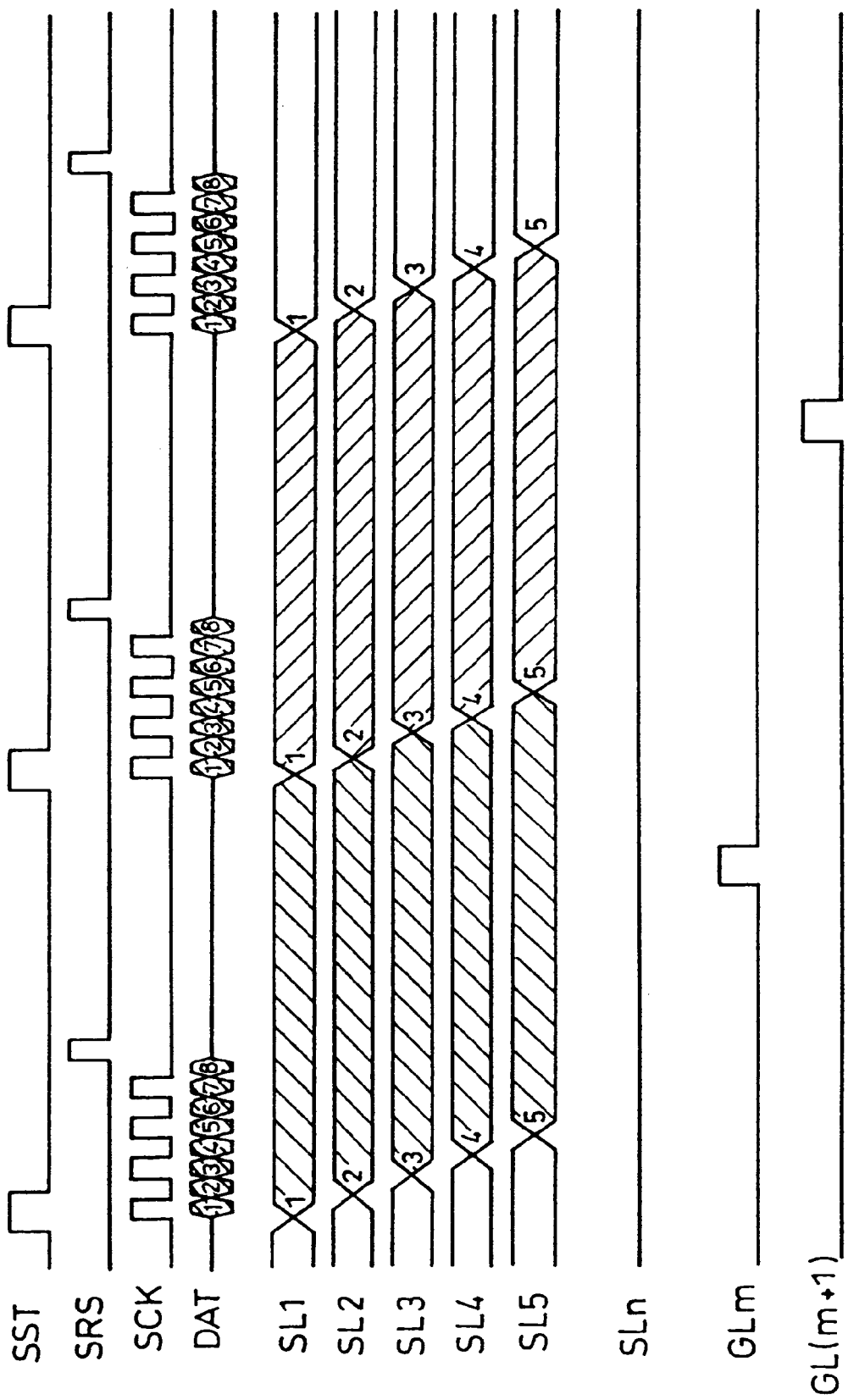
FIG. 69 is an explanatory drawing showing, as an example, another timing chart of an image display device in accordance with the present invention.

FIG. 69 shows a timing chart in a case where the method of terminating the drive circuit before completing its operation by means of a reset signal is adopted in a data signal line drive circuit. The configuration of a scanning circuit part of the drive circuit is similar to those shown in FIG. 67 and FIG. 68. In FIG. 69, when the reset signal SRS is inputted, the operation of the data signal line drive circuit is suspended, and no video signal is written to succeeding data signal lines. Therefore, the video signal written up to that moment is held;-for-non-display video data is preferably written in advance to the data signal line before switching to the partial display mode.

Figure 70:
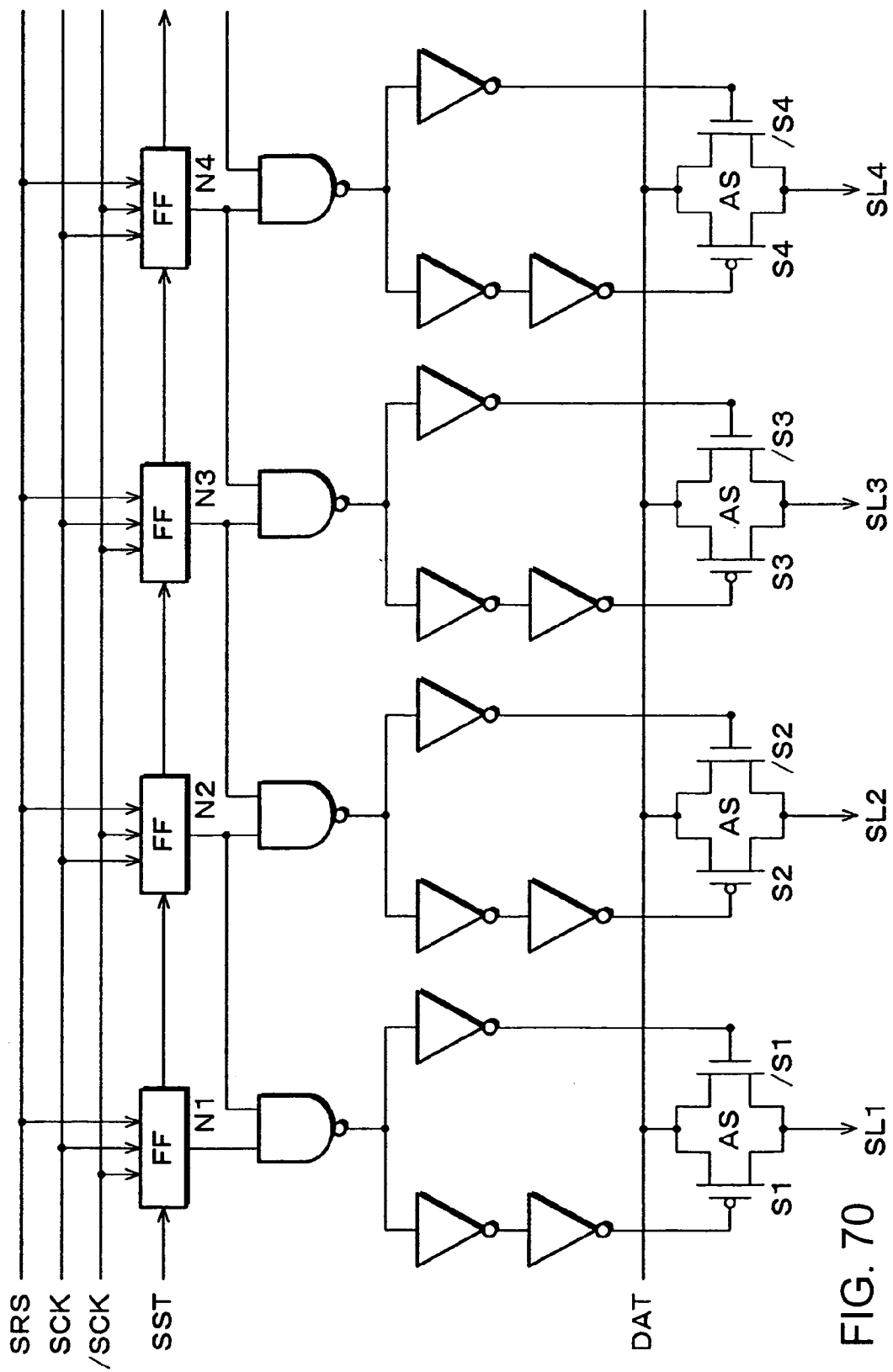
FIG. 70 is an explanatory drawing showing, as an example, another configuration of a data signal line drive circuit constituting an image display device in accordance with the present invention.

FIG. 70 shows such a configuration to cause the data signal line drive circuit to terminate its scanning operation before completion, where the reset signal SRS is inputted to each flip-flop FF constituting a scan section in the data signal line drive circuit.

Figure 71:
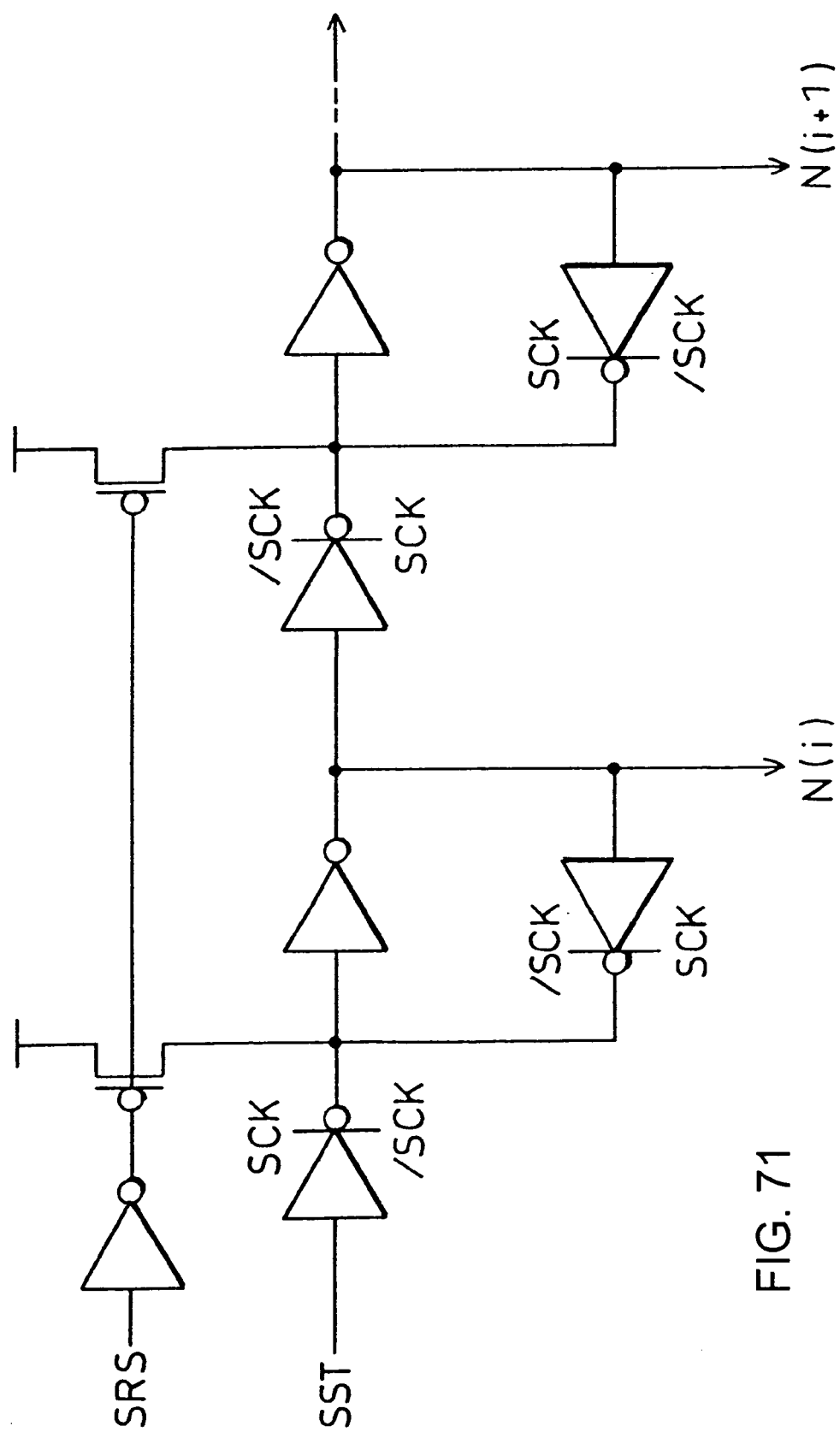
FIG. 71 is an explanatory drawing showing, as an example, a configuration of a scan circuit constituting the data signal line drive circuit of FIG. 70.

FIG. 71 shows a configuration of a flip-flop part of the circuit. The input of the reset signal SRS forcibly causes the internal node to have a high potential.

Figure 72:
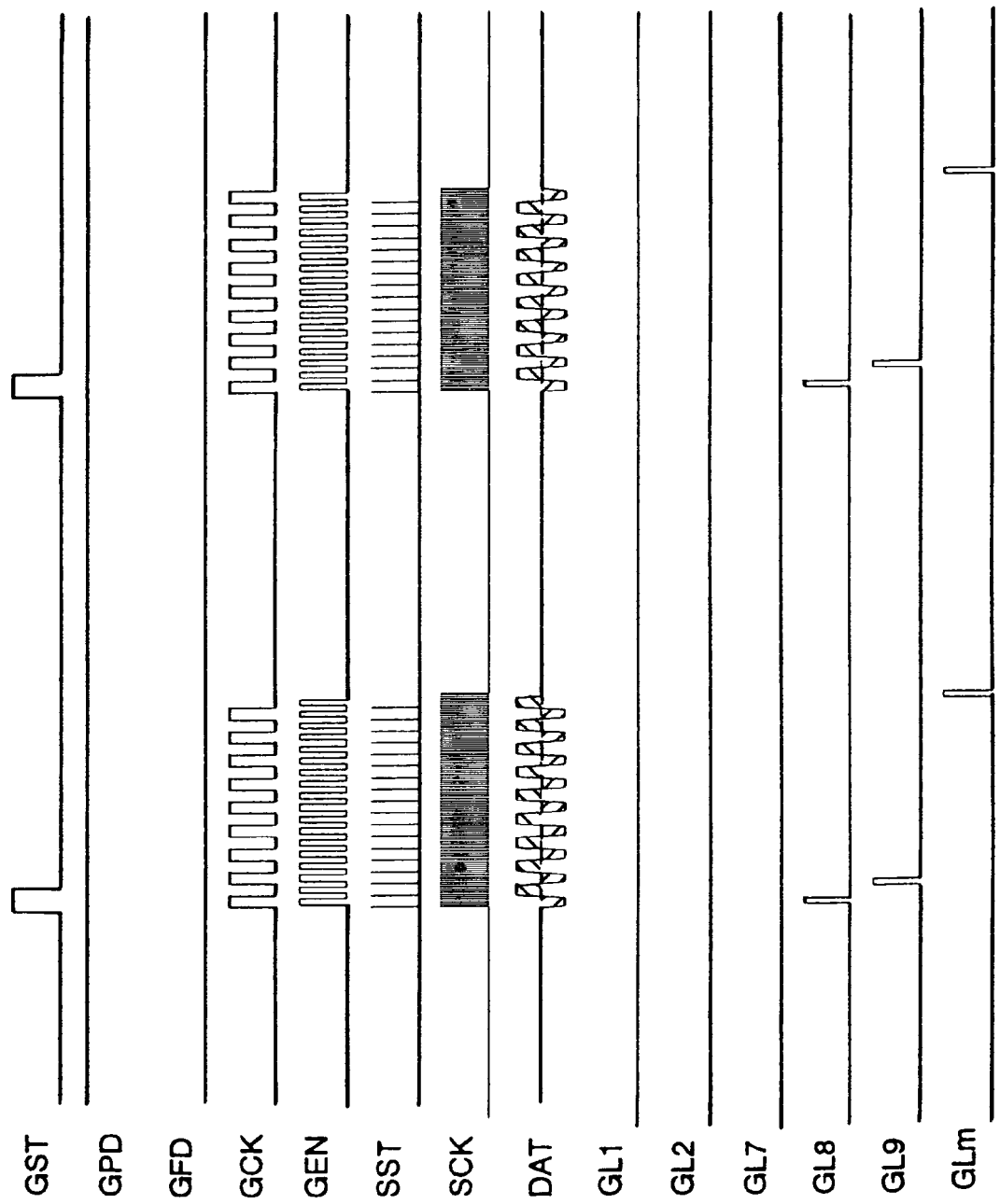
FIG. 72 is an explanatory drawing showing, as an example, another timing chart of an image display device in accordance with the present invention.

In FIG. 72, by inputting the start signal (GST) to an intermediate stage of the scan signal line drive circuit, the scan signal line drive circuit is caused to start its scanning at an intermediate stage to display an image partially in the vertical direction of the screen. The operation of, and signal inputs (GCK, GEN, etc.) to, the scan signal line drive circuit and the operation of, and signal input (SCK, SST, DAT, etc.) to, the data signal line drive circuit are preferably suspended again during the periods when the operation of the scan signal line drive circuit is suspended, since no display is produced during those periods.

Figure 73:
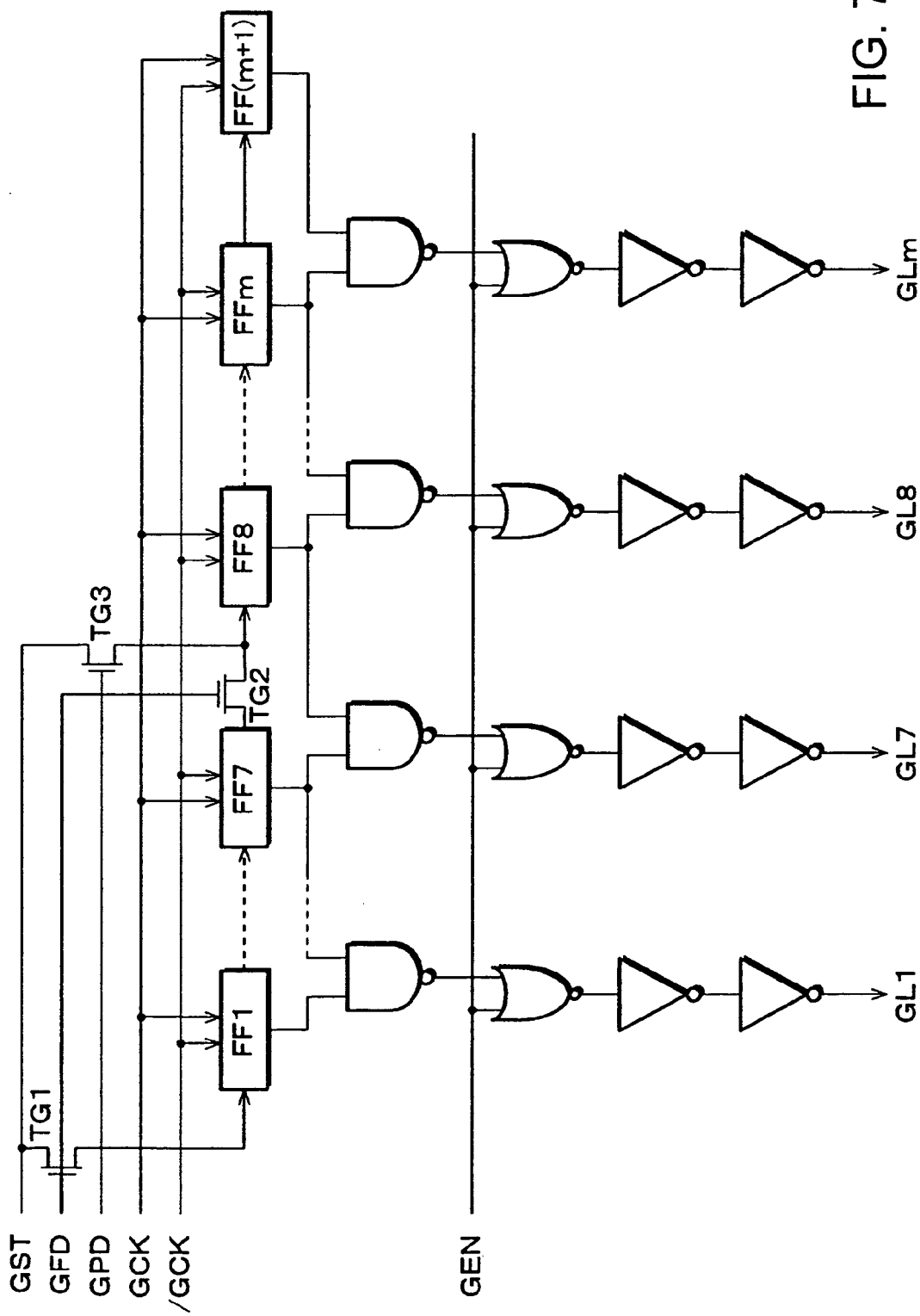
FIG. 73 is an explanatory drawing showing, as an example, another configuration of a scan signal line drive circuit constituting an image display device in accordance with the present invention.

FIG. 73 shows, as an example, such a configuration to cause the scan signal line drive circuit to start its scanning operation at an intermediate stage, where the start signal GST is made to be inputted at the first stage (FF1 in FIG. 73) and an intermediate stage (FF8 in FIG. 73) of the scanning circuits FF1 to FF(m+1) and controlled through a control switch (first control switching means) TG1, a control switch (second control switching means) TG2, and a control switch (third control switching means) TG3 according to a for-all-stage-drive control signal (first control signal) GFD and a for-partial-drive control signal (second control signal) GPD.

Figure 74:
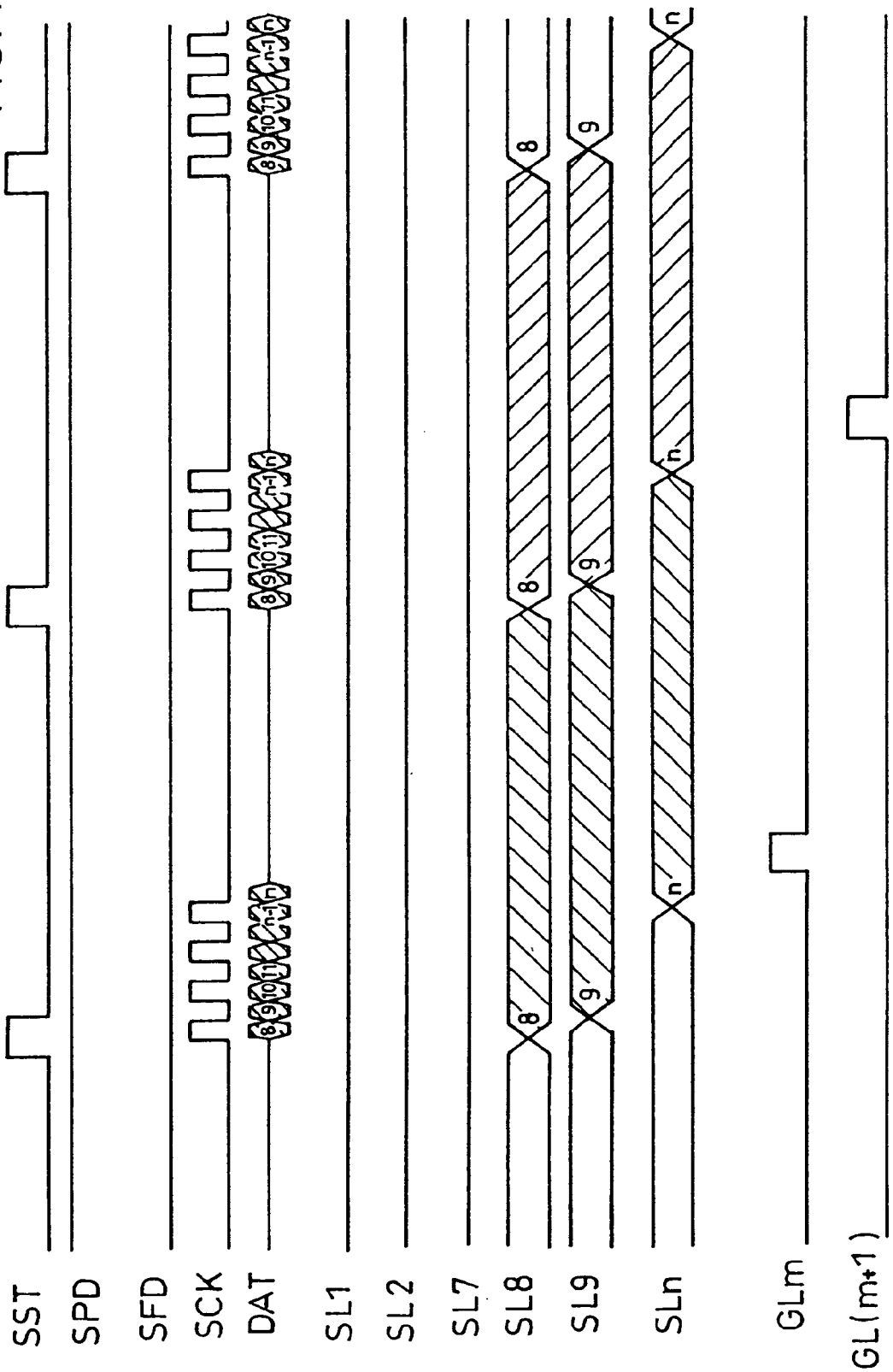
FIG. 74 is an explanatory drawing showing, as an example, another timing chart of an image display device in accordance with the present invention.

FIG. 74 shows a timing chart in a case where the method of inputting starting at an intermediate stage by means of the start signal is adopted in a data signal line drive circuit. The configuration of a scanning circuit part of the drive circuit is similar to that shown in FIG. 73. In FIG. 74, before the start signal SST is inputted, the operation of the data signal line drive circuit is suspended, and no video signal is written to the data signal line. Therefore, the video signal written up to that moment is held; for-non-display video data is preferably written in advance to the data signal line before switching to the partial display mode.

Figure 75:
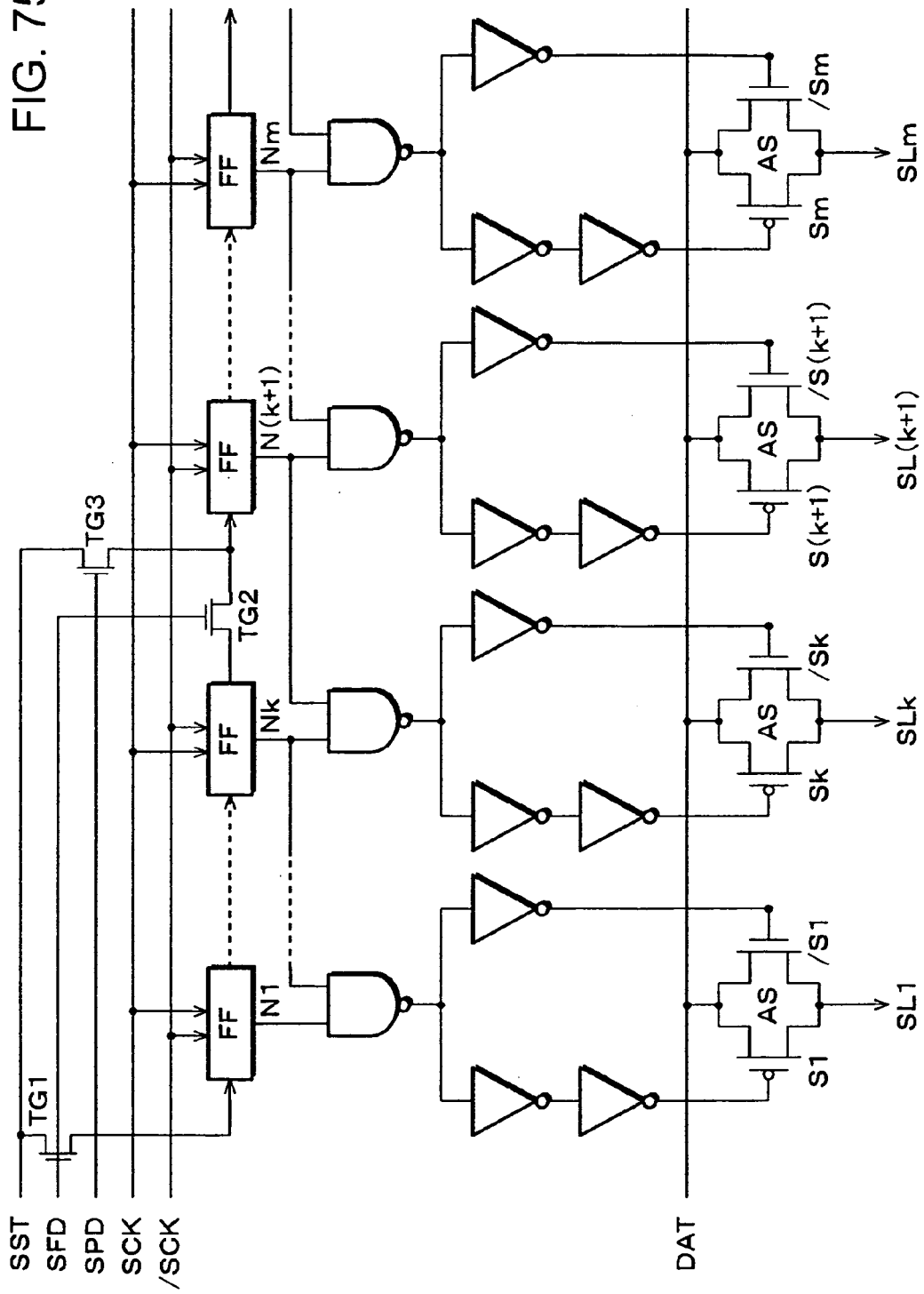
FIG. 75 is an explanatory drawing showing, as an example, another configuration of a data signal line drive circuit constituting an image display device in accordance with the present invention.

FIG. 75 shows, as an example, such a configuration to cause the data signal line drive circuit to start its scan operation at an intermediate stage, where the start signal SST is made to be inputted at the first stage and an intermediate stage ((k+1)-th stage in FIG. 75) of the scanning circuits FF and controlled through a control switch (first control switching means) TG1, a control switch (second control switching means) TG2, and a control switch (third control switching means) TG3 according to a for-all-stage-drive control signal (first control signal) SFD and a for-partial-drive control signal (second control) SPD.

The foregoing configurations for partial displays may be used in combination. The combined use increases versatility in the use of the display area and, as an example, enables a partial display both in the horizontal and vertical directions.

Figure 76:
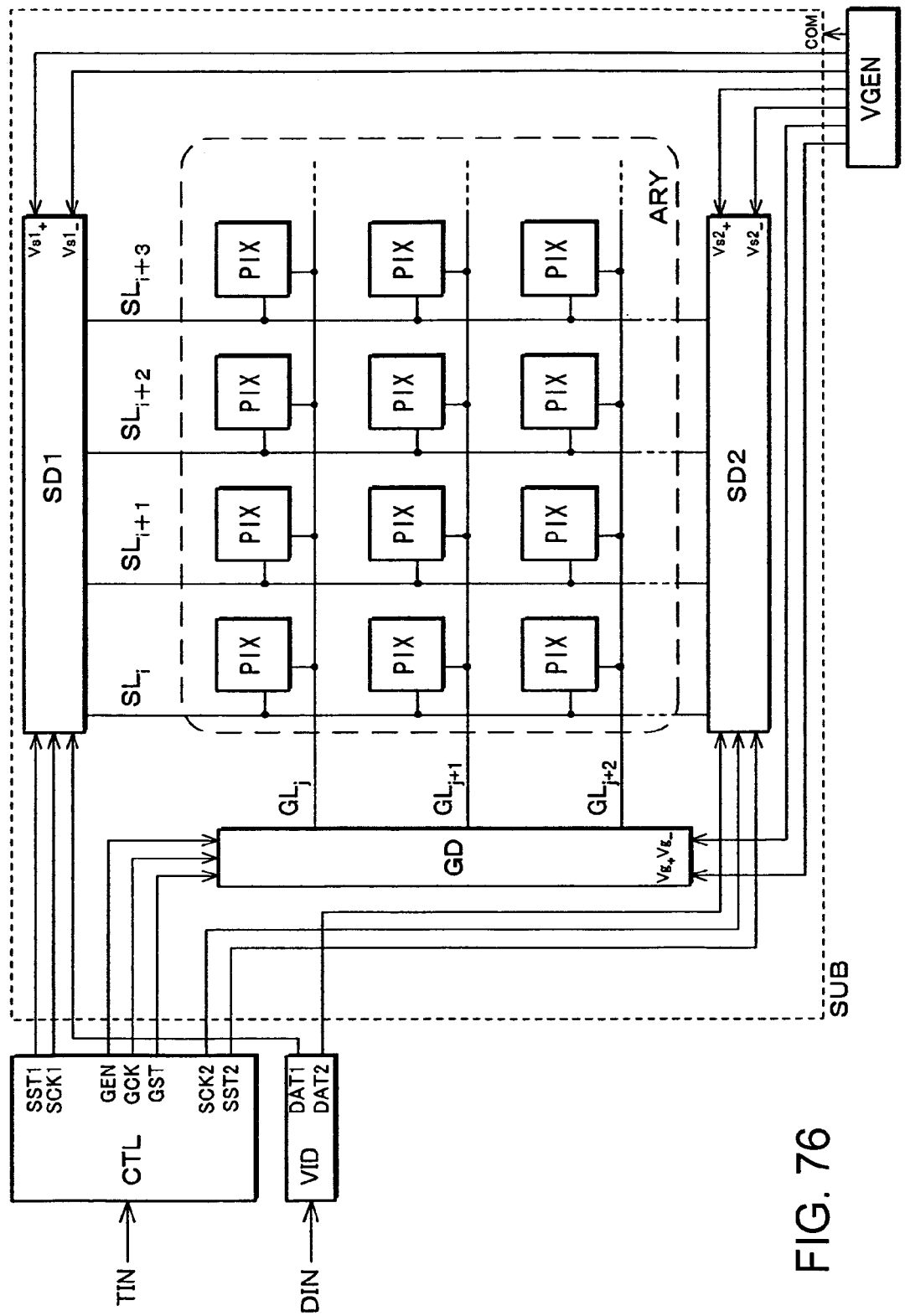
FIG. 76 is a block diagram showing, as an example, another configuration of an image display device in accordance with the present invention.

FIG. 76 is a diagram showing, as an example, another configuration of the image display device in accordance with the present invention. In the image display device of FIG. 76, the pixel PIX, the data signal line drive circuits SD1 and SD2, and the scan signal line drive circuit GD are placed on a single substrate SUB (driver monolithic structure) and driven by signals from an external timing circuit CTL and video signal processing circuit VID and a drive power supply from an external power source circuit VGEN. In the figure, COM represents a common terminal. The configuration, where a data signal line drive circuit (additionally, a scan signal line drive circuit also in some cases) is provided on the same substrate as are the pixels ("monolithic"), can better reduce costs in the manufacture and packaging of the drive circuit and improve reliability than the configuration where they are separately packaged.

Figure 77:
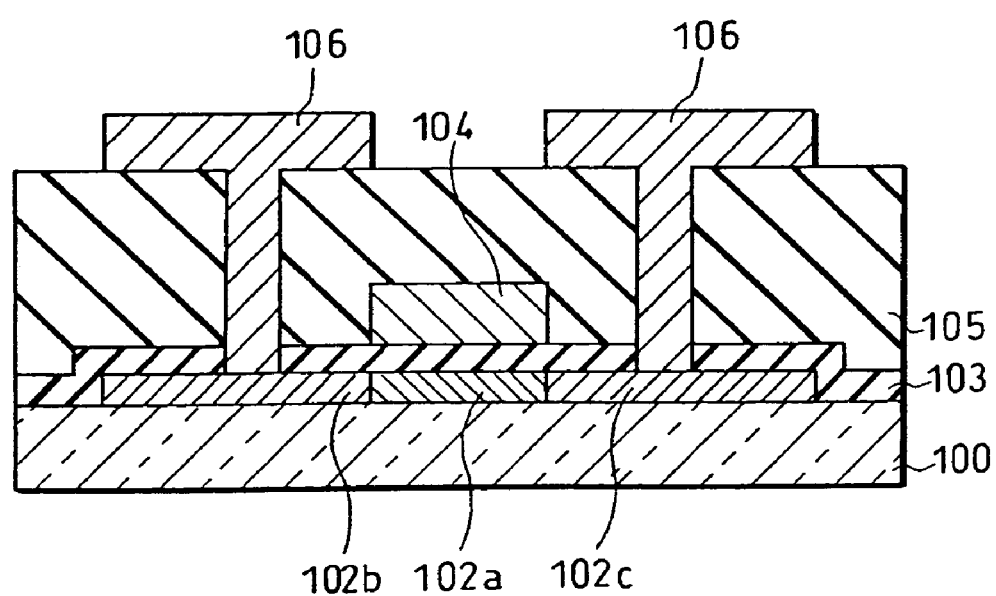
FIG. 77 is a cross-sectional view showing, as an example, an active element constituting an image display device in accordance with the present invention.
Figure 78:
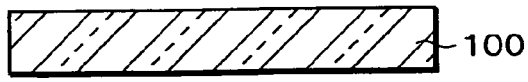
FIG. 78(a) to FIG. 78(k) are cross-sectional views showing, as an example, a manufacturing process of an active element constituting an image display device in accordance with the present invention.
Figure 78:
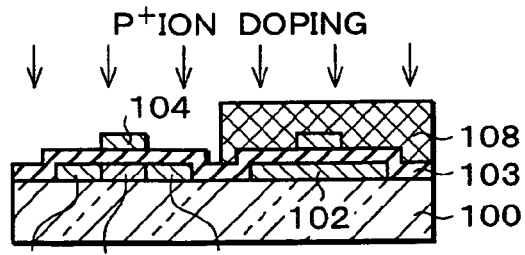
Figure 78:
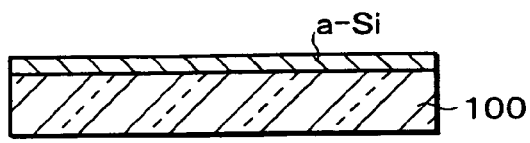
Figure 78:
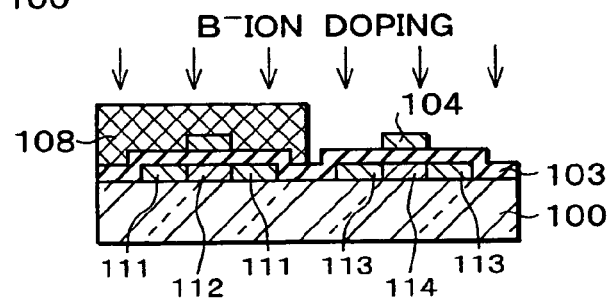
Figure 78:
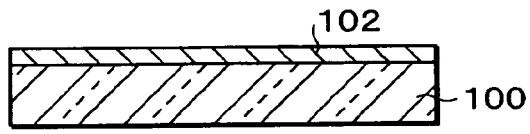
Figure 78:
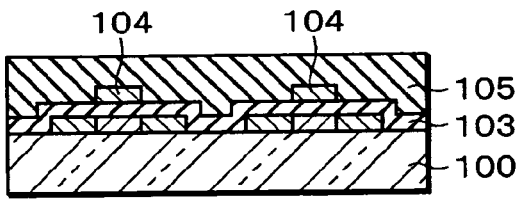
Figure 78:
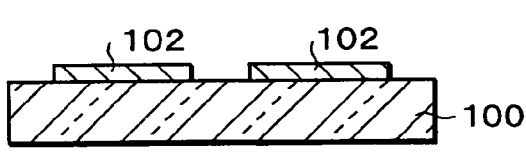
Figure 78:
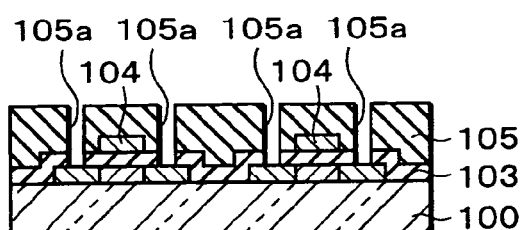
Figure 78:
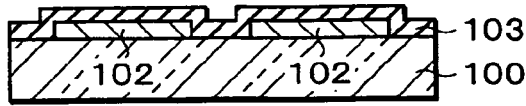
Figure 78:
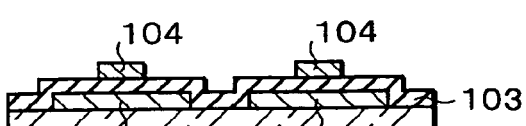
Figure 78:
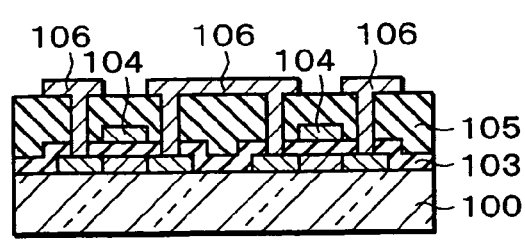

FIG. 77 shows, as an example, a structure of a polycrystalline silicon thin film transistor an active element constituting an image display device in accordance with the present invention. The polycrystalline silicon thin film transistor is composed of a channel area 102a provided on a glass substrate 100, a polycrystalline silicon thin film including a source area 102b and a drain area 102c, a gate insulating film 103, gate electrode 104, and interlayer insulating film 105 deposited on the polycrystalline silicon thin film in this order, and a metal wire 106.

The polycrystalline silicon thin film transistor of FIG. 77 has a stagger (top gate) structure with the polycrystalline silicon thin film being provided as an active layer on the insulating substrate The present invention is however not limited to this structure; An inverted stagger or another structures may be employed.

The use of the polycrystalline silicon thin film transistor enables a scan signal line drive circuit and a data signal line drive circuit with a useful drive performance to be provided on the same substrate as the pixel array by an almost identical manufacturing process.

Further, generally, the polycrystalline silicon thin film transistor has inferior characteristics and therefore requires a higher drive voltage than the monocrystalline silicon transistor (MOS transistor). Also, it includes elements of larger size and therefore has a larger internal parasitic capacitance. As a result, its power consumption tends to be great, and the technology to cut down the power consumption in accordance with the present invention is very effectively applicable.

FIG. 78(a) to FIG. 78(k) show, as an example, structures in cross section, illustrating a manufacturing process of the polycrystalline silicon thin film transistor constituting an image display device in accordance with the present invention. The following will briefly describe a process of manufacturing a polycrystalline silicon thin film transistor at 600° C. or below.

FIG. 78(a) to FIG. 78(k) are cross-sectional views illustrating respective steps. Fist, an eximer laser is shone onto an a-Si (FIG. 78(b)) forming an amorphous silicon thin film deposited on a glass substrate 100 (FIG. 78(a)) to form a polycrystalline silicon thin film (poly-Si) 102 (FIG. 78(c)). The polycrystalline silicon thin film 102 is fabricated into a desired pattern (FIG. 78(d)), and a gate insulating film 103 of silicon dioxide is provided (FIG. 78(e)). Then, a gate electrode 104 for the thin film transistor is formed of aluminum, etc. (FIG. 78(f)), before impurities (phosphor in an n-type area and boron in a p-type area) are injected in the source and drain areas of the thin film transistor (FIG. 78(g), FIG. 78(h)). More specifically, an n-type area 111 and a center area 112 surrounded thereby are provided by phosphor cation doping (FIG. 78(g)), and a p-type area 113 and a center area 114 surrounded thereby are provided by boron anion doping (FIG. 78(h)). When the impurity is injected to the n-type area, the p-type area is masked with a resist 108 (FIG. 78(g)); when the impurity is injected to the p-type area, the n-type area is masked with a resist 108 (FIG. 78(h)). Thereafter, an interlayer insulating film 105 made of silicon dioxide or silicon nitride, etc. is deposited (FIG. 78(i)), a contact hole 105a is opened (FIG. 78(j)), and then a metal wire 106 is fabricated of aluminum and other materials (FIG. 78(k)). Since in these steps, process temperature tops at 600° C. during the formation of the gate insulating film; therefore, highly thermoresistant glass, such as 1737 glass available from Corning Inc. of the USA.

To form a liquid crystal display device, the foregoing steps are followed by the formation of a transparent electrode (for a transmission-type liquid crystal display device) or a reflective electrode (for a reflection-type liquid crystal display device) on another interlayer insulating film.

Under these circumstances, inexpensive, large-area glass substrates can be used as a result of fabricating polycrystalline silicon thin film transistors by the manufacturing process shown in FIG. 78(a) to FIG. 78(k) at temperatures of 600° C. or less; accordingly, the image display device can be made cheaper and come to have a large area.

Figure 79:
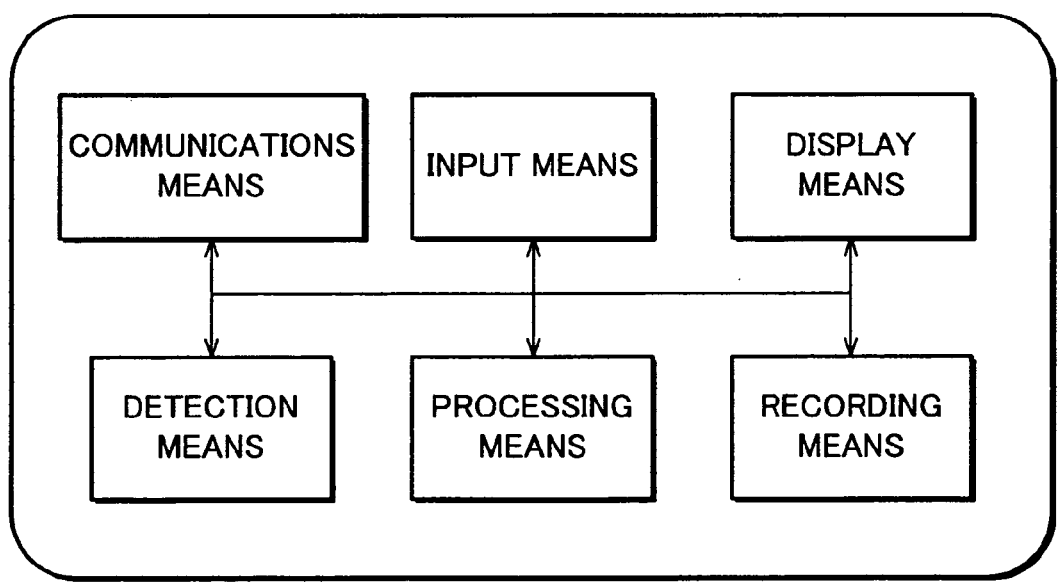
FIG. 79 is an explanatory drawing showing, as an example, a configuration of an electronic apparatus in accordance with the present invention.

FIG. 79 is a block diagram showing a configuration of an electronic apparatus incorporating the image display device in accordance with the present invention. In this example, the electronic apparatus is composed of communications means, detection means, input means, processing means, display means, and recording means. Now, a configuration example of the electronic apparatus will be explained.

Figure 80:
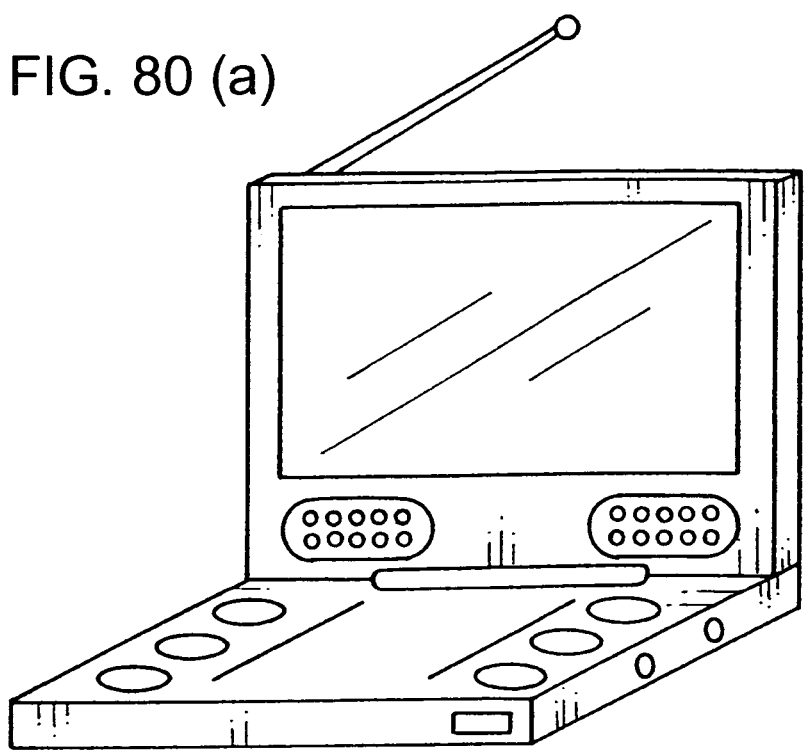
FIG. 80(a) and FIG. 80(b) are explanatory drawings showing, as an example, another configuration of an electronic apparatus in accordance with the present invention.
Figure 80:
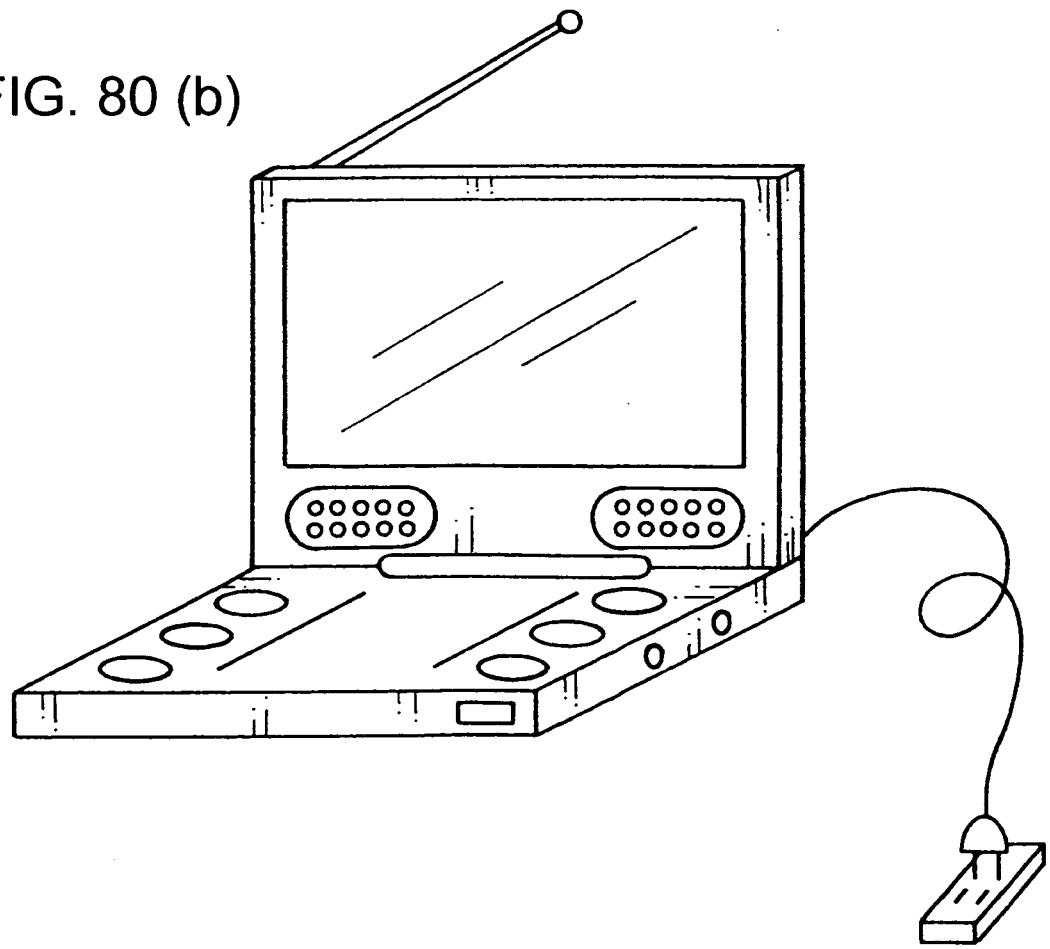

FIG. 80(a) to FIG. 82 show, as examples, electronic apparatuses in accordance with the present invention. In FIG. 80(a) and FIG. 80(b), the electronic apparatus (television receiver) can be driven by both a built-in battery and an external AC power source. When the built-in battery is being used (FIG. 80(a)), since there are constraints on battery life, a less power consuming mode or format of display is preferred where available. Also, when the AC power source is being used (FIG. 80(b)), since there are no such constraints, as a high quality display as possible is preferred.

FIG. 81(a) and FIG. 81(b) show an electronic apparatus (mobile telephone) in a standby state and operation state. During standby (FIG. 80(a)), mostly, text information is displayed, and a less power consuming, black & white binary display presents no problem at all in most cases. In contrast, in operation (FIG. 80(b)), image data sometimes needs to be handled, and an appropriate color or halftone display is preferred accordingly. Some electronic apparatuses stands by far longer than operates. For these apparatuses, reduced power consumption during standby greatly improves on the battery-dependent operating time.

Figure 82:
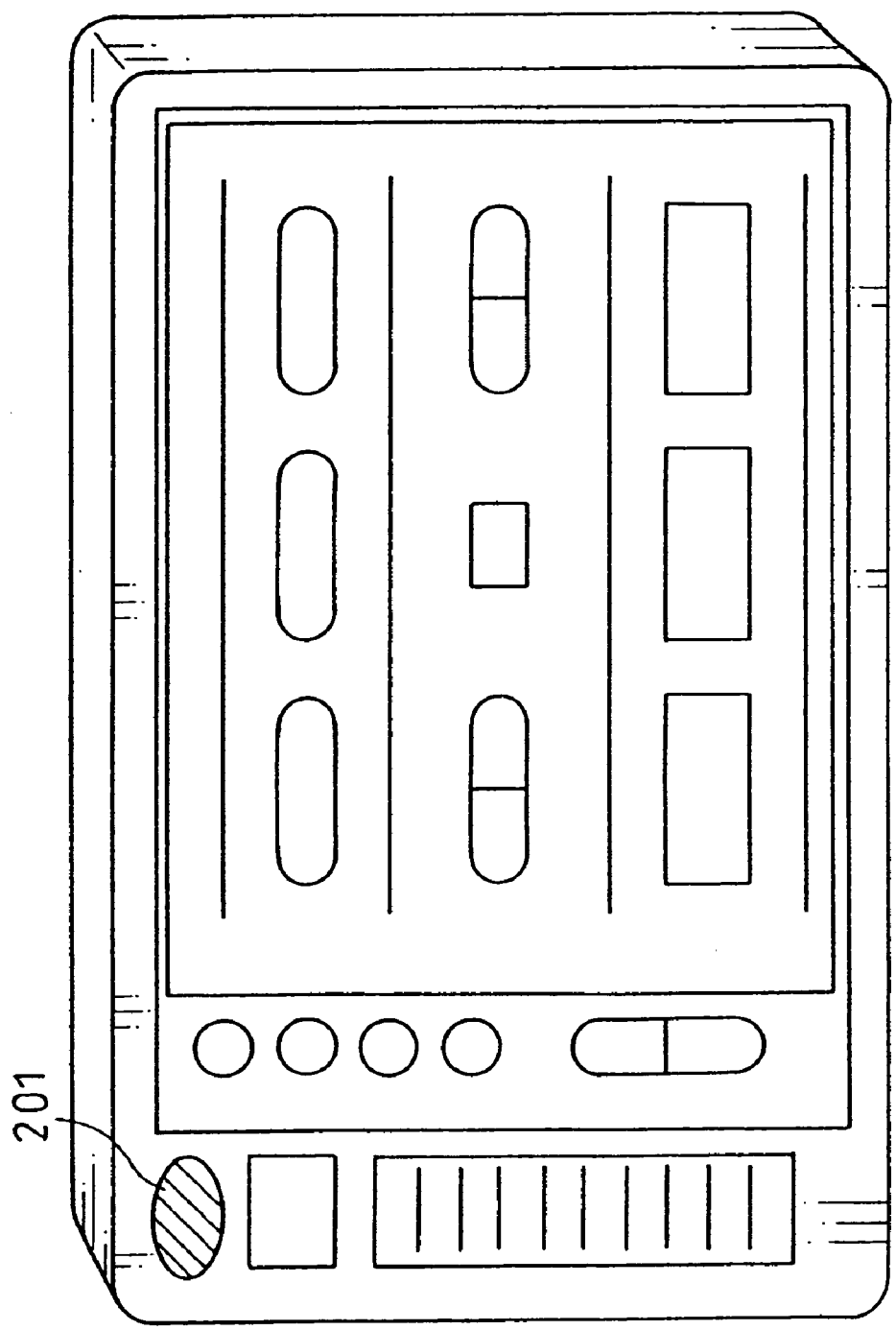
FIG. 82 is an explanatory drawing showing, as an example, another configuration of an electronic apparatus in accordance with the present invention.

The electronic apparatus (portable information terminal) shown in FIG. 82 includes an optical sensor 201 for sensing ambient brightness to automatically select a reflection display mode when there is strong external light and a transmission display mode when there is only weak external light.

FIG. 83 to FIG. 92 show, as further examples, electronic apparatuses in accordance with the present invention.

Figure 83:
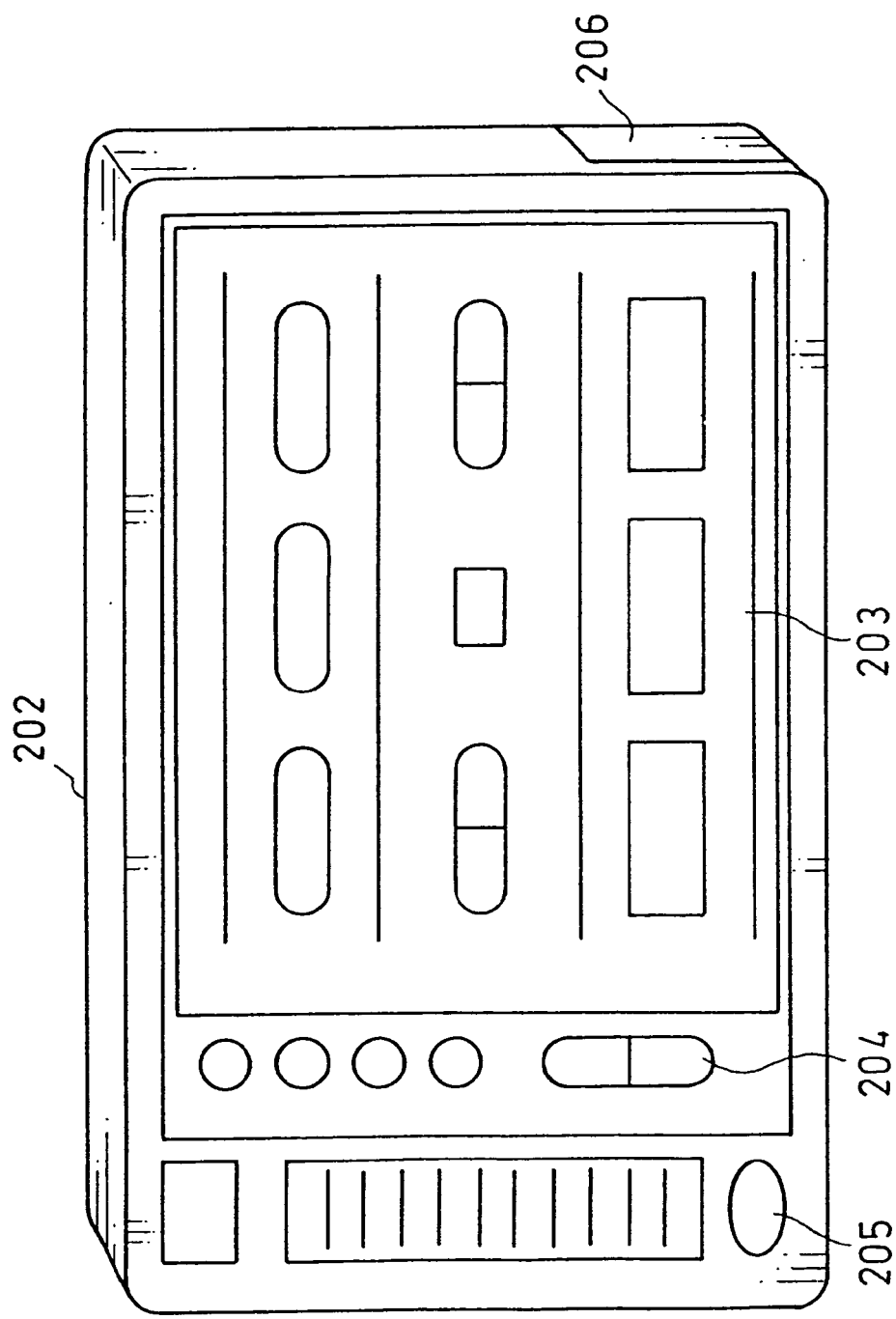
FIG. 83 is an explanatory drawing showing, as an example, another configuration of an electronic apparatus in accordance with the present invention.

FIG. 83 shows a personal digital assistant, which is primarily composed of a main body 202, a display section 203, a manipulation section 204, a sound output section 205, and a built-in battery 206. The above-mentioned image display device is applicable as the display section 203.

Figure 84:
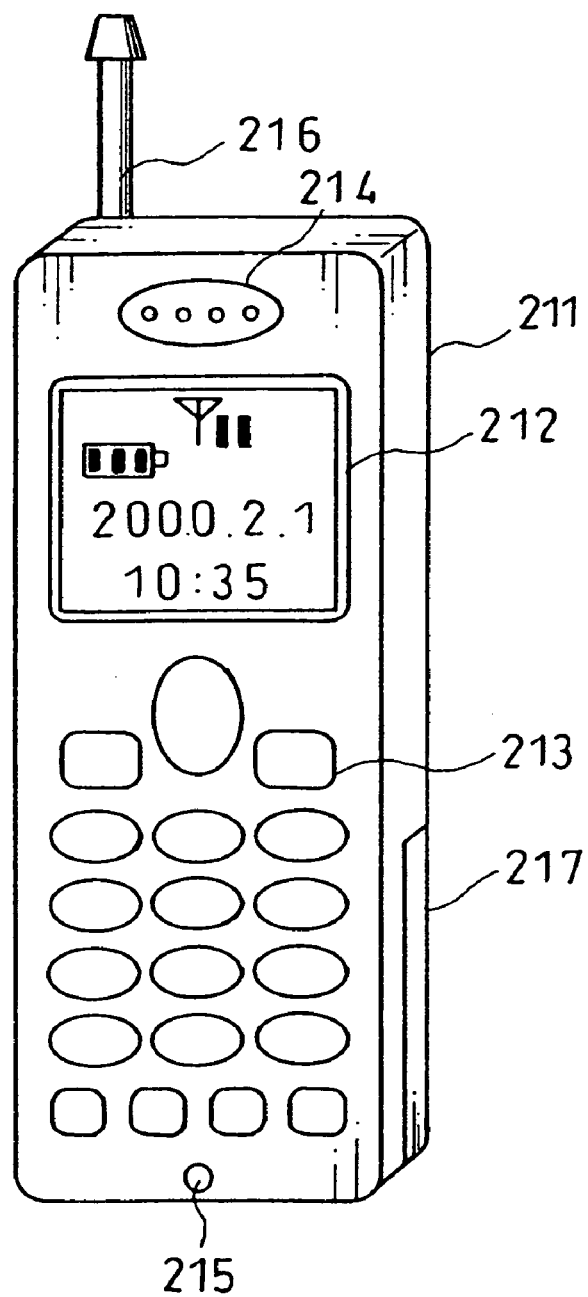
FIG. 84 is an explanatory drawing showing, as an example, another configuration of an electronic apparatus in accordance with the present invention.

FIG. 84 shows a mobile telephone, which is primarily composed of a main body 211, a display section 212, a manipulation section 213, a sound output section 214, a sound input section 215, an aerial 216, and a built-in battery 217. The above-mentioned image display device is applicable to the display section 212.

Figure 85:
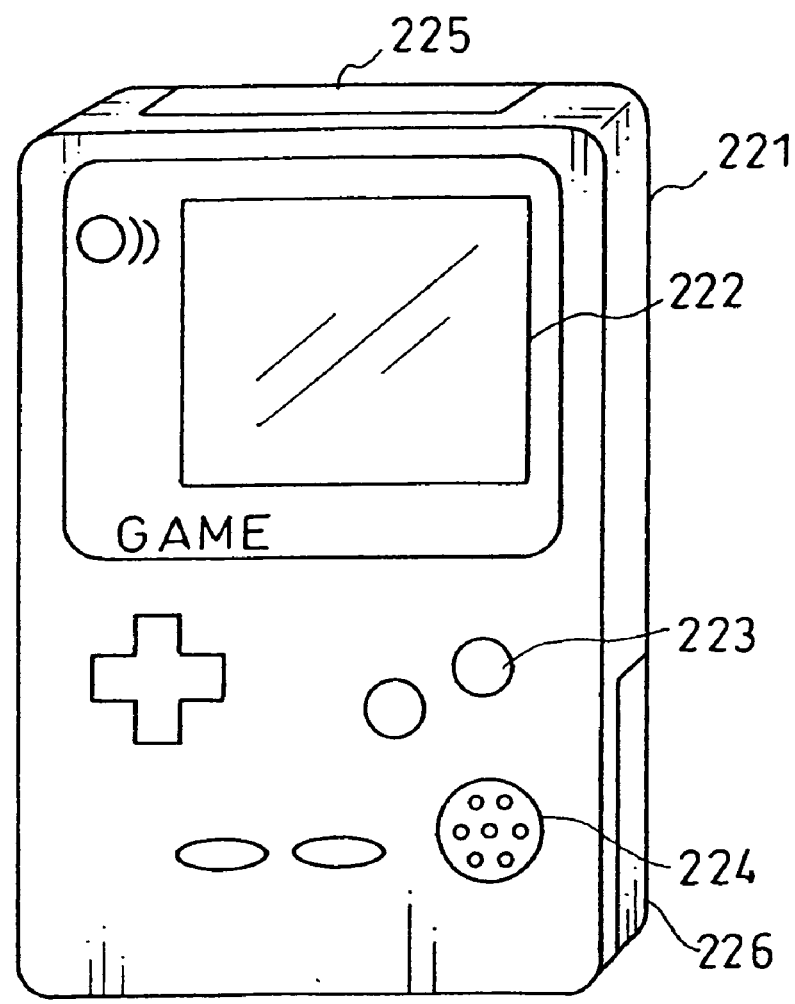
FIG. 85 is an explanatory drawing showing, as an example, another configuration of an electronic apparatus in accordance with the present invention.
Figure 86:
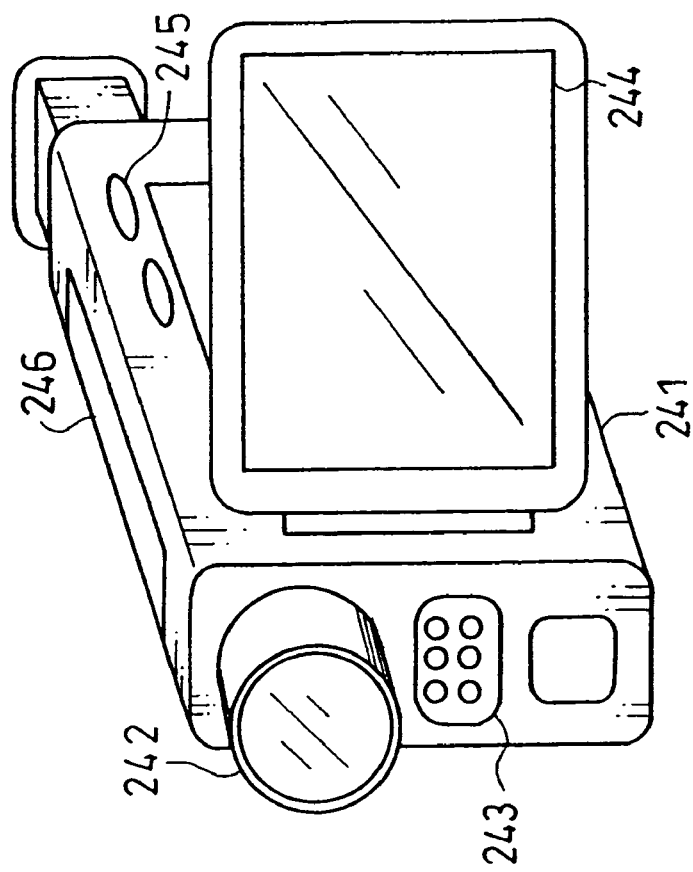
FIG. 86(a) and FIG. 86(b) are explanatory drawings showing, as an example, another configuration of an electronic apparatus in accordance with the present invention.
Figure 86:
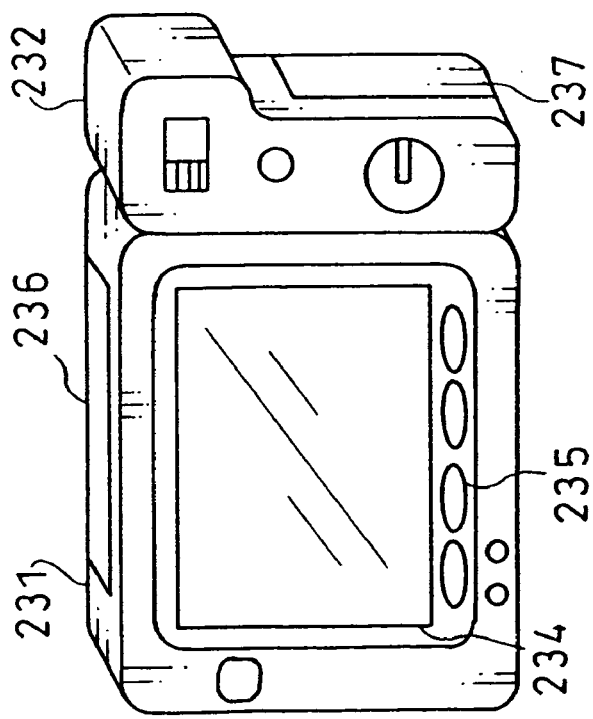

FIG. 85 shows a game player, which is primarily composed of a main body 221, a display section 222, a manipulation section 223, a sound output section 224, a recording medium insertion section 225, and a built-in battery 226. The above-mentioned image display device is applicable to the display section 222.

FIG. 86(a) and FIG. 86(b) both show a video camera, which is primarily composed of a main body 231, 241; an image-capturing section 232, 242; a sound input section 243; a display section 234, 244; a manipulation section 235, 245; a recording medium insertion section 236, 246; and a built-in battery 237. The above-mentioned image display device is applicable to the display section 234, 244.

Figure 87:
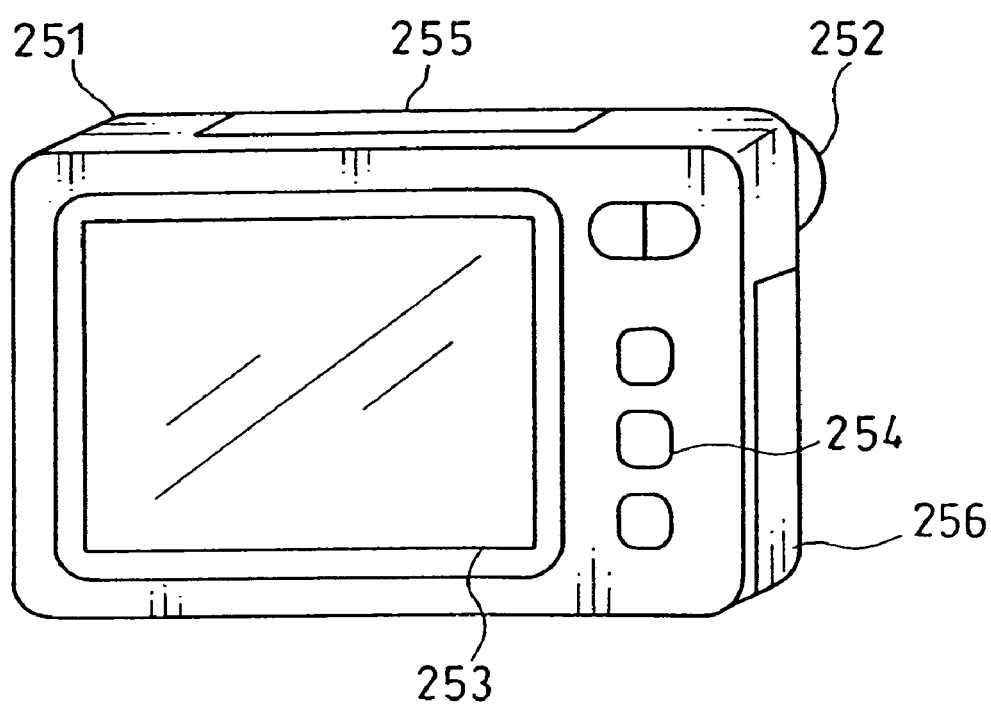
FIG. 87 is an explanatory drawing showing, as an example, another configuration of an electronic apparatus in accordance with the present invention.

FIG. 87 shows a still camera, which is primarily composed of a main body 251, an image-capturing section 252, a display section 253, a manipulation section 254, a recording medium insertion section 255, and a built-in battery 256. The above-mentioned image display device is applicable to the display section 253.

Figure 88:
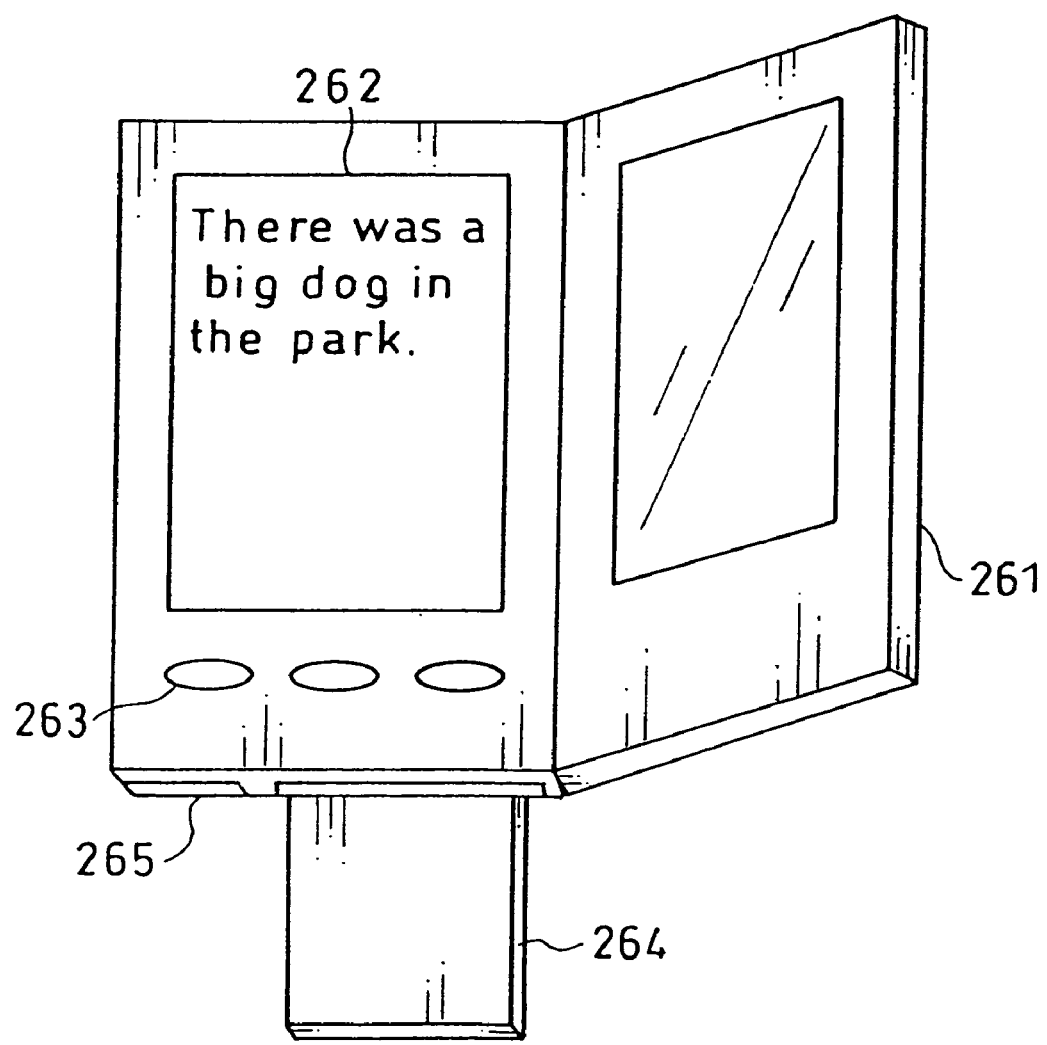
FIG. 88 is an explanatory drawing showing, as an example, another configuration of an electronic apparatus in accordance with the present invention.

FIG. 88 shows an electronic book, which is primarily composed of a main body 261, a display section 262, a manipulation section 263, a recording medium insertion section 264, and a built-in battery 265. The above-mentioned image display device is applicable to the display section 262.

Figure 89:
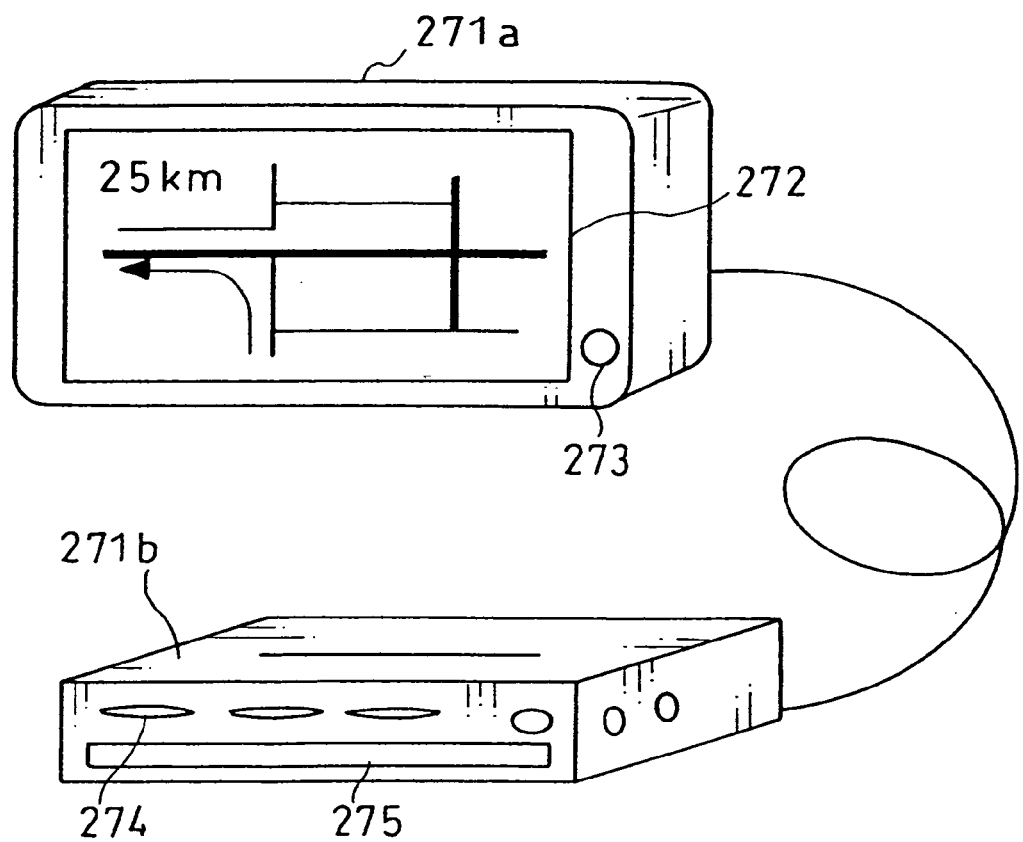
FIG. 89 is an explanatory drawing showing, as an example, another configuration of an electronic apparatus in accordance with the present invention.

FIG. 89 shows a car navigation system, which is primarily composed of a main body 271a, 271b, a display section 272, a sound output section 273, a manipulation section 274, a recording medium insertion section 275, and a location sensor. The above-mentioned image display device is applicable to the display section 272.

Figure 90:
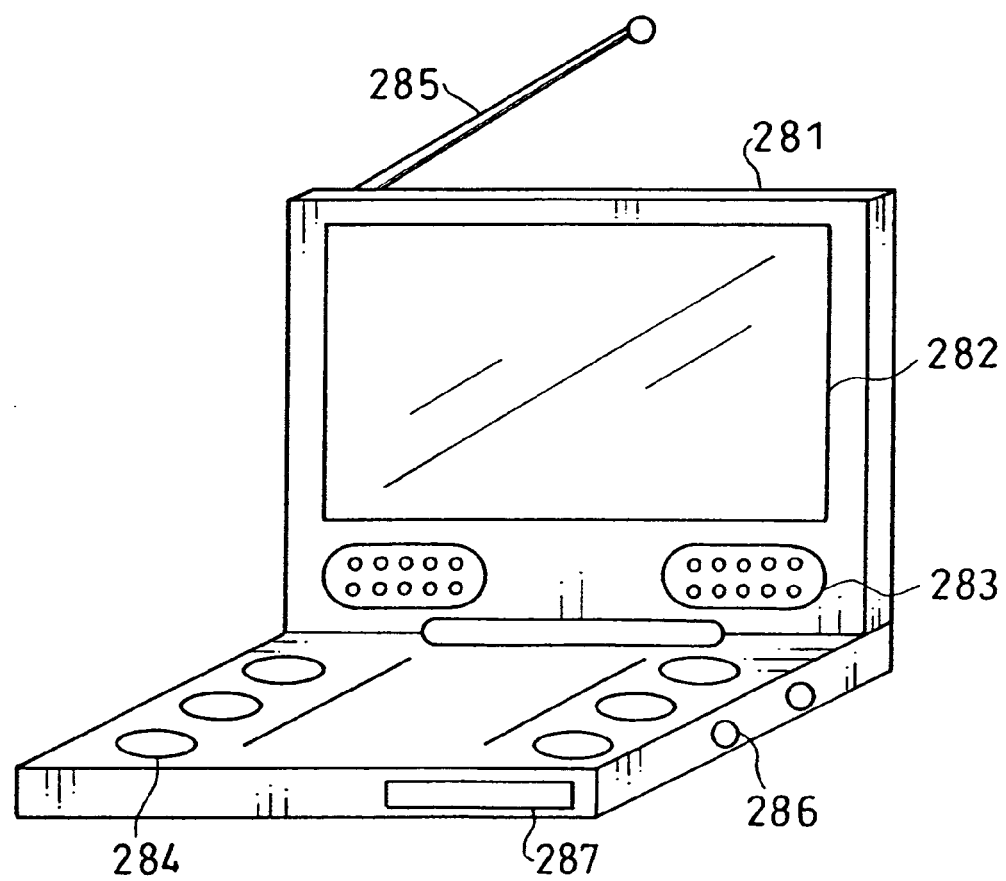
FIG. 90 is an explanatory drawing showing, as an example, another configuration of an electronic apparatus in accordance with the present invention.

FIG. 90 is a television receiver, which is primarily composed of a main body 281, a display section 282, a sound output section 283, a manipulation section 284, an aerial 285, an input and output terminal 286, and a built-in battery 287. The above-mentioned image display device is applicable to the display section 282.

Figure 91:
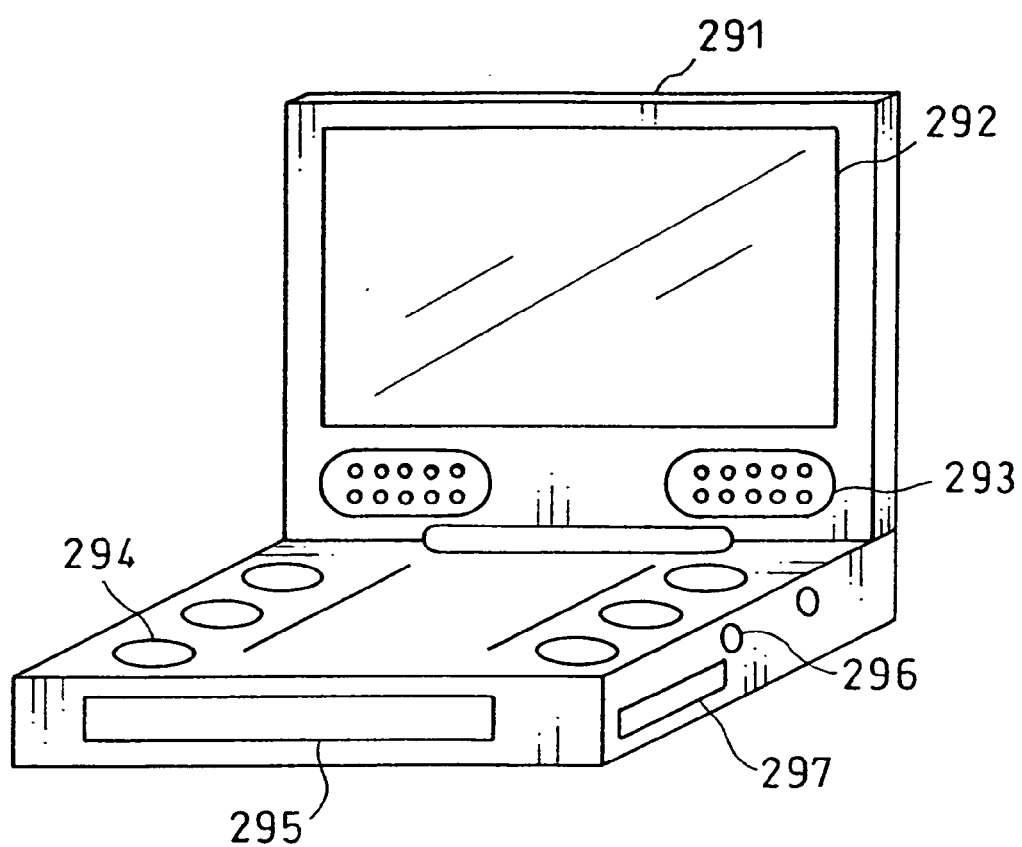
FIG. 91 is an explanatory drawing showing, as an example, another configuration of an electronic apparatus in accordance with the present invention.

FIG. 91 shows a video replay apparatus, which is primarily composed of a main body 291, a display section 292, a sound output section 293, a manipulation section 294, a recording medium insertion section 295, an input and output terminal 296, and a built-in battery 297. The above-mentioned image display device is applicable to the display section 292.

FIG. 92 shows a computer, which is primarily composed of a main body 301, a display section 302, a sound output section 303, a manipulation section 304, an input and output terminal 305, a recording medium insertion section 306, and a built-in battery 307. The above-mentioned image display device is applicable to the display section 302.

As detailed above, the present invention can find a wide variety of applications as a display section in electronic apparatus, allowing for selection of the most suitable display mode and format according to environmental and operating conditions to improve on the visibility, easy of manipulation, and convenience.

The present invention has been described by means of some configuration examples, but it is not limited to them. The present invention is equally applicable to, for example, any combination of these configuration examples.

An image display device in accordance with the present invention includes:

a pixel array constituted by a plurality of pixels for displaying an image;

a data signal line drive circuit for supplying a video signal to the pixel array;

a scan signal line drive circuit for controlling writing of the video signal to the plurality of pixels;

a timing circuit for supplying a timing signal to the data signal line drive circuit and the scan signal line drive circuit; and a video signal processing circuit for supplying the video signal to the data signal line drive circuit, and may be arranged so that:

a part or entirety of the data signal line drive circuit is provided in plurality so as to realize mutually different display configurations and drive one area in the pixel array.

Another image display device in accordance with the present invention is arranged as above and may be further arranged so that:

only one of the parts and entireties of the data signal line drive circuit operates at any given time.

Another image display device in accordance with the present invention is arranged as above and may be further arranged so that:

one of the parts and entireties of the data signal line drive circuit is driven throughout one or more frame periods.

Another image display device in accordance with the present invention is arranged as above and may be further arranged so that:

two or more of the parts and entireties of the data signal line drive circuit are switchably driven in one frame period.

Another image display device in accordance with the present invention is arranged as above and may be further arranged so that:

at least two of the parts and entireties of the data signal line drive circuit write image data in respective areas on a screen.

Another image display device in accordance with the present invention is arranged as above and may be further arranged so that:

at least two of the parts and entireties of the data signal line drive circuit write image data in one partial or whole area on a screen in one frame period.

Another image display device in accordance with the present invention is arranged as above and may be further arranged so that:

at least two of the parts and entireties of the data signal line drive circuit operate simultaneously.

Another image display device in accordance with the present invention is arranged as above and may be further arranged so that:

at least one of the part-s and entireties of the data signal line drive circuit writes image data overlapping an image written by another part or entirety of the data signal line drive circuit in one frame period.

Another image display device in accordance with the present invention is arranged as above and may be further arranged so that:

at least one of the parts and entireties of the data signal line drive circuit writes an image overlapping another image throughout one or more entire horizontal scan periods.

Another image display device in accordance with the present invention is arranged as above and may be further arranged so that:

at least one of the parts and entireties of the data signal line drive circuit writes an image overlapping another image only in a part of one or more entire horizontal scan periods.

Another image display device in accordance with the present invention is arranged as above and may be further arranged so that:

at least one of the parts and entireties of the data signal line drive circuit writes image data in a blanking period of each horizontal scan period.

Another image display device in accordance with the present invention is arranged as above and may be further arranged so that:

at least one of the parts and entireties of the data signal line drive circuit writes image data with a predetermined delay from another part or entirety of the data signal line drive circuit.

Another image display device in accordance with the present invention is arranged as above and may be further arranged so that:

the parts and entireties of the data signal line drive circuit are located opposing one another across the pixel array.

Another image display device in accordance with the present invention is arranged as above and may be further arranged so that:

the parts and entireties of the data signal line drive circuit are located on one side of the pixel array.

Another image display device in accordance with the present invention is arranged as above and may be further arranged so that:

the parts and entireties of the data signal line drive circuit share a common circuit.

Another image display device in accordance with the present invention includes:

a pixel array constituted by a plurality of pixels for displaying an image;

a data signal line drive circuit for supplying a video signal to the pixel array;

a scan signal line drive circuit for controlling writing of the video signal to the plurality of pixels;

a timing circuit for supplying a timing signal to the data signal line drive circuit and the scan signal line drive circuit; and a video signal processing circuit for supplying the video signal to the data signal line drive circuit, and may be arranged so that:

a part or entirety of the scan signal line drive circuit is provided in plurality so as to realize mutually different display configurations and drive one area in the pixel array.

Another image display device in accordance with the present invention is arranged as above and may be further arranged so that:

only one of the parts and entireties of the scan signal line drive circuit operates at any given time.

Another image display device in accordance with the present invention is arranged as above and may be further arranged so that:

one of the parts and entireties of the scan signal line drive circuit is driven throughout one or more frame periods.

Another image display device in accordance with the present invention is arranged as above and may be further arranged so that:

two or more of the parts and entireties of the scan signal line drive circuit are switchably driven in one frame period.

Another image display device in accordance with the present invention is arranged as above and may be further arranged so that:

at least two of the parts and entireties of the scan signal line drive circuit write image data in respective areas on a screen.

Another image display device in accordance with the present invention is arranged as above and may be further arranged so that:

the parts and entireties of the scan signal line drive circuit are located opposing one another across the pixel array.

Another image display device in accordance with the present invention is arranged as above and may be further arranged so that:

the parts and entireties of the scan signal line drive circuit are located on one side of the pixel array.

Another image display device in accordance with the present invention is arranged as above and may be further arranged so that:

the parts and entireties of the scan signal line drive circuit share a common circuit.

Another image display device in accordance with the present invention is arranged as above and may be further arranged so that:

an externally inputted signal controls which of the parts and entireties of the data signal line drive circuit will be driven.

Another image display device in accordance with the present invention is arranged as above and may be further arranged so that:

an externally inputted signal controls which of the parts and entireties of the scan signal line drive circuit will be driven.

Another image display device in accordance with the present invention is arranged as above and may be further arranged so that:

one of plurality of display modes and formats is selected according to a kind of input display data.

Another image display device in accordance with the present invention is arranged as above and may be further arranged so that:

one of plurality of display modes and formats is selected according to an environmental condition.

Another image display device in accordance with the present invention is arranged as above and may be further arranged so that:

the video signal processing circuit has a function to convert the input video signal to a plurality of kinds of display formats.

Another image display device in accordance with the present invention is arranged as above and may be further arranged so that:

the timing circuit has a function to convert the input timing signal to a signal compatible with a display format.

Another image display device in accordance with the present invention is arranged as above and may be further arranged so that:

the timing circuit includes means for, upon reception of an external control signal, switching destinations to which the timing signal is to be supplied.

Another image display device in accordance with the present invention is arranged as above and may be further arranged so that:

the video signal processing circuit includes means for, upon reception of an external control signal, switching destinations to which the video signal is to be supplied.

Another image display device in accordance with the present invention is arranged as above and may be further arranged so that it also includes:

means for detecting an environmental condition; and
means for switching display modes and formats according to a signal from the detection means.

Another image display device in accordance with the present invention is arranged as above and may be further arranged so that it also includes:

identification means for identifying a kind or format of the input video signal; and means for switching display modes and formats according to a signal from the identification means.

Another image display device in accordance with the present invention is arranged as above and may be further arranged so that:

each of the parts and entireties of either the data signal line drive circuit or the scan signal line drive circuit has its own power supply terminal and input terminal.

Another image display device in accordance with the present invention is arranged as above and may be further arranged so that:

the parts and entireties of either the data signal line drive circuit or the scan signal line drive circuit share a partially common power supply terminal and input terminal.

Another image display device in accordance with the present invention is arranged as above and may be further arranged so that:

none of the parts and entireties of either the data signal line drive circuit or the scan signal line drive circuit is fed with electric power when not operating.

Another image display device in accordance with the present invention is arranged as above and may be further arranged so that it also includes:

means for electrically isolating some of the parts and entireties of either the data signal line drive circuit or the scan signal line drive circuit that are not being involved in producing a display from the pixel array.

Another image display device in accordance with the present invention is arranged as above and may be further arranged so that:

one of a plurality of display formats produces a relatively high quality display, whilst the other produces a relatively low quality display.

Another image display device in accordance with the present invention is arranged as above and may be further arranged so that:

one of a plurality of display formats consumes relatively little power, whilst the other consumes a relatively great power.

Another image display device in accordance with the present invention is arranged as above and may be further arranged so that:

one of a plurality of display formats produces a relatively high resolution, whilst the other produces a relatively low resolution.

Another image display device in accordance with the present invention is arranged as above and may be further arranged so that:

one of a plurality of display formats is a color display, whilst the other is a black-and-white display.

Another image display device in accordance with the present invention may be arranged so that:

one of the parts and entireties of the data signal line drive circuit writes identical image data to a plurality of data signal lines.

Another image display device in accordance with the present invention may be arranged so that:

one of the parts and entireties of the data signal line drive circuit writes identical image data to data signal lines corresponding to some of the plurality of pixels of the same color, those some pixels being horizontally adjacent to each other with or without an intervening pixel of a different color.

Another image display device in accordance with the present invention may be arranged so that:

one of the parts and entireties of the data signal line drive circuit writes identical image data to data signal lines corresponding to some of the plurality of pixels, those some pixels being horizontally adjacent to each other and of three different colors.

Another image display device in accordance with the present invention may be arranged so that:

a scan signal is written to a plurality of successive scan signal lines at an identical timing; and the data signal line drive circuit outputs image data which is held by the plurality of data signal lines in each scan period.

Another image display device in accordance with the present invention may be arranged so that:

a scan signal is written to a plurality of successive scan signal lines at different timings; and the data signal line drive circuit outputs identical image data in each scan period.

Another image display device in accordance with the present invention may be arranged so that:

a scan signal is written to a plurality of successive scan signal lines at different timings; and the data signal line drive circuit outputs image data which is held by the plurality of data signal lines in a period including a plurality of scan periods.

Another image display device in accordance with the present invention may be arranged so that:

a scan signal is written to a plurality of successive scan signal lines at different timings; and the data signal line drive circuit outputs image data representing an identical halftone, but different polarities, in each scan period.

Another image display device in accordance with the present invention may be arranged so that:

image data is written to data signal lines without changing a polarity thereof throughout one frame period.

Another image display device in accordance with the present invention is arranged as above and may be further arranged so that:

one of the plurality of display formats displays a relatively great number of halftones, whilst the other displays a relatively small number of halftones.

Another image display device in accordance with the present invention is arranged as above and may be further arranged so that:

one of the plurality of display formats is compatible with a halftone display, whilst the other is compatible with a binary display.

Another image display device in accordance with the present invention is arranged as above and may be further arranged so that:

the parts and entireties of the data signal line drive circuit include a reference voltage selection circuit and an intermediate potential generation circuit, wherein:

when relatively a few halftones are displayed, the reference voltage selection circuit operates, but the intermediate potential generation circuit does not operate; and when relatively many halftones are displayed, both the reference voltage selection circuit and the intermediate potential generation circuit operate.

Another image display device in accordance with the present invention is arranged as above and may be further arranged so that:

the parts and entireties of the data signal line drive circuit include an amplifier circuit, wherein when relatively a few halftones are displayed, the amplifier circuit does not operate; and when relatively many halftones are displayed, the amplifier circuit operates.

Another image display device in accordance with the present invention is arranged as above and may be further arranged so that:

the input video signal is analog in one of the plurality of display formats and digital in the other.

Another image display device in accordance with the present invention is arranged as above and may be further arranged so that:

the input video signal carries image data in one of the plurality of display formats and text data in the other.

Another image display device in accordance with the present invention is arranged as above and may be further arranged so that: the input video signal carries natural image data in one of the plurality of display formats and graphics data in the other.

Another image display device in accordance with the present invention is arranged as above and may be further arranged so that:

one of a plurality of display modes is a transmission display mode, whilst the other is a reflection display mode.

Another image display device in accordance with the present invention may be arranged so that:

none of the parts and entireties of the drive circuit(s) writes image data in at least a part of a display area.

Another image display device in accordance with the present invention may be arranged so that:

none of the parts and entireties of the drive circuit(s) writes image data in a part of a display area by controlling outputs from the parts and entireties of the drive circuit(s) based on a signal that represents drive timings of the signal lines.

Another image display device in accordance with the present invention may be arranged so that:

none of the parts and entireties of the drive circuit(s) writes image data in a part of a display area by controlling outputs from the parts and entireties of the drive circuit(s) based on a reset signal causing the parts and entireties of the drive circuit(s) to stop scanning.

Another image display device in accordance with the present invention may be arranged so that:

none of the parts and entireties of the drive circuit(s) writes image data in a part of a display area by inputting a start signal from an intermediate stage of a scan circuit included in the parts and entireties of the drive circuit(s), the start signal causing the parts and entireties of the drive circuit(s) to start scanning.

Another image display device in accordance with the present invention is arranged as above and may be further arranged so that:

the parts and entireties of either or both of the data signal line drive circuit and the scan signal line drive circuit are formed on the same substrate as are the plurality of pixels.

Another image display device in accordance with the present invention is arranged as above and may be further arranged so that:

the parts and entireties of either or both of the data signal line drive circuit and the scan signal line drive circuit include a polycrystalline silicon thin transistor as an active element.

Another image display device in accordance with the present invention is arranged as above and may be further arranged so that:

the active element is formed on a glass substrate by a process at or below 600° C.

An electronic apparatus in accordance with the present invention incorporates an image display device as an output device, and may be arranged so that the image display device is any one of the aforementioned image display devices.

Another electronic apparatus in accordance with the present invention is arranged as above and may be further arranged so that it switches between display modes or display formats according to whether it is driven by an external power source or by an internal battery.

Another electronic apparatus in accordance with the present invention is arranged as above and may be further arranged so that:

the electronic apparatus switches between display modes or display formats according to whether it is standing by or is operating.

Another electronic apparatus in accordance with the present invention is arranged as above and may be further arranged so that:

the electronic apparatus switches between display modes or display formats according to ambient brightness when used.

Any of the foregoing electronic apparatuses in accordance with the present invention may be arranged to act as a personal digital assistant, mobile telephone, game player device, video camera, still camera, electronic book, navigator system, television receiver, video replay apparatus, or computer.

As described so far, the image display device in accordance with the present invention incorporates a plurality of data signal line drive circuits and scan signal line drive circuits that are arranged differently. Different data signal line drive circuits and scan signal line drive circuits are compatible with different display formats (e.g., resolution, display halftones). Therefore, depending on the selection of a drive circuit, display quality and power consumption during operation vary. By switching the operating drive circuits depending on the kind of input video and environmental conditions, a display can be produced in the most suitable (necessary and sufficient) display format and power consumption can be successfully reduced.

Moreover, by writing video signals to signal lines with a time difference using a plurality of drive circuits, an image can be written over another image, which enables a superimpose display without externally processing the video signals.

The electronic apparatus incorporating this image display device can be optimized in terms of display quality, maximum operating time, etc. and therefore will improve in terms of visual recognition, operability, and overall convenience. In this manner, according to the present invention, the image display device can produce an image display of satisfactory quality and reduced power consumption.

[Embodiment 2]

Referring to FIG. 93 to FIG. 96, the following will describe another embodiment in accordance with the present invention.

Figure 93:
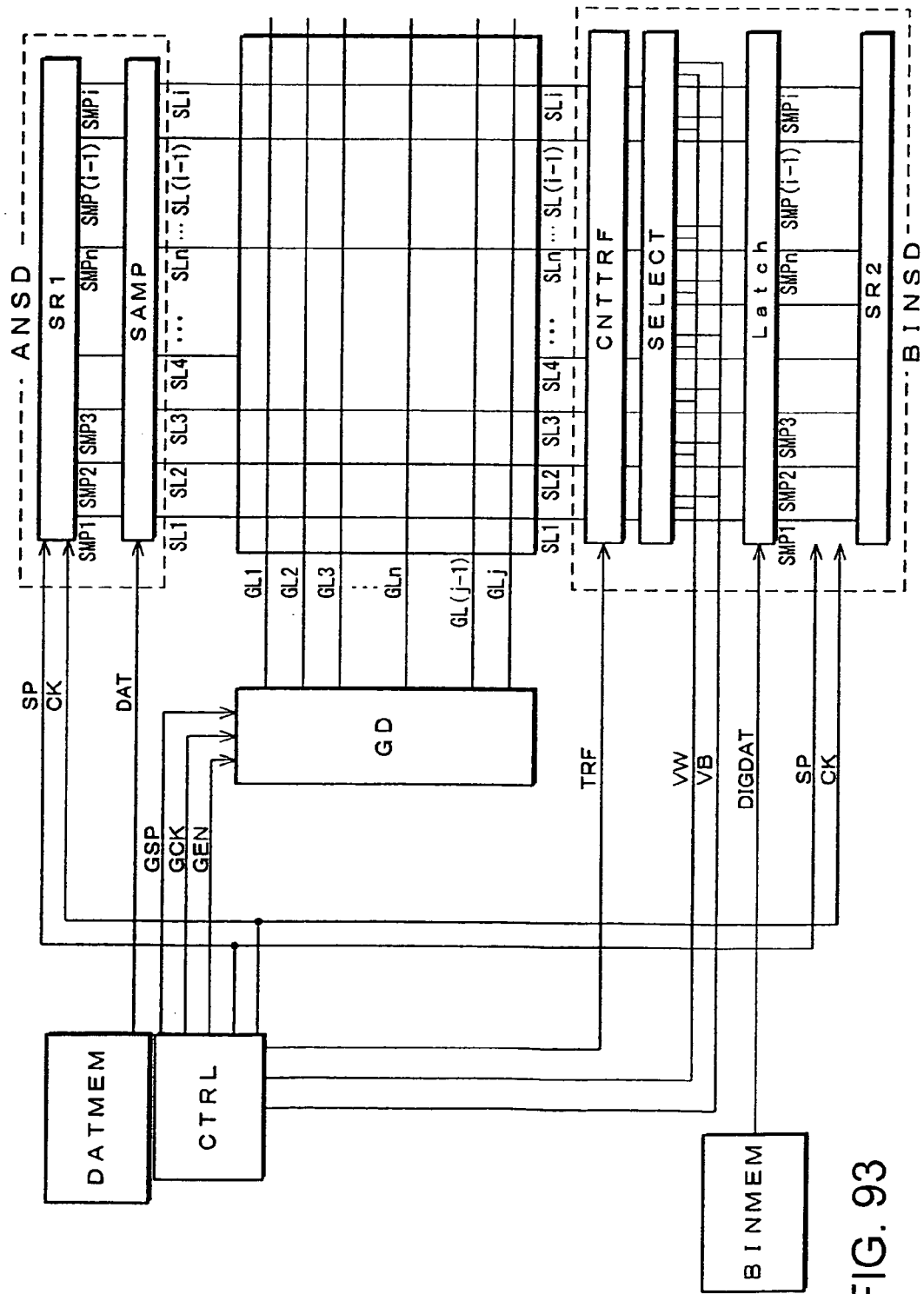
FIG. 93 is a block diagram showing, as an example, a configuration of an image display device in accordance with the present invention.

FIG. 93 is a block diagram showing, as an example, a configuration of an image display device of the present embodiment. The present image display device is composed of a multitone analog data signal line drive circuit ANSD and scan signal line drive circuit GD, a binary data signal line drive circuit BINSD, data signal lines SLn ($1 \leq n \leq i$), scan signal lines GLn ($1 \leq n \leq j$), pixels PIX, a control signal circuit CTRL, a binary data storage section BINMEM, and a multitone data storage section DATMEM.

The analog data signal line drive circuit ANSD includes a shift register SR1 and sampling section SAMP which operate in synchronism with a clock signal CK. The multitone analog data signal line drive circuit ANSD may be replaced with a drive circuit for binary analog data, drive circuit for digital data, or a drive circuit for a binary digital data.

The binary data signal line drive circuit BINSD includes (1) a shift register SR2 which operates in synchronism with a clock signal CK; (2) a data holding section Latch for sampling and holding binary data signals DIGDAT which are inputted digital data; (3) a data switching section SELECT for switching a binary data potential between a for-turn-on potential and a for-non-turn-on potential according the held data; and (4) an output control section CNTTRF, provided between the output of the data switching section SELECT and the data signal line, for controlling an output according to an externally inputted transfer instruction signal TRF.

Composed similarly to conventional ones as shown in FIG. 133, the pixel PIX includes a switching element SW, liquid crystal capacitance CL, and supplemental capacitance CS. One of two ends of the capacitance constituting the pixel PIX through the switching element SW is connected to the data signal line SL; the other end is connected to a common electrode called an opposite electrode COM (not shown) and an opposite potential VCOM is applied thereto. In other words, the difference between the opposite potential VCOM and the signal potential written to the pixel PIX via the data signal line SL and the switching element SW is applied across the liquid crystal, and various display states are realized by modifying light that transmits or reflects at the liquid crystal according to the real voltage value of the applied potential.

The analog data signal line drive circuit ANSD, the scan signal line drive circuit GD, the binary data signal line drive circuit BINSD, and the switching elements constituting the pixels PIX are provided on the same substrate as polycrystalline silicon thin film transistors at processing temperatures of 600° C. and less.

Figure 94:
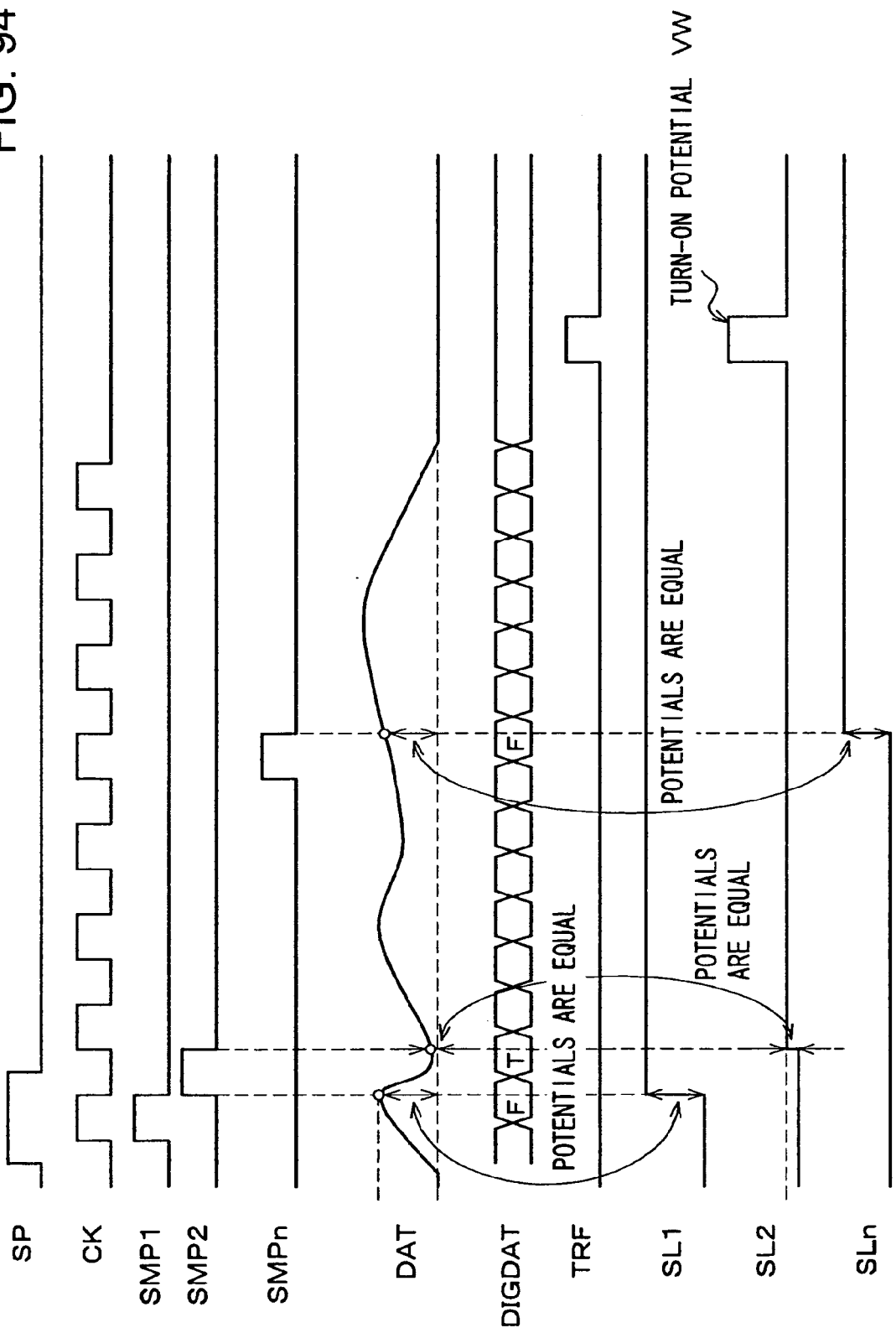
FIG. 94 is a timing chart showing operation of a binary data signal line drive circuit in accordance with the present invention.

FIG. 94 is a timing chart of the present embodiment, showing a clock signal CK and a start signal SP inputted to the analog data signal line drive circuit ANSD and the binary data signal line drive circuit BINSD; sampling signals SMPn ($1 \leq n \leq i$) outputted, in synchronism with the signals, by the shift registers SR1, SR2 constituting the analog data signal line drive circuit ANSD and the binary data signal line drive circuit BINSD; binary data signals DIGDAT inputted to the binary data signal line drive circuit; a video signal DAT which is an analog video signal inputted to the data signal line drive circuit; a transfer instruction signal TRF; a for-turn-on potential VW (in case of normally black) which is a liquid-crystal-driving white potential inputted to the data switching section SELECT constituting the binary data signal line drive circuit BINSD at a timing of the transfer instruction signal TRF timing; and potential conditions of the data signal lines SLn.

Figure 95:
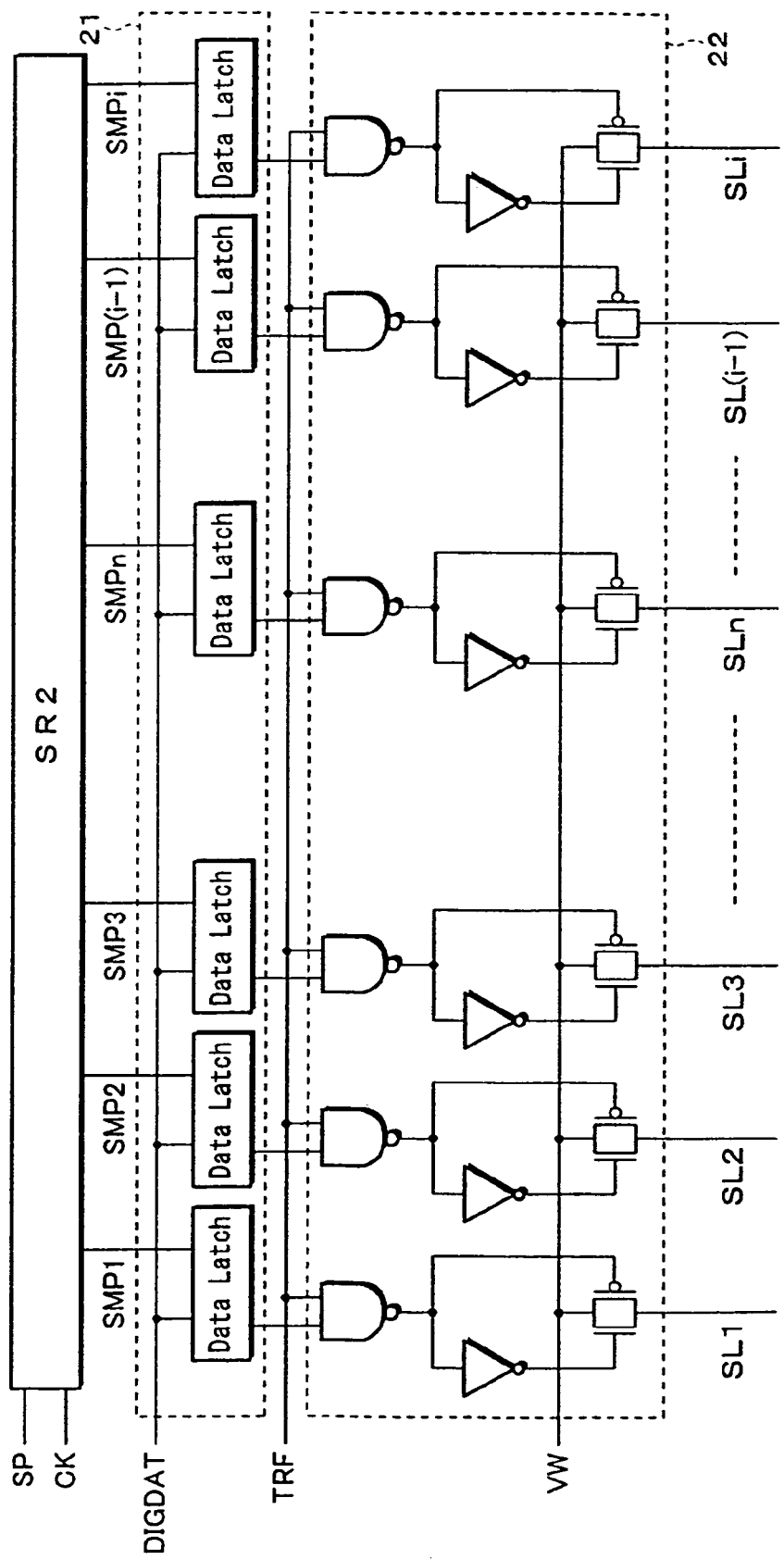
FIG. 95 is a block diagram showing, as an example, a configuration of a binary data signal line drive circuit in accordance with the present invention.

FIG. 95 is a block diagram of the binary data signal line drive circuit BINSD. 21 represents a data holding section. The data switching section SELECT and the output control section CNTTRF constitute the data control section 22. FIG. 4 shows a configuration example of the data holding section Latch.

Now, operations under these circumstances will be described in reference to the timing chart of FIG. 94. As the start signal SP and the clock signal CK of FIG. 94 are inputted to the analog data signal line drive circuit ANSD and the binary data signal line drive circuit BINSD, the associated shift registers SR1, SR2 each output sequential sampling signals SMP1, SMP2, SMP3, SMPn in synchronism with the clock signal CK.

As to the analog data signal line drive circuit ANSD, the video signal DAT and the sampling signals outputted from the shift register SR1 are inputted to the sampling section SAMP composed of analog switches where the video signal DAT is sampled to the data signal line SL in synchronism with the sampling signals.

Under these circumstances, the binary data signal line drive circuit BINSD samples and latches (holds), according to the sampling signals outputted by the shift register SR2, the binary data signals DIGDAT separately inputted to the data latch section Latch. "T" and "F" appearing alongside the waveform of DIGDAT denote a period in which data is meaningful and meaningless respectively. In other words, when the binary data signal DIGDAT sampled according to a sampling signal SMP is "T," the for-turn-on potential VW is selected (in case of normally black). Therefore, in the present embodiment, the for-turn-on potential VW is selected only when the held data is meaningful; otherwise, the output control section CNTTRF dose not operate even if the transfer instruction signal TRF is inputted so as to retain the original image.

Conversely, the configuration may be such that the for-non-turn-on potential VB which is a liquid crystal drive black potential is selected when the held data is meaningful (in case of normally white). Data being meaningful indicates that there exists data. For example, in binary display, in case of normally black (black background), the for-turn-on potential VW which is a liquid-crystal-driving white potential is selected where data is meaningful, to display a white image; in case of normally white (white background), the for-non-turn-on potential VB which is a liquid crystal drive black potential is selected where data is meaningful, to display a black image.

Next, the analog data signal line drive circuit ANSD and the binary data signal line drive circuit BINSD finish sampling of the video signal DAT and the binary data signals DIGDAT. Here, the video signal DAT is supplied to the data signal lines SL by the analog data signal line drive circuit ANSD. Subsequently, in a horizontal blanking period, the for-turn-on potential VW selected by the data signal switching section SELECT is written to a plurality of data signal lines in the output control section CNTTRF constituting the binary data signal line drive circuit BINSD according to the output of the data latch section and the transfer instruction signal TRF. Consequently, the for-turn-on potential VW is overwritten to the data signal line only when the binary data signal is meaningful. When the binary data signal is meaningless, the video signal DAT written by the analog data signal line drive circuit ANSD remains written. Then, the scan signal line drive circuit GD drives the scan signal lines GLn, the data written to the data signal line SL is written to the pixel PIX and displayed by the display section.

In this manner, a plurality sets of image data can be superimposed to display without advance synthesis, thereby offering a less power consuming image display device.

[Embodiment 3]

Figure 97:
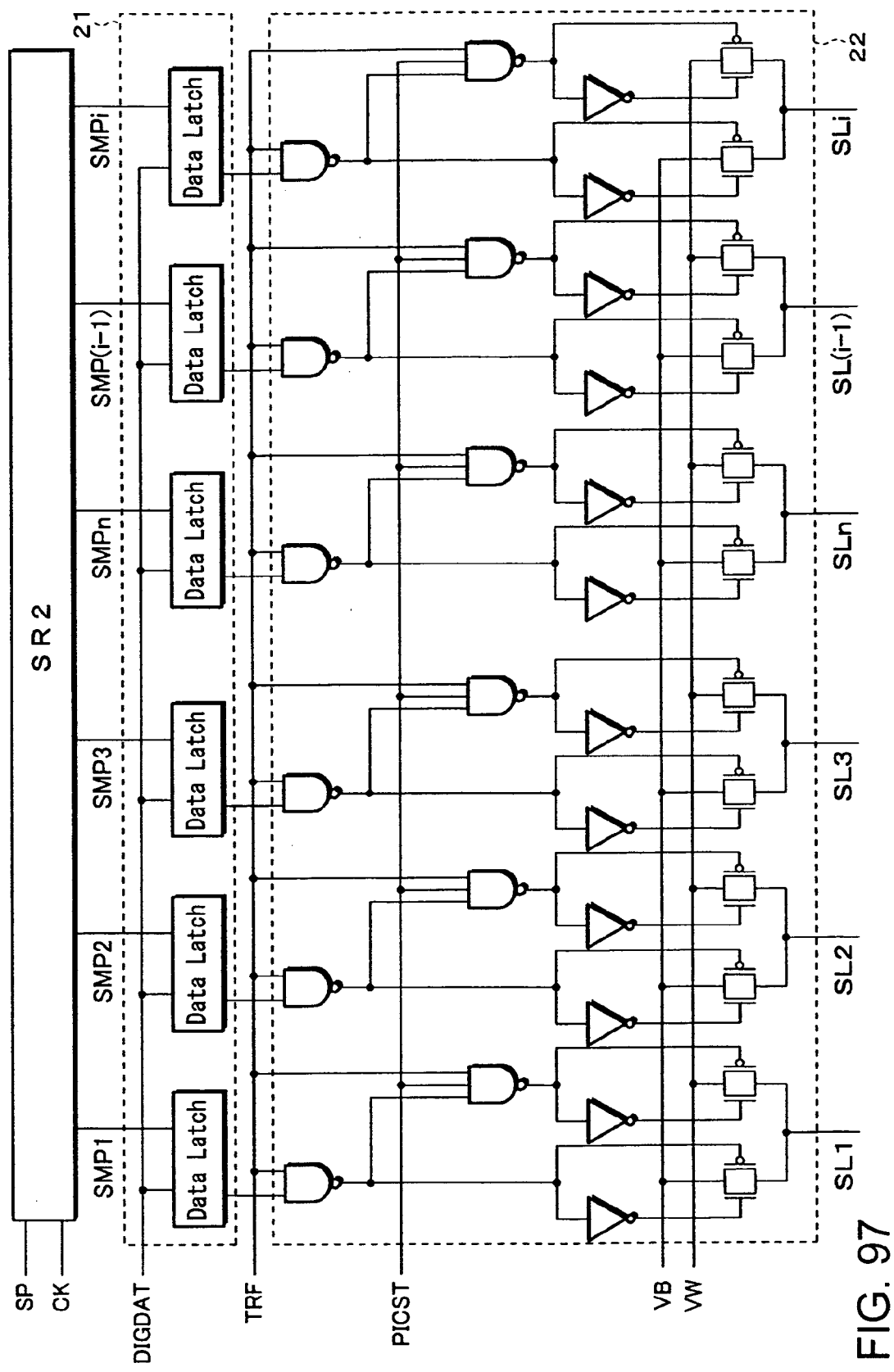
FIG. 97 is a block diagram showing, as an example, a configuration of another binary data signal line drive circuit in accordance with the present invention.

Referring to FIG. 97, the following will describe still another embodiment in accordance with the present invention. Here, for convenience, members of the present embodiment that have the same arrangement and function as members shown in a figure of any one of the previous embodiments, and that are mentioned in that embodiment are indicated by the same reference numerals and description thereof is omitted.

In the present embodiment, a display state switching signal PICST is separately inputted to the output control section CNTTRF constituting the binary data signal line drive circuit BINSD. FIG. 97 is a block diagram showing the binary data signal line drive circuit BINSD in such a case. In embodiment 2, either the for-turn-on potential VW or the for-non-turn-on potential VB is supplied to the data signal line only when the binary data signal DIGDAT is meaningful. In contrast, in the present embodiment, the output control section CNTTRF operates as follows: when the display state switching signal PICST is active, a display is produced similarly to the case of embodiment 2.

Also, when the display state switching signal PICST is non-active, if the binary data is meaningful, the for-turn-on potential VW is supplied to the data signal line; if the binary data is meaningless, the for-non-turn-on potential VB is supplied to the data signal line. As a result, when the display state switching signal PICST is non-active, the pixels PIX connected to the data signal lines of which the binary data is meaningful is turned on, whereas those connected to the data signal lines of which the binary data is meaningless are not turned on. It is therefore only the binary data signal line drive circuit BINSD that drives the data signal lines SL. Here, by suspending the supply of the start signal SP, the clock signal CK, and the video signal DAT to the analog data signal line drive circuit ANSD, driving capabilities become available such that desirable conditions both during operation and during standby are suitably met, thereby offering a less power consuming image display device.

The user of the image display device can freely change the display state switching signal PICST. It is also possible in a mobile telephone, for example, to cause the display state switching signal PICST to automatically switch from active to non-active with the change from a full color display in a standby period to a text display in, a mail reception notification period.

[Embodiment 4]

Figure 98:
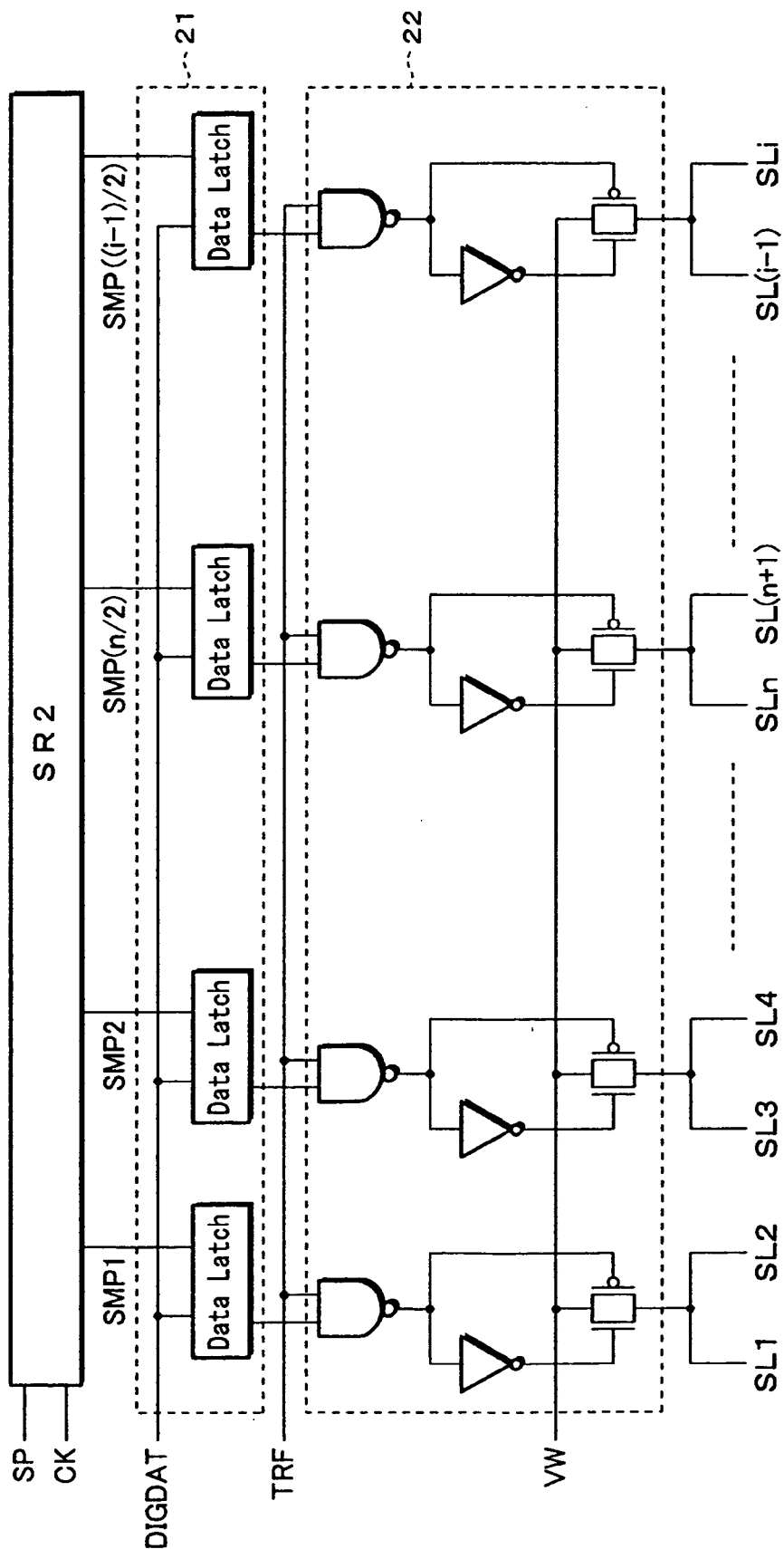
FIG. 98 is a block diagram showing, as an example, a configuration of still another binary data signal line drive circuit in accordance with the present invention.

Referring to FIG. 98, the following will describe yet another embodiment in accordance with the present invention. Here, for convenience, members of the present embodiment that have the same arrangement and function as members shown in a figure of any one of the previous embodiments, and that are mentioned in that embodiment are indicated by the same reference numerals and description thereof is omitted.

In the present embodiment, the output of the binary data signal line drive circuit BINSD is coupled to two data signal line drive circuits. FIG. 98 shows a block diagram. With such a configuration, resolution can be readily varied (reduced) at a given place on the screen, as compared to a case of a single data signal line drive circuit. Under these circumstances, for the shift register SR2 constituting the binary data signal line drive circuit BINSD, a clock signal is sufficient which has a frequency half that of the clock CK inputted to the shift register SR1 in the analog data signal line drive circuit ANSD. Generally, power consumption P increases in proportion with frequency f. Therefore, the configuration allows for further reduction in power consumption and enables an image display device to be offered with driving capabilities that match desirable conditions both during use and during standby. Also, a plurality sets of image data can be superimposed to display without advance synthesis, thereby offering a less power consuming image display device.

[Embodiment 5]

Figure 99:
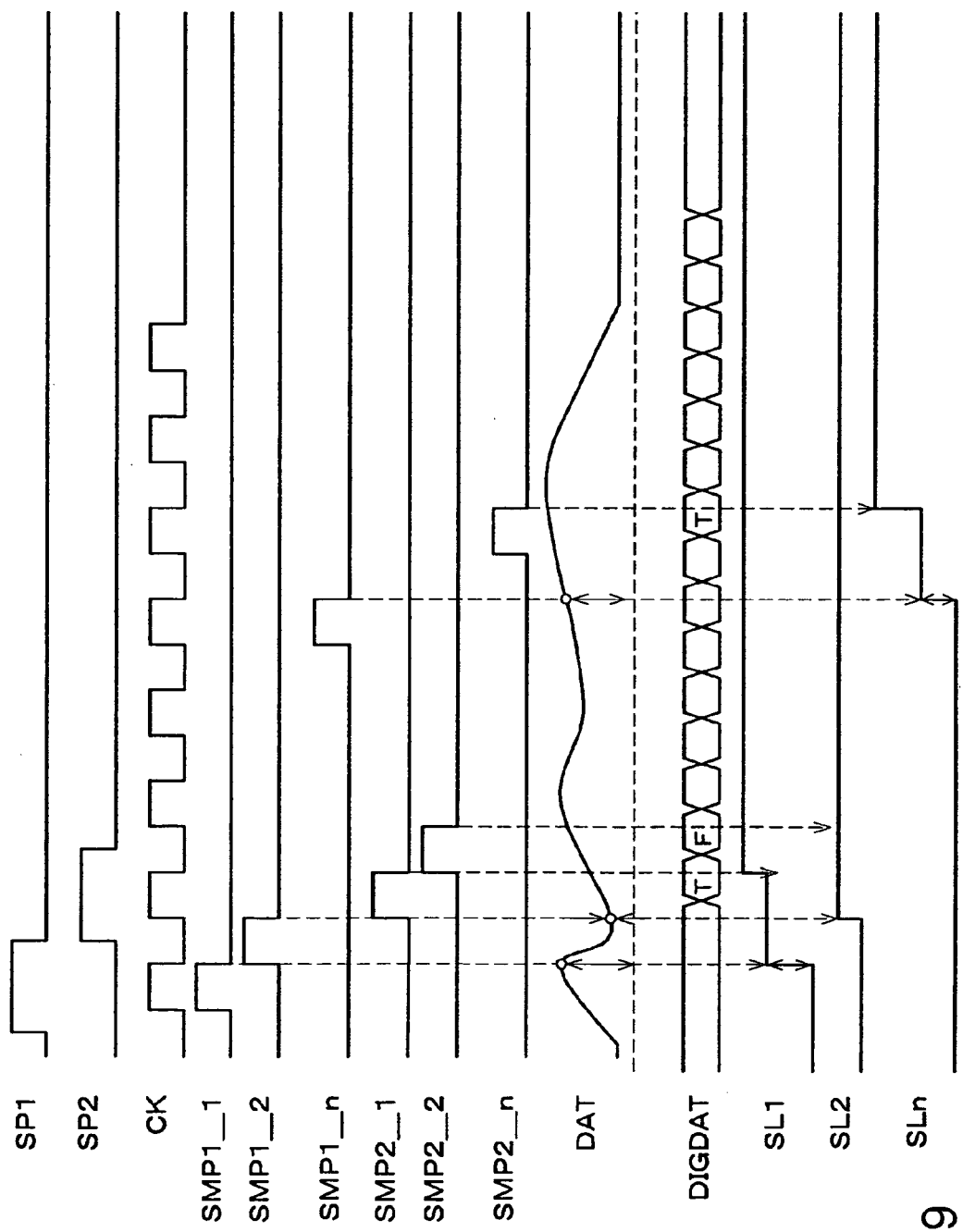
FIG. 99 is timing chart showing operation of a binary data signal line drive circuit in accordance with the present invention.
Figure 100:
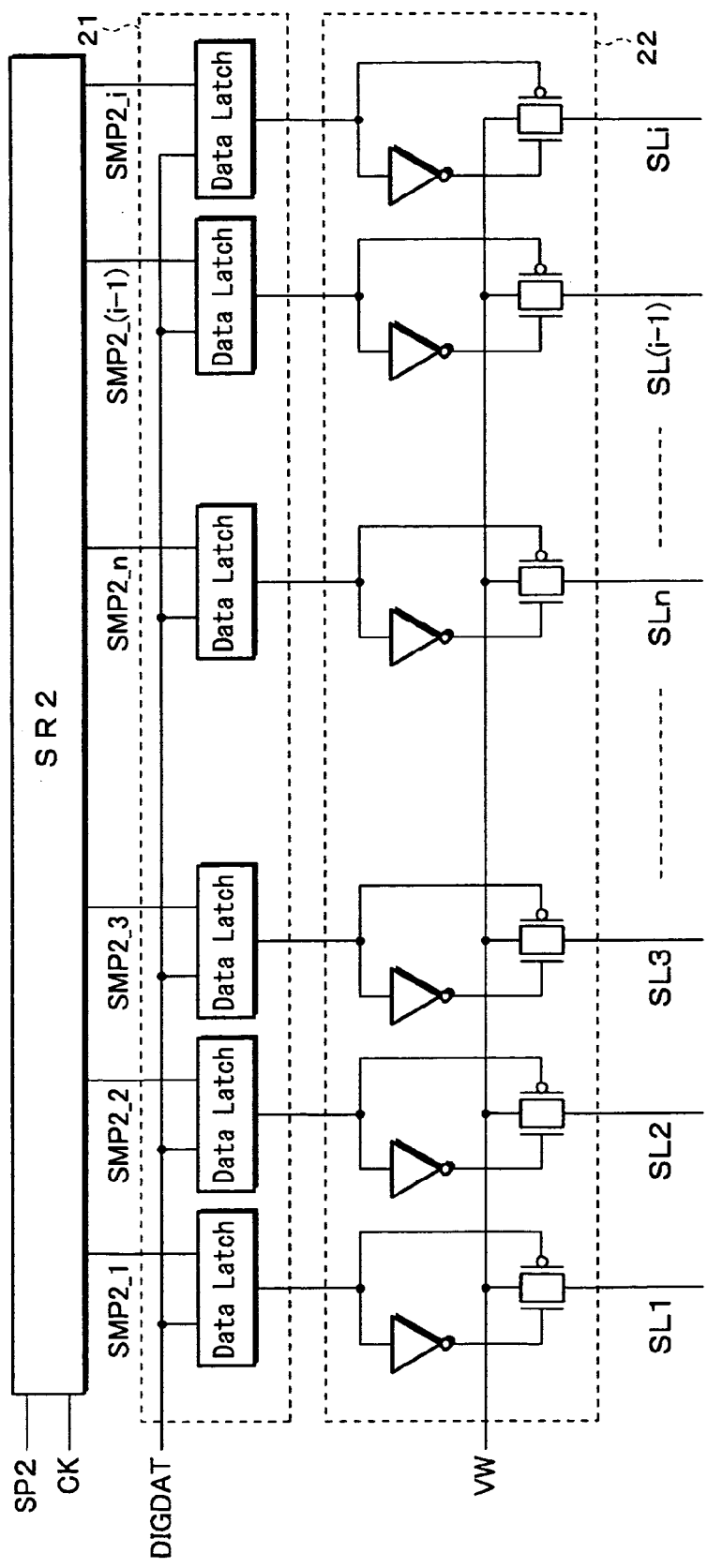
FIG. 100 is a block diagram showing, as an example, a configuration of yet another binary data signal line drive circuit in accordance with the present invention.

Referring to FIG. 99 and FIG. 100, the following will describe still another embodiment in accordance with the present invention. Here, for convenience, members of the present embodiment that have the same arrangement and function as members shown in a figure of any one of the previous embodiments, and that are mentioned in that embodiment are indicated by the same reference numerals and description thereof is omitted.

In the present embodiment, the start signal SP1 to the analog data signal line drive circuit ANSD and the start signal SP2 to the binary data signal line drive circuit BINSD are separately provided. FIG. 99 shows a timing chart, and FIG. 100 shows a block diagram of the binary data signal line drive circuit BINSD. The timing chart of FIG. 99 shows a start signal SP1 for use with an analog data signal line drive circuit ANSD; a start signal SP2 for use with a binary data signal line drive circuit BINSD; a clock signal CK; a video signal DAT; a binary data signal DIGDAT; output signals SMP1_1, SMP1_2, SMP1_n as sampling signals of the shift register SR1 in the analog data signal line drive circuit ANSD; and output signals SMP2_1, SMP2_2, and SMP2_n as sampling signals of the shift register SR2 in the binary data signal line drive circuit BINSD. Here, the configuration is such that the binary data signal line drive circuit BINSD supplies either the for-turn-on potential VW or the for-non-turn-on potential VB to the data signal line simultaneously with an output of the shift register SR2.

Under these circumstances, according to the timing chart of FIG. 99, the start signal SP1 is inputted earlier than SP2. Therefore, the shift register SR1 supplies the video signal DAT to the data signal line before the shift register SR2. The configuration is such that both SMP1_1 and SMP2_1 act on the data signal line SL1. First, SMP1_1 causes the video signal DAT to be supplied, and then SMP2_1 causes either the for-turn-on potential VW or the for-non-turn-on potential VB to be supplied according to the binary data signal DIGDAT when the binary data signal DIGDAT is meaningful, which produces effects similar to those in embodiment 2.

[Embodiment 6]

Referring to FIG. 101 to FIG. 110, the following will describe still another embodiment in accordance with the present invention. Here, for convenience, members of the present embodiment that have the same arrangement and function as members shown in a figure of any one of the previous embodiments, and that are mentioned in that embodiment are indicated by the same reference numerals and description thereof is omitted.

In the foregoing embodiments, the signals inputted to the data signal line drive circuits had the equal potential as that of the source voltage of the data signal line drive circuit. However, in recent years, image display devices are widely used in personal digital assistants, whereupon reductions in power consumption are in great demand. Generally, an electronic circuit consumes electric power increasing in large amounts in proportion to frequency, load capacitance, and the square of the voltage. Therefore, for example, in image display devices or circuits connected to an image display device, such as a circuit producing a video signal to the image display device, drive voltage tends to be specified to an increasingly low level to reduce power consumption.

In a circuit including monocrystalline silicon transistors, such as a video signal producing circuit, drive voltage is in may cases specified to, for example, 5 V or 3.3 V or less. However, in circuits including polycrystalline silicon thin film transistors to ensure a wide display area, such as the pixels, the data signal line drive circuit and scan signal line drive circuit, the difference in threshold value voltage between the substrates sometimes reaches a few volts for example; it is difficult to say that there is sufficient advancement in the reduction of drive voltage.

Therefore, when an input signal is applied which is lower than the drive voltage for the shift register constituting a data signal line drive circuit, the shift register may be provided with a level shifter to increase the voltage level of the input signal. The binary data signal which is digital data makes no exception; a data holding section for sampling and storing data may be provided with a similar level shifter.

Figure 101:
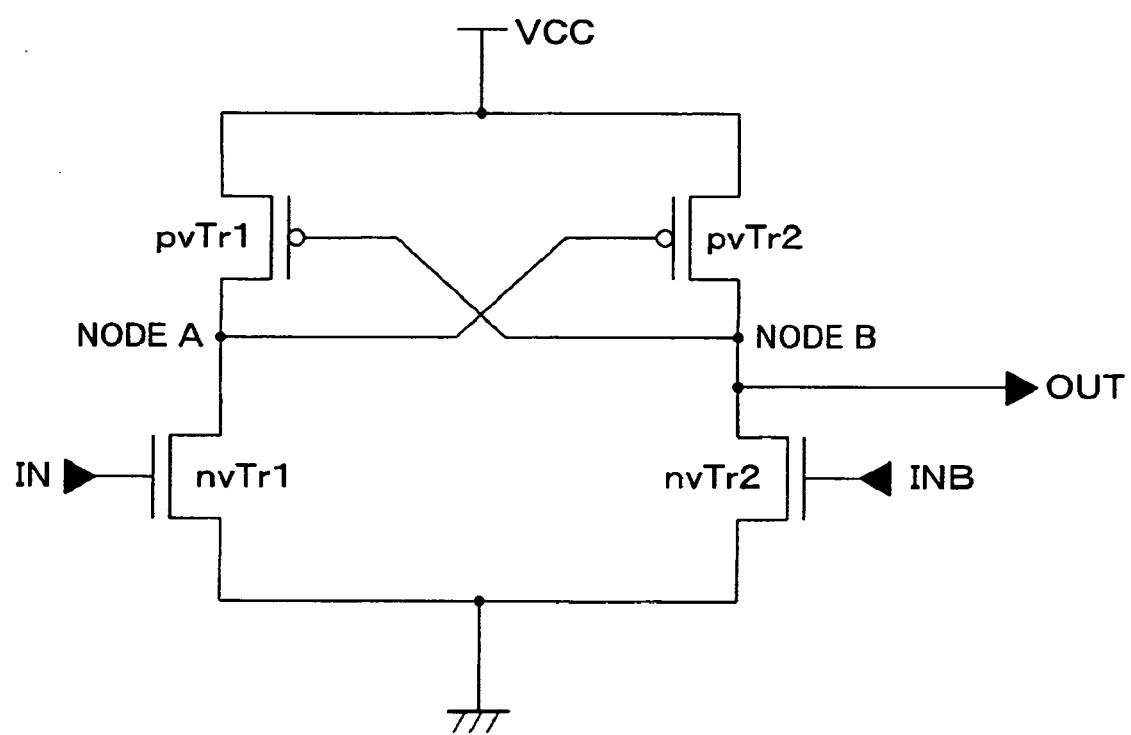
FIG. 101 is a circuit diagram showing, as an example, a configuration of a level shifter of a voltage drive type.
Figure 102:
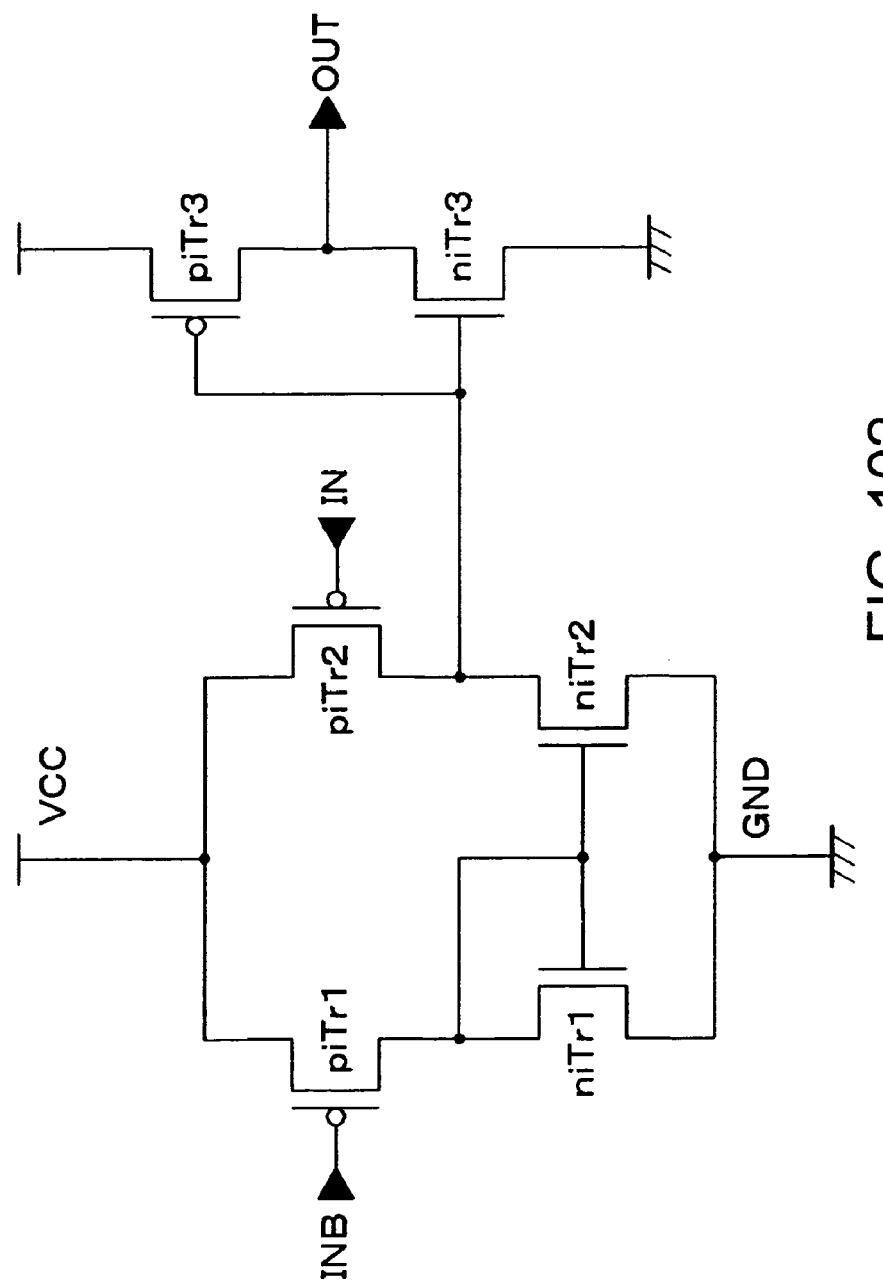
FIG. 102 is a circuit diagram showing, as an example, a configuration of a level shifter of a current drive type.

Here, level shifters are classified into two main categories: voltage drive types shown in FIG. 101 and current drive types shown in FIG. 102. Each operation will be now described. Note that in the following the drive voltage supplied from the power source VCC will be also referred to as VCC.

As shown in FIG. 101, a level shifter of a voltage drive type is composed of N channel transistors nvTr1 and nvTr2 and P channel transistors pvTr1 and pvTr2. Here, signals 180 degrees out of phase are inputted to the gate electrode of nvTr1 and the gate electrode of nvTr2. If the input signal IN is inputted to the gate electrode of nvTr1 and the input signal INB is inputted to the gate electrode of nvTr2 as shown in the timing chart of FIG. 103, nvTr1 conducts, causing the level of the node A in the figure to become low (GND). Here, since the gate electrode of the P channel transistor pvTr2 is connected to the node A, pvTr2 also conducts, causing the level of the node B to become high (VCC). Further, pvTr1 with a gate electrode connected to the node B is in an non-conducting state, and nvTr2 to which the input signal INB is being inputted is also in an non-conducting state. Here, if the node B is used as an output OUT, the level of the input signal IN can be increased equal to the drive voltage VCC.

However, with respect to the signal potentials inputted to nvTr1 and nvTr2, as described earlier, in a circuit including monocrystalline silicon transistors, such as a video signal producing circuit, its drive voltage is in may cases specified to, for example, 5 V or 3.3 V or less. Therefore, if the voltage drive type level shifter is composed of polycrystalline silicon transistors, and the threshold value voltage of the n channel transistor reaches a few volts, the signal level is insufficient to cause nvTr1 and nvTr2 to conduct. For these reasons, in the present technology, the voltage drive type level shifter cannot be used alongside with a polycrystalline silicon transistor (p-Si). This leaves us only with the other choice: a current drive type.

The current drive type level shifter of FIG. 102 includes (1) P channel transistors piTr1 and piTr2 connected with each other at their sources as a differential input pair for an input stage; (2) a power source VCC for supplying current to the sources of both the transistors piTr1 and piTr2; (3) N channel transistors niTr1 and niTr2 constituting current mirror circuits and acting as active loads for both the transistors piTr1 and piTr2; and (4) transistors niTr3 and piTr3 having a CMOS structure for amplifying the output of a differential input pair.

Figure 103:
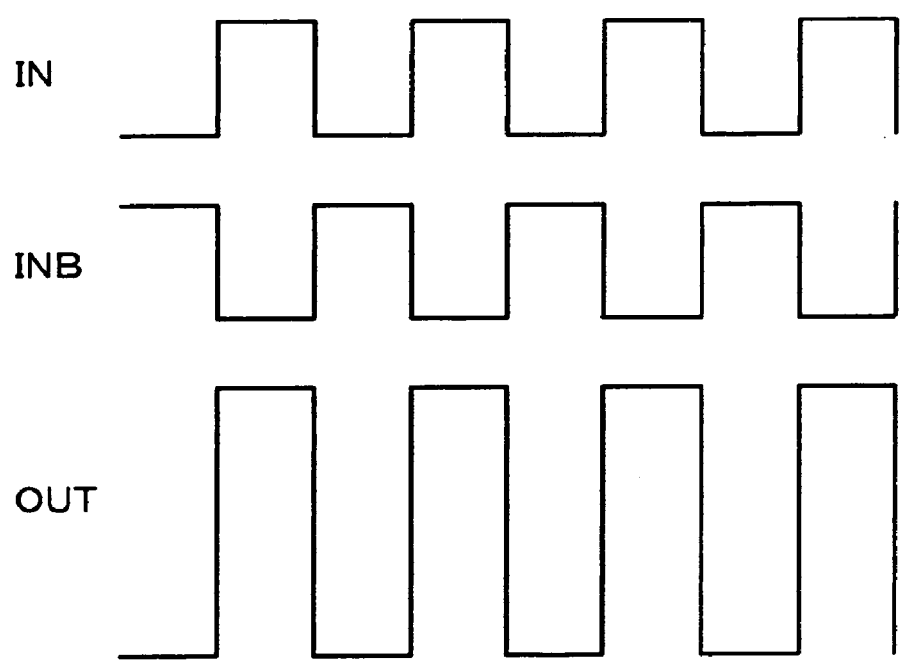
FIG. 103 is a timing chart showing input and output waveforms of a level shifter.

As shown in FIG. 103, an input signal IN inputted to the transistor piTr2, whereas an input signal INB, which is an inverse signal to the input signal IN, is inputted to piTr1. The gates of niTr1 and niTr2 are connected to each other and also to the drains of PiTr1 and niTr1. Meanwhile, the mutually connected drains of piTr2 and niTr2 are connected to the gates of piTr3 and niTr3. Note that the sources of niTr1 and niTr2 are mutually connected and grounded.

Now the operation of the current drive type level shifter will be described. In the current drive type level shifter, the input signal IN or INB is applied to the gates of the transistors piTr1 and piTr2, resulting in current flows through the transistors piTr1 and piTr2 in such amounts according to the ratio of individual gate-source voltages. Meanwhile, niTr1 and niTr2 act as active elements; therefore, the voltage at the connection point of the transistors piTr2 and niTr2 coincides with the difference in voltage level between the input signals IN and INB. This voltage is applied to the gates of the CMOS P channel transistors piTr3 and niTr3, amplified by the transistors piTr3 and niTr3 in terms of electric power, and outputted as an output voltage OUT.

Unlike the configuration in which the transistors pvTr1 and pvTr2 in an input stage is switched between conduction and cut-off by means of the input signal IN, in other words, the voltage drive type level shifter shown in FIG. 101, the current drive type level shifter is of a kind such that piTr1 and piTr2 in an input stage permanently conduct during operation and shifts the level of the input signal IN in accordance with the ratio of the gate-source voltages of the transistors piTr1 and piTr2. This enables the level of the input signal IN to be shifted with no difficulties at all even when the amplitude of the input signal IN is lower than the threshold value of the transistors piTr1 and piTr2 in an input stage.

The present embodiment includes:

a display section including: a plurality of pixels PIX arranged in a matrix form; a plurality of data signal lines SLn ($1 \leq n \leq i$) each provided associated with a row of the pixels PIX; and a plurality of scan signal lines GLn ($1 \leq n \leq j$) each provided associated with a row of the pixels, the data signal lines SL supplying data for displaying an image to the pixels PIX in synchronism with scan signals supplied from the scan signal lines GL;

an analog data signal line drive circuit ANSD for outputting a video signal to the plurality of data signal lines in synchronism with predetermined timing signals; and a scan signal line drive circuit GD for outputting a scan signal to the plurality of scan signal lines GL in synchronism with predetermined timing signals.

The present embodiment also includes a binary data signal line drive circuit BINSD which is similar to that of a foregoing embodiment. With respect to the binary data signal line drive circuit BINSD, the start signal SP, the clock signal CK, and the binary data signal DIGDAT are lower than the source voltage.

The configuration of the binary data signal line drive circuit BINSD is such that a level shifter is provided in an input section for the clock signal CK of the shift register SR2 and also in an input section for the binary data signal DIGDAT, which will be referred to as CKLS and DATLS. As a result, the shift register output SMP is outputted in synchronism with the clock signal CK whose level has been boosted by the for-clock-signal level shifter CKLS. By rasing the level of the binary data according to SMP simultaneously as the operation of the for-binary-data-signal level shifter-DATLS, the data holding section Latch holds the data whose level is boosted to the potential equal to that of the source voltage.

Similarly to embodiment 2, the present embodiment includes: a data switching section for switching the binary data potential between the for-turn-on potential and the for-non-turn-on potential; and an output control section, interposed between the output from the data switching section and the data signal line, for controlling an output according to the externally inputted transfer instruction signal. The driving method of the present embodiment is the same as that of embodiment 2.

Figure 104:
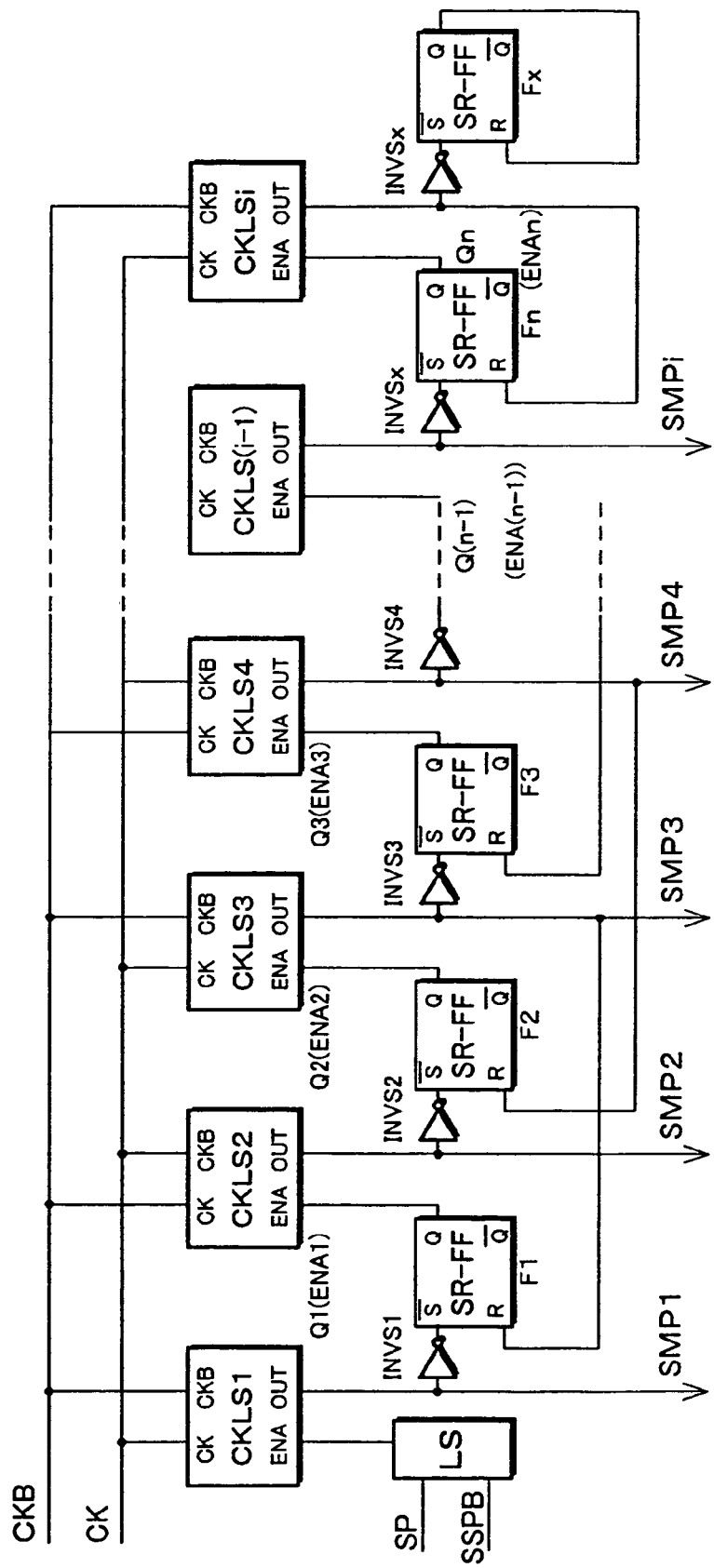
FIG. 104 is a block diagram showing, as an example, a configuration of a shift register in accordance with the present invention.
Figure 105:
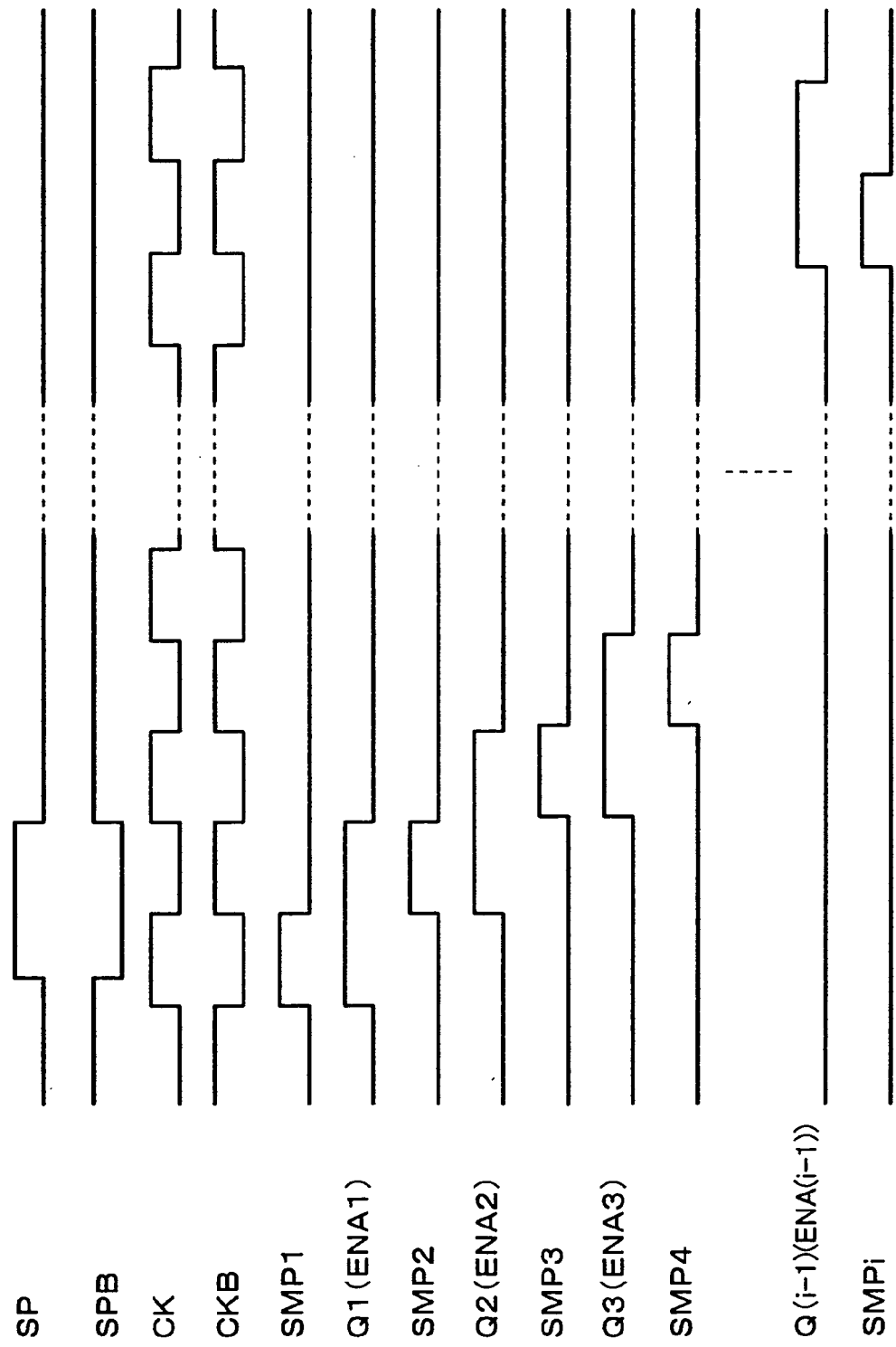
FIG. 105 is timing chart showing operation of a shift register in accordance with the present invention.
Figure 106:
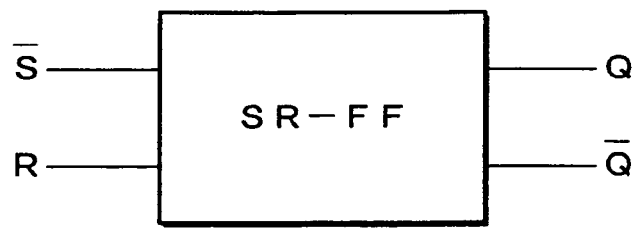
FIG. 106(*a*) is a block diagram showing input and output terminals in a configuration example of a set-reset flip-flop, and FIG. 106(*b*) is a circuit diagram showing a configuration of its internal circuit.
Figure 106:
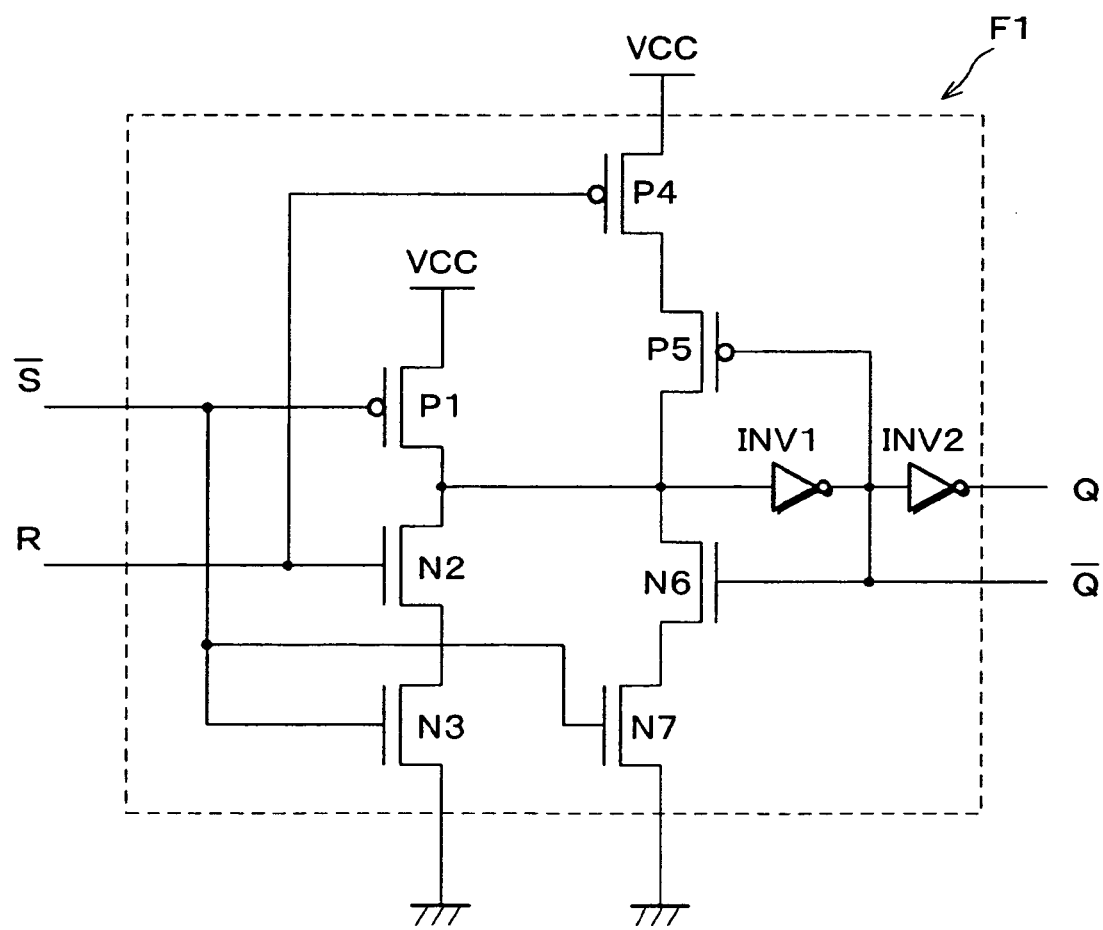

Now, the shift register SR2 and the data holding section Latch used in the present embodiment will be described. FIG. 104 shows a configuration example of the shift register SR2 in the binary data signal line drive circuit BINSD. FIG. 105 is a timing chart showing specific operations.

In FIG. 104, the shift register SR2 is composed of a level shifter LS for use with a start signal (SP), a plurality of set-reset-type flip-flop circuits F (i.e., F1, F2, F3, . . . , Fn, and Fx; hereinafter, will be referred to as "SR flip-flops"), and the equal number of level shifters CKLS for use with a clock signal as the SR flip-flops F.

SR flip-flops will be now described. Normally, a flip-flop refers to a circuit that flips from one of two stable stages to the other every time it receives a signal at a certain timing and remains in that state until it receives another valid signal. An SR flip-flop (set-reset-type flip-flop), for example, delivers a "high" output in response to an input of a set signal and continues to deliver that output even after the set signal turns non-active. If the reset signal becomes active when the set signal is non-active, the SR flip flop delivers a "low" output and continues to deliver that output even when the reset signal turns non-active, until the set signal becomes active.

In the present embodiment, the for-clock-signal level shifters CKLS are provided corresponding one-to-one to the SR flip-flops F, and as will be detailed later, are configured as a level shifter of a current drive type so that the voltage is boosted with no difficulties at all even when the amplitude of the clock signal CK is smaller than the drive voltage VCC. Each level shifter CKLS can apply a voltage-boosted clock signal to the corresponding SR flip-flop F according to the clock signal CK while the control signal ENA representing an instruction for the operation. Moreover, each level shifter CKLS can suspend the operation to prevent the application of the clock signal CK to the corresponding SR flip-flop F while the control signal ENA is representing an instruction for the suspension of operation and opens the input switching element (detailed later) while suspending the operation, thereby reducing the power consumption in the level shifters CKLS due to a through current.

Meanwhile, the shift register SR2 is configured so that it can transmit a start signal SP having one clock cycle width to a next stage at every rise of the clock signal CK. Specifically, the output of the preceding stage (SP in the case of the first stage) is outputted as a shift register output SMP, and the level shifter CKLS is activated to apply CK via INVS1 to the SR flip-flop F1 as a negative logic set signal S. The output signal Q1 of the SR flip-flop F1 is applied as a signal ENA1 which activates a next stage level shifter CKLS2. Further, a signal delayed by the transmitted pulse width from the shift register output SMPn of set signals to a following stage SR flip-flop is applied to the SR flip-flops Fn as a reset signal R. In the present embodiment, since a pulse having one clock cycle width is transmitted, a signal delayed by one clock cycle, that is, the output signal SMP(n+2) from the shift register 1 of which the voltage is boosted by the level shifter CKLS (n+2) in the second next stage, is applied as a positive logic reset signal.

Further, the clock signal CK is inputted to those level shifters CKLS1, CKLS3, . . . in the odd numbered stages so that those SR flip-flops F1, F3, . . . in the odd numbered stages are set at a rise of the clock signal CK. Meanwhile, CKB is applied to those level shifters CKLS2, CKLS4, . . . in the even-numbered stages so that those SR flip-flops F2, . . . in the even-numbered stages are set at a rise of the inverse signal CKB of the clock signal CK.

With the configuration, as shown in FIG. 104, the level shifter CKLS1 in the first stage operates to apply the voltage-boosted clock signal CK ("CKa") to the SR flip-flop F1, while the start signal SP is being pulse inputted. As a result, the SR flip-flop F1 is set when the clock signal has risen after the pulse input is started, thereby switching the output Q1 to high.

Q1 is applied as a control signal ENA1 to the second stage level shifter CKLS2. This causes the level shifter CKLS2 to output a clock signal CKB while the SR flip-flop F1 is pulse outputting (i.e., while ENA1=Q1 is high). As a result, the SR flip-flop F2 is set when the inverse signal CKB of the clock signal has fallen for the first time after the output Q1 from the preceding stage turns high, thereby switching the output Q2 to high.

Here, defining i as being a positive integer not greater than n, each SR flip-flop output signal Qi is applied to a next stage level shifter as a control signals ENAi, and therefore the second and succeeding SR flip-flops Fi delivers outputs Qi with a delay equal to half the cycle of CK behind outputs Q (i−1) from the preceding stages.

Under these circumstances, since different level shifters are provided to correspond to different SR flip-flops F, the distance can be reduced between the corresponding level shifter and flip-flop as compared to a case where a single level shifter boosts the voltage level of the clock signal CK or CKB before applying it the all the flip-flops, even when there are relatively large numbers of SR flip-flop stages. Therefore, the voltage-boosted clock signal CKa or CKBa is transmitted over a reduced distance, and the load capacitance of each level shifter can be reduced. Since the load capacitance is reduced, even when it is difficult to ensure sufficient driving capabilities for the level shifter, such as when the level shifter is composed of polycrystalline silicon thin film transistors, no buffer needs to be provided. For these reasons, the power consumption by the shift register can be reduced.

Further, the level shifter CKLSi suspends its operation, while the SR flip-flop Fi does not require a clock signal input, such as when the start signal SP and the output Q (i−1) from the preceding stage is low. In these conditions, a clock signal is not driven, power consumption does not occur to drive it. Further, as will be detailed later, power supply to the level shifters CKLS provided in the respective level shifters is suspended, as well as an input switching element is opened, permitting no flow of through current. Therefore, although there are provided many (n) level shifters of a current drive type, power is consumed only in operating level shifters. As a result, the power consumption by the shift register can be greatly reduced.

In addition, the level shifter CKLSi of the present embodiment determines, only according to the start signal SP or the output Q (i−1) from the preceding stage, the period in which the clock signal is necessary to the SR flip-flop Fi, that is, the period from the time when the start signal SP or the output Q (i−1) from the SR flip-flop in the preceding stage starts pulse outputting to the time when the SR flip-flop Fi is set. As a result, by only directly applying the start signal SP or the output Q (i−1) from the preceding stage, the level shifters CKLSi can be controlled individually to operate and/or suspend the operation. Shift registers can have a simpler circuit configuration, as compared to a case where a circuit is provided to produce a new control signal.

Further, in the present embodiment, while the operation of the level shifter CKLSi is being suspended, the clock inputs to the SR flip-flops Fi are blocked. Therefore, the start signal SP can be correctly transmitted without providing a switch which conducts according to whether or not a clock input is needed, separately from the level shifters CKLSi.

Under these circumstances, in the SR flip-flop, as shown in FIG. 106(a) and FIG. 106(b) for example, a p-type MOS transistor P1 and-tn-type MOS transistors N2, N3 are connected in series between the power source VCC and ground level; a negative logic signal $\overline{S}$ is applied to the gates of the transistors P1, N3, and a positive logic reset signal R is applied to the gate of the transistor N2. Moreover, the drain potentials of the mutually connected transistors P1, N2 are inverted by inverters INV1, INV2 respectively and outputted as output signals Q.

Figure 107:
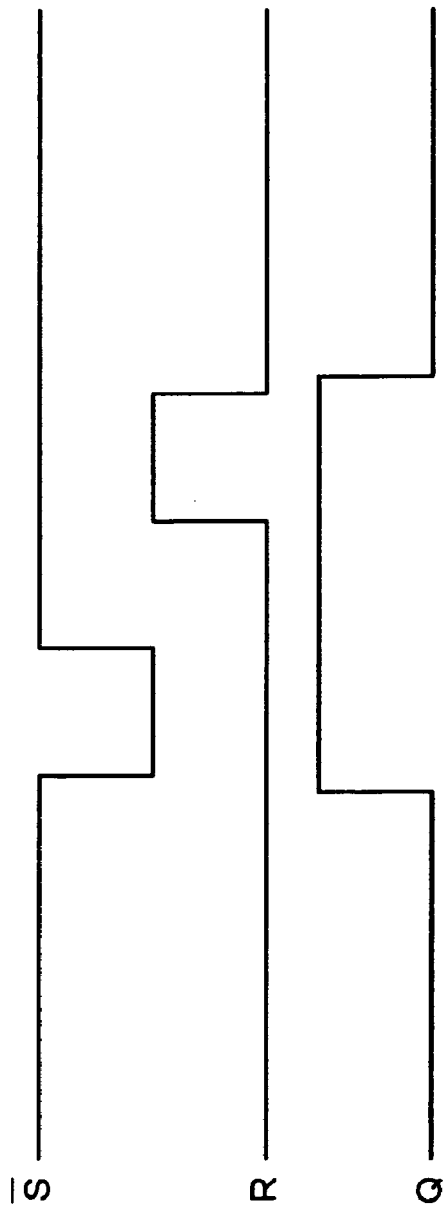
FIG. 107 is a timing chart showing operation of a set-reset flip-flop.

Meanwhile, p-type MOS transistors P4, P5 and n-type MOS transistors N6, N7 are connected in series between the power source VCC and ground level. The drains of the transistors P5, N6 are connected to the input of the inverter INV1, and the gates of the transistors P5, N6 are connected to the output of the inverter INV1. Further, the reset signal R is applied to the transistor P4, and the set signal $\overline{S}$ is applied to the transistor N7. In the SR flip-flop F1, as shown in FIG. 107, if the set signal $\overline{S}$ switches to active (low level) while the reset signal R is being inactive (low level), the transistor P1 conducts and switches the input to the inverter INV1 to high level. This causes the output signal Q from the SR flip-flop F1 to switch to high level.

In this state, the reset signal R and the output from the inverter INV1 cause the transistors P4, P5 to conduct, and the reset signal R and the output from the inverter INV1 causes the transistors N2, N6 to be at cut off. As a result, even if the set signal $\overline{S}$ becomes inactive, the input to the inverter INV1 remains high, retaining a high level output signal Q.

Thereafter, as the reset signal R becomes active, the transistor P4 is cut off, causing the transistor N2 to conduct. Under these circumstances, the set signal $\overline{S}$ remains inactive; therefore, the transistor P1 is cut off, whereas the transistor N3 conducts. Therefore, the input of the inverter INV1 is driven to low level, causing the output signal Q to switch to low level.

Figure 108:
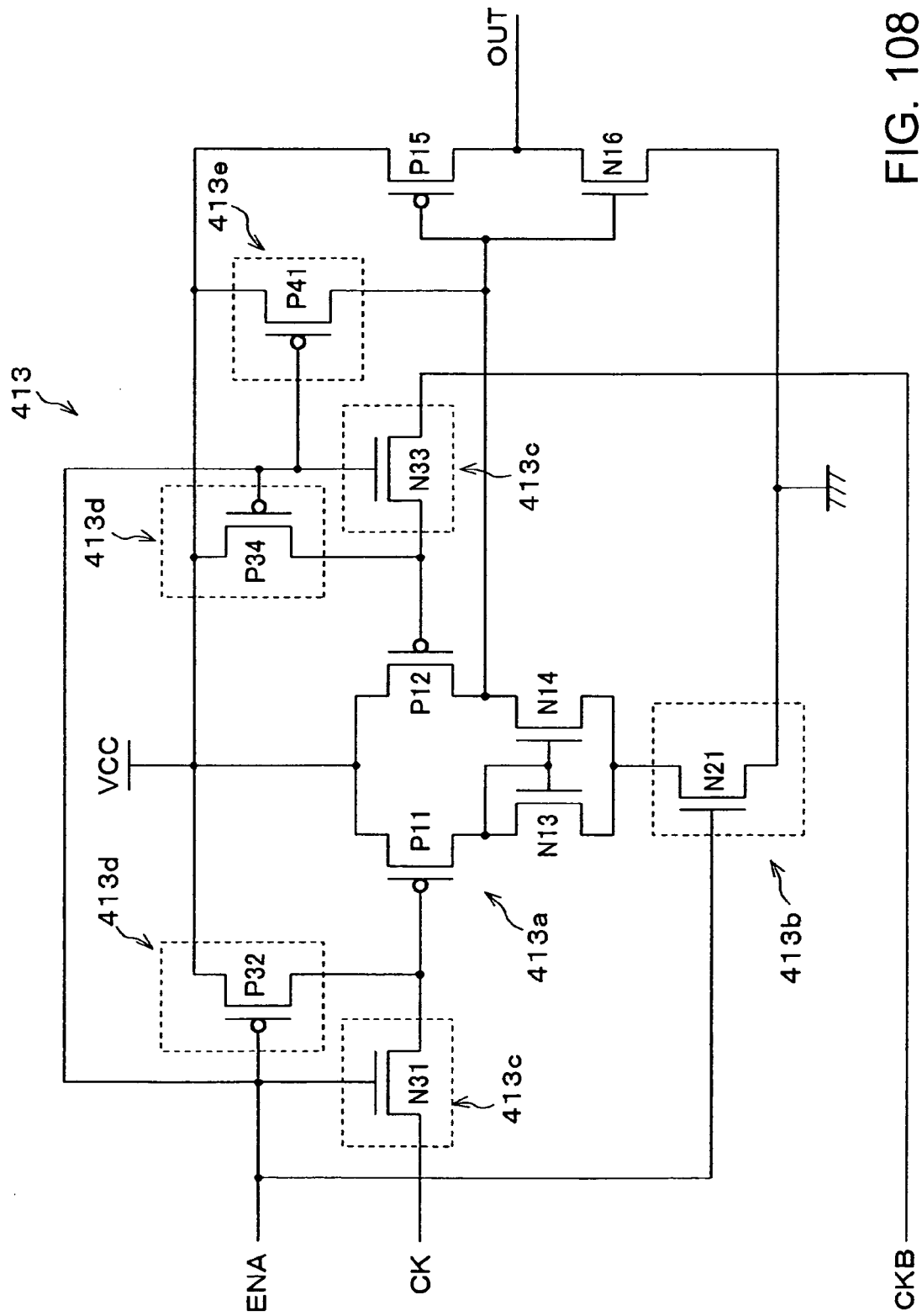
FIG. 108 is a circuit diagram showing, as an example, a configuration of level shifters for start and clock signals in a shift register.

Meanwhile, as shown in FIG. 108 for example, the level shifter 413 of the present embodiment is composed of: a level shift section 413a for shifting the clock signal CK; a power supply control section 413b for blocking electric power supply to the level shift section 413a during a period when the clock signal do not need to be supplied; an input control section (switch) 413c for, during suspension period, electrically isolating the level shift section 413a from the signal line passing a clock signal; an input switching element opening control section (input signal control section) 413d for opening the input switching element in the level shift section 413a during the suspension period; and output stabilizer section (output stabilizer means) 413e for retaining the output of the level shift section 413a at a predetermined value during the suspension period.

The level shift section 413a, together with the p-type MOS transistors P11, P12 whose sources are mutually connected forming a differential input pair in the input stage, constitutes a current mirror circuit and is composed of n-type MOS transistors N13, N14 acting as active loads for the transistors P11, P12 and CMOS transistors P15, N16 amplifying the output from the differential input pair.

The transistor P11 receives at its gate the incoming clock signal CK via a transistor N31 (will be detailed later), whereas the transistor P12 receives at its gate the incoming inverse signal CKB of the clock signal CK via a transistor N33 (will be detailed later). The transistors N13, N14 have their gates connected with each other which are in turn connected to the drains of the transistors P11, N13. Meanwhile, the mutually connected drains of the transistors P12, N14 are connected to the gate of the transistors P15, N16.

The sources of the transistors N13, N14 are grounded via an n-type MOS transistor N21 as an electric power supply section 113b.

Meanwhile, in the input control section 413c on the side of the transistor P11, there is provided an n-type MOS transistor N31 between the clock signal and the gate of the transistor P11. In the input switching element opening control section 413d on the side of the transistor P11, there is provided a p-type MOS transistor P32 between the gate of the transistor P11 and the power source VCC. Similarly, the transistor P12 receives at its gate the incoming inverse signal CKB of the clock signal via a transistor N33 as the input control section 413c and the drive voltage VCC via a transistor P34 as an input switching element opening control section 413d.

The output stabilizer section 413e is configured to stabilize the output voltage OUT from the level shifter 413 during the suspension period at ground level and includes a p-type MOS transistor P41 between the power source VCC and the gate of the transistors P15, N16.

The present embodiment is configured so that the control signal ENA represents operation of the level shifter 413 when it is at high level. Therefore, the control signal ENA is applied to the gates of the transistors N21 to P41.

In the level shifter 413 thus configured, when the control signal ENA represents operation (high level), the transistors N21, N31, N33 conduct and the transistors P32, P34, P41 are cut off. In this state, the current from the power source VCC passes either the transistors P11, N13 or the transistors P12, N14 before further passing the transistor N21. The transistors P11, P12 receive at their gates the incoming clock signal CK or inverse signal CKB of the clock signal. As a result, current flow through the transistors P11, P12 at individual amounts that are in accordance with the ratio of the gate-source voltages. Meanwhile, since the transistors N13, N14 act as active loads, the voltage at the connecting point of the transistors P12, P14 is in accordance with the difference in voltage level of CK and CKB. The voltage is equal to the gate voltage of the CMOS transistors P15, N16 and is outputted as an output voltage OUT after being amplified in terms of electric power by the transistors P15, N16.

The level shifter 413 is configured to switch the transistors P11, P12 in the input stage between conduction and cut-off according to the clock signal CK, that is, configured so that unlike a voltage drive type, a current drive type whereby the transistors P11, P12 in the input stage always conduct during operation; therefore, the clock signal CK can be level shifted with no difficulties at all even when the amplitude of the clock signal CK is smaller than the threshold value of the transistors P11, P12 in the input stage.

As a result, as shown in FIG. 105, the level shifter is capable of outputting an output signal OUT having a boosted amplitude as high as that of the drive voltage VCC (for example, about 15 V) in the same waveform as that of the clock signal CK in a case where as the clock signal CK has an amplitude lower than that of the drive voltage VCC (for example, about 5 V) while the associated control signal ENAi is being at high level.

Conversely, when the control signal ENAi represents suspension of operation (at low level), the flow of the current that originates in the power source VCC and passes either the transistors P11, N13 or the transistors P12, N14 is blocked by the transistor N21. In this state, the current supply from the power source VCC is blocked by the transistor N21; therefore, the power consumption due to this current flow can be reduced. In this state, no current is supplied to the transistor P11, P12; therefore, the transistors P11, P12 cannot act as a differential input pair, and the potential cannot determined at the output terminal, that is, the connecting point of the transistors P12, N14.

Further, in this state, the transistors N31, N33 in the input control section 413c are cut off. This electrically isolates the signal line passing the clock signal CK from the gates of both the transistors P11, P12 in the input stage, which restricts the gate capacitance acting as the load capacitance for the signal line only to that for the level shifter 11 during operation. As a result, despite the plurality of level shifters 413 being connected to the signal line, the load capacitance for the signal line can be reduced, and also the power consumption is reduced in the drive circuit, in the control signal circuit CTRL shown in FIG. 93, for the clock signals CK, CKB.

During suspension of operation, the transistors P32, P34 in the input switching element opening control sections 413d conduct, and the gate voltages of the transistors P11, P12 both become equal to the drive voltage VCC, thereby cutting off the transistors P11, P12. This enables reductions in current consumption that amount to the current output from the power source VCC, similarly to the case where the transistor N21 is cut off. In this state, the transistors P11, P12 are incapable of operating as a differential input pair, and therefore fails to determine the output terminal potential.

In addition, when the control signal ENA represents an instruction for the suspension of operation, the transistor P41 in the output stabilizer section 413e also conducts. As a result, the output terminal, in other words, the gate potentials of the CMOS transistors P15, N16 become equal to the drive voltage VCC, whereas the output voltage OUT switches to low level. This enables, as shown in FIG. 105, the output voltage OUT from the level shifter to be sustained at low level regardless of the clock signal if the control signal ENA is representing an instruction for the suspension of operation. As a result, unlike the case where the output voltage OUT is indefinite during the suspension of operation of the level shifter, erroneous operations of the SR flip-flop F become preventable, stabilizing the operation of the shift register.

Figure 109:
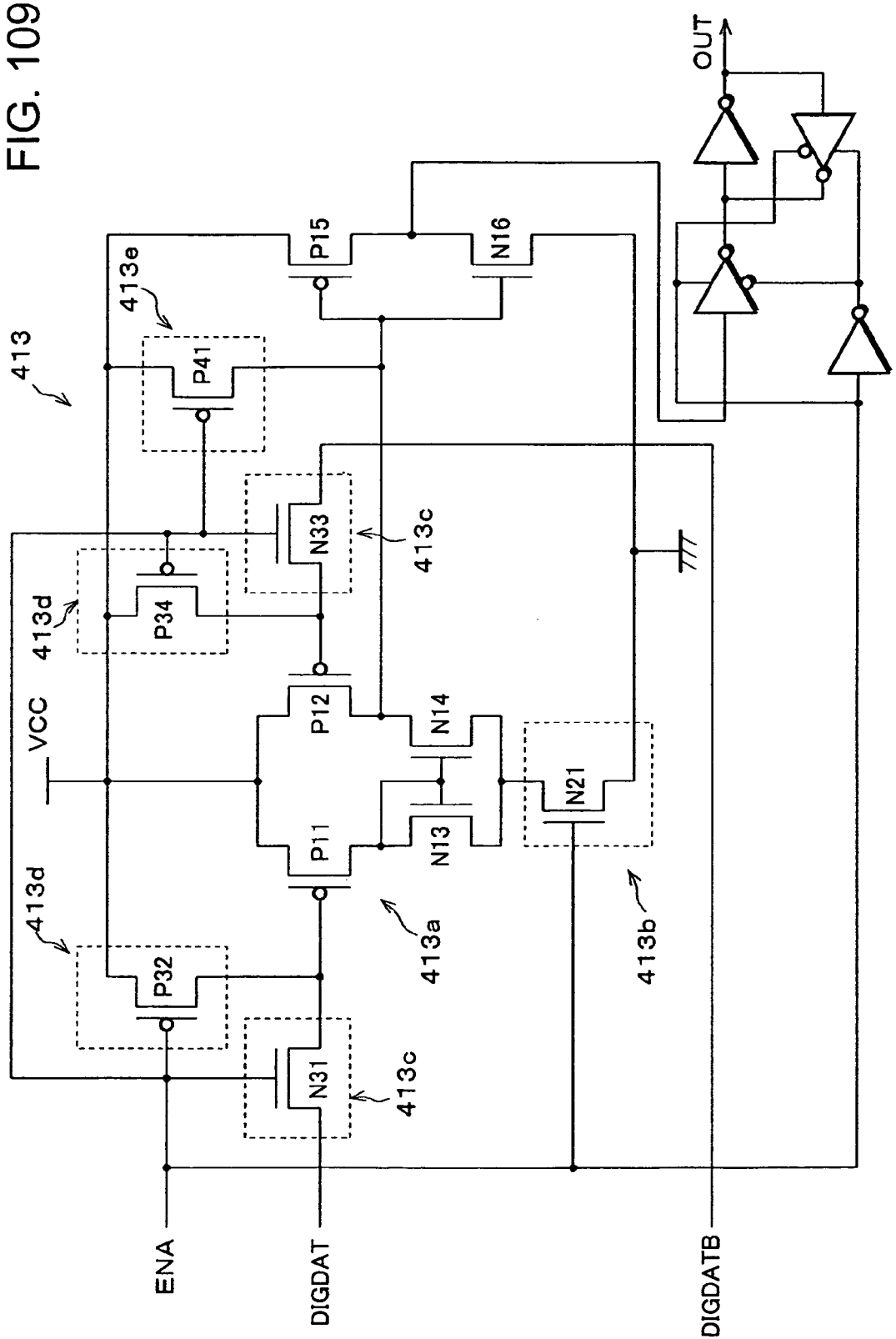
FIG. 109 is a circuit diagram showing, as an example, a configuration of a data holding section with level shifters.

The preceding description focused on the level shifters LS and CKLS in the shift register SR2; however, the same principles are applicable to the level shifter DATLS for binary data for the data holding section Latch. The following will focus on the latter case. FIG. 109 is a circuit diagram showing a data holding section Latch with a level shifter. Specifically, a level shifter 413 having the same configuration as the one shown in FIG. 108 is connected to the position where DIGDAT is inputted to the data holding section Latch having the same configuration as the one shown in FIG. 96, to act as a level shifter DATLS for binary data for the data holding section Latch.

ENAi is produced using the output (sampling signal) SMPi from the shift register SR2 and inputted to the level shifter 413 shown in FIG. 109. If ENAi is active, the level shifter 413 operates and boosts the voltage level of the binary data signal DIGDAT, the voltage-boosted signal being inputted to the data holding section Latch. When the output SMPi from the shift register SR2 becomes non-active, the level shifter suspends its operation. Data input is then suspended with the data holding section Latch as the data holding section in the binary data signal DIGDAT holding the data as such before the suspension of operation of the level shifter. Since the binary data signal DIGDAT voltage-boosted while the output SMP from the shift register SR2 is being meaningful is held, the binary data signal DIGDAT is held at the same potential as the source voltage and inputted to the data switching section in a next stage. The binary data signal line drive circuits BINSD in subsequent and later stages operate similarly to those in embodiment 2.

Alternatively, the shift register SR1 in the data signal line drive circuit ANSD may be configured similarly to the shift register SR2.

Employing the same circuit configuration in embodiments 3 to 5 as in the present embodiment produces similar merits to those in embodiment 2 with no increases in power consumption even when the clock signal or binary data signal is lower than the source voltage.

As detailed above, the present image display device includes an analog data signal line drive circuit ANSD for outputting full color image data to the display section and a binary data signal line drive circuit BINSD for outputting binary data (8 colors) to the display section.

Figure 110:
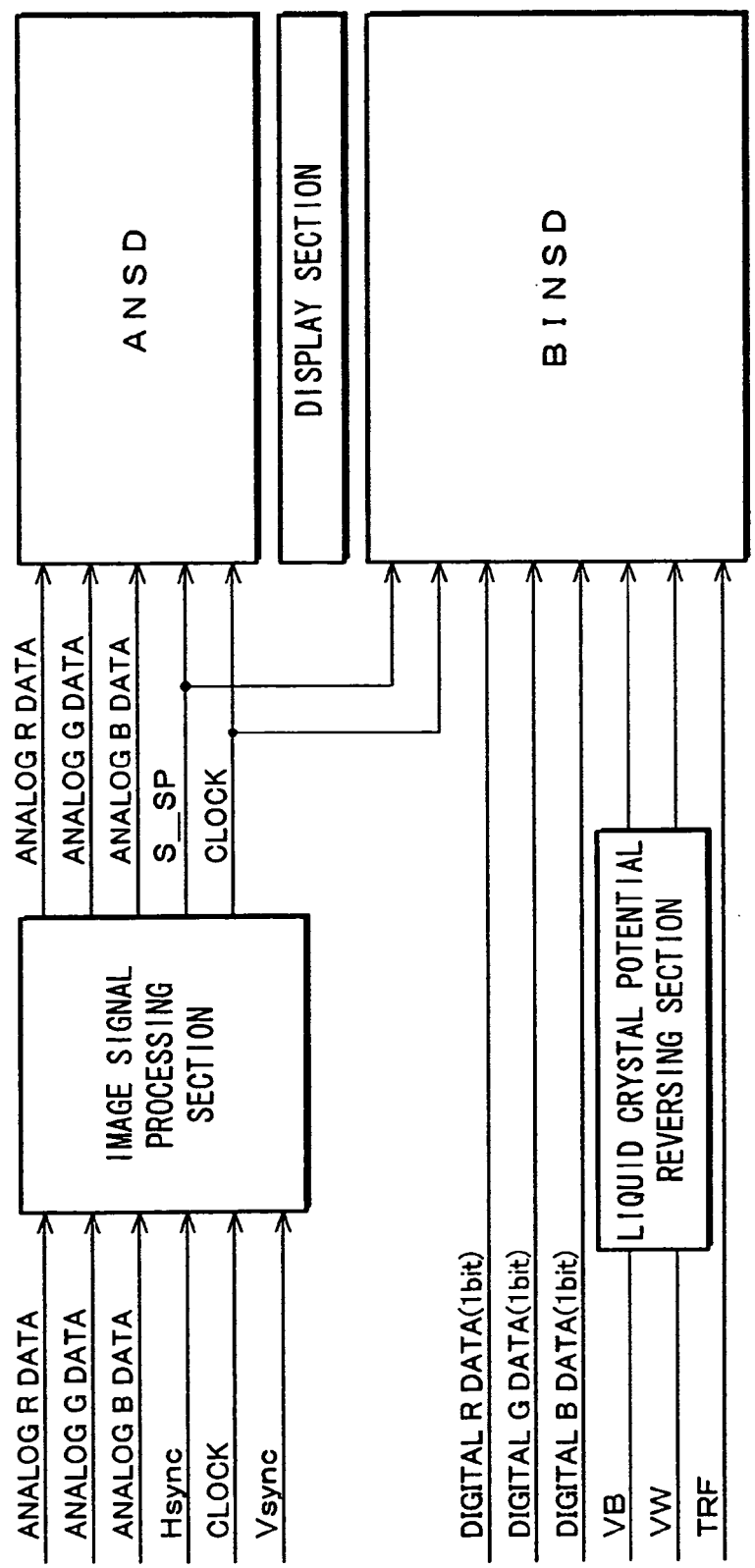
FIG. 110 is a block diagram showing, as an example, another configuration of an image display device in accordance with the present invention.

As shown in FIG. 110, the analog data signal line drive circuit ANSD is composed of a shift register operating in synchronism with the start pulse (S_SP) and clock, and a switch for sampling an analog video signal (RGB) according to the output of the shift register and outputting the sampled signal to the display section. The analog video signal is subjected to inversion, halftone compensation, etc. using a high speed, broadband video amplifier in a video signal processing section before being converted for use in liquid crystal drive and inputted to the analog data signal line drive circuit ANSD. The video amplifier is very power consuming: the higher the resolution or the more the halftones, the greater power it consumes.

The binary data signal line drive circuit BINSD is composed of a shift register operating in synchronism with the start pulse (S_SP) and clock, a latch circuit for holding the binary data signal (1 bits) corresponding to one horizontal scan period (horizontal effective period, horizontal display period, 1 H) according to the output from the shift register, and a switch for selecting a liquid crystal drive black potential or liquid-crystal-driving white potential according to the transfer instruction signal TRF externally inputted during horizontal blanking period and the output signal from the latch circuit and outputting the selected potential to the display section.

The liquid crystal drive black potential and liquid-crystal-driving white potential only needs switching of polarity for every 1 H, and does not require a potentially highly power consuming element like the high speed, broadband video amplifier.

[Embodiment 7]

Referring to FIG. 111 to FIG. 117, the following will describe still another embodiment in accordance with the present invention. Here, for convenience, members of the present embodiment that have the same arrangement and function as members shown in a figure of any one of the previous embodiments, and that are mentioned in that embodiment are indicated by the same reference numerals and description thereof is omitted.

The present embodiment relates to a method of driving an image display device whereby a display of multitone images and simple images (e.g., text and graphics) is formed using individual data signal line drive circuits, especially, to a method of driving by writing a binary data potential to a data signal line whereby at least one of the data signal line drive circuits is a binary data signal line drive circuit for supplying binary data potentials consisting of an externally supplied for-turn-on potential and for-non-turn-on potential to a data signal line according to a binary data signal.

The following will describe, first, an active matrix liquid crystal display device as an example of an image display device. Incidentally, in recent years, increasing numbers of display devices are designed to display multitone images or so-called natural images, as well as binary text and graphics: a typical example of such a device is the display section of a personal digital assistant. If the foregoing image display device is incorporated as such a section, text and graphics information and multitone image information are synthesized in the image synthesizing section before being passed through the data signal line drive circuit to produce a display on the display section.

Alternatively, in some use of the personal digital assistant, either text and graphics information or a multitone image is displayed. In such an event, the data signal line drive circuit operates in exactly the same manner on binary information and multivalue (natural) images, resulting in similar power consumption.

Another trend in recent years is attempts to reduce power consumption by providing a plurality of data signal line drive circuit on the same substrate, as well as a multitone data signal line drive circuit at an end of each data signal line and a binary data signal line drive circuit at the end for example, and selectively using the plurality of data signal line drive circuits as required.

Now, operation of the binary data signal line drive circuit is described. The binary data signal line drive circuits is composed of a shift register, a data holding circuit, a NAND circuit, and an analog switches as major components and receives inputs of, for example, a binary data signal, binary data potentials (for-turn-on and for-non-turn-on potentials for use in driving the liquid crystal), and a timing signal. A circuit supplying the binary data potentials is connected to the data signal line via the analog switch. The NAND circuit receives an input of a transfer instruction signal TRF representing instructions for an output to the data holding circuit and an output to the data signal line.

Figure 116:
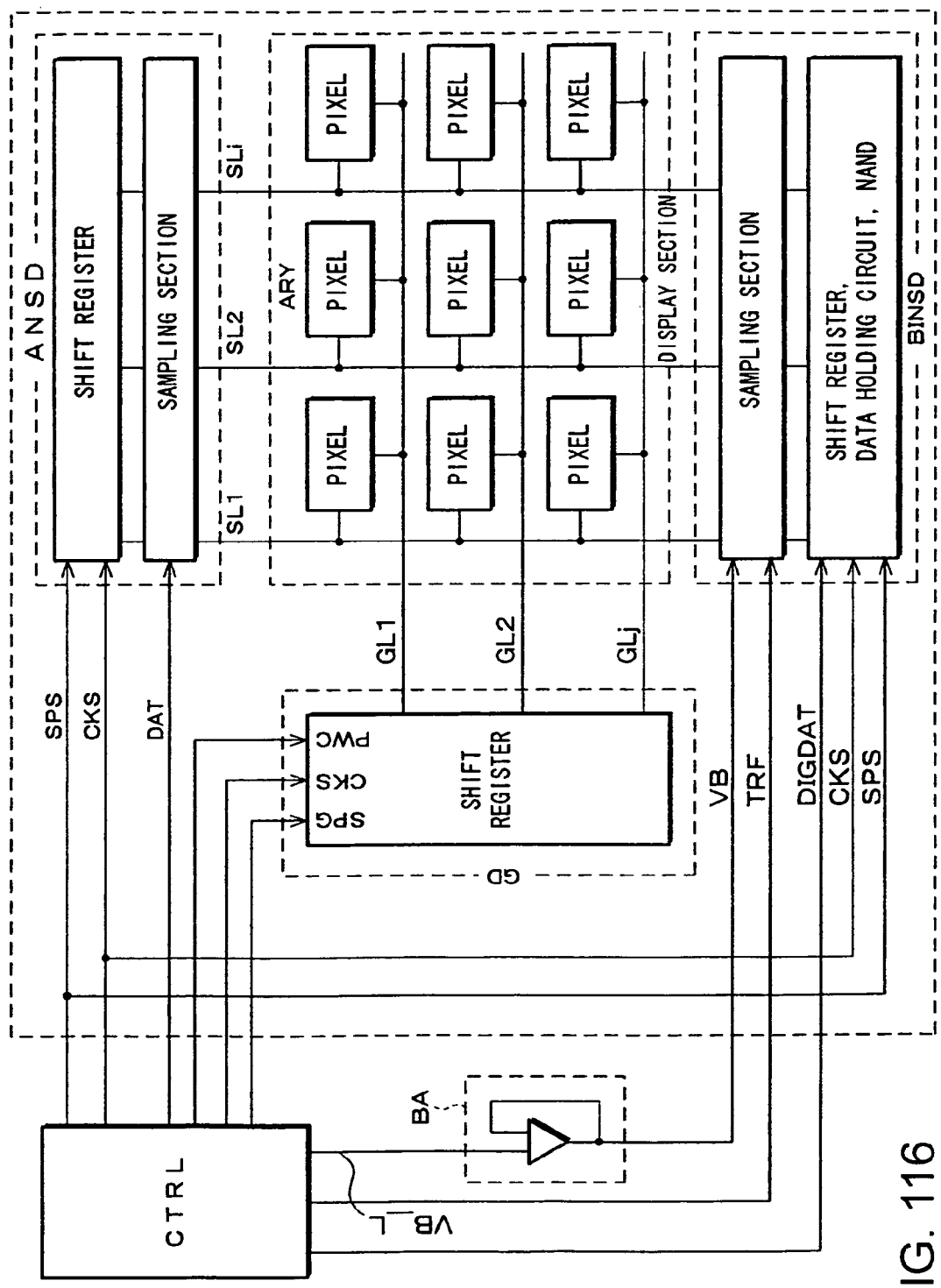
FIG. 116 is a block diagram showing, as an example, still another configuration of an image display device in accordance with the present invention.

Another example of the image display device will be described in reference to FIG. 116. As shown in the figure, the image display device is composed of a pixel array ARY a scan signal line drive circuit GD, a multitone analog data signal line drive circuit ANSD, a binary data signal line drive circuit BINSD, a binary data potential amplifier circuit (binary data potential stabilizer section) BA, and a control signal circuit CTRL. The binary data potential amplifier circuit BA is interposed along a binary data potential supply line VB_L which is a wire passing a binary data potential VB from the control signal circuit CTRL to a sampling section in the binary data signal line drive circuit BINSD.

The pixel array ARY includes a plurality of intersecting scan signal lines GL and data signal lines SL with a pixel PIX provided in each segment surrounded by two adjacent scan signal lines GL and data signal lines SL to collectively form a matrix.

Figure 117:
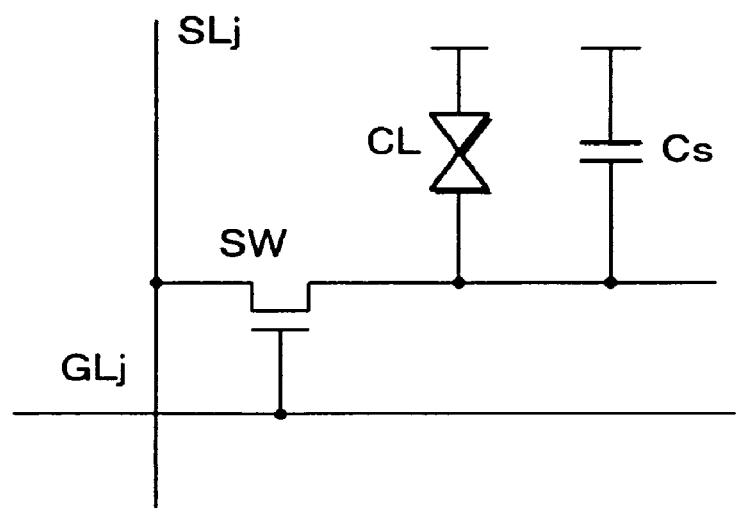
FIG. 117 is a circuit diagram showing a configuration of pixels.

Each pixel PIX is, as shown in FIG. 117, composed of a switching element SW, a liquid crystal capacitance CL, and a supplemental capacitance CS.

Now, a superimposed display will be described as an example of a method of driving the image display device, whereby binary data, such as text information, is displayed over multitone data, such as a natural image.

First, a multitone analog data signal line drive circuit ANSD samples the video signal DAT inputted via an analog switch in synchronism with the clock signal CKS, the data start signal SPS, or another timing signal to write into the data signal lines SL in sequence.

Next, similarly to the multitone analog data signal line drive circuit ANSD, a binary data signal line drive circuit BINSD holds a binary data signal DIGDAT in the data holding circuits individually provided for data signal lines in sequence in synchronism with the clock signal CKS, the data start signal SPS, or another timing signal according to a binary data signal DIGDAT. Then, following the completion of the writing of the multitone analog data signal line drive circuit ANSD to the data signal lines, if a potential representative of that the data is meaningful is being held in the data holding circuit, the binary data potential VB is sampled by controlling the analog switch via the NAND circuit in synchronism with the output of the data holding circuit and the transfer instruction signal TRF, and written in the data signal lines simultaneously. Here we presume that the display is normally white and the for-non-turn-on potential VB (liquid crystal drive black potential) is referred to as a binary data potential for convenience. In case of normally black, the binary data potential should be the for-turn-on potential VW (liquid-crystal-driving white potential).

The scan signal line drive circuit GD selects a scan signal line GL in sequence in synchronism with the clock signal CKG, the scan start signal SPG, the pulse width control signal PWC, or another timing signal and opens/closes the switching element SW in the pixel PIX, thereby writing to the pixels the video signal DAT or binary data potential VB previously written to the data signal lines SL and holding the video signal DAT or binary data potential VB previously written by the supplemental capacitance CS and liquid crystal capacitance CL in each pixel.

This process is repeatedly done to obtain an image display formed by the pixel array ARY.

Under these circumstances, the binary data potential VB, since being applied to the data signal lines simultaneously, varies and fails to deliver a desired potential to the data signal lines; the resultant display quality of the image display device deteriorates. To prevent this from happening, as mentioned earlier, a binary data potential amplifier circuit BA may be externally provided for amplifying the current of a binary data potential to increase the supply capability of the binary data potential VB.

The image display device shown in FIG. 111 will be described below as another example of the image display device. The configuration better restrains increases in power consumption than the configuration of FIG. 24 which includes a binary data potential amplifier circuit BA.

Figure 111:
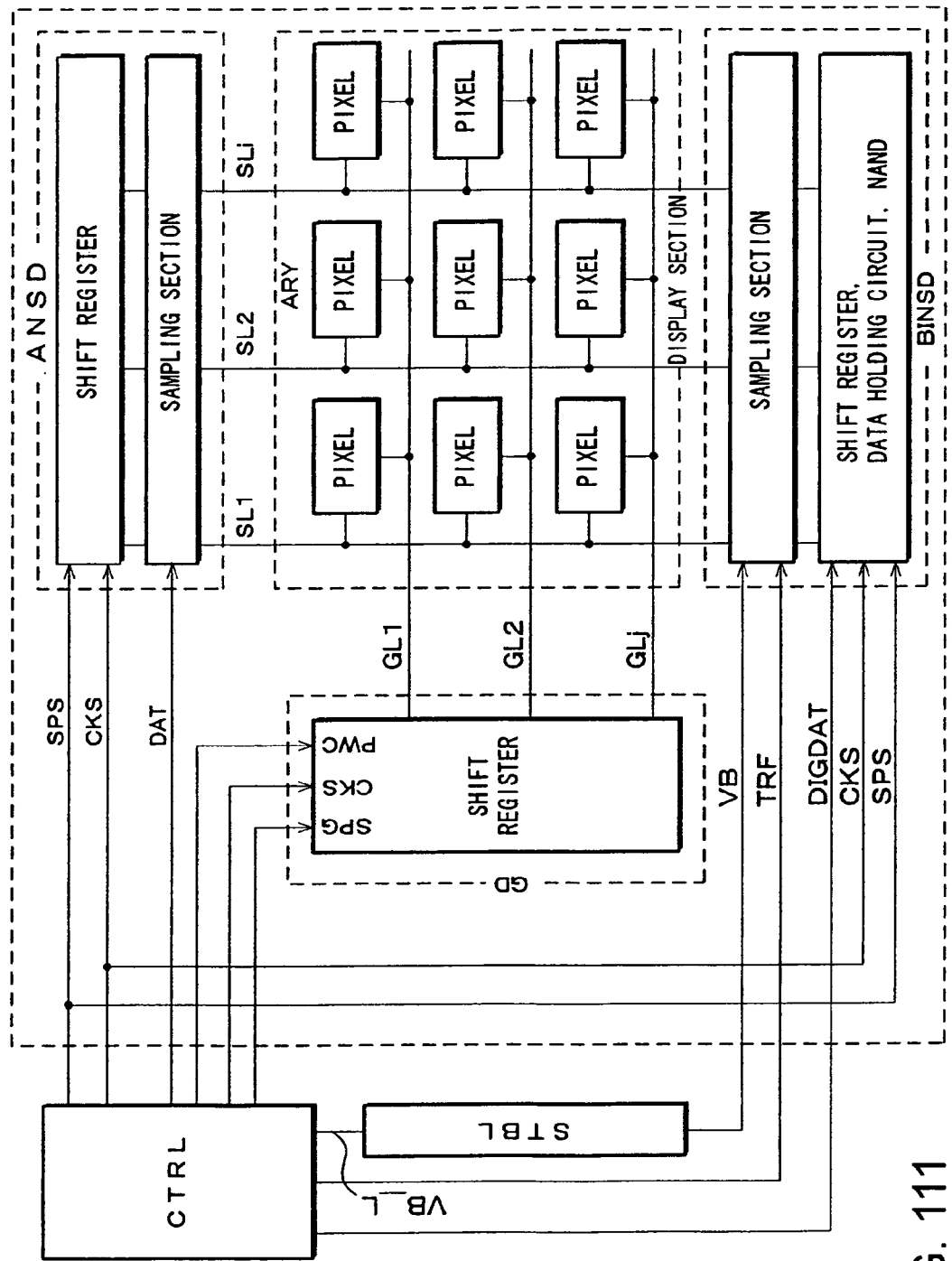
FIG. 111 is a block diagram showing, as an example, still another configuration of an image display device in accordance with the present invention.

FIG. 111 is a block diagram showing, as an example, a configuration of an image display device. The block diagram includes a multitone analog data signal line drive circuit ANSD, a binary data signal line drive circuit BINSD, a scan signal line drive circuit GD, data signal lines SLi (i≧1), scan signal lines GLj (j≧1), pixel array ARY composed of pixels PIX, a control signal circuit CTRL, and a binary data potential stabilizer section STBL.

The binary data potential stabilizer section STBL is interposed along a binary data potential supply line VB_L which is a wire passing a binary data potential VB from the control signal circuit CTL to a sampling section in the binary data signal line drive circuit BINSD. Inside the binary data potential stabilizer section STBL is there provided an electric charge holding section for receiving electric charges from the binary data potential supply line VB_L and holding them, as will be detailed later.

The multitone analog data signal line drive circuit ANSD, the binary data signal line drive circuit BINSD, the scan signal line drive circuit GD, and the switching elements constituting the pixels are provided on the same substrate in the form of polycrystalline silicon thin film transistors which is processed at temperatures of 600° C. or less.

Figure 113:
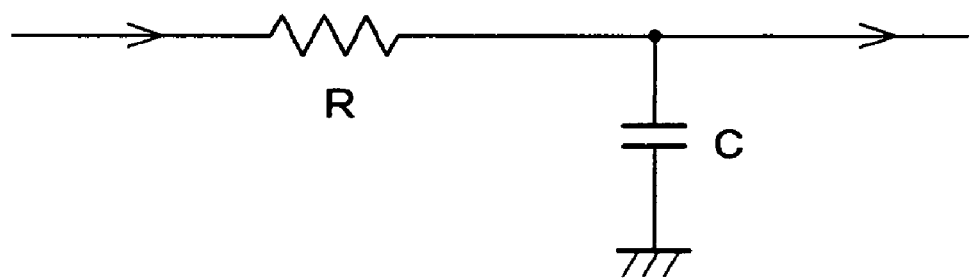
FIG. 113 a circuit diagram showing, as an example, a configuration of a binary data potential stabilizer section in accordance with the present invention.

The binary data potential stabilizer section STBL is, as shown in FIG. 113, composed of an electric charge holding section for holding electric charges supplied from the binary data potential supply line VB_L and a current control section for determining the amount of electric charges held by the electric charge holding section by means of a resistance value. Here, the electric charge holding section is composed of a capacitor C, whilst the current control section is composed of a resistor R to restrain power consumption. Further, the capacitor C possesses a capacitance at least greater than the total capacitance of the data signal lines. Also, the values of the capacitor C and resistor R are determined to satisfy the requirement that the current control section and electric charge holding section have a time constant that is optimum to stabilize to a sufficient potential within a display period of the video signal. Here, an RC circuit including the capacitor C and the resistor R is being used as the binary data potential stabilizer section STBL; however, other electronic elements may be used instead, as long as the requirement is satisfied.

Figure 112:
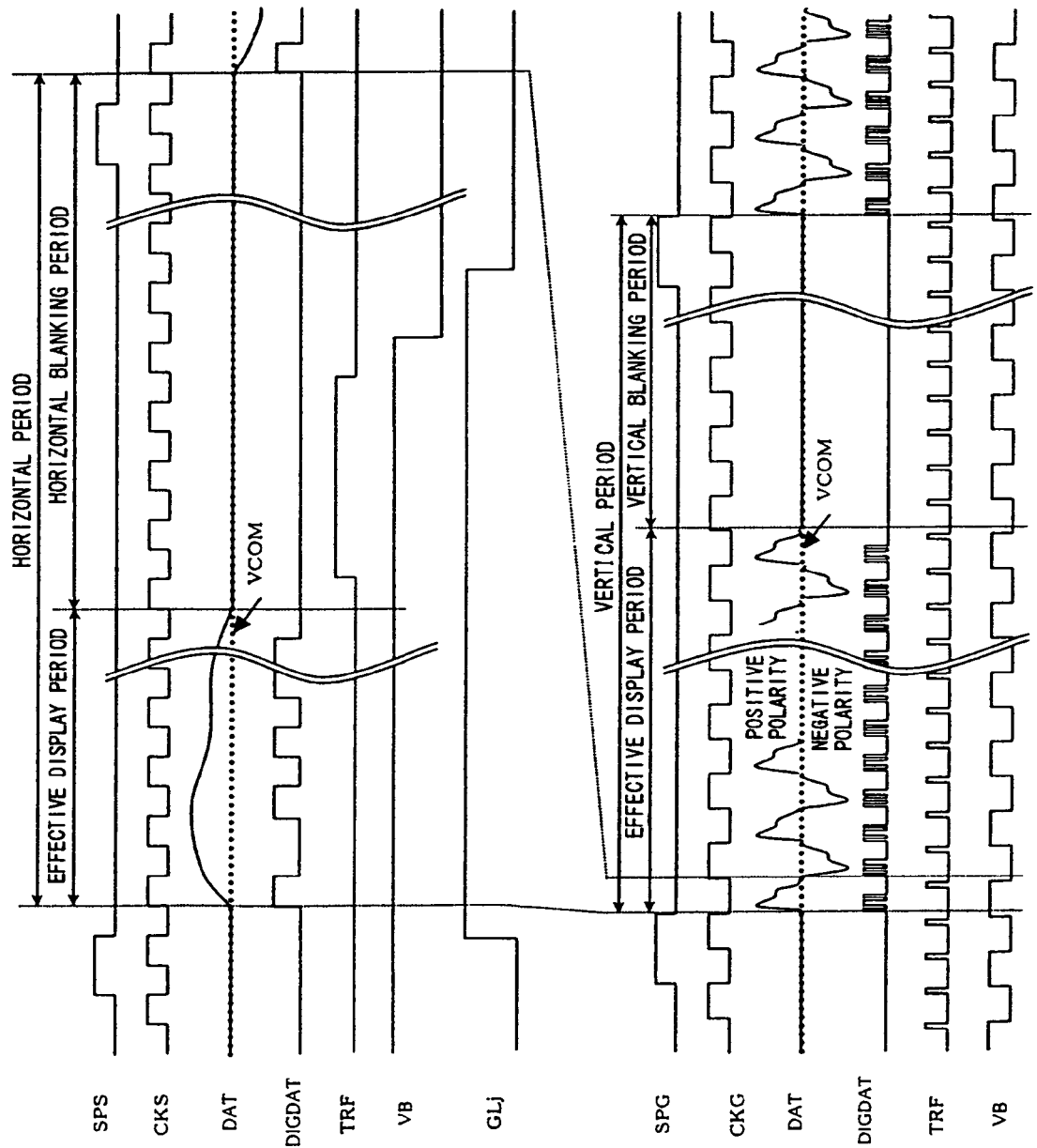
FIG. 112 timing chart showing, as an example, a drive waveform for an image display device in accordance with the present invention.

The control signal circuit CTRL outputs control signals as shown in the timing chart of FIG. 112. Here, the horizontal blanking period is employed as the predetermined period in which the binary data signal line drive circuit supplies a binary data potential to the data signal lines according to an external timing signal. Similarly to the earlier case, we presume that the display here is normally white and the for-non-turn-on potential VB (liquid crystal drive black potential) is referred to as a binary data potential for convenience. In case of normally black, the binary data potential should be the for-turn-on potential VW (liquid-crystal-driving white potential).

The present embodiment employs a driving method termed 1 H reverse drive whereby the binary data potential VB and the video signal DAT which is a multitone data signal written to the pixels PIX are switched from positive polarity to negative polarity or vice versa once per horizontal scan period.

Now, a superimposed display will be described as an example of the method of driving the image display device of the present embodiment, whereby binary data, such as text information, is displayed over multitone data, such as a natural image.

First, a multitone analog data signal line drive circuit ANSD samples the video signal DAT of positive polarity inputted via ah analog switch in synchronism with the clock signal CKS, the data start signal SPS, or another timing signal of FIG. 112 to write into the data signal lines SLi in sequence.

Next, similarly to the multitone analog data signal line drive circuit ANSD, a binary data signal line drive circuit BINSD holds a binary data signal DIGDAT in the data holding circuits individually provided for data signal lines in sequence in synchronism with the clock signal CKS, the data start signal SPS, or another timing signal according to a binary data signal DIGDAT. Then, following the completion of the writing by the multitone analog data signal line drive circuit ANSD to the data signal lines, if a potential representative of that the data is meaningful is being held in the data holding circuit, the binary data potential VB of positive polarity is sampled by controlling the analog switch via the NAND circuit in synchronism with the output of the data holding circuit and the transfer instruction signal TRF, and written in the data signal lines simultaneously. Under these circumstances, the capacitor C in the binary data potential stabilizer section STBL is sufficiently charged up to VB in one horizontal scan period, and even if electric charges start moving to the data signal lines according to the transfer instruction signal TRF, the electric charges stored in the capacitor C in the electric charge holding section start moving; therefore, variations of the binary data potential VB can be restrained to a minimum. Also, the resistor R as a current control section restrains the incoming flow of current from the control signal circuit CTRL and hence the variations of power source in the control signal circuit.

The scan signal line drive circuit GD selects a scan signal line GLj in sequence in synchronism with the clock signal CKG, the scan start signal SPG, the pulse width control signal PWC, or another timing signal. After the multitone analog data signal line drive circuit ANSD writes a positive polarity video signal DAT into the data signal lines or the binary data signal line drive circuit BINSD writes a positive polarity binary data potential VB into the data signal lines, the scan signal line drive circuit GD ends the selection of the scan signal lines GLj. Simultaneously, each pixel PIX is electrically isolated from the data signal line SL by the switching element SW and thereby holds the video signal DAT or binary data potential VB written by the liquid crystal capacitance CL and supplemental capacitance CS in that pixel.

Incidentally, in a liquid crystal-display device, as mentioned earlier in reference to conventional examples, each pixel PIX is composed of a switching element SW, liquid crystal capacitance CL, and supplemental capacitance CS. An end of the capacitance is connected to the data signal line SL via the switching element SW, whilst the other end receives a potential termed opposite potential. In other words, the video signal DAT and the binary data potential VB written to the pixel PIX is applied to the liquid crystal due to the potential difference from the opposite potential VCOM to provide various display states through modification of light passing through the liquid crystal. In the present embodiment, the opposite potential VCOM (shown in dotted lines in FIG. 112) is a d.c. potential. The "positive" and "negative" polarity of the video signal DAT and the binary data potential VB are so termed with this opposite potential VCOM as the reference value.

A driving method termed 1 H reverse drive has been described so far, whereby the video signal DAT written to the pixels PIX is switched from positive polarity to negative polarity or vice versa once per horizontal scan period; however, the present invention is applicable to other driving methods as well.

Also, the description above has been limited to a case of a superimpose display whereby binary data, such as text information, is displayed over multitone data, such as a natural image, by the dual operation of both the multitone analog data signal line drive circuit and the binary data signal line drive circuit. The present invention is of course applicable to a case where binary text or graphics information is displayed by the single use of the binary data signal line drive circuit with the operation of the multitone analog data signal line drive circuit suspended, depending on the needs.

As described in detail above, here, as an attempt to further reduce power consumption, the binary data potential stabilizer section STBL is provided in the stage that immediately precedes the one in which the liquid crystal drive black potential and the liquid-crystal-driving white potential are inputted to the binary data signal line drive circuit BINSD.

In other words, since the transfer instruction signal TRF of the binary data signal line drive circuit BINSD is effective during the horizontal blanking period, the liquid crystal drive black potential is outputted to the display section once per 1 H only during the horizontal blanking period. In other words, for the pixel, the liquid crystal drive black potential only needs to have a desired value when the transfer instruction signal TRF is effective: there is no need for the polarity to switch rapidly.

Figure 114:
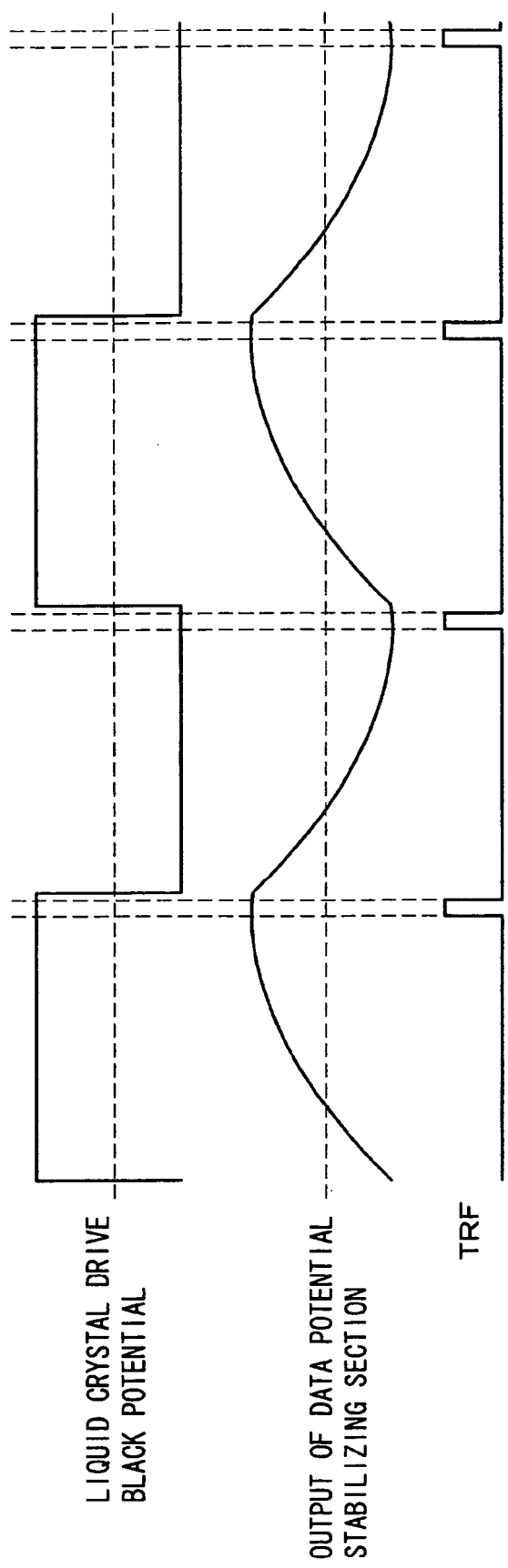
FIG. 114 is an explanatory drawing showing a waveform during a precharge operation in accordance with the present invention.

The binary data potential stabilizer section STBL is composed of a capacitance C and a resistance R, both of which being inactive elements. The capacitance C should greater than the total sum of the capacitances of the data signal lines for supplying data to the display section. The resistance R should have such a value that causes a current flow which allows the capacitance C to sufficiently store electric charges within a period of 1 H (about 63 µs). FIG. 114 shows the waveforms.

Figure 115:
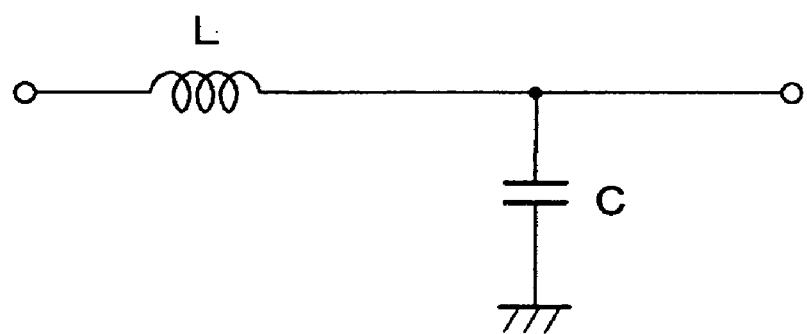
FIG. 115 is a circuit diagram showing, as an example, another configuration of a binary data potential stabilizer section in accordance with the present invention.

In the above example, an RC circuit including the capacitor C and the resistor R was used as the binary data potential stabilizer section STBL; alternatively, as shown in FIG. 115, an LC circuit may be used which includes an inductance L and a capacitor C. In other words, the figure shows the use of inductance as a current limiting element (current control section). It is supposed that the capacitor C as the capacitance element (electric charge holding section) is 1 µF, the data potential is changed once per 1 H, and the liquid crystal is a.c. driven once per 1 H. Considering that the cut off frequency fc of the LC circuit needs to be greater than the frequency 15.87 kHz of 1 H, the inductance L is given as follows.

Since $f_c > 1/\{2\pi\sqrt{LC}\}$, $L > 1/(4\pi^2 f_c^2 C)$

Therefore, L>100 µH

So, if L is 100 µH or greater, the incorporation of an LC circuit provides the desired binary data potential stabilizer section TBL.

[Embodiment 8]

Referring to FIG. 118 to FIG. 131, the following will describe still another embodiment in accordance with the present invention. Here, for convenience, members of the present embodiment that have the same arrangement and function as members shown in a figure of any one of the previous embodiments, and that are mentioned in that embodiment are indicated by the same reference numerals and description thereof is omitted.

The present embodiment is different from the configurations of embodiments 2 to 7 in that there is additionally provided a precharge function. The precharge function has a purpose to supplement the operation of the analog data signal line drive circuit ANSD. Specifically, the analog data signal line drive circuit ANSD, as mentioned earlier, samples an analog video signal according to the output from the shift register. An a.c. potential is applied to the liquid crystal display element to prevent the liquid crystal material from deterioration. Well-known driving methods include 1 H reverse drive (the polarity changes once per horizontal scan period) and frame reverse drive.

Therefore, for example, before the analog data signal line drive circuit ANSD samples a positive polarity analog video signal, the data signal line holds a negative polarity potential which is sampled in the preceding 1 H period. If the foregoing analog data signal line drive circuit ANSD does not have sufficient switching capabilities, the analog video signal may not in some cases written with a desired potential, degrading display quality.

Figure 118:
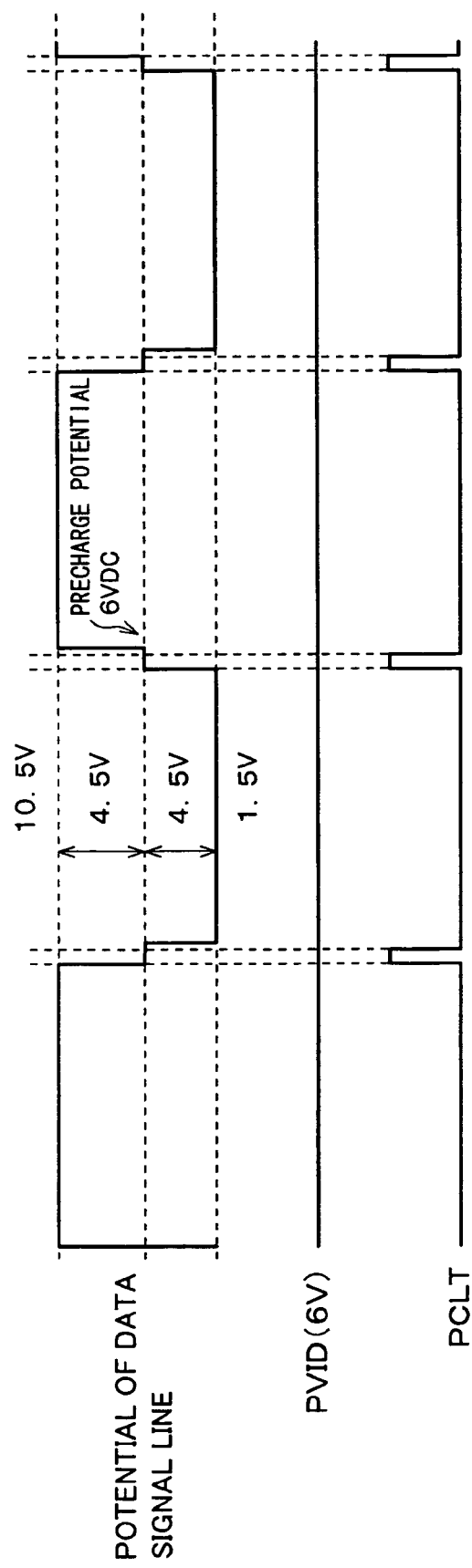
FIG. 118 is an explanatory drawing showing a waveform during a precharge operation.
Figure 119:
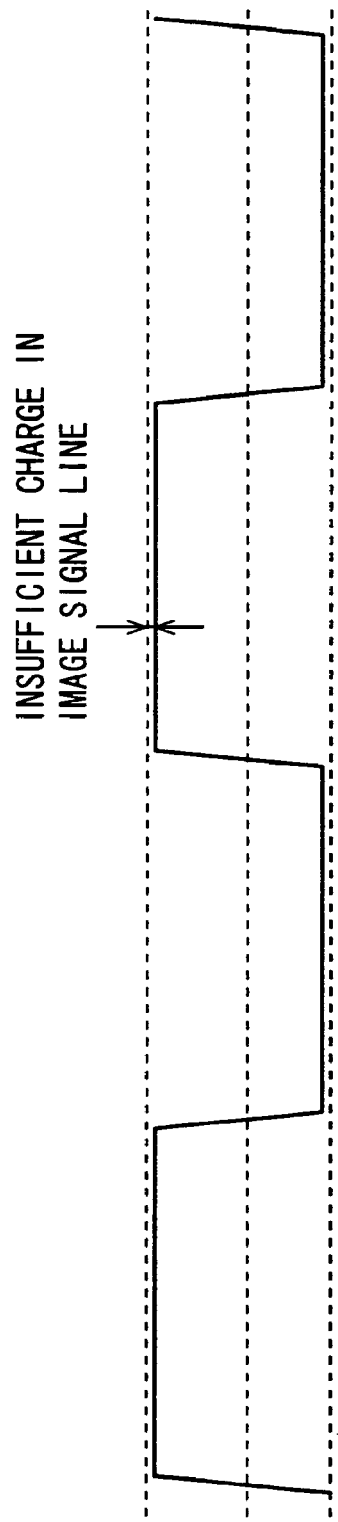
FIG. 119 is an explanatory drawing showing a waveform during an operation without a precharge operation.

To solve these inconveniences, the incorporation of a precharge circuit is conceived so that it and the analog data signal line drive circuit ANSD sandwich the display section between them. The precharge circuit is driven as follows. If a negative polarity analog video signal is supplied to the data signal lines in a 1 H period, for example, the precharge potential PVID which is being inputted to the precharge circuit is supplied to all the data signal lines simultaneously according to a precharge control signal PCLT in a horizontal blanking period after the completion of sampling. The precharge potential PVID here may have an arbitrary value. After precharge, the potential of the data signal lines is equal to the precharge potential. FIG. 118 shows waveforms. FIG. 119 shows a potential waveform of the data signal lines when no precharge operation is performed. As can be seen here, the precharge circuit is required when the transistor included in the drive circuit has less-than desirable characteristics.

Figure 96:
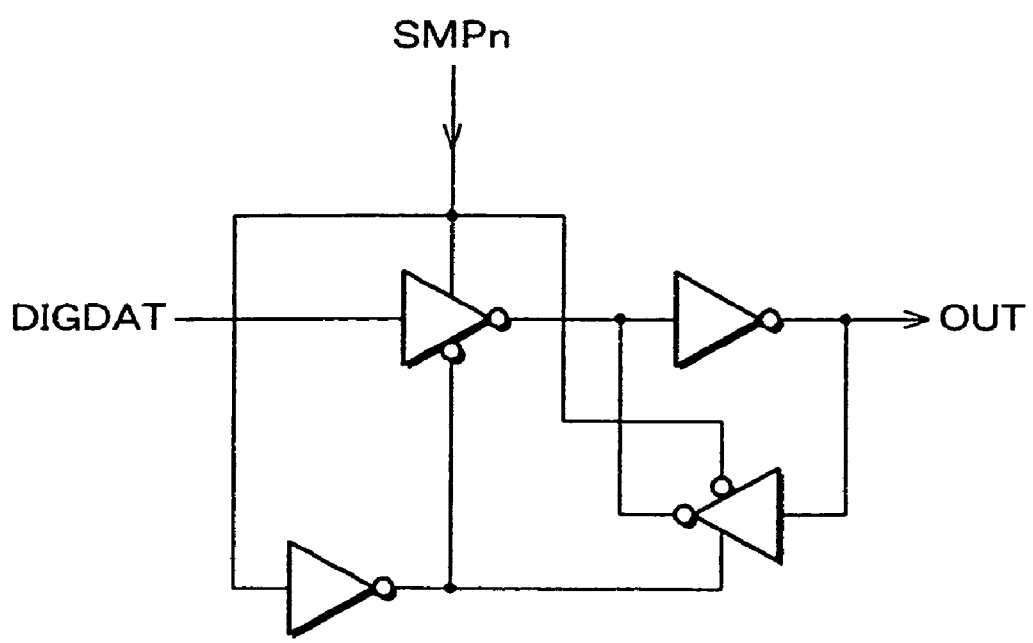
FIG. 96 is a block diagram showing, as an example, a configuration of a data holding section in accordance with the present invention.
Figure 120:
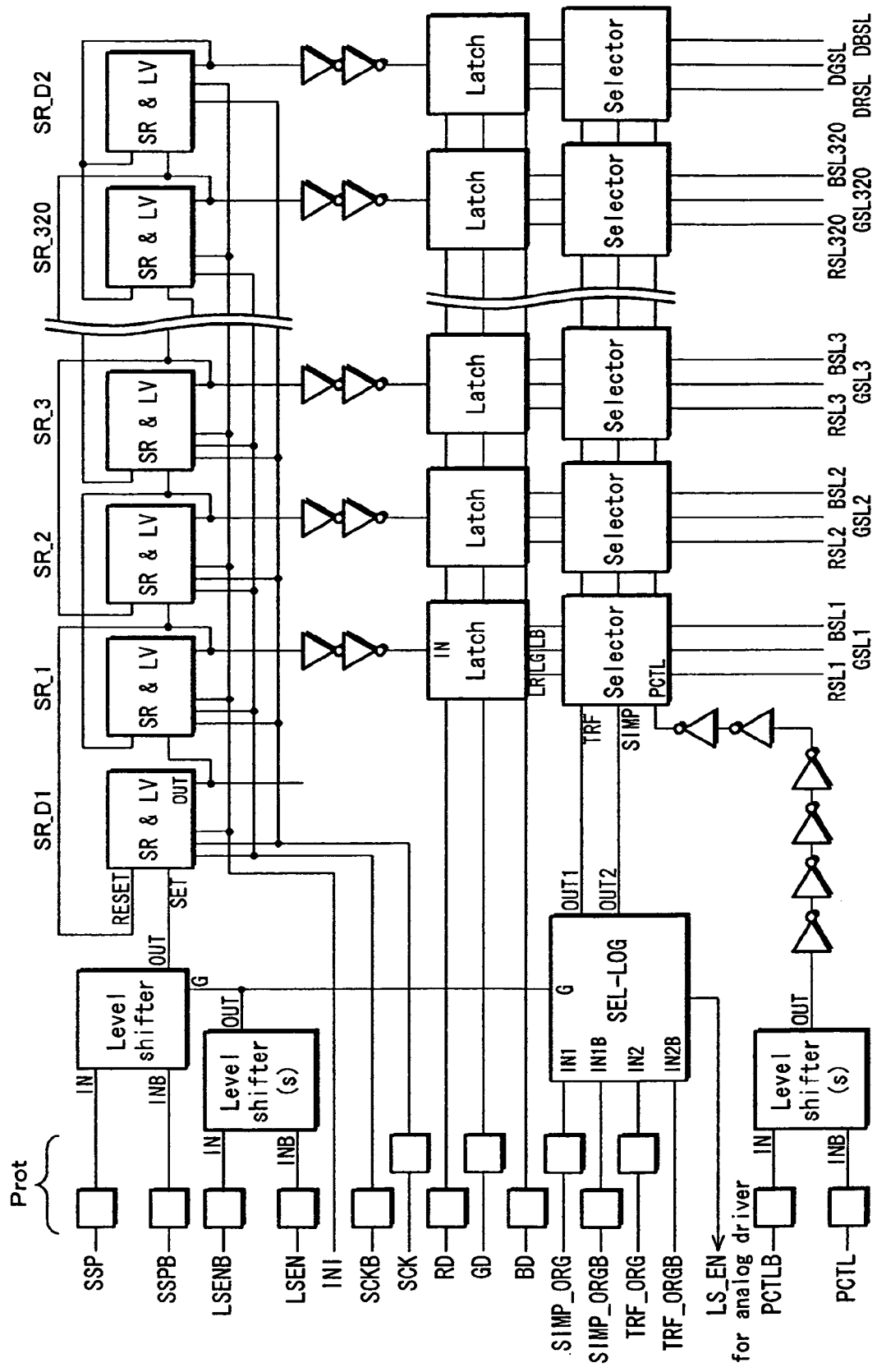
Figure 121:
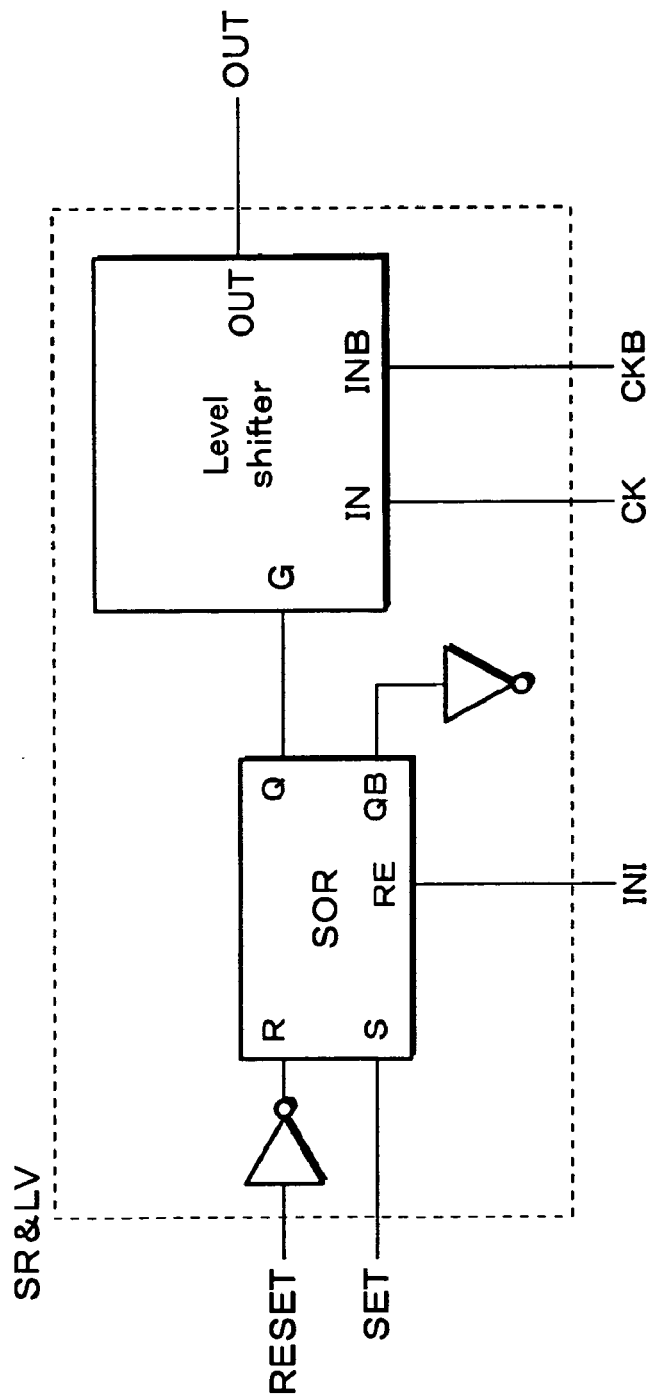
Figure 122:
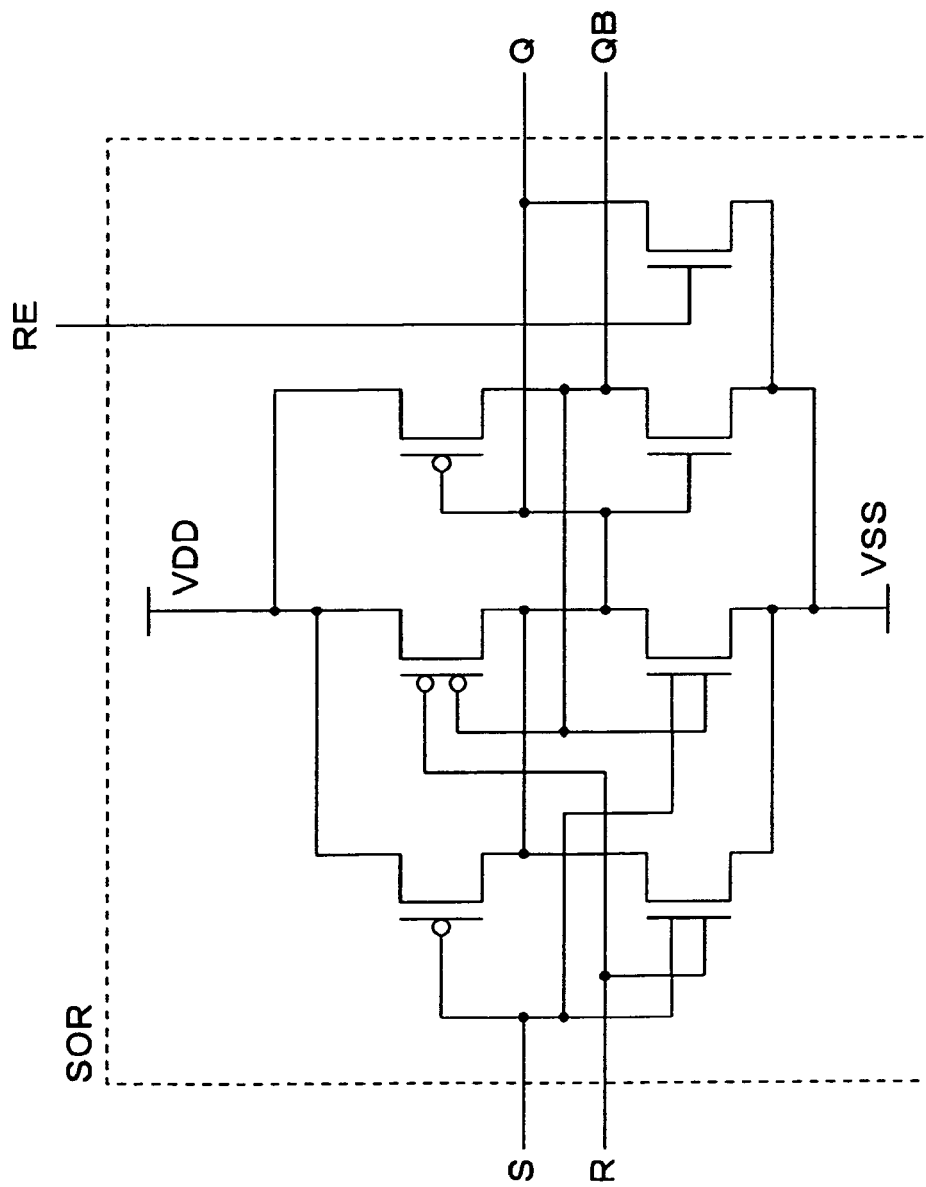

To solve this problem, the present embodiment employs a binary data signal line drive circuit BINSD shown in FIG. 120. The binary data signal line drive circuit BINSD is composed of a shift register section, an SEL-LOG section, a data latch section, and a selector section. In the figure, Prot indicates a protection circuit. The shift register section has a configuration shown in FIG. 121. The SOR section has a configuration shown in FIG. 122. The data latch section has an aforementioned configuration as shown in FIG. 96 and FIG. 109.

Figure 123:
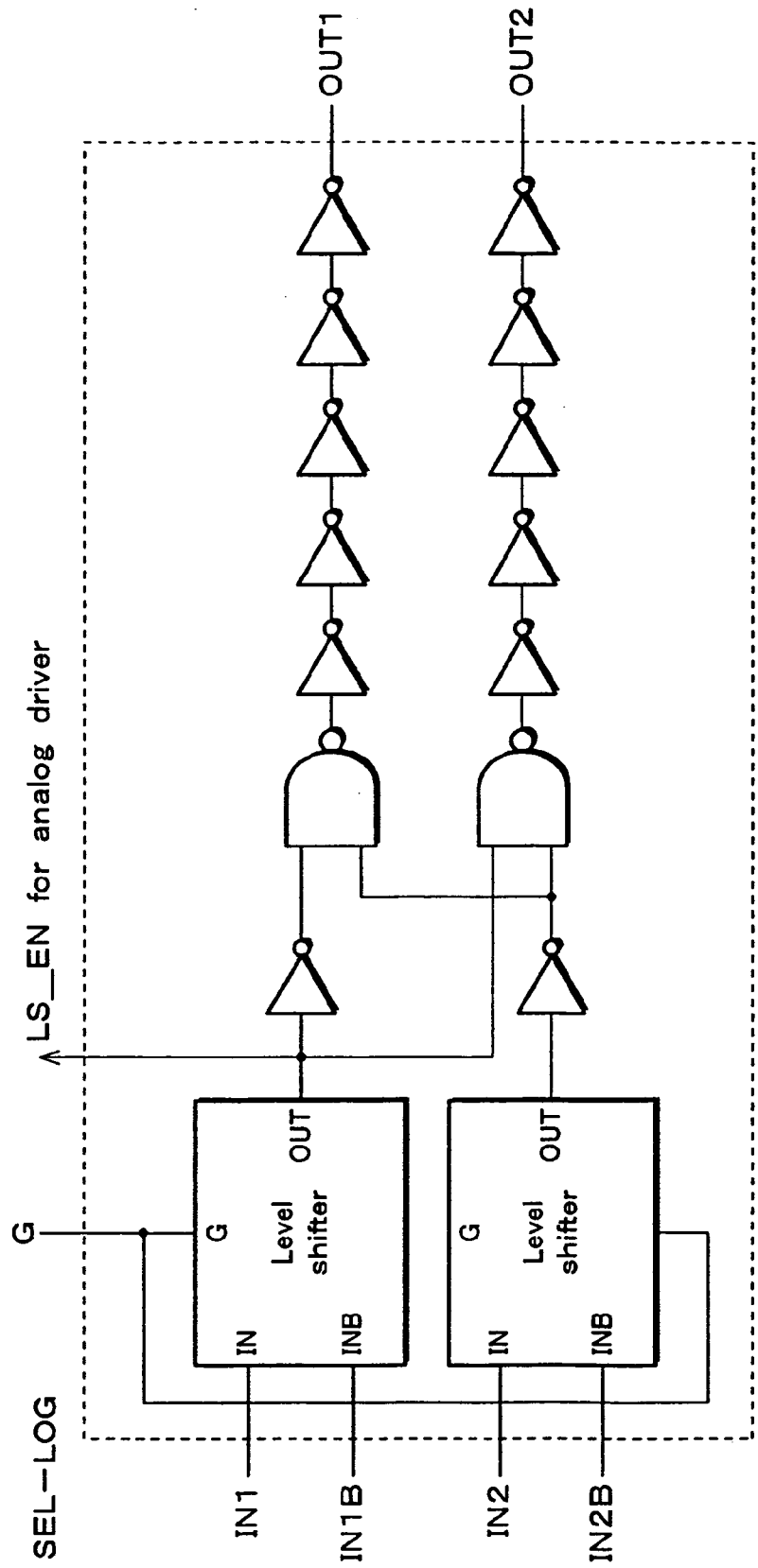
Figure 124:
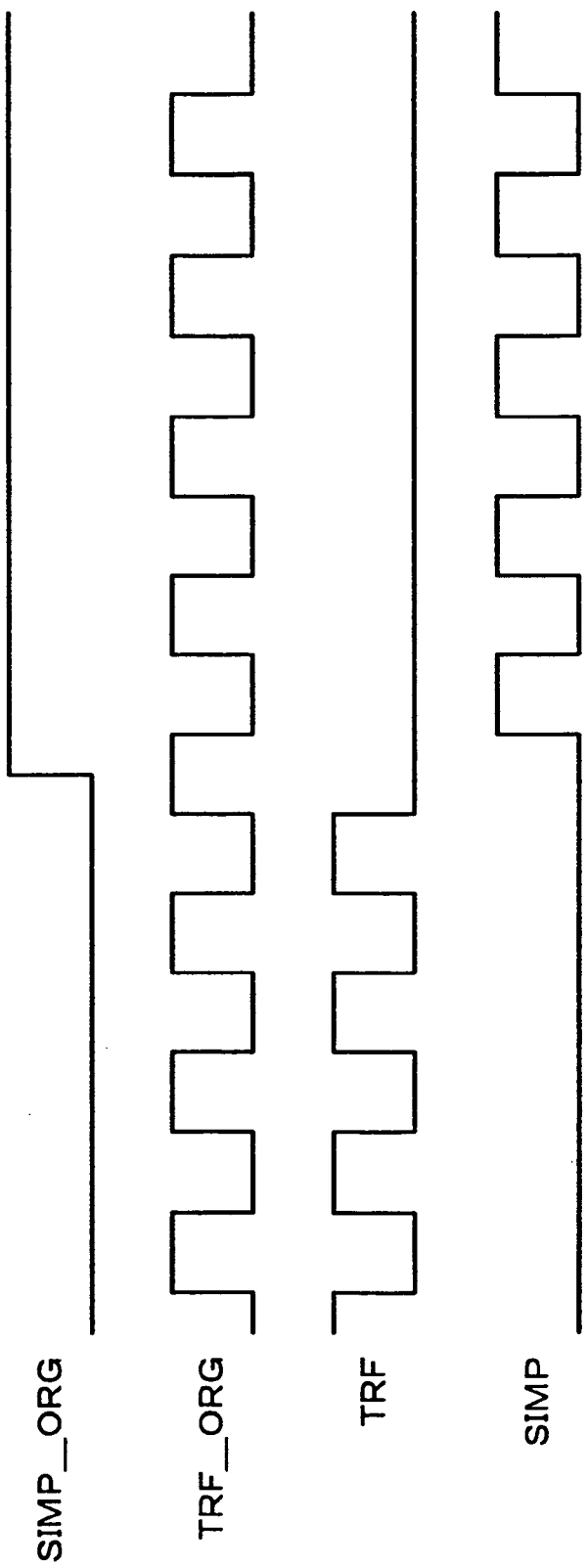

The SEL-LOG section has a configuration shown in FIG. 123, receiving the inputs SIMP_ORG and TRF_ORG at IN1 and IN2 respectively and outputting the transfer instruction signal TRF and the superimpose instruction signal SIMP from OUT1 and OUT2 respectively. FIG. 124 shows the waveforms.

Figure 125:
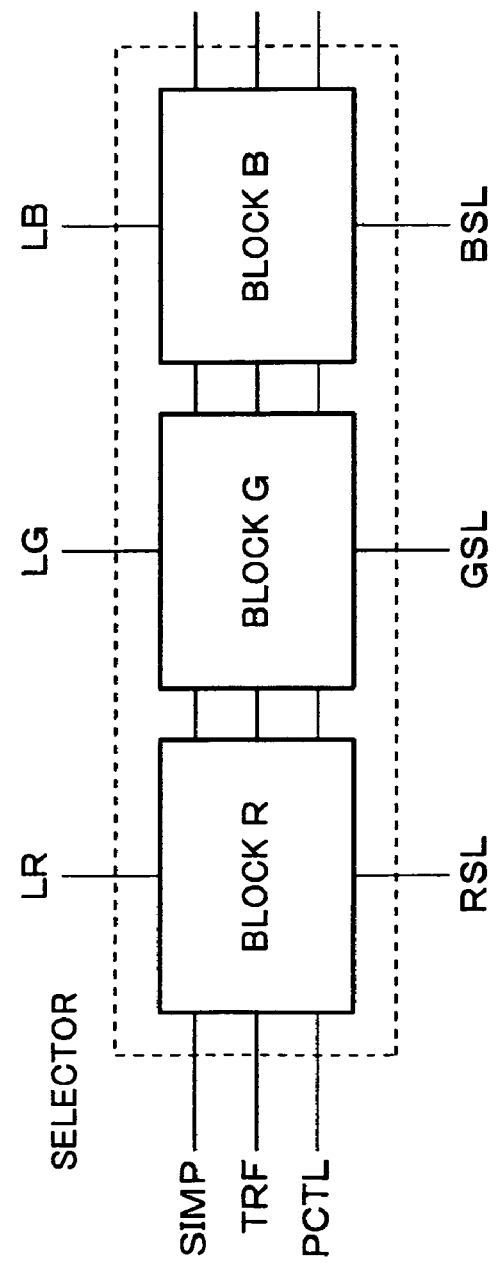

A unit in the selector section have a configuration as shown in FIG. 125, divided into three blocks corresponding to the three sets (RGB) of digital data.

Figure 126:
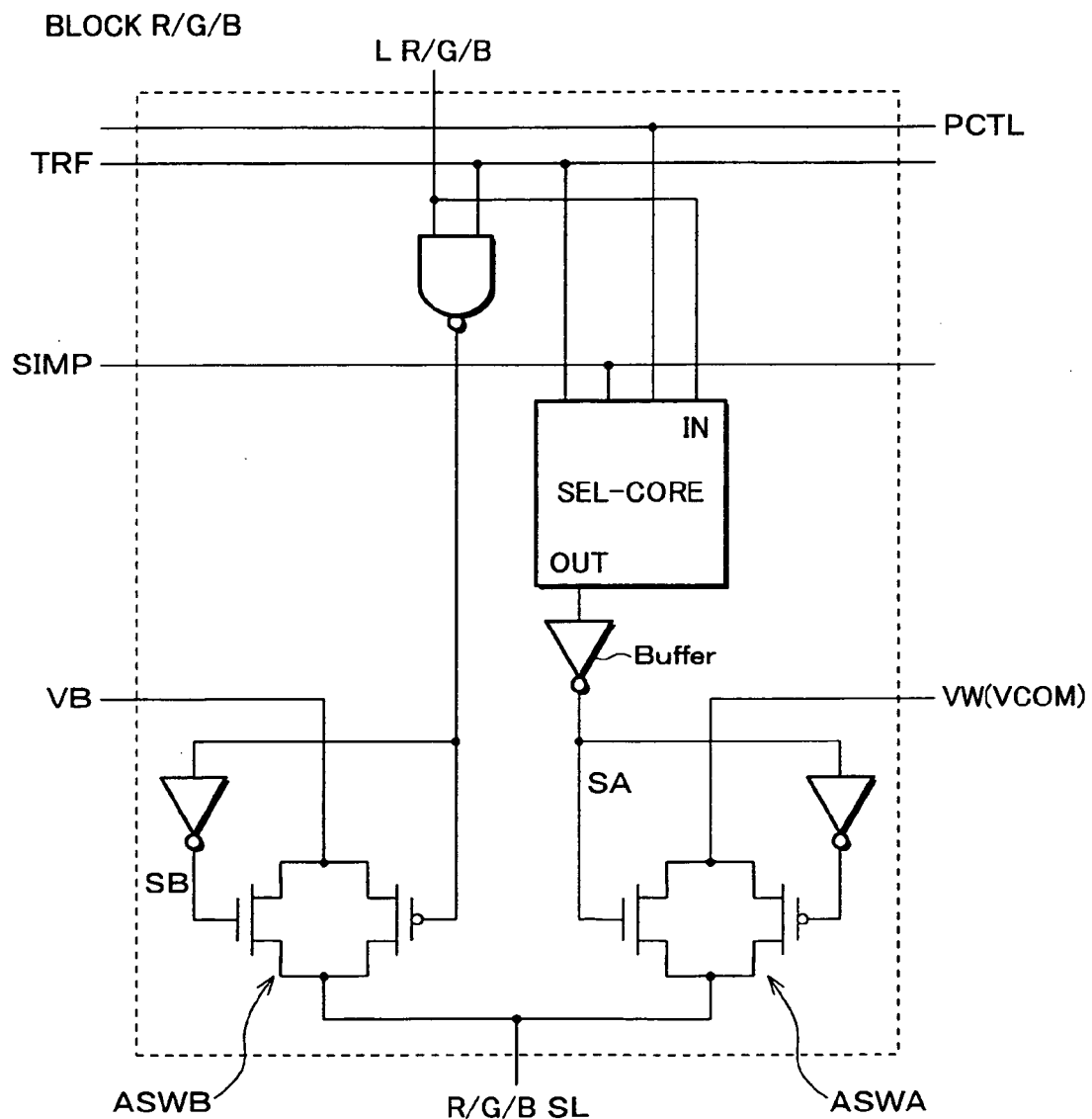

FIG. 126 shows the blocks in detail. The block is composed of (1) a two-input NAND which receives inputs of a transfer instruction signal TRF and a binary data signal DIGDAT produced by a data latch section (corresponding to LR/G/B in the figure); (2) an internal selector (SEL-CORE) which receives inputs of a binary data signal DIGDAT produced by a data latch section, a superimpose instruction signal SIMP, a transfer instruction signal TRF, and a precharge control signal PCLT; (3) a buffer; (4) an analog switch ASWB for controlling an output of a liquid crystal drive black potential according to the output from the two-input NAND; and (5) an analog switch ASWA for controlling outputs of a liquid-crystal-driving white potential and a precharge potential according to the output from the internal selector. The outputs of the analog switches ASWA and ASWB are connected to the same data signal line SL. In the figure, SA and SB represent a precharge and white writing signal SA and a black writing signal SB respectively in later detailed FIG. 128 and FIG. 129.

Figure 127:
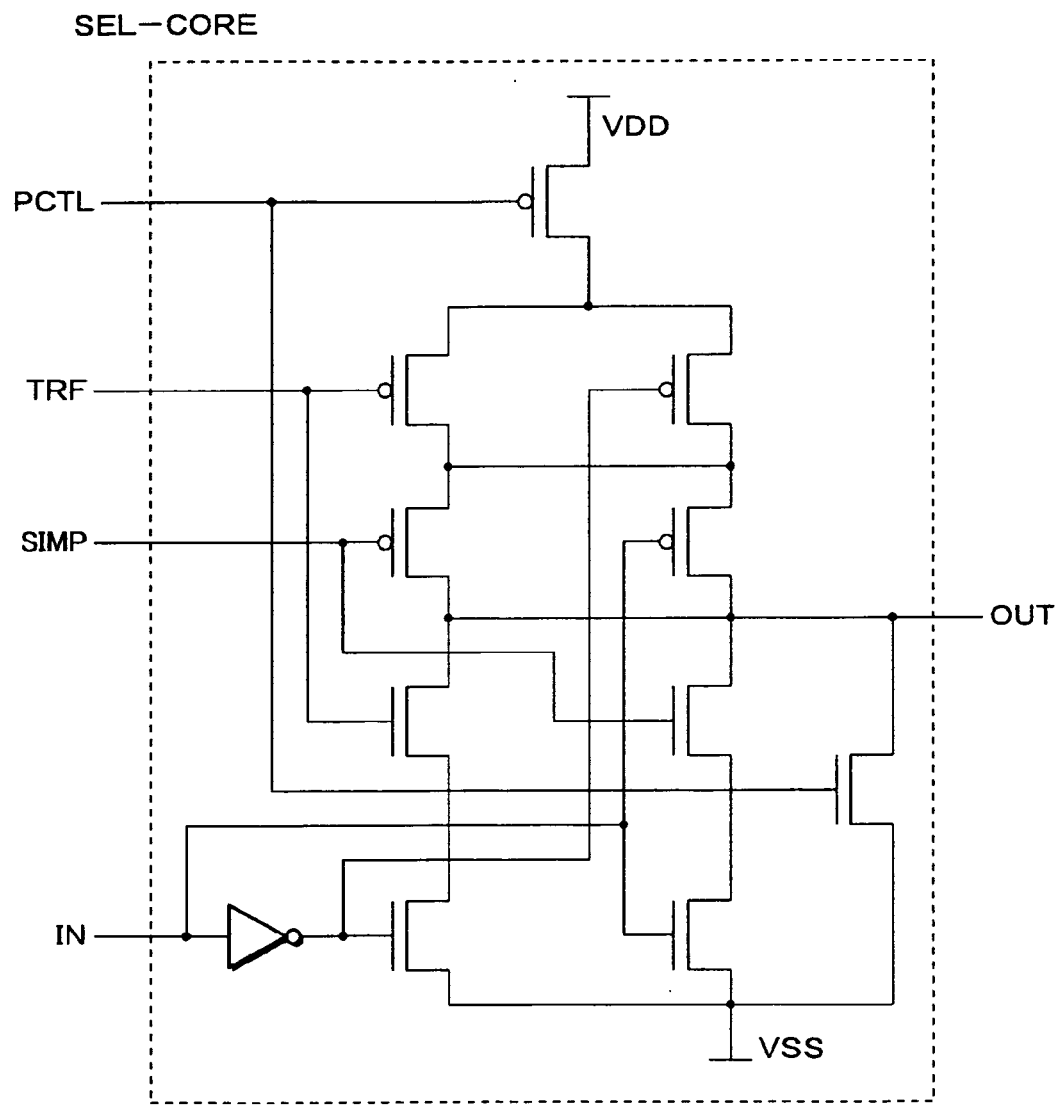

The internal selector constitutes a complex logic circuit as shown in FIG. 127.

In other words, the present embodiment is configured so that the aforementioned binary data signal line drive circuit BINSD acts as a precharge circuit for the analog data signal line drive circuit ANSD. For example, in a case where a negative-polarity analog video signal is supplied to a data signal line in a certain 1 H, as a horizontal blanking period starts after completion of the sampling, the for-turn-on potentials VW which are binary data potentials inputted to the binary data signal line drive circuit BINSD are supplied all together as a precharge potential PVID to the data signal lines according to the precharge control signal PCLT. The precharge potential PVID may be any given potential and set, for example, to the median value of the positive and negative maxima of the analog video signal (direct current (DC) 6 V, i.e., the potential equal to the liquid crystal opposite potential VCOM). Although the precharge potential here is 6 V which is the median value as is VCOM, it may be set to a value different from VCOM, for example, to 3 V or 5 V. As the precharge is completed, the potential of the data signal lines becomes equal to the precharge potential. FIG. 118 shows the waveforms as already descried earlier.

The operation will be described in reference to FIG. 128 and FIG. 129.

Figure 128:
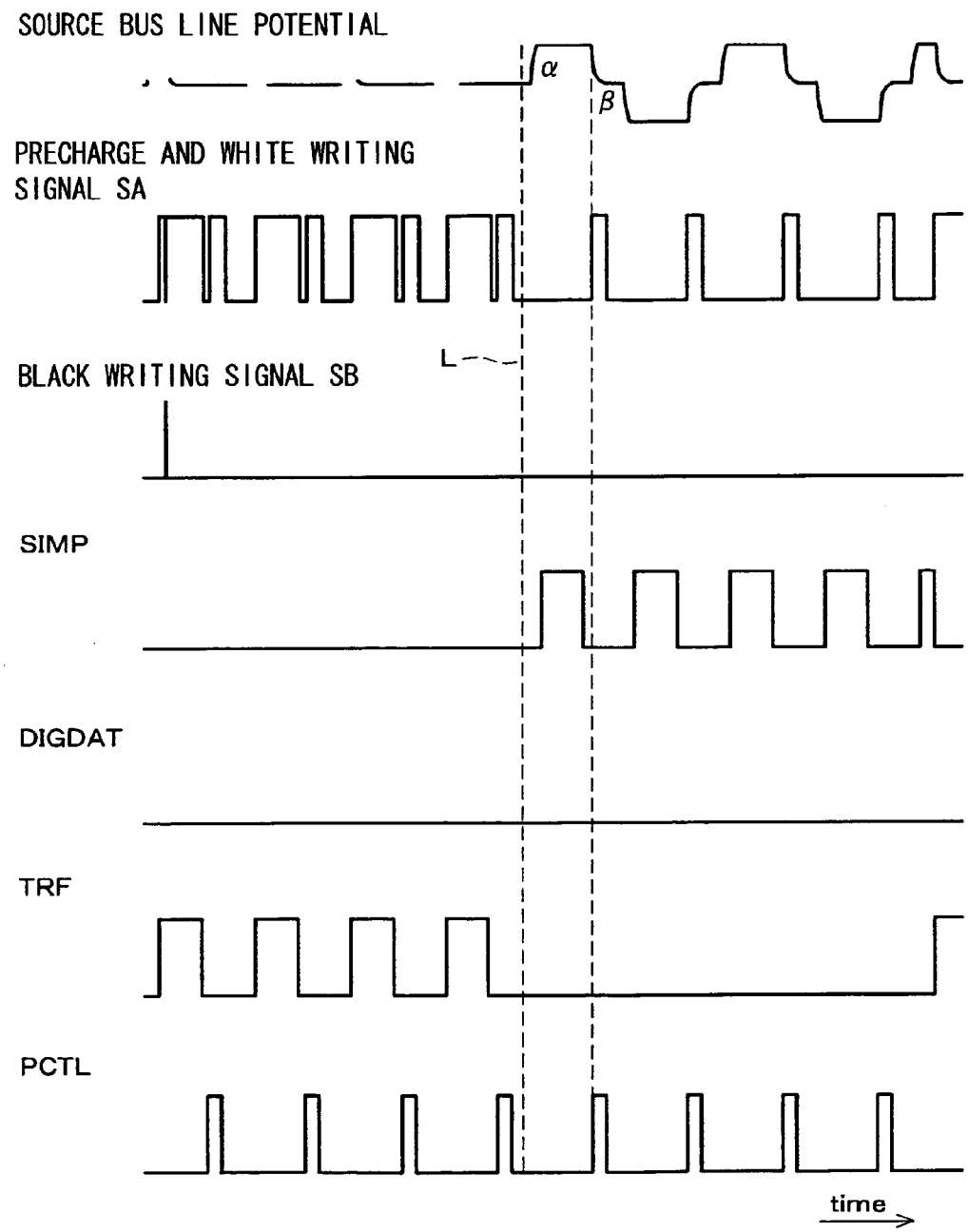

FIG. 128 shows a case where the binary data signal is meaningless (there is no data).

In the figure, to the left side of vertical line L in the middle of the figure are shown an input waveform, a state of the data signal line (source bus line) potential, etc. when only the binary data signal line drive circuit BINSD is driven.

Since the binary data signal DIGDAT is not meaningful, the liquid-crystal-driving white potential is written in the data signal line by the transfer instruction signal TRF. As the transfer instruction signal TRF becomes low, the precharge control signal PCLT becomes high, causing an output of the precharge potential PVID to the data signal lines. However, since the liquid-crystal-driving white potential and the precharge potential PVID are supplied to the same destination, the potential of the data signal lines does not change. Although not shown in the figure, the scan signal for driving the switching element SW in the pixel acts before the precharge control signal PCLT becomes high and is thereby turns off the switching element SW in the pixel. Therefore, as to the pixel potential, the liquid-crystal-driving white potential is held (in the case of normally white).

To the right side of vertical line-L in the middle of the figure are shown an input waveform, a state of the data signal line (source bus line) potential, etc. when the display image produced by the binary data signal line drive circuit BINSD is superimposed on the display image analog data signal line drive circuit ANSD. Although the device is working in superimpose mode, the output from the binary data signal DIGDAT is meaningless in the figure; therefore the image produced by the analog data signal line drive circuit ANSD is displayed alone.

The writing of an analog video signal by the analog data signal line drive circuit ANSD is marked "α" in the waveform and the data signal line potential. Here, even if the superimpose instruction signal SIMP becomes active, since the binary data signal is meaningless, the binary data signal DIGDAT which is an output signal from the data latch section becomes low. This causes none of the analog switches ASWA and ASWB to operate and results in nothing outputted to the data signal lines. So, the display section displays the video outputted from the analog data signal line drive circuit ANSD. Next, as the scan signal (not shown) turns off the switching element SW in the pixel, causing the precharge control signal PCLT to act and the precharge potential to be outputted to the data signal lines (marked as "β").

Figure 129:
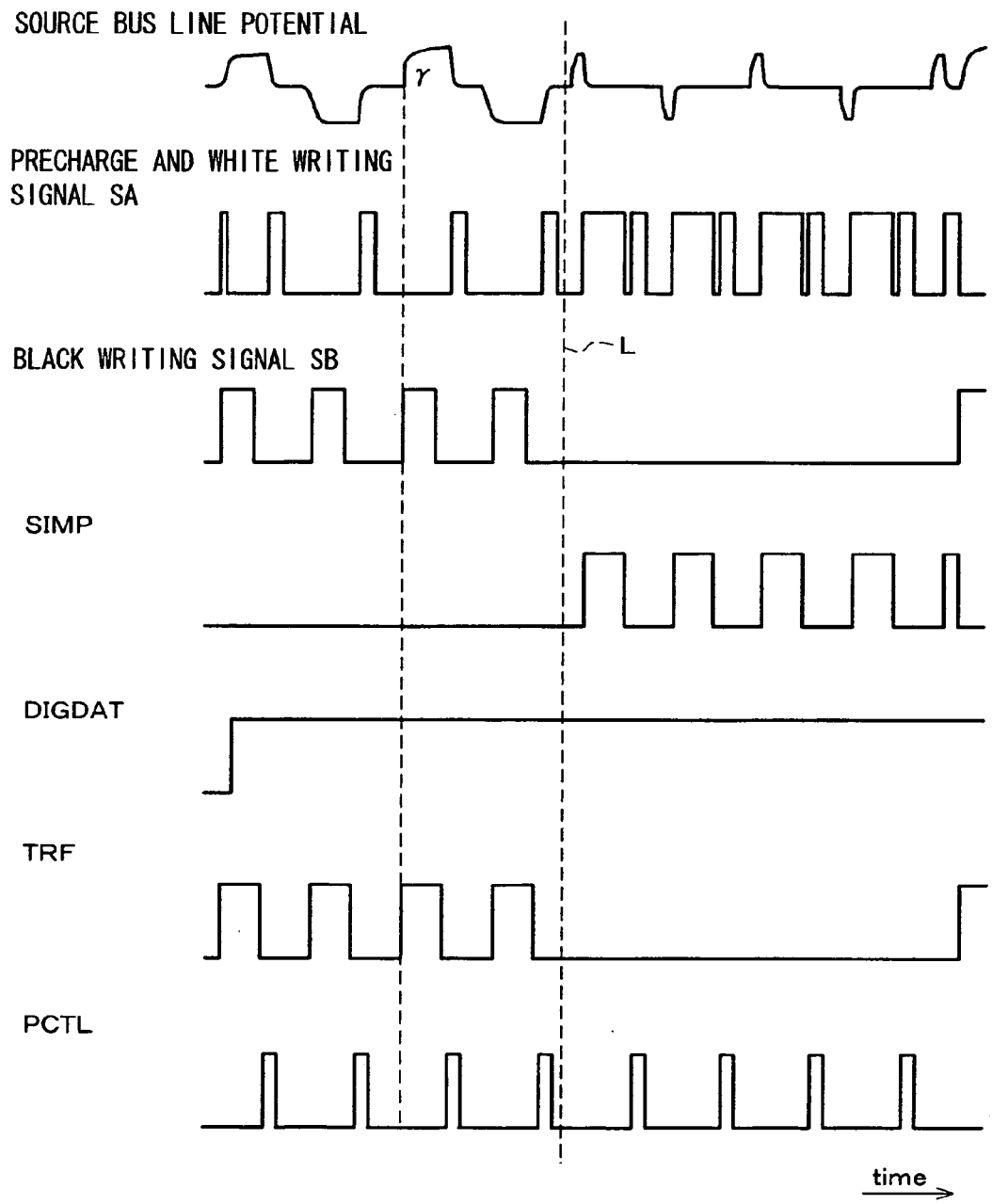

FIG. 129 shows a case where the binary data signal is meaningful.

In the figure, to the left of vertical line L in the middle of the figure are shown an input waveform and the data signal line (source bus line) potential, etc. when only the binary data signal line drive circuit BINSD is driven. Since the binary data signal DIGDAT is meaningful, the liquid crystal drive black potential is supplied to the data signal lines by the transfer instruction signal TRF. In other words, the device works in text display only mode: the liquid crystal drive black potential is supplied to the pixel where there is text data, whilst the liquid-crystal-driving white potential is supplied to the pixel where there is no text data (in the case of normally white). In this case, it can be understood again that after the switching element SW in the pixels turns off with the scan signal, the precharge control signal PCLT acts and causes the precharge potential to be written (marked as "γ").

To the right of vertical line L in the middle of the figure is shown a superimposed state in which the liquid-crystal-driving white potential written to the data signal lines to which a video signal has been already written by the analog data signal line drive circuit ANSD.

In other words, the analog data signal line drive circuit ANSD writes a video signal to the data signal lines; as to those data signal lines where the data is meaningful, as mentioned earlier, the superimpose instruction signal SIMP and the binary data signal DIGDAT which is an output signal from the data latch section causes the analog switch ASW2 to open during the horizontal blanking period, and the liquid-crystal-driving white potential is written to the data signal lines by the binary data signal line drive circuit BINSD. This causes text or another binary image produced by the binary data signal line drive circuit BINSD to be displayed in white on the image produced by the analog data signal line drive circuit ANSD (in the case of normally white).

Thereafter, if the switching element SW in the pixel turns off with the scan signal before the subsequent horizontal scan period starts, the precharge control signal PCLT writes the precharge potential, completing the precharge.

As detailed in the above, the binary data signal line drive circuit BINSD can achieve the superimpose function and text display in the binary data signal line drive circuit BINSD. Precharge can be also carried out using this binary data signal line drive circuit BINSD, to supplement the analog data signal line drive circuit ANSD. Therefore, no dedicated circuit is required separately for the precharge operation, and the circuit configuration is simplified.

In the case of a text display alone, that is, when the binary data signal line drive circuit BINSD is used to display, power consumption may be further reduced by suspending the input signal of the analog data signal line drive circuit ANSD and providing a power supply to the circuit constituting the analog data signal line drive circuit ANSD.

The precharge may be suspended when the binary data signal line drive circuit BINSD is used to display. The sampling of the analog video signal supplied to the data signal lines in the analog data signal-line drive circuit ANSD must be completed, although variable depending upon display formats, within about a hundred and a few dozen nano seconds for QVGA, for example. As for the binary data signal line drive circuit BINSD, there is provided a sufficient time to supply potential to the data signal line which is as long as half the horizontal blanking period (about 6 μs); therefore, the suspension of the precharge does not pose any problem in charging.

As a result of the recent trends for low voltage interfaces, the foregoing input signal voltages are lower (e.g., about 3.3 V or 5 V) than the source voltages of the drive circuits, and the aforementioned level shifter may be provided in the panel for each signal. If the level shifter is of a current drive type (voltage amplifier with a constatntly flowing current), current flows through it even with no signal input; power consumption is likely to increase. Accordingly, if the power supply to various circuits included in the drive and other circuits is to be suspended, it is desirable to suspend the current drive type level shifter. In other words, if the precharge is to be suspended, the level shifter for use with the precharge control signal PCLT should be suspended. To suspend the analog data signal line drive circuit ANSD, the level shifter for use with the start pulse or clock signal, for example, should be suspended. If the analog data signal line drive circuit ANSD is to operate alone, the level shifter for use with the signals (TRF, SIMP) inputted to the binary data signal line drive circuit BINSD should be suspended.

Figure 130:
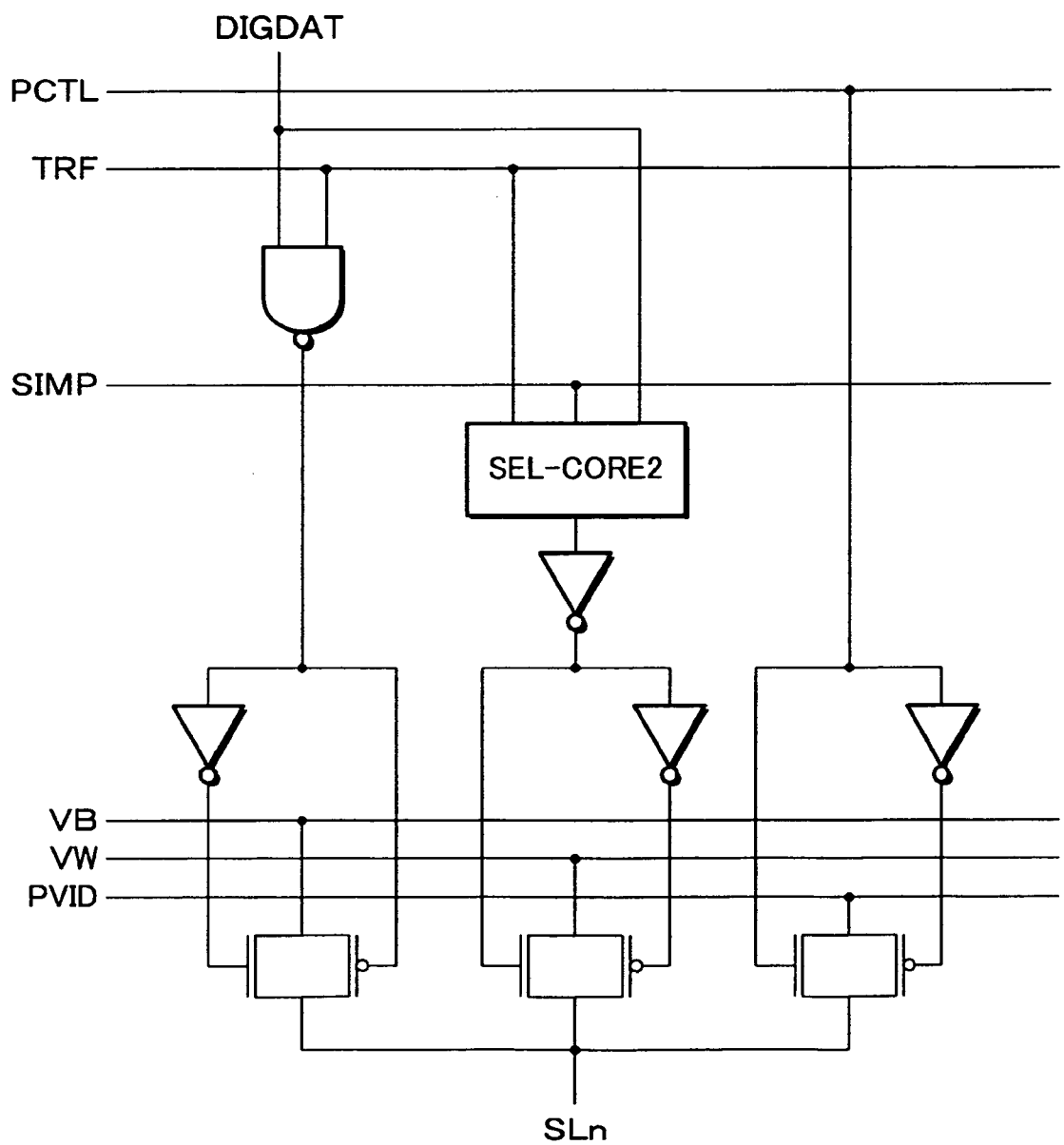
Figure 131:
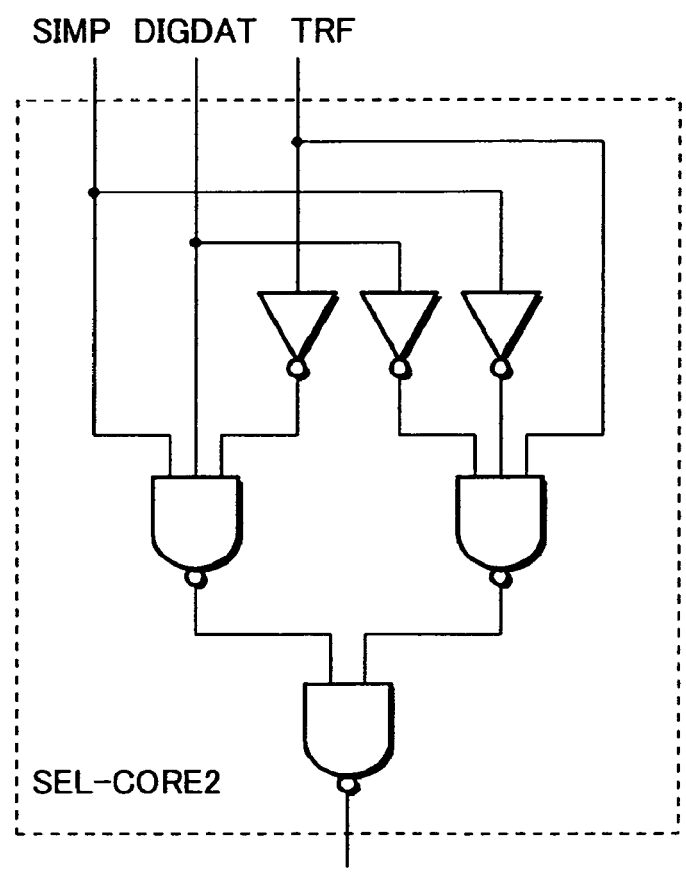

FIG. 130 is a circuit block diagram when the precharge potential PVID is provided separately from the liquid-crystal-driving white potential VW. Under these circumstances, the internal selector (SEL-CORE2) can be provided by using a decoder circuit shown in FIG. 131, and the externally inputted control signals TRF, SIMP, and PCTL are inputted so that their high periods (active periods) do not overlap one another. This configuration enables the data signal lines to be charged to an arbitrary precharge potential PVID. In contrast, if a common potential used as both the precharge potential PVID and the liquid-crystal-driving white potential VW, no dedicated circuit needs to be separately provided to supply the precharge potential PVID, simplifying the circuit configuration.

An image display device in accordance with the present invention includes:

a plurality of pixels arranged in a matrix form;

a plurality of data signal lines arranged to match with columns of the plurality of pixels and a plurality of scan signal lines arranged to match with rows of the plurality of pixels;

a display section in which the plurality of pixels are fed with data for an image display from the plurality of data signal lines in synchronism with a scan signal supplied from the plurality of scan signal lines;

a plurality of data signal line drive circuits, connected to the same data signal lines, for outputting a video signal to the plurality of data signal lines in synchronism with a predetermined timing signal; and a scan signal line drive circuit for outputting the scan signal to the plurality of scan signal lines in synchronism with a predetermined timing signal, wherein:

at least one of the plurality of data signal line drive circuits includes:

a shift register section operating at a predetermined timing;

a data holding section for sampling and holding separately inputted digital data (binary data signal) according to an output of the shift register section;

a data switching section for switching a for-turn-on potential and a for-non-turn-on potential according to the data being held;

an output control section, provided between an output of the data switching section and the plurality of data signal lines, for controlling an output based on an externally inputted transfer instruction signal; and an output from the output control section.

This enables the image display device to be offered with capabilities to produce a superimposed display based on a plurality of sets of image data without preliminary synthesis and to operate on a reduced electric power.

The output control section may supply a for-turn-on potential or for-non-turn-on potential to the plurality of data signal lines based on an externally inputted display state selection signal when the data holding section produces an output that is meaningful.

This is equivalent to only the binary data signal line drive circuit BINSD driving the plurality of data signal lines SL. Under these circumstances, such driving that is suitable to individual needs in both actual use and standby becomes possible by suspending the supply of the start signal SP, the clock signal CK, and the video signal DAT to the analog data signal line drive circuit ANSD.

In at least one of the plurality of data signal line drive circuits, outputs to the plurality of data signal lines may be coupled to the plurality of data signal lines.

Thus, in at least one of the plurality of data signal line drive circuits, outputs to the plurality of data signal lines may be coupled to the plurality of data signal lines; therefore, that data signal line drive circuit drives at a lower frequency than the other data signal line drive circuit. This enables power consumption to be reduced and the image display device to be offered with capabilities to drive suitably to individual needs in both actual use and standby. A superimposed display can be hence produced from a plurality of sets of image data without preliminary synthesis, which provides opportunities to further reduce power consumption.

The plurality of data signal line drive circuits may be arranged so that each of them provides an output to the data signal lines at a different timing from the others.

This prevents the for-non-turn-on potential or the for-turn-on potential from being fed to the plurality of data signal lines simultaneously with the video signal, enabling a display of satisfactory quality and reductions in power consumption. Thereby, the image display device can be offered with capabilities to drive suitably to individual needs in both actual use and standby. A superimposed display can be hence produced from a plurality of sets of image data without preliminary synthesis, which provides opportunities to further reduce power consumption.

The transfer instruction signal may be turned active in a horizontal blanking period with either the for-turn-on potential or the for-non-turn-on potential supplied simultaneously.

This prevents the for-non-turn-on potential or the for-turn-on potential from being fed to the plurality of data signal lines simultaneously with the video signal, enabling a display of satisfactory quality and reductions in power consumption. Thereby, the image display device can be offered with capabilities to drive suitably to individual needs in both actual use and standby. A superimposed display can be hence produced from a plurality of sets of image data without preliminary synthesis, which provides opportunities to further reduce power consumption.

One or more of the plurality of data signal line drive circuits may be suspended from operating.

This suspends operation of one or more of the plurality of data signal line drive circuits and thereby reduces power consumption. Thus, the image display device can be offered with capabilities to drive suitably to individual needs in both actual use and standby. A superimposed display can be hence produced from a plurality of sets of image data without preliminary synthesis, which provides opportunities to further reduce power consumption.

An image display device in accordance with the present invention includes:

a plurality of pixels arranged in a matrix form;

a plurality of data signal lines arranged to match with columns of the plurality of pixels and a plurality of scan signal lines arranged to match with rows of the plurality of pixels;

a display section in which the plurality of pixels are fed with data for an image display from the plurality of data signal lines in synchronism with a scan signal supplied from the plurality of scan signal lines;

a plurality of data signal line drive circuits, connected to the same data signal lines, for outputting a video signal to the plurality of data signal lines in synchronism with a predetermined timing signal; and a scan signal line drive circuit for outputting the scan signal to the plurality of scan signal lines in synchronism with a predetermined timing signal, wherein:

when a predetermined timing signal and digital data have lower potentials than a source voltage, at least one of the plurality of data signal line drive circuits includes a level shifter in an input section for the timing signal of the shift register section and in an input section for the digital data of the data holding section and samples and subsequently holds the digital data according to an output of the shift register section based on a timing signal voltage-boosted by the level shifters; and there are provided a data switching section for switching the for-turn-on-potential and the for-non-turn-on potential according to the data being held and an output control section, located between an output of the data switching section and the plurality of data signal lines, for controlling an output according to an externally inputted transfer instruction signal.

This enables power consumption to be reduced and the image display device to be offered with capabilities to drive suitably to individual needs in both actual use and standby. A superimposed display can be hence produced from a plurality of sets of image data without preliminary synthesis, and power consumption can be reduced with a low voltage interface.

There may be provided control means in the level shifters in the data holding section such that the level shifters operate only when an output signal of the shift register section which is inputted to sample and hold digital data is active.

This disables the level shifters, except when they need to operate and thus reduces power consumption. The image display device can be offered with capabilities to drive suitably to individual needs in both actual use and standby. A superimposed display can be hence produced from a plurality of sets of image data without preliminary synthesis, and power consumption can be reduced with a low voltage interface.

The level shifters may each include a level shifter part of a current drive type.

This enables the level shifters to operate even if they are constituted by transistors which exhibit poor characteristics. Further, the level shifters are disabled, except when they need to operate and thus reduces power consumption. The image display device can be offered with capabilities to drive suitably to individual needs in both actual use and standby. A superimposed display can be hence produced from a plurality of sets of image data without preliminary synthesis, and power consumption can be reduced with a low voltage interface and power consumption can be reduced with a low voltage interface.

The control means may suspend operation of the level shifters by providing as an input signal to the level shifters a signal having a sufficient level to cause an input switching element to cut off.

This enables the control means to suspend operation of the level shifters and power consumption to be reduced during the suspension by the amount that would be otherwise consumed by the current flow through the input switching element.

The control means may suspend operation of the level shifters by suspending electric power supply to the level shifters.

This enables the control means to stops the electric power supply to the level shifters to suspend their operation. Thus, the control means can suspend operation of the level shifters and reduce power consumption by the amount that would be otherwise consumed by the level shifters during their operation.

The control means may control an input so that a gate capacitance of a transistor receiving the digital data inputted to the level shifter parts is isolated from a transmission line of the digital data to reduce a capacitance of the transmission line.

This can reduce the capacitance of the transmission line carrying the digital data.

The output control section may supply a for-turn-on potential or for-non-turn-on potential to the data signal lines based on an externally inputted display state selection signal when the data holding section produces an output that is meaningful.

This is equivalent to only the binary data signal line drive circuit BINSD driving the plurality of data signal lines SL. Under these circumstances, such driving that is suitable to individual needs in both actual use and standby becomes possible by suspending the supply of the start-signal SP, the clock signal CK, and the video signal DAT to the analog data signal line drive circuit ANSD. The resultant low voltage interface further reduces power consumption.

In at least one of the plurality of data signal line drive circuits, outputs to the plurality of data signal lines may be coupled to the plurality of data signal lines.

Thus, in at least one of the plurality of data signal line drive circuits, outputs to the plurality of data signal lines may be coupled to the plurality of data signal lines; therefore, that data signal line drive circuit drives at a lower frequency than the other data signal line drive circuit. This enables power consumption to be reduced and the image display device to be offered with capabilities to drive suitably to individual needs in both actual use and standby. A superimposed display can be hence produced from a plurality of sets of image data without preliminary synthesis, and power consumption can be reduced with a low voltage interface.

In a method of driving the image display device, the plurality of data signal line drive circuits may each provide an output to the data signal lines at a different timing from the others.

This prevents the for-non-turn-on potential or the for-turn-on potential from being fed to the data signal lines simultaneously with the video signal, enabling a display of satisfactory quality and reductions in power consumption. Thereby, the image display device can be offered with capabilities to drive suitably to individual needs in both actual use and standby. A superimposed display can be hence produced from a plurality of sets of image data without preliminary synthesis, and power consumption can be reduced with a low voltage interface.

In a method of driving the image display device, the transfer instruction signal may be turned active in a horizontal blanking period with either the for-turn-on potential or the for-non-turn-on potential supplied simultaneously.

This prevents the for-non-turn-on potential or the for-turn-on potential from being fed to the plurality of data signal lines simultaneously with the video signal, enabling a display of satisfactory quality and reductions in power consumption. Thereby, the image display device can be offered with capabilities to drive suitably to individual needs in both actual use and standby. A superimposed display can be hence produced from a plurality of sets of image data without preliminary synthesis, and power consumption can be reduced with a low voltage interface.

In the image display device, one or more of the plurality of data signal line drive circuits may be suspended from operating.

This enables power consumption to be reduced and the image display device to be offered with capabilities to drive suitably to individual needs in both actual use and standby. A superimposed display can be hence produced from a plurality of sets of image data without preliminary synthesis, and power consumption can be reduced with a low voltage interface.

In the image display device, the plurality of data signal line drive circuits, scan signal line drive circuits, and switching elements constituting the plurality of pixels may be made of polycrystalline silicon thin film transistors. In other words, the plurality of data signal line drive circuits, scan signal line drive circuits, and pixels may each include switching element having a polycrystalline silicon thin film transistor.

This enables the display area to be readily expanded and the various components to be readily fabricated on the same substrate, which saves labor during manufacture and the capacitance of the signal lines. In addition, the use of the shift registers in the foregoing configurations enables the size of the circuitry and thus the frame of the display device to be reduced. Further, the provision of the level shifters enables power consumption to be reduced with a low amplitude clock signal even when the shift registers are controlled.

In the image display device, the plurality of data signal line drive circuits, scan signal line drive circuits, and switching elements constituting the plurality of pixels may be manufactured at a process temperature equal to or below 600° C.

This allows use of an inexpensive glass substrate as the substrate and makes it possible to offer an image display device with a wider display area at a lower cost.

Another image display device in accordance with the present invention includes:

a plurality of pixels arranged in a matrix form;

a plurality of data signal lines arranged to match with columns of the plurality of pixels;

a plurality of scan signal lines arranged to match with rows of the plurality of pixels;

a data signal line drive circuit for outputting a separately inputted video signal to the plurality of data signal lines in synchronism with a predetermined timing signal; and a display section including the plurality of scan signal line drive circuits, pixels, scan signal lines, and data signal lines for display an image based on a video signal inputted to the data signal line drive circuit, wherein:

at least one of the plurality of data signal line drive circuits may be arranged to include a binary data potential stabilizer section for stabilizing the binary data potential in a method of driving an image display device including a binary data signal line drive circuit for determining an externally supplied binary data potential according to the binary data signal and supplying the binary data potential to the plurality of data signal lines according to an external timing signal in a predetermined period.

With the arrangement, a binary data potential stabilizer section is provided for stabilizing a binary data potential inputted to a binary data signal line drive circuit for charging the plurality of data signal lines to any given binary data potential; therefore, variations in the binary data potential are restrained. The data signal line can be thus charged to any desired potential, which alleviates degradation in image quality of the image display device and can restrain increases in power consumption due to the omission of the current amplifier circuit.

In other words, with the arrangement, increases in power consumption can be alleviated and the write performance of the binary data potential to the data signal lines can be improved.

Another image display device in accordance with the present invention may be, in the foregoing image display device, arranged so that:

the binary data potential stabilizer section is composed of a current control section and an electric charge holding section.

With the arrangement, the binary data potential stabilizer section is composed of a current control section and an electric charge holding section; therefore, by holding the potential (electric charges) supplied to the data signal lines in the electric charge holding section, only the electric charge holding section needs to supply electric charges while the transfer instruction signal TRF (transfer signal) which is a binary data potential control signal is being effective. Moreover, the binary data potential supplied by the control signal circuit needs to be supplied to the electric charge holding section only when the transfer instruction signal is ineffective; the use of a current control section enables the electric charge holding section to be fed without producing unnecessarily heavy current. This can alleviate degradation in image quality of the image display device similarly to the foregoing and reduce power consumption.

Another image display device in accordance with the present invention may be, in the foregoing image display device, arranged so that:

the electric charge holding section is composed of a capacitance (capacitor). This can alleviate degradation in image quality of the image display device similarly to the foregoing and allows selection of the most suitable amount of the electric charges held.

Another image display device in accordance with the present invention may be, in the foregoing image display device, arranged so that:

the current control section is composed of a resistance. This can alleviate degradation in image quality of the image display device similarly to the foregoing and restrain increases in current consumption.

Another image display device in accordance with the present invention may be, in the foregoing image display device, arranged so that:

the electric charge holding section has a capacitance (capacitor) that is greater than at least a total capacitance of the plurality of data signal lines.

With the arrangement, by specifying the capacitance of the capacitance (capacitor) in the electric charge holding section to be larger than the total capacitance of the plurality of data signal lines, only the electric charges stored in the electric charge holding section need to be supplied while the transfer instruction signal is being effective, which makes it no longer necessary for the control signal circuit to supply more electric charges. This can alleviate degradation in image quality of the image display device similarly to the foregoing and restrain increases in the amount of current and hence increases in power consumption.

Another image display device in accordance with the present invention may be, in the foregoing image display device, arranged so that: the current control section and the electric charge holding section constituting the binary data potential stabilizer section each exhibit a time constant that has such a value that stabilizes the potential at a sufficient value within a period during which a display is produced based on the video signal.

With the arrangement, the time constants of the current control section and the electric charge holding section constituting the binary data potential stabilizer section take such values that stabilize the potential at a sufficient value within a period during which a display is produced based on the video signal; therefore, for example, when one horizontal scan period (1 H) is an NTSC signal, the period equals about 63 µs, enabling the potential to be hold within that period. In other words, a sufficient amount of electric charges can be stored in the electric charge holding section before the transfer instruction signal becomes effective, which makes it no longer necessary for the control signal circuit to supply more electric charges. This can alleviate degradation in image quality of the image display device similarly to the foregoing and restrain increases in the amount of current and hence increases in power consumption.

In the liquid crystal display device, the capacitance constituting a pixel PIX is connected at an end of it to a data signal line SL via a switching element SW, whilst the capacitance receives at the other end a potential termed opposite potential. In other words, the video signal DAT or the binary data potential VB written to a pixel PIX is applied to the liquid crystal due to the potential difference from the opposite potential VCOM, realizing various display states by modification of light passing through the liquid crystal.

Another image display device in accordance with the present invention may be, in the foregoing image display device, arranged so that:

the binary data potential has an a.c. potential in synchronism with one horizontal scan period of a video signal.

Another image display device in accordance with the present invention may be, in the foregoing image display device, arranged so that:

the binary data potential can always have any given direct current potential.

For example, the opposite potential VCOM is provided by a direct current potential, and the positive and negative polarities of the video signal DAT or binary data potential VB can be expressed with the opposite potential VCOM as the reference.

As described above, when the video signal has a positive or negative polarity, the data signal lines can be charged to the most suitable binary data potential by giving an a.c. potential to the binary data potential in synchronism with the change in polarity. Thus, variations of the binary data potential can be restrained and the data signal lines can be charged to a desired potential, which can alleviate degradation in image quality of the image display device.

Another image display device in accordance with the present invention may be, in the foregoing image display device, arranged so that:

the plurality of data signal line drive circuits, scan signal line drive circuits, and pixels can be formed on one substrate.

With the arrangement, the plurality of data signal line drive circuits, scan signal line drive circuits, and pixels are formed on one substrate; the wires connecting the plurality of data signal line drive circuits to pixels and also those connecting the plurality of scan signal lines to pixels are formed on the single substrate, do not need to extend out of the substrate. As a result, increases in the number of data signal lines or scan signal lines do not change the number of signal lines extending beyond the substrate and does not require reassembling. The capacitance of the signal lines can be prevented from unnecessarily increase and the extent of integration can be prevented from falling.

Incidentally, in comparison to monocrystalline silicon, the polycrystalline silicon thin film is easy to expand its area; however, the polycrystalline silicon transistor is inferior to the monocrystalline silicon transistor, for example, in characteristics including mobility and threshold values. Therefore, if monocrystalline silicon transistors are used as components of a circuit, it is difficult to expand the display area. If polycrystalline silicon thin film transistors are used as components of a circuit, the circuit exhibit poorer driving capabilities. If the two drive circuits are fabricated on another substrate from the pixels, the substrates needs to be interconnected by the signal lines. This requires extra labor in manufacture and increases the capacitance of each signal line.

In contrast, the image display device in accordance with the present invention may be arranged so that the plurality of data signal line drive circuits, scan signal line drive circuits, and switching element constituting the pixels are composed of polycrystalline silicon thin film transistors. In other words, the plurality of data signal line drive circuits, scan signal line drive circuits, and pixels may be arranged to include switching elements composed of polycrystalline silicon thin film transistors.

With the arrangement, each of the plurality of data signal line drive circuits, scan signal line drive circuits, and pixels include a switching element composed of a polycrystalline silicon thin film transistor; therefore, the display area is readily expandable. Further, these components can be readily formed on the same substrate, saving labor in manufacture and reducing the capacitance of signal lines. The use of shift registers arranged as above can reduce the size of circuits and hence the size of the frame, as well as can reduce power consumption.

Another image display device in accordance with the present invention may be, in the foregoing image display device, arranged so that:

the plurality of data signal line drive circuits, scan signal line drive circuits, and pixels may include switching elements manufactured at a process temperature equal to or below 600° C.

With the arrangement, the process temperature of the switching elements is set to 600° C. or below; therefore, the use of a normal glass substrate (of which the distortion temperature is 600° C. or below) as the substrate for the switching elements does not lead to warping due to a process during which temperature rises exceeding the distortion temperature. As a result, an image display device can be offered which boasts a wider display area and which can be more readily packaged.

Another image display device in accordance with the present invention may be, in the foregoing image display device, arranged so that:

only one of the parts and entireties of the drive circuit(s) operates at any given time.

To display an image in a specified format, one of the parts and entireties of the data signal line drive circuit writes image data to the pixel array, and the other parts and entireties of the data signal line drive circuit are not involved in the production of display. In this event, the suspension of operation of the parts and entireties of the data signal line drive circuit allows reduction in power consumption.

To display an image in a specified format, one of the parts and entireties of the scan signal line drive circuit is driven to write image data to the pixel array, the other parts and entireties of the scan signal line drive circuit are not involved in the production of display. In that event, the suspension of the operation of the parts and entireties of the scan signal line drive circuit allows reduction in power consumption.

Another image display device in accordance with the present invention may be, in the foregoing image display device, arranged so that:

the same part(s) and entirety(ies) of the drive circuit(s) is(are) driven throughout one or more frame periods.

By driving the same part(s) and entirety(ies) of the data signal line drive circuit throughout one or more frame periods, an image can be displayed in the most suitable format to the kind of image for each frame, thus achieving both a high quality image display and low power consumption.

By driving the same part(s) and entirety(ies) of the scan signal line drive circuit throughout one or more frame periods, an image can be displayed in the most suitable format to the kind of image for each frame, thus achieving both a high quality image display and low power consumption.

Another image display device in accordance with the present invention may be, in the foregoing image display device, arranged so that:

two or more of the parts and entireties of the drive circuit(s) are switchably driven in one frame period.

By switchably driving two or more of the parts and entireties of the data signal line drive circuit in one frame period, images of different kinds can be viewed simultaneously with different areas of the screen showing images of different kinds in the most suitable formats, thus achieving both a high quality image display and low power consumption.

By switchably driving two or more of the parts and entireties of the scan signal line drive circuit in one frame period, images of different kinds can be viewed simultaneously with different areas of the screen showing images of different kinds in the most suitable formats, thus achieving both a high quality image display and low power consumption. The switchably driving the parts and entireties of the scan signal line drive circuit in one frame period can be done by limiting outputs using an enable signal, inputting a start signal during the course of operation, etc.

Another image display device in accordance with the present invention may be, in the foregoing image display device, arranged so that:

at least two of the parts and entireties of the drive circuit(s) write image data in respective areas on a screen.

By the at least two of the parts and entireties of the data signal line drive circuit writing image data in respective areas on a screen, images of different kinds can be displayed on one screen with different areas of the screen showing images of different kinds in the most suitable formats, thus achieving both a high quality image display and low power consumption.

By the at least two of the parts and entireties of the scan signal line drive circuit writing image data in respective areas on a screen, images of different kinds can be displayed on one screen with different areas of the screen showing images of different kinds in the most suitable formats, thus achieving both a high quality image display and low power consumption.

Another image display device in accordance with the present invention may be, in the foregoing image display device, arranged so that:

a part or entirety of the data signal line drive circuit is provided in plurality; and at least two of the parts and entireties of the data signal line drive circuit write image data in one partial or whole area on a screen in one frame period.

By the at least two of the parts and entireties of the data signal line drive circuit writing image data in one partial or whole area on a screen in one frame period, an image can be displayed overlapping another (superimposed). In other words, image data can be written over the previously written image data in one display area without the data going through an external image processing circuit. This makes the system simpler and less costly, achieving low power consumption.

Another image display device in accordance with the present invention may be, in the foregoing image display device, arranged so that:

at least two of the parts and entireties of the data signal line drive circuit operate simultaneously.

By the at least two of the parts and entireties of the data signal line drive circuit operating simultaneously, a display can be produced regardless of from which of the parts and entireties of the data signal line drive circuit the image data comes. Images can be displayed on one screen using different formats and one image can be written overlapping another.

Another image display device in accordance with the present invention may be, in the foregoing image display device, arranged so that:

at least one of the parts and entireties of the data signal line drive circuit writes image data overlapping an image written by another part or entirety of the data signal line drive circuit in one frame period.

By at least one of the parts and entireties of the data signal line drive circuit writes image data overlapping an image written by another part or entirety of the data signal line drive circuit, images can be synthesized without an external image processing circuit. This makes the system simpler and less costly, achieving low power consumption.

Another image display device in accordance with the present invention may be, in the foregoing image display device, arranged so that:

at least one of the parts and entireties of the data signal line drive circuit writes an image overlapping another image throughout one or more entire horizontal scan periods.

By writing an image overlapping another image throughout one or more entire horizontal scan periods, the driving of the data signal line drive circuit controlling overwrite can be made simple. In other words, a part or entirety of the data signal line drive circuit is driven only in a display period corresponding to the line in which overwriting takes place, but is not driven in a display period corresponding to the other lines.

Another image display device in accordance with the present invention may be, in the foregoing image display device, arranged so that:

at least one of the parts and entireties of the data signal line drive circuit writes an image overlapping another image only in a part of one or more entire horizontal scan periods.

By writing an image overlapping another image only in a part of one or more entire horizontal scan periods, overwriting can be used only for text displayed in white on a black background (alternatively, displayed in black on a black background): no overwriting takes place at other times. Thus, text can be superimposed.

Another image display device in accordance with the present invention may be, in the foregoing image display device, arranged so that:

a part or entirety of the data signal line drive circuit is provided in plurality; and at least one of the parts and entireties of the data signal line drive circuit writes image data in a blanking period of each horizontal scan period.

The blanking period of a horizontal scan period comes after a normal writing period in terms of time. Therefore, by the data signal line drive circuit writing image data in a blanking period of each horizontal scan period, image data can be overwritten without any problem even when there is image data already written to the data signal line corresponding to the display area.

Another image display device in accordance with the present invention may be, in the foregoing image display device, arranged so that:

a part or entirety of the data signal line drive circuit is provided in plurality; and at least one of the parts and entireties of the data signal line drive circuit writes image data with a predetermined delay from another part or entirety of the data signal line drive circuit.

By at least one of the parts and entireties of the data signal line drive circuit writing image data with a predetermined delay from another part or entirety of the data signal line drive circuit, image data can be overwritten without any problem even when there is image data already written to the data signal line corresponding to the display area.

Another image display device in accordance with the present invention may be, in the foregoing image display device, arranged so that: the parts and entireties of the drive circuit(s) are located opposing one another across the pixel array.

Typically, the data signal line drive circuits are located on a single side of the pixel array (screen area) with no drive circuits, etc. located on the opposite side.

If there are a plurality of data signal line drive circuits as above, this space can be efficiently used by allocating them on both sides of the pixel array.

Typically, the scan signal line drive circuits are located on a single side of the pixel array (screen area) with no drive circuit, etc. located on the opposite side.

If there are a plurality of scan signal line drive circuits as above, this space can be efficiently used by allocating them on both sides of the pixel array.

Further, if drive circuits of different configurations are located on one side, complex wiring is necessary (for example, the output lines of one of the drive circuits are laid in empty spaces in the other drive circuit), which leads to an increase in layout area and noise and erroneous operations due to interference of signal lines. In contrast, these inconveniences do not occur if the drive circuits are located in separately.

Another image display device in accordance with the present invention may be, in the foregoing image display device, arranged so that:

the parts and entireties of the drive circuit(s) are located on one side of the pixel array.

In some cases, by locating the parts and entireties of the data signal line drive circuit on one side of the pixel array (screen area), signal wires can be placed together, and the overall size is reduced.

Further, the signal input terminals, power source terminals, etc. can be placed close to both the drive circuits, which prevents signal delays and waveform distortions from occurring due to elongated wires.

In some cases, by locating the parts and entireties of the scan signal line drive circuits on one side of the pixel array (screen area), signal wires can be placed together, and the overall size is reduced.

Further, the signal input terminals, power source terminals, etc. can be placed close to both the drive circuits, which prevents signal delays and waveform distortions from occurring due to elongated wires.

Another image display device in accordance with the present invention may be, in the foregoing image display device, arranged so that:

the parts and entireties of the drive circuit(s) share a common circuit.

When there are provided data signal line drive circuits of different configurations, they in some cases partially share a common circuit arrangement: for example, when an image is always displayed with the same resolution, scan circuits (shift register circuits), etc. for sequentially transferring a signal operate in the same manner. In such a case, the drive circuits can be reduced in size by partially sharing a common circuit.

When there are provided scan signal line drive circuits of different configurations, they in some cases partially share a common circuit arrangement: for example, when an image is always displayed with the same resolution, scan circuits (shift register circuits), etc. for sequentially transferring a signal operate in the same manner. In such a case, the drive circuits can be reduced in size by partially sharing a common circuit.

Another image display device in accordance with the present invention may be, in the foregoing image display device, arranged so that:

an externally inputted signal controls which of the parts and entireties of the drive circuit(s) will be driven.

Despite the provision of a plurality of data signal line drive circuits, it is only one of them that actually drives the pixel array. It is a waste to drive the data signal line drive circuits that are not involved in producing a display; therefore, it is advantageous in terms of power consumption to control through an external signal so that only the data signal line drive circuit controlling the display operate.

Despite the provision of a plurality of scan signal line drive circuits, it is only one of them that actually drives the pixel array. It is a waste to drive the scan signal line drive circuits that are not involved in producing a display; therefore, it is advantageous in terms of power consumption to control through an external signal so that only the scan signal line drive circuit controlling the display operate.

Another image display device in accordance with the present invention may be, in the foregoing image display device, arranged so that:

one of the mutually different display configurations is selected according to a kind of input display data.

The image display device displays various kinds of images: text, graphics, tables, charts and graphs, photographs, motion pictures. The resolutions (indicating how fine the display image is) of original signals also vary wildly.

There is no need to apply a single display mode or display format to display these images of various kinds based on a wide variety of signals. For example, when only text is to be displays, no halftone display is required: a binary display will be sufficient in some cases. Meanwhile, when an image, such as a photograph, is to be displayed, a halftone display is required to produce a high resolution and great number of multitones (64 to 256 halftones) Display modes are preferably switchable whereby, for example, for a photograph for which a more vivid display is desirable, the transmission display mode is selectable, whereas for text and the like for which nothing more than mere legibility is required, the reflection display mode is selectable which, although producing a low contrast ratio, allows for reductions in power consumption Accordingly, by providing more than one drive circuit and switching between display modes and formats according to the kind of video to be displayed, the display and drive are optimized for the input display data (the kind of image to be displayed).

Another image display device in accordance with the present invention may be, in the foregoing image display device, arranged so that:

one of the mutually different display configurations is selected according to an environmental condition.

Typically, the transmission display mode produces a brighter, clearer display due to the effects of backlight in a relatively dark environment, but shows very poor visibility due to reflection in intense external light. Meanwhile, the reflection display mode achieves a clear, high legibility display in intense external light, but produces only a hard-to-view display in weak external light. In addition, for example, in the reflection display mode, the contrast ratio is low and large numbers of halftones do not produce intended advantages. Accordingly, the most suitable display format is preferably selected depending on the display mode. As detailed here, both good video viewing conditions and low power consumption become possible by switching display modes depending on ambient brightness and other environmental conditions and also by switching display formats depending on the display mode.

Another image display device in accordance with the present invention may be, in the foregoing image display device, arranged so that:

the video signal processing circuit converts the input video signal to a plurality of kinds of display formats as the mutually different display configurations.

As described above, the image display device produces displays based on various kinds of input video data; however, the input signals sometimes have the same format. In such a case, the video data needs be converted to the format compatible with the kind of the video before being supplied to the data signal line drive circuit, which becomes possible by the provision of a signal processing circuit with a format convert function. In other words, the provision enables the image display device to be compatible with various kinds of input video data.

Another image display device in accordance with the present invention may be, in the foregoing image display device, arranged so that:

the timing circuit converts the input timing signal to a signal compatible with a display format as one of the mutually different display configurations.

When the display resolution, frame frequency, etc. are changed depending on the kind of video and environmental conditions, the timing signals (clock signal, etc.) supplied to the data signal line drive circuit and the scan signal line drive circuit need be changed. This becomes possible by the provision of a timing circuit with a function to convert original timing signals, such as a synchronous signal and an original clock signal, to those compatible with the display format. In other words, the provision enables the image display device to be adaptable to situations where the display resolution, frame frequency, etc. are changed depending on the kind of video and environmental conditions.

Another image display device in accordance with the present invention may be, in the foregoing image display device, arranged so that:

the timing circuit includes timing signal supply destination switching means for, upon reception of an external control signal, switching destinations to which the timing signal is to be supplied.

In the arrangement, only one of the parts and entireties of the data signal line drive circuit and only one of the parts and entireties of the scan signal line drive circuit operates. None of the other parts or entireties of the drive circuits, which are not operating, need be fed with a timing signal.

Therefore, the provision of means for switching destinations to which the timing signal is to be supplied and the resultant capability to stop redundant supply of the timing signal allows for prevention of noise-induced erroneous operations and reductions in power consumption.

Another image display device in accordance with the present invention may be, in the foregoing image display device, arranged so that:

the video signal processing circuit includes video signal supply destination switching means for, upon reception of an external control signal, switching destinations to which the video signal is to be supplied.

In the arrangement, only one of the parts and entireties of the data signal line drive circuit operates. None of the other parts or entireties of the drive circuit, which are not operating, need be fed with a video signal. Therefore, the provision of means for switching destinations to which the video signal is to be supplied and the resultant capability to stop redundant supply of the video signal allows for prevention of noise-induced erroneous operations and reductions in power consumption.

Another image display device in accordance with the present invention may be, in the foregoing image display device, arranged so that it further includes:

detection means for detecting an environmental condition; and display configuration switching means for switching the display configurations according to a signal from the detection means.

As described above, a user may switch display modes and formats according to an environmental condition, using a switch, for example. However, the inclusion of an optical sensor or the like sensing an environmental condition enables the image display device to be automatically switched selectively to the most suitable display mode and format, which eliminates the need for the user to control the device by himself.

Another image display device in accordance with the present invention may be, in the foregoing image display device, arranged so that it further includes:

video kind identification means for identifying a kind of the input video signal; and display configuration switching means for switching the display configurations according to a signal from the video kind identification means.

As described above, a user may switch display modes and formats according to the kind of video to be displayed (photographs, charts and graphs, text, etc.), using a switch, for example. However, the inclusion of means for identifying the kind of video signal and format enables the image display device to be automatically switched selectively to the most suitable display mode and format compatible with the kind of the video, which eliminates the need for the user to control the device by himself.

Another image display device in accordance with the present invention may be, in the foregoing image display device, arranged so that:

each of the parts and entireties of the drive circuit(s) has its own power supply terminal and input terminal.

As described above, the inclusion of more than one drive circuit requires a timing signal, video signal and electric power to be supplied to those drive circuits. Especially, when the drive circuits are located on opposite sides across the pixel array, the provision of independent power source terminals and input terminals reduces the number of intersections of signal lines and power source lines, making it possible to prevent erroneous operations and displays from occurring due to noise and other reasons caused by capacitance coupling.

Another image display device in accordance with the present invention may be, in the foregoing image display device, arranged so that:

the parts and entireties of the drive circuit(s) share a partially common power supply terminal and input terminal.

In some cases, the provision of more than one data signal line drive circuit or scan signal line drive circuit requires separate timing signals and video signals, as well as separate drive power sources, since different drive circuits need be driven by different methods. However, at least some of the signals and power sources may be identical in some cases. In such a case, the sharing of terminals for those common signals and common voltage power sources reduces the number of terminals and allows for simplification of external switching of signals and power supplies.

Another image display device in accordance with the present invention may be, in the foregoing image display device, arranged so that:

none of the parts and entireties of the drive circuit(s) is fed with electric power when not operating.

In the arrangement, only one of the parts and entireties of the data signal line drive circuit operates, and only one of the parts and entireties of the scan signal line drive circuit operates. None of the other parts or entireties of the drive circuits, which are not operating, need be fed with an electric power. Therefore, the arrangement whereby the drive circuits have an individual power source terminal and the resultant capability to stop the supply of an electric power to the power source terminals of a non-operating drive circuits allows for prevention of power consumption due to leak current and other reasons.

Another image display device in accordance with the present invention may be, in the foregoing image display device, arranged so that it further includes:

drive circuit isolating means for electrically isolating some of the parts and entireties of the drive circuit(s) that are not being involved in producing a display from the pixel array.

If a plurality of data signal line drive circuit or scan signal line drive circuits which are provided to drive one pixel array supply signals (video signals or scan signals) simultaneously to the pixel array, interference of the signals may occur, obstructing the image display device functioning normally. Even when one of the drive circuits is not operating, if it is connected to signal lines, the signal may leak and adversely affect the display.

Therefore, the provision of means for electrically isolating those drive circuits not involved in producing a display from the pixel array enables the image display device to produce a good display.

Another image display device in accordance with the present invention may be, in the foregoing image display device, arranged so that:

one of a plurality of display formats as the mutually different display configurations produces a relatively high quality display, whilst the other produces a relatively low quality display.

As described above, the provision of a plurality of data signal line drive circuits or scan signal line drive circuits for a single pixel array enables a display to be produced by a plurality of formats and allows the most suitable display mode and format to be selected according to the kind of display data and environmental conditions.

Under these circumstances, the most suitable display method and drive method become selectable according to the kind of video and environmental conditions, by providing two drive circuits, one to achieve high display quality (for example, high resolution, color display, many halftones, high frame frequency, transmission display mode, etc.) and the other to produce a relatively low quality display (low resolution, black & white display, small number of halftones, low frame frequency, reflection display mode, etc.).

Another image display device in accordance with the present invention may be, in the foregoing image display device, arranged so that:

one of a plurality of display formats as the mutually different display configurations consumes relatively little power, whilst the other consumes a relatively great power.

Typically, to improve display quality, as described above, a high resolution, color display, multitone, high frame frequency, transmission display mode, etc. need be realized, which in many cases leads to increased power consumption. In contrast, reduced display quality, such as a low resolution, black & white display, small number of halftones, low frame frequency, and reflection display mode, leads to reduced power consumption.

A suitable display mode and display format is selectable according to the kind of display data and environmental conditions in this manner. The selection of the most suitable display method and drive method according the kind of video and environmental conditions allows for optimization of power consumption.

Another image display device in accordance with the present invention may be, in the foregoing image display device, arranged so that:

one of the plurality of display formats produces a relatively high resolution, whilst the other produces a relatively low resolution.

A display may be adequately produced at a resolution that is lower than that of the display device, for example, when the resolution of original video data is lower than that of the image display device. In such an event, identical data is to be written to a plurality of pixels, which means that an identical signal is inputted simultaneously to a plurality of data signal line drive circuits or a plurality of scan signal line drive circuits. The number of drive circuits that operate to produce a low resolution display can be therefore reduced. This, in the production of a low resolution display, allows for reduction in size of the operating circuits, the number of wires, and the drive frequency, and thus leads to reduced power consumption by the image display device.

Another image display device in accordance with the present invention may be, in the foregoing image display device, arranged so that:

one of the plurality of display formats is a color display, whilst the other is a black-and-white display.

A black & white display (may include halftones) is sufficiently good, for example, when the original video data includes nothing more than text and tables. When the pixel array is composed of red, green, and blue pixels and is compatible with a color display, writing identical data to a group of red, green, and blue pixels enables a black & white display. In this situation, identical data needs be simultaneously inputted to a plurality of data signal line drive circuits, which leads to a reduction in the number of drive circuits that are operating to produce a black & white display. This, in the production of a black & white display, allows for reduction in size of the operating circuits and the number of wires, and thus leads to reduced power consumption by the image display device.

Another image display device in accordance with the present invention, may be, in the foregoing image display device, arranged so that: a part or entirety of the data signal line drive circuit is provided in plurality; and at least one of the parts and entireties of the data signal line drive circuit write(s) identical image data to a plurality of data signal lines.

In this manner, the writing of identical image data to a plurality of data signal lines enables a plurality of pixels in the horizontal direction on the screen to be driven based on identical image data, and permits a display to be produced at a resolution that is lower than the physical resolution of the image display device. For example, the identical image data is written to a plurality of successive data signal lines.

In this situation, the number of outputs from the data signal line drive circuit decreases (down to 1/n, for example, if identical image data is written to n data signal lines). This reduces the size of the data signal line drive circuit, the number of data signals and clock signals or frequency, which leads to reduced power consumption by the data signal line drive circuit.

Another image display device in accordance with the present invention, may be, in the foregoing image display device, arranged so that:

a part or entirety of the data signal line drive circuit is provided in plurality; and at least one of the parts and entireties of the data signal line drive circuit write(s) identical image data to a data signal line associated with a plurality of horizontally succeeding pixels of the same color.

In this manner, the plurality of horizontally successive pixels of the same color produce a display based on the identical image data, by writing identical image data to a data signal line associated with a plurality of horizontally succeeding pixels of the same color, in other words, to a data signal line associated with pixels that are horizontally adjacent to each other when considering only those pixels of the same color. A display becomes possible at a resolution that is lower than the physical resolution of the image display device without sacrificing the reproducibility of colors.

In this situation, the number of outputs from the data signal line drive circuit decreases (down to 1/n, for example, if identical image data is written to n data signal lines). This reduces the size of the data signal line drive circuit, the number of data signals and clock signals or frequency, which leads to reduced power consumption by the data signal line drive circuit.

Another image display device in accordance with the present invention may be, in: the foregoing image display device, arranged so that:

a part or entirety of the data signal line drive circuit is provided in plurality; and at least one of the parts and entireties of the data signal line drive circuit write(s) identical image data to a data signal line associated with a plurality of horizontally succeeding pixels of three colors.

In this manner, the plurality of horizontally successive pixels of three colors produce a display based on the identical image data, by writing identical image data to a data signal line associated with a plurality of horizontally succeeding pixels of three colors. A black & white display (including halftones displays) becomes possible.

In this situation, the number of outputs from the data signal line drive circuit decreases to ⅓ (for example, if each pixel is composed of three primary colors RGB). This reduces the size of the data signal line drive circuit, the number of data signals and clock signals or frequency, which leads to reduced power consumption by the data signal line drive circuit.

Another image display device in accordance with the present invention may be, in the foregoing image display device, arranged so that:

in one of the plurality of display formats of a relatively low resolution, a scan signal is written to a plurality of successive scan signal lines at an identical timing; and the data signal line drive circuit outputs image data which is held by data signal lines in each scan period.

In this manner, the writing of identical image data to the data signal lines in scan periods corresponding to a plurality of successive scan signal lines enables a plurality of vertically successive pixels on the screen to be driven based on identical image data, and permits a display to be produced at a resolution that is lower than the physical resolution of the image display device.

Under these circumstances, the vertical and horizontal resolutions can be matched if means for reducing the horizontal resolution is used in combination.

Another image display device in accordance with the present invention may be, in the foregoing image display device, arranged so that:

in one of the plurality of display formats of a relatively low resolution, a scan signal is written to a plurality of successive scan signal lines at different timings; and the data signal line drive circuit outputs identical image data in each scan period.

In this manner, the writing of identical image data to the data signal lines in scan periods corresponding to a plurality of successive scan signal lines enables a plurality of vertically successive pixels on the screen to be driven based on identical image data, and permits a display to be produced at a resolution that is lower than the physical resolution of the image display device.

Under these circumstances, the vertical and horizontal resolutions can be matched if means for reducing the horizontal resolution is used in combination.

Another image display device in accordance with the present invention may be, in the foregoing image display device, arranged so that:

in one of the plurality of display formats of a relatively low resolution, a scan signal is written to a plurality of successive scan signal lines at different timings; and the data signal line drive circuit outputs image data which is held by data signal lines in a period including a plurality of scan periods.

In this manner, by the plurality of data signal lines holding the image data outputted from the data signal line drive circuit in scan periods corresponding to a plurality of successive scan signal lines, the output cycle of the video data from the data signal line drive circuit can be reduced. This permits a display to be produced at a resolution that is lower than the physical resolution of the image display device and reduces the number or frequency of the data signal and clock signal in the data signal line drive circuit. Therefore, the data signal line drive circuit consumes less power.

Another image display device in accordance with the present invention may be, in the foregoing image display device, arranged so that:

in one of the plurality of display formats of a relatively low resolution, a scan signal is written to a plurality of successive scan signal lines at different timings; and the data signal line drive circuit outputs image data representing an identical halftone, but different polarities, in each scan period.

In this manner, with such an arrangement that the data signal line drive circuit outputs image data representing an identical halftone, but of different polarities in scan periods corresponding to a plurality of successive scan signal lines, a display becomes possible at a resolution lower than the physical resolution without making any compromise in display quality in a horizontal line reverse drive method.

Reasons why this is done when adopting a horizontal line reverse drive method is as follows. When a display is to be produced by a horizontal line reverse drive method, a plurality of lines, etc. must be reverse driven for the data signal lines to hold image data in scan periods corresponding to a plurality of scan signal lines as in the foregoing. However, in such a case, display quality degrades, because the difference in potential between a plurality of pixels to which identical image data has been written grows larger due to the parasitic capacitances between the upper and lower pixels and other reasons. In contrast, if the polarity of the image data is reversed for every line, almost no difference develops in potential variation of the pixels due to the parasitic capacitances between the upper and lower pixels; therefore display quality does not degrade.

Another image display device in accordance with the present invention may be, in the foregoing image display device, arranged so that:

in one of the plurality of display formats of a relatively low resolution, image data is written to data signal lines without changing a polarity thereof throughout one frame period.

In this manner, if the image data written to the data signal lines is of the same polarity throughout a frame period, even when the data signal lines hold the image data in scan periods corresponding to a plurality of scan signal lines, almost no difference develops in potential variation of the pixels due to the parasitic capacitances between the upper and lower pixels; therefore display quality does not degrade.

For these reasons, a drive method can be adopted whereby the plurality of data signal lines hold the image data outputted from the data signal line drive circuit in scan periods corresponding to a plurality of successive scan signal lines with no degradation in display quality. This reduces the output cycle of the video data from the data signal line drive circuit, thereby permits a display to be produced at a resolution that is lower than the physical resolution of the image display device, and reduces the number or frequency of the data signal and clock signal in the data signal line drive circuit. Therefore, the data signal line drive circuit consumes less power.

Another image display device in accordance with the present invention may be, in the foregoing image display device, arranged so that:

one of the plurality of display formats displays a relatively great number of halftones, whilst the other displays a relatively small number of halftones.

Required display halftones differ when original video data represents text, tables, charts and graphs, or animation and when it represents photographs, for example. In a reflection display mode, the contrast ratio is lower than in a transmission display mode and a large number of halftones is not essential unless there is a special purpose for doing so.

In this manner, a large number of halftones may not be necessary for some image to be displayed and in some display modes. Accordingly, arranging so that one of the plurality of data signal line drive circuits can produce a display with a smaller number of halftones than the other, the operating circuit in the production of a display with less halftones can be reduced in size and the number of wires and terminals, which in reduces the power consumption of the image display device.

Another image-display device in accordance with the present invention may be, in the foregoing image display device, arranged so that:

one of the plurality of display formats is compatible with a halftone display, whilst the other is compatible with a binary display.

As described above, producing a display at different halftones according to the kind of the image to be displayed and the display mode is a very effective way of reducing the power consumption of an image display device.

Under these circumstances, the halftone display is not required in some cases when the original video data represents text, tables, charts and graphs; in such a case, power consumption is further reduced by driving based on binary data (1 bits). Binary data is not provided by an analog signal whose processing is complex and which is subject to noise and other disturbances, but by a logic signal representing 0s and 1s which can be processed using only logic circuits. Therefore, the drive circuit is reduced greatly in size, and no through current flows in the circuit. So, power consumption is greatly reduced.

A color image display device can produce an eight-color display even from binary data, which is in many cases is a sufficient display capability for an image display device.

Another image display device in accordance with the present invention may be, in the foregoing image display device, arranged so that:

a part or entirety of the data signal line drive circuit is provided in plurality; and the parts and entireties of the data signal line drive circuit include a reference voltage selection circuit and an intermediate potential generation circuit, wherein:

when relatively a few halftones are displayed, the reference voltage selection circuit operates, but the intermediate potential generation circuit does not operate; and when relatively many halftones are displayed, both the reference voltage selection circuit and the intermediate potential generation circuit operate.

When relatively a few halftones are to be displayed, a desired halftone potential is obtainable by selecting one of a plurality of externally supplied reference voltages. However, when relatively many halftones are to be displayed and similar drive is to be done, the number of reference voltage lines grows exponentially. To render the situation more practical, it is effective to create multitone data by producing an intermediate potential from two reference potentials.

Therefore, by causing the intermediate potential generation circuit to operate according to a display format and either outputting the output of the reference voltage selection circuit to the data signal lines via the intermediate potential generation circuit or outputting the output of the reference voltage selection circuit directly to the data signal lines without going via the intermediate potential generation circuit, the data signal line drive circuit which shares a common circuit before the intermediate potential generation circuit can produce a display in a plurality of formats.

Another image display device in accordance with the present invention may be, in the foregoing image display device, arranged so that:

a part or entirety of the data signal line drive circuit is provided in plurality; and the parts and entireties of the data signal line drive circuit include an amplifier circuit, wherein when relatively a few halftones are displayed, the amplifier circuit does not operate; and when relatively many halftones are displayed, the amplifier circuit operates.

As described above, when relatively many halftones are to be displayed, it is effective to cause the intermediate potential generation circuit to operate. However, generally, the intermediate potential generation circuit does not have a large driving force. If the screen is large and puts a heavy load on the data signal line drive circuit, the intermediate potential generation circuit alone, in some cases, have difficulties in driving the data signal lines (writing video data). When this is the case, it is effective to provide an amplifier circuit in the stage that immediately follows the intermediate potential generation circuit and write video data to the data signal line using the amplifier.

Therefore, when relatively many halftones are to be displayed, the intermediate potential generation circuit and the amplifier circuit are caused to operate, the amplifier circuit is used to drive the data signal lines. When relatively a few halftones are to be displayed, the data signal lines are driven without going through the intermediate potential generation circuit- and the amplifier circuit. Thereby, the data signal line drive circuit which shares a common circuit before the intermediate potential generation circuit can produce a display in a plurality of formats.

Under these circumstances, since a steady-state current flows through a large amplifier circuit, the amplifier circuit which is non-operating when relatively a few halftones are to be displayed contributes a great deal to reduce power consumption in the image display device.

Another image display device in accordance with the present invention may be, in the foregoing image display device arranged so that:

the input video signal is analog in one of the plurality of display formats and digital in the other.

Examples of driving methods for the image display device include analog drive schemes and digital drive schemes. In the analog drive scheme, the number of displayable halftones is basically infinite and determined by an externally inputted video signal. In contrast, in the digital drive scheme, the number of displayable halftones is determined by the configuration of the data signal line drive circuit; a large scale, complex drive circuit is required to produce a display with more halftones. Meanwhile, the digital drive scheme is advantageous in that it makes processing of signals easy since the video signal is processed in digital immediately before it is written to the data signal lines.

As could be understood from the foregoing, it is preferable to employ the analog drive scheme when relatively many halftones to be displayed, and meanwhile, it is preferable to employ the digital drive scheme when relatively a few halftones are to be displayed.

Another image display device in accordance with the present invention may be, in the foregoing image display device, arranged so that:

the input video signal carries image data in one of the plurality of display formats and text data in the other.

As described above, in a case where one of the drive circuits corresponds to a color display and a multitone display whereas the other drive circuit corresponds to a black & white display, a binary halftone display, and the like, and also in a case where one of the drive circuits is capable of producing a display at a higher resolution than the other drive circuit, it is effective to switch the operating drive circuit and to switch the destination of the video data input according to the kind of video data.

For example, those apparatuses connected to the Internet and mobile telephones capable of receiving images receive both text data and image data, as in mail messages and Web pages respectively. However, for mail reception and transmission, text data needs be handled, and data is therefore inputted to a drive circuit corresponding to a black & white binary display to activate that drive circuit. For Web pages, image data needs be handled, and data is therefore inputted to a drive circuit corresponding to a multitone color display. Hence, the most suitable display can be produced in terms of both display quality and power consumption.

Another image display device in accordance with the present invention may be, in the foregoing image display device, arranged so that:

the input video signal carries natural image data in one of the plurality of display formats and graphics data in the other.

As described above, one of the drive circuits is capable of producing a display at a higher resolution or more halftones than the other drive circuit, it is effective to switch the operating drive circuit and to switch the destination of the video data input according to the kind of video data.

In some cases, the handling of graphics data or animation data, for example, does not require as high a resolution or many displayable halftones as the handling of photographic data. Therefore, by inputting a video data to, and thus activating, a drive circuit corresponding to a lower resolution or smaller number of display halftones, the most suitable display can be produced in terms of both display quality and power consumption.

Another image display device in accordance with the present invention may be, in the foregoing image display device, arranged so that:

one of a plurality of display modes as the mutually different display configurations is a transmission display mode, whilst the other is a reflection display mode.

As in the foregoing, in some cases, it is preferable to switch display modes according to environmental conditions, particularly, ambient brightness. For example, in intense external light, the transmission display mode achieves only a hard-to-view display due to reflection of the external light, while the reflection display mode achieves a clearer display for reflection of the external light is used in producing the display. Meanwhile, in a relatively dark environment, the reflection display mode can only produce a hardly visible display.

In the transmission display mode, the image display device should be lighted up from the underneath by a backlight, the image display device as a whole consumes large electric power, which is a bottleneck in reducing power consumption.

Considering these factors, by switching the display mode between transmission and reflection according to environmental conditions or kinds of video, the most suitable display can be produced in terms of both display quality and power consumption.

Another image display device in accordance with the present invention may be, in the foregoing image display device, arranged so that:

none of the parts and entireties of the drive circuit(s) writes image data in at least a part of a display area.

In this situation, the data signal line drive circuit and the scan signal line drive circuit, as well as a part of entirety of an external control circuit and a video signal processing circuit, can suspend operation in those periods corresponding to image areas where no image data is written. Power consumption can be hence greatly reduced.

Another image display device in accordance with the present invention may be, in the foregoing image display device, arranged so that:

none of the parts and entireties of the drive circuit(s) writes image data in a part of a display area by controlling outputs from the parts and entireties of the drive circuit(s) based on a signal that represents drive timings of the signal lines.

For example, by rendering the output pulse control signal non-active in the data signal line drive circuit or the scan signal line drive circuit, most of the drive circuits can suspend operation. Power consumption can be hence greatly reduced.

Another image display device in accordance with the present invention may be, in the foregoing image display device, arranged so that:

none of the parts and entireties of the drive circuit(s) writes image data in a part of a display area by controlling outputs from the parts and entireties of the drive circuit(s) based on a reset signal causing the parts and entireties of the drive circuit(s) to stop scanning.

For example, by suspending the clock signal in the data signal line drive circuit or the scan signal line drive circuit, the drive circuits can suspend operation. Power consumption can be hence greatly reduced.

Another image display device in accordance with the present invention may be, in the foregoing image display device, arranged so that:

none of the parts and entireties of the drive circuit(s) writes image data in a part of a display area by inputting a start signal from an intermediate stage of a scan circuit included in the parts and entireties of the drive circuit(s), the start signal causing the parts and entireties of the drive circuit(s) to start scanning.

For example, with such an arrangement that a start signal causing the data signal line drive circuit or the scan signal line drive circuit to start scanning can be inputted from an intermediate stage, only a part of the drive circuits can be activated. Power consumption can be hence greatly reduced. In other words, for example, as to a data signal line drive circuit, a start signal is inputted to a part of the scan circuit in the stage corresponding to an intermediate row on the screen. As to a scan signal line drive circuit, a start signal is inputted to a part of the scan circuit in the stage corresponding to an intermediate column on the screen.

Another image display device in accordance with the present invention may be, in the foregoing image display device, arranged so that:

the parts and entireties of the drive circuit(s) are formed on the same substrate as are the plurality of pixels.

In this arrangement, the pixel array for producing a display can be fabricated on the same substrate in the same step as the data signal line drive circuit and scan signal line drive circuit for driving the pixels. Thus, manufacture and packaging costs can be reduced, and the ratio of items conforming to packaging standards is increased.

Particularly, as described above, if there are provided a plurality of drive circuits for a single pixel array, the effects are enhanced, because in the arrangement, a plurality of drive circuit can be fabricated at the same cost regardless of the number of drive circuits, whereas if a drive IC is connected and driven, the bare and packaging costs of the drive IC increase in proportion with the number of drive circuits.

Another image display device in accordance with the present invention may be, in the foregoing image display device, arranged so that:

the parts and entireties of the drive circuit(s) include a polycrystalline silicon thin transistor as an active element.

A much higher driving force becomes obtainable with those transistors fabricated in this manner using a polycrystalline silicon thin film exhibits than amorphous silicon thin film transistors for use in conventional active matrix liquid crystal display devices. These transistors are advantageous, in addition to the foregoing effects, in that the pixels and the signal line drive circuit can be readily fabricated on the same substrate. Thus, manufacture and packaging costs can be reduced, and the ratio of items conforming to packaging standards is increased.

Another image display device in accordance with the present invention may be, in the foregoing image display device, arranged so that:

the active element constituting the parts and entireties of the drive circuit(s) is formed on a glass substrate by a process at or below 600° C.

In this manner, when polycrystalline silicon thin film transistors are fabricated at process temperatures equal to or below 600° C., the substrate can be glass, which, although having a low distortion temperature, is cheap and readily available in large sizes. The use of glass substrate is advantageous, in addition to the foregoing effects, in that a large image display device can be manufactured at low cost.

Another image display device in accordance with the present invention is arranged as in the foregoing and may be further arranged so that:

in at least one of the plurality of data signal line drive circuits, outputs to the plurality of data signal lines are coupled to the plurality of data signal lines.

In the arrangement, in at least one of the plurality of data signal line drive circuits, outputs to the plurality of data signal lines are coupled to the plurality of data signal lines. Therefore, the at least one data signal line drive circuit drives at a frequency that is lower than the other data signal line drive circuits. Therefore, in addition to the effects of the foregoing arrangement, power consumption can be further reduced.

Another image display device in accordance with the present invention is arranged as in the foregoing and may be further arranged so that:

the plurality of data signal line drive circuits each provide an output to the plurality of data signal lines at a different timing from the others.

In the arrangement, the plurality of data signal line drive circuits each provide an output to the plurality of data signal lines at a different timing from the others. This prevents the for-non-turn-on potential or the for-turn-on potential from being fed to the plurality of data signal lines simultaneously with the video signal, enabling a display of more satisfactory quality in addition to the effects of the foregoing arrangement.

Another image display device in accordance with the present invention is arranged as in the foregoing and may be further arranged so that:

the transfer instruction signal is turned active in a horizontal blanking period; and either the for-turn-on potential or the for-non-turn-on potential is supplied simultaneously.

In the arrangement, the transfer instruction signal is turned active in a horizontal blanking period, and either the for-turn-on potential or the for-non-turn-on potential is supplied simultaneously. This prevents the for-non-turn-on potential or the for-turn-on potential from being fed to the plurality of data signal lines simultaneously with the video signal, enabling a display of more satisfactory quality in addition to the effects of the foregoing arrangement.

Another image display device in accordance with the present invention is arranged as in the foregoing and may be further arranged so that:

one or more of the plurality of data signal line drive circuits to which display data is not being supplied stop being driven.

In the arrangement, one or more of the plurality of data signal line drive circuits to which display data is not being supplied stop being driven. The one or more data signal line drive circuits do not consume electric power, unlike the other data signal line drive circuits. Therefore, in addition to the effects of the foregoing arrangement, power consumption can be further reduced.

Another image display device in accordance with the present invention is arranged as in the foregoing and may be further arranged so that:

at least one of the plurality of data signal line drive circuits includes a level shifter in a timing signal input section of the shift register section and in a binary data signal input section of the data holding section; and the data holding section samples and subsequently holds the binary data signal according to an output of the shift register section based on a timing signal voltage-boosted by the level shifters.

In the arrangement, there is provided a level shifter in a timing signal input section of the shift register section and in a binary data signal input section of the data holding section. Therefore, even when an input signal is applied which is lower than the drive voltage of the shift registers constituting a data signal line drive circuits due to the predetermined timing signal and the binary data signal having a lower potential than the source voltage or for other reasons, the pixels can be driven in a satisfactory manner; the image display device can thus become compatible with a low voltage input signal. Hence, in addition to the effects of the foregoing arrangement, an image can be displayed at further reduced power consumption.

Another image display device in accordance with the present invention is arranged as in the foregoing and may be further arranged so that:

the level shifters operate only when an output signal of the shift register section is active.

In the arrangement, the level shifters operate only when the output signal of the shift register is active. Therefore, the level shifters operate only when they need to. Hence, in addition to the effects of the foregoing arrangement, power consumption can be further reduced.

Another image display device in accordance with the present invention is arranged as in the foregoing and may be further arranged so that:

the level shifters are of a current drive type.

In the arrangement, the level shifters are of a current drive type. Therefore, the level shifters can operate even when the transistors constituting the level shifters exhibit poor characteristics. Hence, in addition to the effects of the foregoing arrangement, power consumption can be further reduced.

Another image display device in accordance with the present invention is arranged as in the foregoing and may be further arranged so that:

the level shifters include an input switching element for switching ON and OFF of operation; and the level shifters stop operating as the input switching element receives a signal having a sufficient level to cause the input switching element to cut off.

In the arrangement, the level shifters stop operating as they are fed with a signal having a sufficient level to cause the input switching element in the level shifters to cut off. Therefore, the level shifters can be arranged so that when they stop operating, no current flows through the input switching element. Hence, in addition to the effects of the foregoing arrangement, the level shifters stop operating, and power consumption during the suspension can be further reduced by the amount equal to the current that would otherwise flow through the input switching element.

Another image display device in accordance with the present invention is arranged as in the foregoing and may be further arranged so that:

the level shifters stop operating as power supply thereto is stopped.

In the arrangement, the level shifters stop operating as power supply thereto is stopped. Therefore, when the level shifters stop operating, the power supply to the level shifters is suspended. Hence, in addition to the effects of the foregoing arrangement, the level shifters can stop, and power consumption during operation can be further reduced by the amount equal to the electric power consumed by the level shifters.

Another image display device in accordance with the present invention is arranged as in the foregoing and may be further arranged so that:

the level shifters include:

a transistor receiving the binary data signal; and an input control section for isolating a gate capacitance of the transistor from a transmission line of the binary data signal.

In the arrangement, the gate capacitance of the transistor receiving the binary data signal which will be inputted to the level shifters is isolated from the transmission line of the binary data signal when the level shifters stop. Therefore, the gate capacitance acting as the load capacitance for the transmission line is restricted only to that for the level shifters during operation. As a result, there is no gate capacitance when the level shifters stop. Hence, in addition to the effects of the foregoing arrangement, the capacitance of the transmission line for the binary data signal can be reduced, and power consumption can be further reduced.

Another image display device in accordance with the present invention is arranged as in the foregoing and may be further arranged so that:

switching elements constituting the plurality of data signal line drive circuits, scan signal line drive circuits, and pixels are made of polycrystalline silicon thin film transistors.

In the arrangement, the plurality of data signal line drive circuits, scan signal line drive circuits, and switching elements constituting the plurality of pixels are made of polycrystalline silicon thin film transistors. Therefore, even in a circuit based on polycrystalline silicon thin film transistors to ensure a wide display area, such as the pixels, the data signal line drive circuits, and the scan signal line drive circuits, the provision of the level shifters as above can sufficiently reduce the drive voltage. Hence in addition to the effects of the foregoing arrangement, a wide display area becomes obtainable, while successfully reducing the drive voltage too.

Another image display device in accordance with the present invention is arranged as in the foregoing and may be further arranged so that:

switching elements constituting the plurality of data signal line drive circuits, scan signal line drive circuits, and pixels are manufactured at a process temperature equal to or below 600° C.

In the arrangement, the plurality of data signal line drive circuits, scan signal line drive circuits, and switching element constituting the plurality of pixels are manufactured at a process temperature equal to or below 600° C. Therefore, an inexpensive glass substrate can be used as the substrate. Hence, in addition to the effects of the foregoing arrangement, an image display device can be provided with a large display area at a low cost.

Another image display device in accordance with the present invention is arranged as in the foregoing and may be further arranged so that it includes:

a binary data potential stabilizer section for restricting variations in potential of the binary data potential when the transfer instruction signal is inputted to the binary data signal line drive circuit.

In the arrangement, the binary data potential stabilizer section restricts variations in potential of the binary data potential when the transfer instruction signal is inputted to the binary data signal line drive circuit. Therefore, the binary data potential of the binary data signal line drive circuit is stabilized. Hence, in addition to the effects of the foregoing arrangement, the data signal lines are well charged to a desired potential, and deterioration in image quality is alleviated in an image display device.

Another image display device in accordance with the present invention is arranged as in the foregoing and may be further arranged so that:

the binary data potential stabilizer section includes:

an electric charge holding section for receiving and holding electric charges from a binary data potential supply line supplying the binary data potential to the binary data signal line drive circuit; and a current control section for determining, according to a resistance value, a quantity of electric charges which is held by the electric charge holding section.

In the arrangement, the binary data potential stabilizer section includes a current control section and an electric charge holding section. Therefore, by the electric charge holding section holding the potential (electric charges) to be supplied to the data signal line drive circuit, the electric charge holding section only needs to supply electric charges when the transfer instruction signal is effective. The binary data potential supplied to the binary data signal line drive circuit only needs to be supplied to the electric charge holding section when the transfer instruction signal is not effective. As a result, when the transfer instruction signal is inputted to the binary data signal line drive circuit, variations (reductions) in the potential of the binary data potential inputted to the binary data signal line drive circuit are restrained. Also, by the use of the current control section, a sufficient current, not an excessive current, can be supplied to the electric charge holding section; increases in power consumption can be restricted by corresponding amounts. Hence, in addition to the effects of the foregoing arrangement, the binary data potential of the binary data signal line drive circuit can stabilized with an inexpensive and simple arrangement. Further, no current amplifier circuits are required, and increases in power consumption can be further restrained.

Another image display device in accordance with the present invention is arranged as in the foregoing and may be further arranged so that: the binary data potential stabilizer section includes:

an electric charge holding section for receiving and holding electric charges from a binary data potential supply line supplying the binary data potential to the binary data signal line drive circuit; and a frequency control section for determining a quantity of electric charges which is inputted to and held by the electric charge holding section while reversing polarities for every horizontal scan period, by having a cut off frequency greater than a frequency of one horizontal scan period of a screen display.

In the arrangement, the binary data potential stabilizer section includes a frequency control section and an electric charge holding section. Therefore, by the electric charge holding section holding the potential (electric charges) supplied to the data signal line drive circuit, the electric charge holding section only needs to supply electric charges when the transfer instruction signal is effective. The binary data potential supplied to the binary data signal line drive circuit only needs to be supplied to the electric charge holding section when the transfer instruction signal is non-effective. As a result, when the transfer instruction signal is inputted to the binary data signal line drive circuit, variations (reductions) in the potential of the binary data potential inputted to the binary data signal line drive circuit are restrained. Also, by the use of the frequency control section, a sufficient current, not an excessive current, can be supplied to the electric charge holding section; increases in power consumption can be restricted by corresponding amounts. Hence, in addition to the effects of the foregoing arrangement, the binary data potential of the binary data signal line drive circuit can be stabilized with an inexpensive and simple arrangement. Further, no current amplifier circuits are required, and increases in power consumption can be further restrained.

Another image display device in accordance with the present invention is arranged as in the foregoing and may be further arranged so that:

the electric charge holding section has a capacitance to hold electric charges that is greater than at least a total capacitance of the plurality of data signal lines.

In the arrangement, the electric charge holding section has a capacitance to hold electric charges that is greater than at least a total capacitance of the plurality of data signal lines. Therefore, when transfer instruction signal is effective, only the electric charges stored in the electric charge holding section need be supplied: no external electric charges need be newly supplied. Hence, in addition to the effects of the foregoing arrangement, increases in power consumption can be further restricted.

Another image display device in accordance with the present invention is arranged as in the foregoing and may be further arranged so that:

the current control section and the electric charge holding section each exhibit a time constant that has such a value that stabilizes the binary data potential at a sufficient value within a period during which a display is produced by the display section based on a video signal supplied from the plurality of data signal line drive circuits other than the binary data signal line drive circuit.

In the arrangement, the current control section and the electric charge holding section constituting the binary data potential stabilizer section each exhibit a time constant that has such a value that stabilizes the binary data potential at a sufficient value within a period during which a display is produced based on a video signal. Therefore, a sufficient value of potential can be held within a period during which a display is produced based on a video signal. In other words, the electric charge holding section can store sufficient electric charges before the transfer instruction signal becomes effective and therefore requires no external electric charges need be newly supplied. Hence, in addition to the effects of the foregoing arrangement, increases in power consumption can be further restricted.

Another image display device in accordance with the present invention is arranged as in the foregoing and may be further arranged so that:

in a horizontal blanking period and when the transfer instruction signal is turned off, the binary data signal line drive circuit precharges the plurality of data signal lines to a potential having an intermediate value between a potential of the plurality of data signal lines representing data in a horizontal effective period (horizontal display period, 1 H) and a potential of the plurality of data signal lines representing data in a subsequent horizontal effective period in the plurality of data signal line drive circuits other than the binary data signal line drive circuit.

In the arrangement, in a horizontal blanking period, the binary data signal line drive circuit precharges the plurality of data signal lines to a potential having an intermediate value between a potential of the plurality of data signal lines representing data in a horizontal effective period and a potential of the plurality of data signal lines representing data in a subsequent horizontal effective period. Therefore, even when the plurality of data signal line drive circuits other than the binary data signal line drive circuit do no have sufficient voltage application capabilities, after a display is produced based on a video signal, the plurality of data signal lines can be charged to a precharge potential; consequently, the plurality of data signal lines can be sufficiently charged to a required potential by the drive circuits by the time a subsequent display is produced based on a video signal. The charge rate of the plurality of data signal lines can be thus supplemented too, enhancing display quality. Further, the binary data signal line drive circuit for use in combination with those data signal line drive circuit other than the binary data signal line drive circuit for the purpose of supplying a plurality of kinds of data can double as a circuit for performing this precharge function, preventing the arrangement from becoming too complicated. Hence, in addition to the effects of the foregoing arrangement, a simple arrangement can still supply a plurality of kinds of data and enhance display quality.

Another image display device in accordance with the present invention is arranged as in the foregoing and may be further arranged so that:

the binary data signal line drive circuit supplies a difference between the binary data potential and a predetermined reference potential to the plurality of data signal lines as image data; and the precharge potential is set to a value equal to the reference potential.

In the arrangement, the reference potential (VCOM) used for the supply to the plurality of data signal lines is used as a precharge potential. Therefore, no external precharge potential needs be newly supplied. Hence, in addition to the effects of the foregoing arrangement, a simpler arrangement can still enhance display quality by means of precharging.

A data signal line drive circuit in accordance with the present invention may be arranged to include an amplifier circuit such that:

when relatively a few halftones are displayed, the amplifier circuit does not operate; and when relatively many halftones are displayed, the amplifier circuit operates.

An electronic apparatus in accordance with the present invention is, in the electronic apparatus, arranged to switch between display modes or formats depending on whether it is being driven by an external supply power source or a built-in battery.

When the electronic apparatus is being driven by a built-in battery, the total power consumption by the apparatus is preferably reduced as much as possible to allow the apparatus to run on the battery for an extended period of time. Therefore, when the apparatus is being driven by a built-in battery, the apparatus is driven in a display mode or format that is less power consuming. When the apparatus is being driven by an external power source (an AC power source, for example), no attention needs to be paid to battery life, and therefore, the apparatus is driven in a display mode or format that is more power consuming, but that produces higher quality. In this manner, a display is produced which is best suited to operating environments and the apparatus can run on the battery for a maximally extended period of time.

Another electronic apparatus in accordance with the present invention is, in the electronic apparatus, arranged to switch between display modes or formats depending on whether it is standing by or operating.

This achieves both high display quality during operation and low power consumption during standby, which greatly improves on the visual recognizability, operability, and convenience of the electronic apparatus.

Another electronic apparatus in accordance with the present invention is, in the electronic apparatus, arranged to switch display modes or formats depending on ambient brightness in which it is being used.

This enables a display which is suited to environmental conditions to be produced, while limiting the power consumption to a minimum level possible, which greatly improves on the visual recognizability, operability, and convenience of the electronic apparatus.

The electronic apparatus in accordance with the present invention is applicable to a personal digital assistant. The personal digital assistant needs to display a wide range of information including text, graphics, and photographs. The inclusion of an image display device with the foregoing features enables the electronic apparatus to have greatly enhances visual recognizability, operability, and convenience.

The inclusion of an image display device capable of overwriting display images (superimpose function) allows the personal digital assistant to display mail messages, etc. as required without switching displays when the personal digital assistant is performing another process.

Alternatively, the electronic apparatus in accordance with the present invention is applicable to a mobile telephone. The mobile telephone is increasingly allowing itself to be integrated to the Internet and can now display a wide range of information from conventional bare text to graphics and photographs. The inclusion of an image display device with the foregoing features enables the electronic apparatus to have greatly enhanced visual recognizability, operability, and convenience.

Further, during standby, the mobile telephone only needs to display time and conditions of electromagnetic waves, for which a black & white display or binary display would be sufficient. Therefore, the inclusion of an image display device which can produce a display in such a display format at a reduced power consumption greatly extends the standby of the mobile telephone.

Further, the inclusion of an image display device capable of overwriting display images (superimpose function) allows the mobile telephone which is displaying large amounts of information, such as an image, to simultaneously display mail messages, etc. as required without switching displays.

Alternatively, the electronic apparatus in accordance with the present invention is applicable to a game player device. The game player device may be color or black & white and needs display various halftones, depending on applications (software). Also, in many cases, menu and game displays require different contents (types) of video. Therefore, the inclusion of an image display device with the foregoing features enables the electronic apparatus to have greatly enhanced visual recognizability, operability, and convenience.

Further, the inclusion of an image display device capable of overwriting display images (superimpose function) the game player device executing the game application to simultaneously display time, etc. as required without switching displays.

Alternatively, the electronic apparatus in accordance with the present invention is applicable to a video camera. The video camera is used both indoors and outdoors. Therefore, the inclusion of an image display device allowing for selection of a display mode and format which is best suited to its environmental conditions enables the electronic apparatus to have greatly enhanced visual recognizability, operability, and convenience.

Further, some video cameras are capable of providing on-screen control during recording or replay. The display of the commands, time, a counter are typically binary. Therefore, the inclusion of an image display device capable of overwriting display images (superimpose function) in the cameras enables them to readily overwrite control commands on the recording or replay image.

Alternatively, the electronic apparatus in accordance with the present invention is applicable to a still camera. The still camera is used both indoors and outdoors. Therefore, the inclusion of an image display device allowing for selection of a display mode and format which is best suited to its environmental conditions enables the electronic apparatus to have greatly enhanced visual recognizability, operability, and convenience.

Further, some still cameras are capable of providing an on-screen control console during recording or replay. The display of the commands, time, a counter are typically binary. Therefore, the inclusion of an image display device capable of overwriting display images (superimpose function) in the cameras enables them to readily overwrite control commands on the recording or replay image.

Alternatively, the electronic apparatus in accordance with the present invention is applicable to an electronic book. Some electronic books will include text information alone, while others will be likely to handle pictures, tables, animation, photo albums, and many more kinds of information. The electronic book can offer a best combination of visual recognizability and low power consumption if it can operate in a display format optimized for the content (kind of book data). Further, in some Japanese books, Chinese characters are displayed accompanied by transliteration in Japanese native letters, which requires a higher resolution. Hence, the inclusion of an image display device with the foregoing features enables the electronic apparatus to have greatly enhanced visual recognizability, operability, and convenience.

Further, the inclusion of an image display device capable of overwriting display images (superimpose function) in the electronic books enables them to readily provide an on-screen control console and clock over another image.

Alternatively, the electronic apparatus in accordance with the present invention is applicable to a navigator system. The navigator system needs display different sets of halftones at different resolutions, depending on software. Some of them recently can double as a television. Therefore, the inclusion of an image display device capable of optimizing its display format depending operating conditions, for example, a menu display which does not require a large number of halftones, a navigation display (map display), a television display which need be full color compatible, enables the electronic apparatus to have greatly enhanced visual recognizability, operability, and convenience.

Further, the inclusion of an image display device capable of overwriting display images (superimpose function) in the navigator systems enables them to readily provide a multi-purpose display including an on screen control console, clock, and traffic information map.

Alternatively, the electronic apparatus in accordance with the present invention is applicable to a television receiver. The television receiver is used both indoors and outdoors. Therefore, the inclusion of an image display device allowing for selection of a display mode and format which is best suited to its environmental conditions enables the electronic apparatus to have greatly enhanced visual recognizability, operability, and convenience.

Further, the inclusion of an image display device capable of overwriting display images (superimpose function) in the television receivers enables them to readily provide an on-screen channel and clock.

Alteratively, the electronic apparatus in accordance with the present invention is applicable to a video replay apparatus. The video replay apparatus, such as video tape recorders and DVDs (Digital Versatile Disks), have recently reduced greatly in size, some to the extent that they are portable and therefore can be used both indoors and outdoors. Therefore, the inclusion of an image display device allowing for selection of a display mode and format which is best suited to its environmental conditions enables the electronic apparatus to have greatly enhanced visual recognizability, operability, and convenience.

Further, the inclusion of an image display device capable of overwriting display images (superimpose function) in the video replay apparatuses enables them to readily allow for the user to switch subtitled version and non-subtitled version when he/she replays movies or language learning materials.

Alternatively, the electronic apparatus in accordance with the present invention is applicable to a computer. The computer needs display a wide range of information from bare text to graphics and photographs. Hence, the inclusion of an image display device with the foregoing features enables the electronic apparatus to have greatly enhanced visual recognizability, operability, and convenience.

Further, the inclusion of an image display device capable of overwriting display images (superimpose function) in the computers enables them to readily display images of different signal sources in different windows. The computer is thus compatible with a multiwindow display. For example, a separate window showing television (video), for example, can be displayed on the monitor without image signal processing.

The invention being thus described, it will be obvious that the same may be varied in many ways. Such variations are not to be regarded as a departure from the spirit and scope of the invention, and all such modifications as would be obvious to one skilled in the art intended to be included within the scope of the following claims.

What is claimed is:

1. A data signal line drive circuit, comprising:
a reference voltage selection circuit; and
an intermediate potential generation circuit, wherein:
when relatively a few halftones are displayed, the reference voltage selection circuit operates, but the intermediate potential generation circuit does not operate; and
when relatively many halftones are displayed, both the reference voltage selection circuit and the intermediate potential generation circuit operate.

2. The data signal line drive circuit as defined in claim 1, further comprising an amplifier circuit,
wherein:
when relatively a few halftones are displayed, the amplifier circuit does not operate; and
when relatively many halftones are displayed, the amplifier circuit operates.

3. An image display device including a data signal line drive circuit, the data signal line drive circuit comprising:
a reference voltage selection circuit; and
an intermediate potential generation circuit,
wherein:
when relatively a few halftones are displayed, the reference voltage selection circuit operates, but the intermediate potential generation circuit does not operate; and
when relatively many halftones are displayed, both the reference voltage selection circuit and the intermediate potential generation circuit operate.

4. A drive circuit, comprising:
a scan circuit including n stages, where n is an integral greater than 1;
a first control switching means for controlling an input of a start signal to a first stage of the scan circuit;

a second control switching means provided between mth and (m+1)th stages of the scan circuit, where m is a positive integral not exceeding n; and a third control switching means for controlling an input of a start signal to the (m+1)th stage, wherein:

the first control signal controls the first control switching means and the second control switching means; and the second control signal controls the third control switching means.

5. An image display device including a drive circuit, the drive circuit comprising:

a scan circuit including n stages, where n is an integral greater than 1;

a first control switching means for controlling an input of a start signal to a first stage of the scan circuit;

a second control switching means provided between mth and (m+1)th stages of the scan circuit, where m is a positive integral not exceeding n; and a third control switching means for controlling an input of a start signal to the (m+1)th stage, wherein:

the first control signal controls the first control switching means and the second control switching means; and the second control signal controls the third control switching means.

6. An image display device, comprising:

a plurality of pixels arranged in a matrix form;

a plurality of data signal lines arranged to match with columns of the plurality of pixels and a plurality of scan signal lines arranged to match with rows of the plurality of pixels;

a display section in which the plurality of pixels are fed with data for an image display from the plurality of data signal lines in synchronism with a scan signal supplied from the plurality of scan signal lines;

a plurality of data signal line drive circuits, connected to the same data signal lines, for outputting a video signal to the plurality of data signal lines in synchronism with a predetermined timing signal; and a scan signal line drive circuit for outputting the scan signal to the plurality of scan signal lines in synchronism with a predetermined timing signal, wherein:

at least one of the plurality of data signal line drive circuits is a binary data signal line drive circuit including:

a shift register section operating at a predetermined timing;

a data holding section for sampling and holding a separately inputted binary data signal according to an output of the shift register section;

a data switching section for switching binary data potentials, i.e., a for-turn-on potential and a for-non-turn-on potential, according to the binary data signal being held; and an output control section, provided between an output of the data switching section and the plurality of data signal lines, for controlling an output of the data switching section based on an externally inputted transfer instruction signal.

7. The image display device as defined in claim 6, wherein:

in at least one of the plurality of data signal line drive circuits, outputs to the plurality of data signal lines are coupled to the plurality of data signal lines.

8. The image display device as defined in claim 6, wherein:

the plurality of data signal line drive circuits each provide an output to the plurality of data signal lines at a different timing from the others.

9. The image display device as defined in claim 6, wherein:

the transfer instruction signal is turned active in a horizontal blanking period; and either the for-turn-on potential or the for-non-turn-on potential is supplied simultaneously.

10. The image display device as defined in claim 6, wherein:

one or more of the plurality of data signal line drive circuits to which display data is not being supplied stop being driven.

11. The image display device as defined in claim 6, wherein:

at least one of the plurality of data signal line drive circuits includes a level shifter in a timing signal input section of the shift register section and in a binary data signal input section of the data holding section; and the data holding section samples and subsequently holds the binary data signal according to an output of the shift register section based on a timing signal voltage-boosted by the level shifters.

12. The image display device as defined in claim 11; herein:

the level shifters operate only when an output signal of the shift register section is active.

13. The image display device as defined in claim 11, wherein:

the level shifters are of a current drive type.

14. The image display device as defined in claim 13, wherein:

switching elements constituting the plurality of data signal line drive circuits, scan signal line drive circuits, and pixels are made of polycrystalline silicon thin film transistors.

15. The image display device as defined in claim 13, wherein:

switching elements constituting the plurality of data signal line drive circuits, scan signal line drive circuits, and pixels are manufactured at a process temperature equal to or below 600° C.

16. The image display device as defined in claim 11, wherein:

the level shifters include an input switching element for switching ON and OFF of operation; and the level shifters stop operating as the input switching element receives a signal having a sufficient level to cause the input switching element to cut off.

17. The image display device as defined in claim 16, wherein:

switching elements constituting the plurality of data signal line drive circuits, scan signal line drive circuits, and pixels are made of polycrystalline silicon thin film transistors.

18. The image display device as defined in claim 16, wherein:

switching elements constituting the plurality of data signal line drive circuits, scan signal line drive circuits, and pixels are manufactured at a process temperature equal to or below 600° C.

19. The image display device as defined in claim 11, wherein:
the level shifters stop operating as power supply thereto is stopped.

20. The image display device as defined in claim 19, wherein:
switching elements constituting the plurality of data signal line drive circuits, scan signal line drive circuits, and pixels are made of polycrystalline silicon thin film transistors.

21. The image display device as defined in claim 19, wherein:
switching elements constituting the plurality of data signal line drive circuits, scan signal line drive circuits, and pixels are manufactured at a process temperature equal to or below 600° C.

22. The image display device as defined in claim 11, wherein:
the level shifters include:
a transistor receiving the binary data signal; and
an input control section for isolating a gate capacitance of the transistor from a transmission line of the binary data signal.

23. The image display device as defined in claim 22, wherein:
switching elements constituting the plurality of data signal line drive circuits, scan signal line drive circuits, and pixels are made of polycrystalline silicon thin film transistors.

24. The image display device as defined in claim 22, wherein:
switching elements constituting the plurality of data signal line drive circuits, scan signal line drive circuits, and pixels are manufactured at a process temperature equal to or below 600° C.

25. The image display device as defined in claim 6, further comprising:
a binary data potential stabilizer section for restricting variations in potential of the binary data potential when the transfer instruction signal is inputted to the binary data signal line drive circuit.

26. The image display device as defined in claim 25, wherein:
the binary data potential stabilizer section includes:
an electric charge holding section for receiving and holding electric charges from a binary data potential supply line supplying the binary data potential to the binary data signal line drive circuit; and
a current control section for determining, according to a resistance value, a quantity of electric charges which is held by the electric charge holding section.

27. The image display device as defined in claim 25, wherein:
the binary data potential stabilizer section includes:
an electric charge holding section for receiving and holding electric charges from a binary data potential supply line supplying the binary data potential to the binary data signal line drive circuit; and
a frequency control section for determining a quantity of electric charges which is inputted to and held by the electric charge holding section while reversing polarities for every horizontal scan period, by having a cut off frequency greater than a frequency of one horizontal scan period of a screen display.

28. The image display device as defined in claim 25, wherein:
the electric charge holding section has a capacitance to hold electric charges that is greater than at least a total capacitance of the plurality of data signal lines.

29. The image display device as defined in claim 25, wherein:
the current control section and the electric charge holding section each exhibit a time constant that has such a value that stabilizes the binary data potential at a sufficient value within a period during which a display is produced by the display section based on a video signal supplied from the plurality of data signal line drive circuits other than the binary data signal line drive circuit.

30. The image display device as defined in claim 6, wherein:
in a horizontal blanking period and when the transfer instruction signal is turned off, the binary data signal line drive circuit precharges the plurality of data signal lines to a potential having an intermediate value between a potential of the plurality of data signal lines representing data in a horizontal effective period and a potential of the plurality of data signal lines representing data in a subsequent horizontal effective period in the plurality of data signal line drive circuits other than the binary data signal line drive circuit.

31. The image display device as defined in claim 30, wherein:
the binary data signal line drive circuit supplies a difference between the binary data potential and a predetermined reference potential to the plurality of data signal lines as image data; and
the precharge potential is set to a value equal to the reference potential.

* * * * *